United States Patent [19]

Allred, Jr. et al.

[11] Patent Number: 4,520,313

[45] Date of Patent: May 28, 1985

[54] SEMICONDUCTOR TESTING AND APPARATUS THEREFOR

[75] Inventors: Laurence L. Allred, Jr.; Bradley N. Lange, both of Chandler, Ariz.

[73] Assignee: Advanced Semiconductor Materials America, Inc., Phoenix, Ariz.

[21] Appl. No.: 363,641

[22] Filed: Mar. 30, 1982

[51] Int. Cl.[3] .............................................. G01R 31/00

[52] U.S. Cl. .............................. 324/158 R; 324/73 R

[58] Field of Search ............ 324/158 R, 158 D, 73 R

[56] References Cited

U.S. PATENT DOCUMENTS 4,051,437 9/1977 Lile et al. ........................ 324/158 R 4,205,265 5/1980 Staebler .......................... 324/158 D 4,220,854 9/1980 Feuerbaum ...................... 324/158 D 4,277,679 7/1981 Feuerbaum ..................... 324/158 D

*Primary Examiner*—Ernest F. Karlsen

*Attorney, Agent, or Firm*—Weiss & Holloway

[57] ABSTRACT

A semiconductor die is positioned and examined by means of scanning certain strategic regions which border or overlap said die. The video which results from the scanning is digitized. For example, black is represented by an "0" and white is represented by a "1". The results may be compared with an acceptable pattern to determine a good die and statistically analyzed to see if the data represents the die or surrounding street.

9 Claims, 51 Drawing Figures

S189 L3 RAM
S189 K3 RAM
125 L6 BUFFER
125 K6 BUFFER
193 L2 COUNTER
VIDEO DATA BUS
Y SIZE WRITE EN
READ EN
X SIZE READ EN
TO FIG. 26 B
296
298
310
312
308
292
294

FIG. 29D
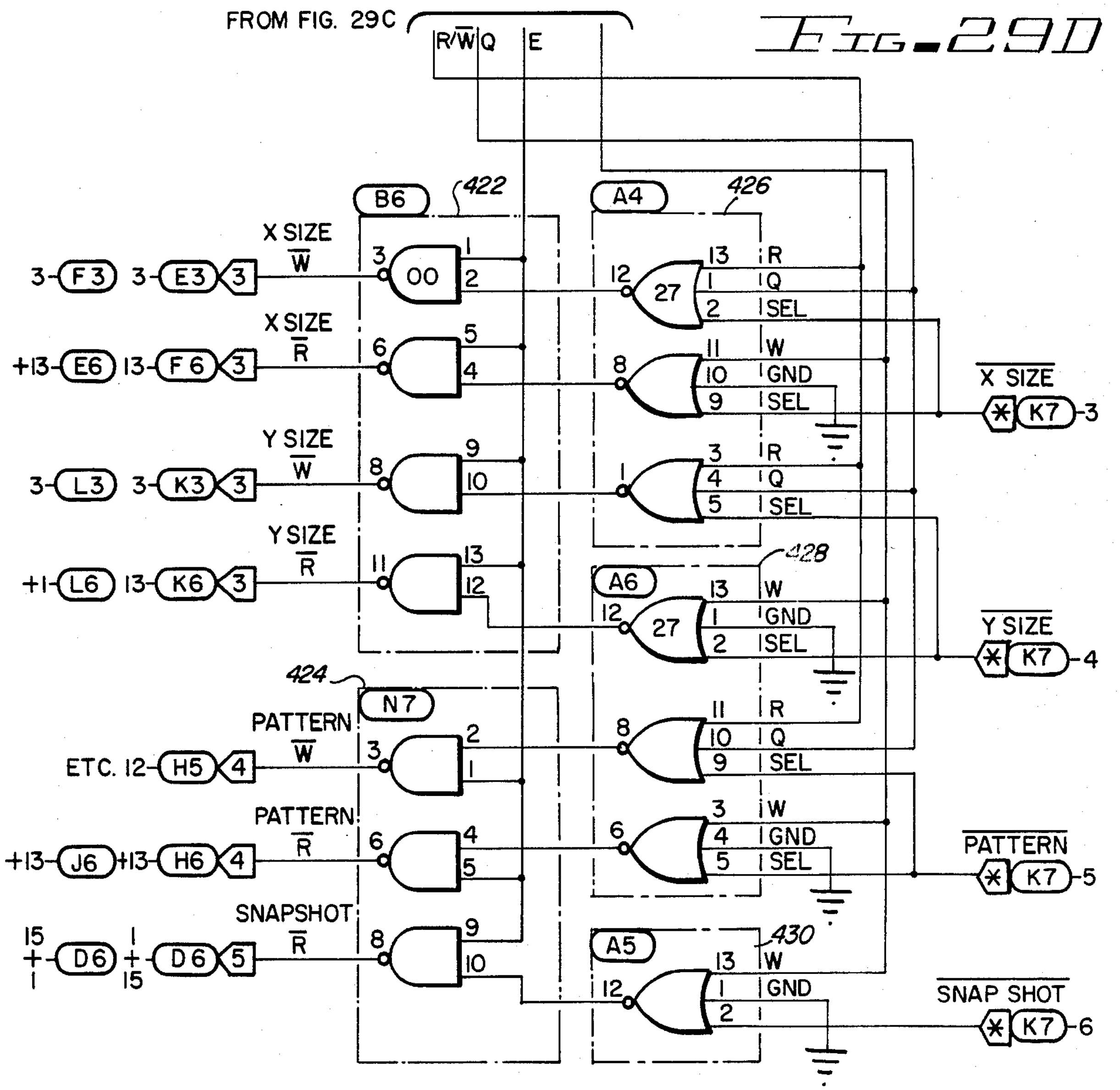
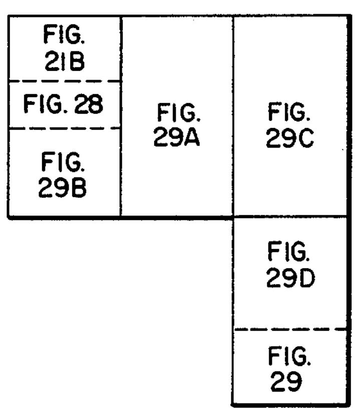
FIG. 29

SEMICONDUCTOR TESTING AND APPARATUS THEREFOR

BACKGROUND OF THE INVENTION

1. Field of the Invention

This invention relates generally to semiconductor testing and, more particularly, to a method and apparatus for evaluating the potential failure of semiconductor chips by digitizing a video scene of only strategic areas on said chip and comparing the resulting pattern with an acceptable pattern stored in memory.

2. Description of the Prior Art

The use of pattern recognition techniques is known in the art of testing semiconductor die. Pattern recognition systems are being used for automatic die inspection in an attempt to locate gross defects in the die. This may be accomplished since the defects can alter a digitized video scene. In some cases, the semiconductor die is scanned and the digitized video signal from a T.V. camera is compared with acceptable stored data.

Unfortunately, to scan an entire die including portions of the scribe areas surrounding the die results in a great deal of data which must be stored and processed. This not only substantially increases the complexity of the test equipment, but also significantly increases test time. The need existed to develop a semiconductor die testing apparatus which would be accurate and have relatively fast test time.

SUMMARY OF THE INVENTION

It is an object of the present invention to provide an improved method for testing semiconductor die.

It is a further object of the present invention to provide a method of testing semiconductor die wherein a video scene of only portions of the die and surrounding scribe areas (or streets) are digitized.

It is a still further object of the present invention to provide a method for testing semiconductor die by digitizing certain regions of the semiconductor die and surrounding scribe areas, said regions being referred to as windows which are programmable so as to change their relative positions and locations.

It is another object of this invention to provide for the simultaneous display on a video screen of alpha numerics, windows or digitized video signals.

It is still another object of the present invention to provide a method for testing semiconductor die by comparing digitized regions or windows of a test die to acceptable data stored in memory.

The above and other objects are achieved by a method of locating and testing a semiconductor die surrounded by a scribe region comprising: scanning preselected regions of said die and said scribe region to generate a video signal corresponding thereto; digitizing said video signal such that white is represented by a first potential and black is represented by a second potential; storing said digitized video signal of said preselected regions; and comparing said stored digitized video signal with a pattern which corresponds to an acceptable semiconductor die.

According to a further aspect of the invention, there is provided an apparatus for testing a semiconductor die surrounded by a scribe region, comprising: first means for scanning preselected regions of said die and said scribe regions to generate a digital video signal corresponding thereto; memory means for storing said digitized video signal; and second means for comparing said stored digitized video signal to a digital pattern which corresponds to an acceptable die.

The above and other objects, features and advantages of the present invention will be more clearly understood from the following detailed description taken in conjunction with the accompanying drawings, in which:

BRIEF DESCRIPTION OF THE DRAWINGS

FIGS. 29 and 29A–29D are diagrams of a circuit which functions as the MPU INTERFACE BOARD.

CIRCUIT OPERATION

Figure 1:
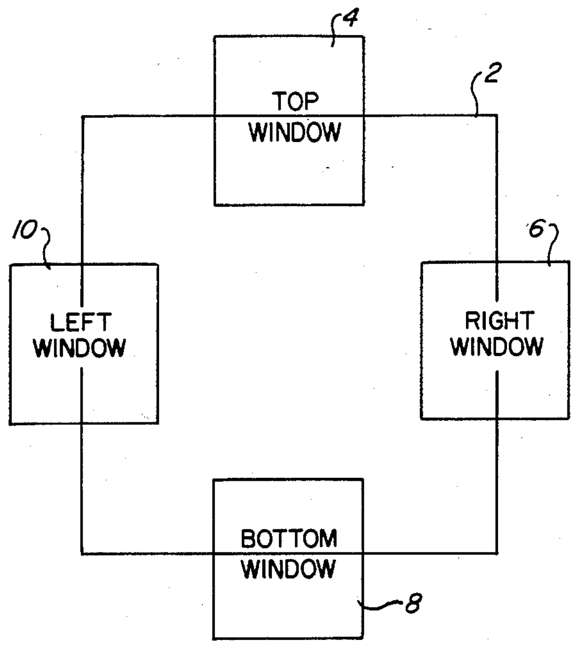
FIG. 1 illustrates a semiconductor die and four strategic windows of comparison.

FIG. 1 illustrates a semiconductor die 2 which is only one of many on a semiconductor wafer. The region immediately surrounding semiconductor die 2 corresponds to a scribe or street area. As can be seen, four windows partly overlap the semiconductor die. These are top window 4, right window 6, bottom window 8, and left window 10. It is only in the window areas that digitized data is stored in memory in order to determine the chip edges.

Figure 2:
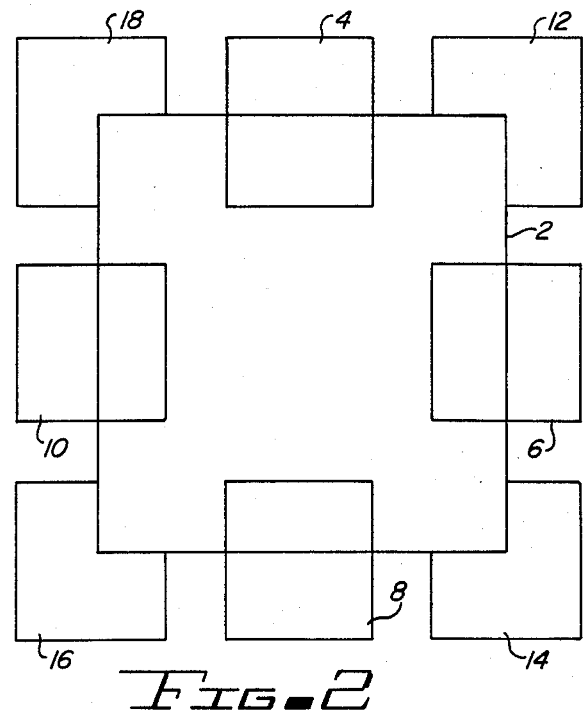
FIG. 2 illustrates an alternate pattern of windows.

FIG. 2 illustrates the same semiconductor die 2 which is analyzed using the top, right, bottom and left windows 4, 6, 8, and 10, respectively, shown in FIG. 1 plus additional regions of analysis corresponding to an upper right-hand corner region 12, a lower right-hand corner region 14, a lower left-hand corner region 16 and an upper left-hand corner region 18.

Figure 3:
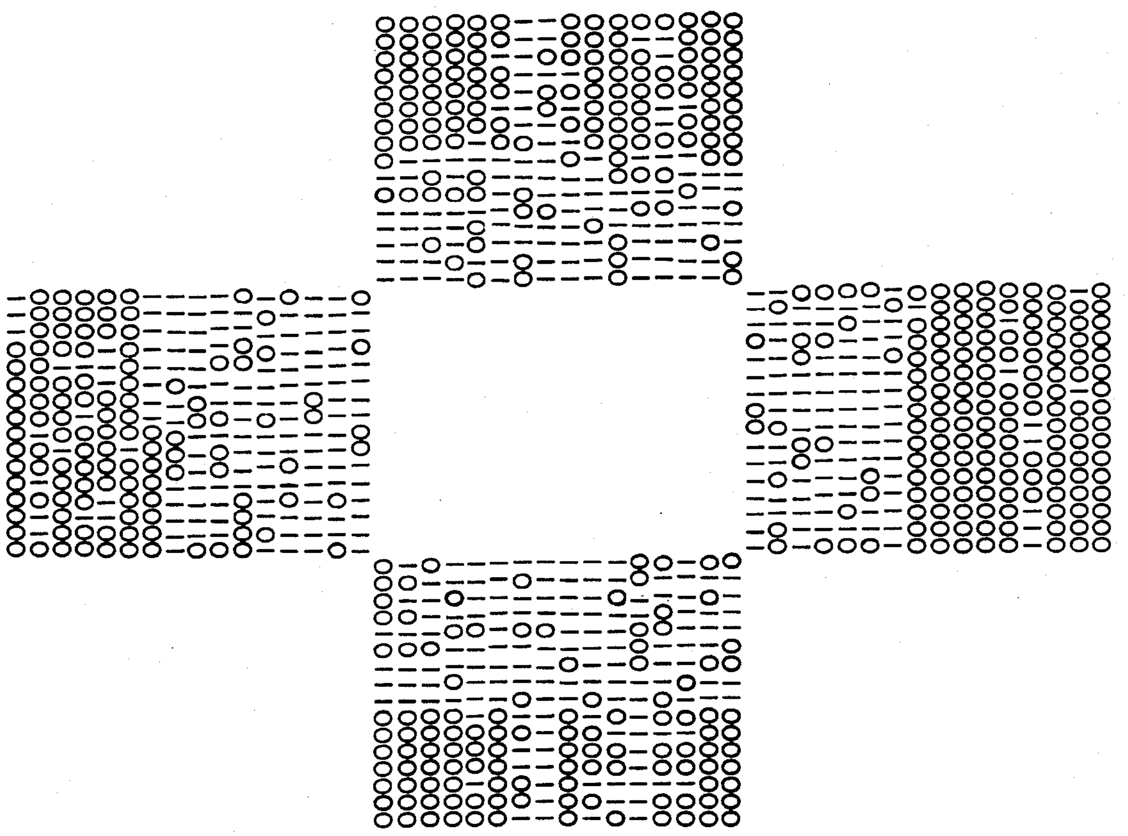
FIG. 3 illustrates data generated from the scanned and digitized windows.

Referring again to FIG. 1, each of the windows are scanned and digitized in order to generate data corresponding to light and dark spaces on the chip. The data is converted to digital form and may appear as is shown in FIG. 3 wherein the upper group of data corresponds to window 4, the right-hand group of data corresponds to window 6, the lower group of data corresponds to window 8 and the leftmost group of data corresponds to window 10. This data is then used to locate the die edge (or streets).

Figure 4:
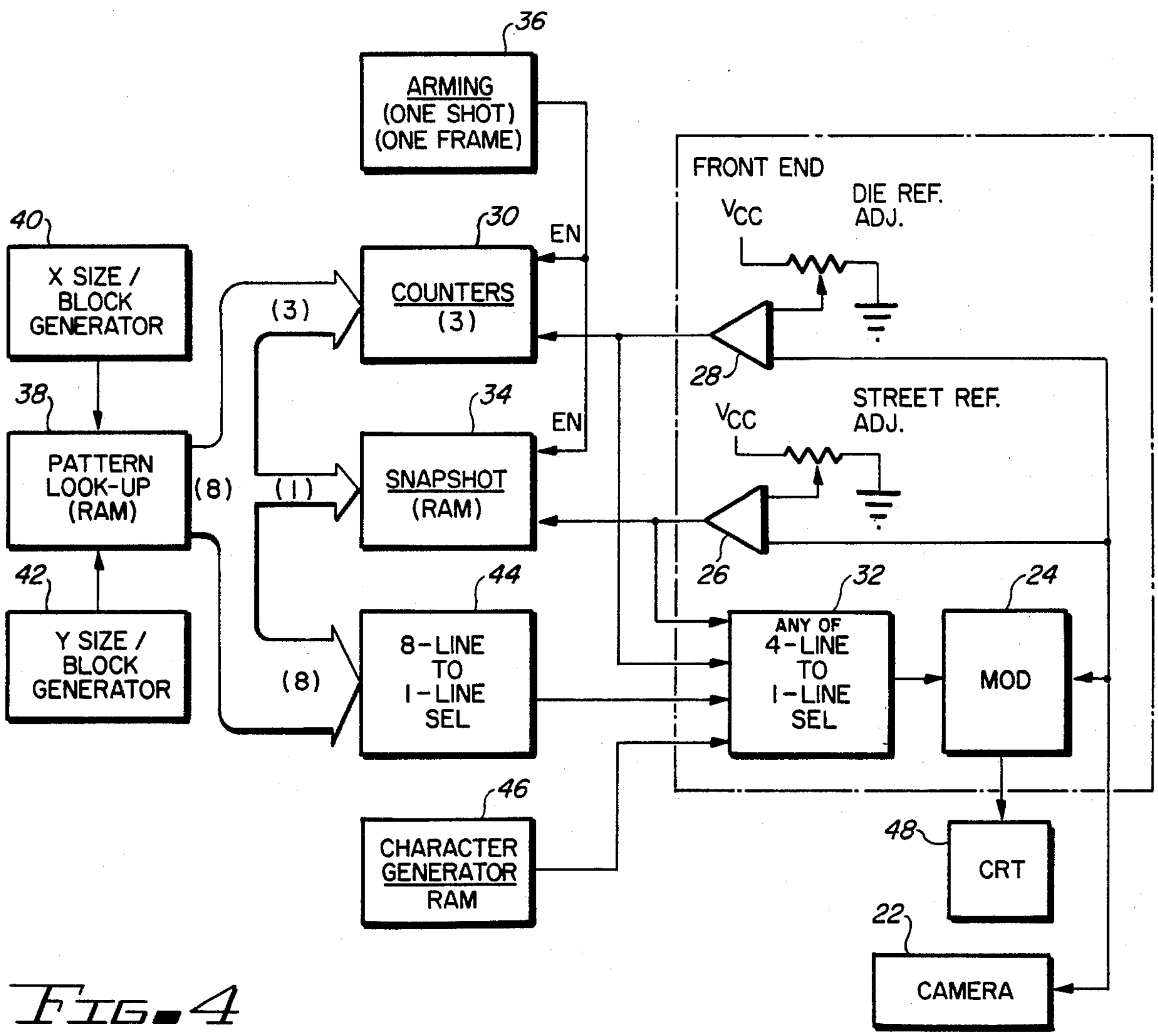
FIG. 4 is a block diagram of a video interface structure to couple a video camera to a software or hardware unit.

FIG. 4 is a block diagram of a video interface structure necessary for carrying out the inventive scanning process. As can be seen, a video camera 22 has an output coupled to a modulator 24 and to a first input of a street comparator 26 and a die comparator 28. A second input of the street comparator 26 is coupled to a street reference adjust mechanism which is adjusted so that a maximum of white dots are detected leaving the streets or scribe areas black. This is to be done so as to enable the edges to be seen by the MPU thru the SNAPSHOT RAM circuit 34. A second input of the die comparator 28 is coupled to a die reference adjust mechanism which will pass data corresponding to ink dots and scratches as black and ignore the streets. These adjustments are significant because these references are used by a central processing unit check to see if the die is acceptable. The output of the die comparator 28 is coupled to one input of a COUNTER block 30 and to a first input of an any of four-to-one select block 32. The output of the street comparator 26 is coupled to a first input of the SNAPSHOT RAM circuit 34 and to a second input of the any of four-to-one select block 32. An ARMING unit 36 generates an ENABLE signal which is applied to a second input of the COUNTER block 30 and to a second input of the SNAPSOT RAM circuitry 34. A PATTERN LOOK-UP RAM circuit 38 has a first input coupled to a X-SIZE block generator 40 and a second input coupled to a Y-SIZE block generator 42. The output of the PATTERN LOOK-UP RAM circuit 38 is coupled to the COUNTER block 30, the SNAPSHOT RAM circuit 34, and to an eight-to-one select block 44 as shown. An output of the eight-to-one select block 44 is coupled to a third input of the any of four-to-one select block 32. A fourth input of the any of four-to-one select block 32 corresponds to an output of a CHARACTER GENERATOR RAM circuit 46. An output of the any of four-to-one select block 32 is coupled to a second input modulator 24 an output of which is applied to a CRT 48.

The any of four-to-one select block 42 permits the visual display of certain data. The street reference comparator 26, in effect, acts as an edge detector which is used with the window patterns 12, 14, 16 and 18 and the SNAPSHOT RAM circuit 34 for centering or alignment of the die. Finally, the die reference comparator 28 is used to detect defects in the die. The output of the street comparator, die comparator, eight-to-one pattern select block or the character generator may be displayed on CRT 48 as white dots.

Figure 5:
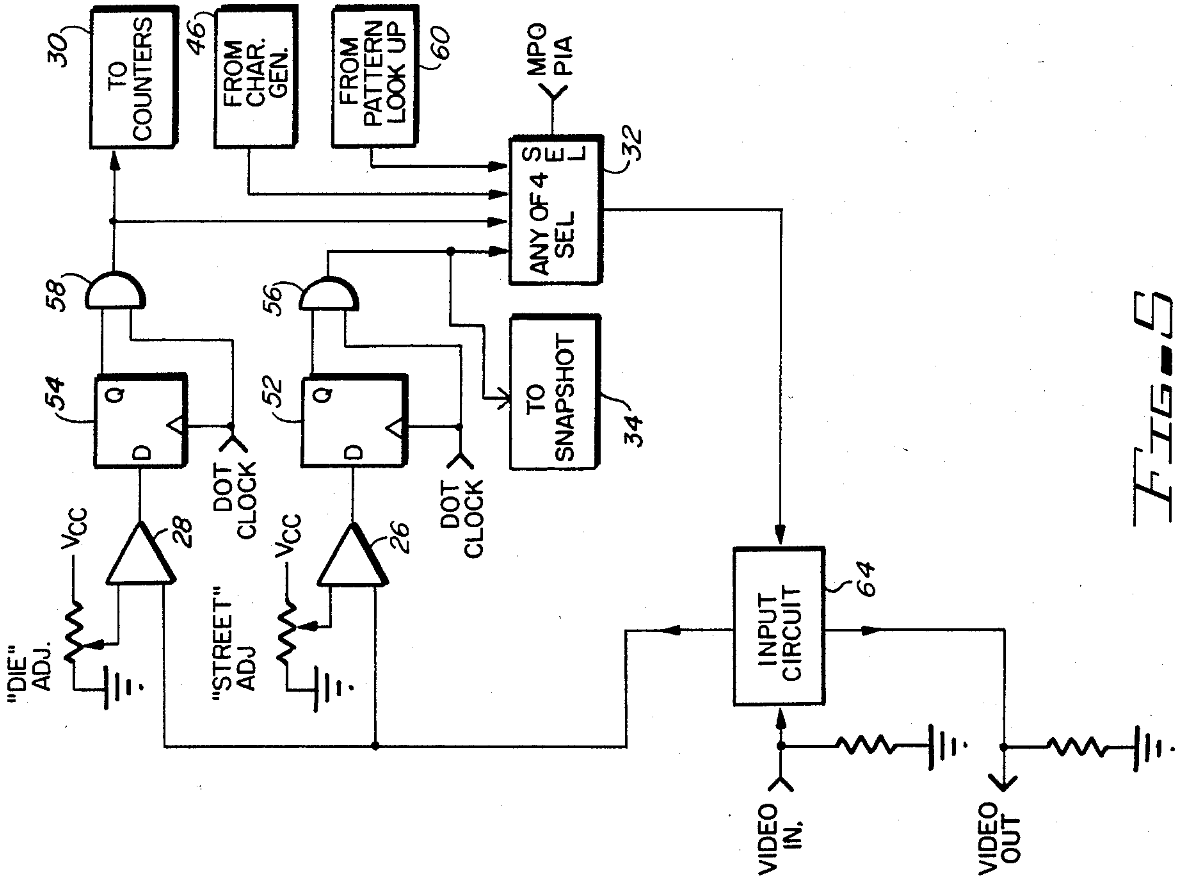
FIG. 5 is a block diagram of the FRONT END shown in FIG. 4.

FIG. 5 is a block diagram illustrating, in greater detail, that portion of the system shown in FIG. 4 and labeled FRONT END. A VIDEO IN signal is amplified, and clamped by input circuit 64, and then applied to the street and die comparators 26 and 28, respectively. The output of the comparators 26 and 28 are applied to the D inputs of flip flops 52 and 54, respectively, each having a Q output applied to one input of NAND gates 56 and 58, respectively. The second input of NAND gates 56 and 58 are coupled to a clock pulse applied through the flip flops 52 and 54. The multiple select 32 selects any combination of the output of NAND gate 58, NAND gate 56, character generator 46, and of pattern generator 60 for transmission, under the control of a select signal from the MPU peripheral interface adapter, as a VIDEO OUT signal. Comparators 26 and 28 may be of a type commercially available from Motorola, Inc. and bearing part No. MC3432.

Figure 6:
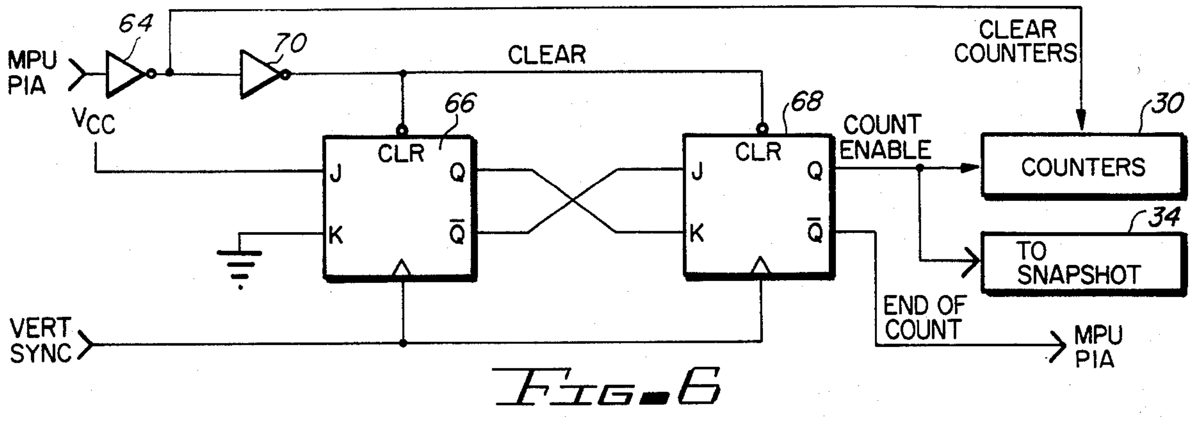
FIG. 6 illustrates the contents of the ARMING block shown in FIG. 4.

FIG. 6 illustrates, in more detail, contents of the ARMING block 36 shown in FIG. 4. As can be seen, a START-OF-COUNT signal from the MPU peripheral interface adapters is applied to the input of a series of two inverters 64 and 70. The output of inverter 70 represents a CLEAR signal to JK flip flops 66 and 68. The J input of flip flop 66 is tied to a positive source of supply voltage Vcc while the K input is grounded. The Q output of flip flop 66 is coupled to the K input of flip flop 68, while the Q output of flip flop 66 is coupled to the J input of flip/flop 68. Both flip flops 66 and 68 have their clock inputs coupled to a vertical pulse, VERT. The output of inverter 64 also represents a CLEAR COUNTERS signal for clearing COUNTER block 30. The Q output of flip flop 68 represents a COUNT ENABLE signal which is applied to both the COUNTER block 30 and the SNAPSHOT RAM 34. The Q output of flip flop 68 represents an END-OF-COUNT signal which is forwarded to the MPU. The ARMING circuit 36 represents synchronous one shot which generates an enabled signal for loading the SNAPSHOT RAM circuit 34 and the COUNTER block 30. Clearing the flip/-flops also clears the COUNTER block 30. Releasing the clear will allow the next vertical SYNC pulse to enable the SNAPSHOT RAM and COUNTER circuits. THe second vertical SYNC pulse will turn off the enable and set a flag in the peripheral interface adapter to signal the MPU that it can go in and look at digitized data stored in the SNAPSHOT RAM 34. This accomplishes a comparison between the acceptable data in the memory of the CPU and the digitized data in the SNAPSHOT RAM circuit 34 to define the edges of a die.

Figure 7:
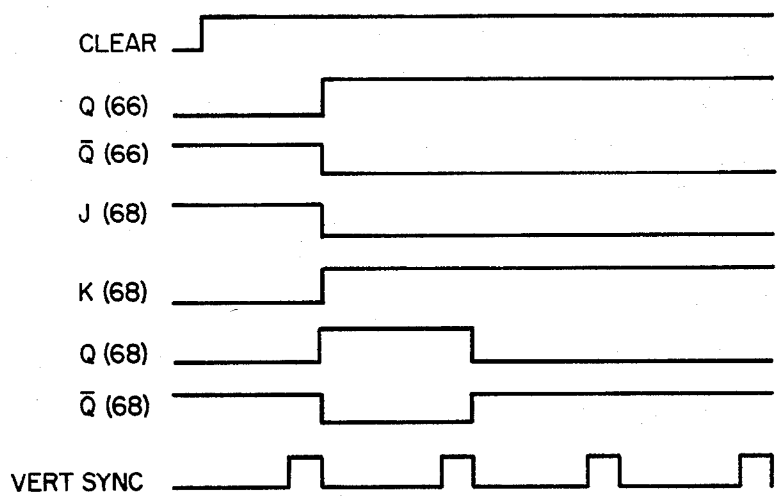
FIG. 7 is a timing diagram illustrating the operation of the circuitry shown in FIG. 6.

FIG. 7 is a timing diagram illustrating the operation of the circuitry shown in FIG. 6. The first line represents a CLEAR pulse while the last line represents the vertical SYNC pulses. The second and third lines represents the Q and $\overline{Q}$ outputs of flip flop 66, while the sixth and seventh lines indicate the Q and $\overline{Q}$ outputs of flip flop 68. The fourth and fifth lines represent the J and K inputs of flip flops 68.

Figure 8:
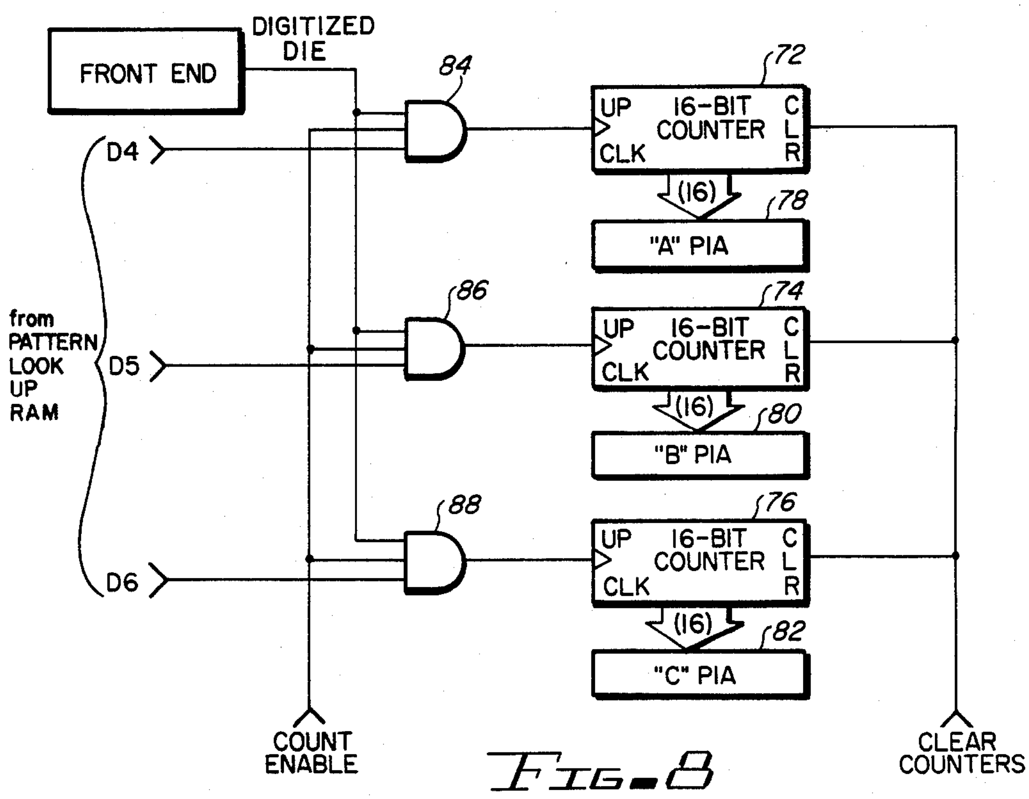
FIG. 8 illustrates in detail the COUNTER block shown in FIG. 4.

FIG. 8 is a block diagram illustrating, in greater detail, the COUNTER block 30 shown in FIG. 4. Three 16-bit counters 72, 74, and 76 feed, respectively, peripheral interface adapters 78, 80, and 82. The CLEAR COUNTERS signal from the ARMING circuit 46 is applied to the clear input of each of the counters. Each of the counters 72, 74, and 76 have an up clock input which is coupled, respectively, to the output of AND gates 84, 86, and 88. A COUNT ENABLE signal from the ARMING circuit is applied to the first input of each of the AND gates. The digitized signal from the FRONT END, which corresponds to the output of the DIE comparator 28 shown in FIG. 4, is applied to the second input of each of the AND gates. The third inputs of AND gates 84, 86, and 88 are coupled, respectively, to data signals D4, D5, and D6 from PATTERN LOOK-UP RAM 38 (FIG. 4). Each of the counters are cleared when the ARMING circuit is set up to be triggered. When the COUNT ENABLE signal from the ARMING circuit and a pattern bit (N) are true, the counter will count the number of "white" dots from the digitized "DIE" signal in the pattern for one frame. At the end of that frame, the counters are disabled. The signal from the FRONT END applied to inputs of AND gates 84, 86, and 88 corresponds to the digitized die and comprises all logical ones or zeros.

Figure 9:
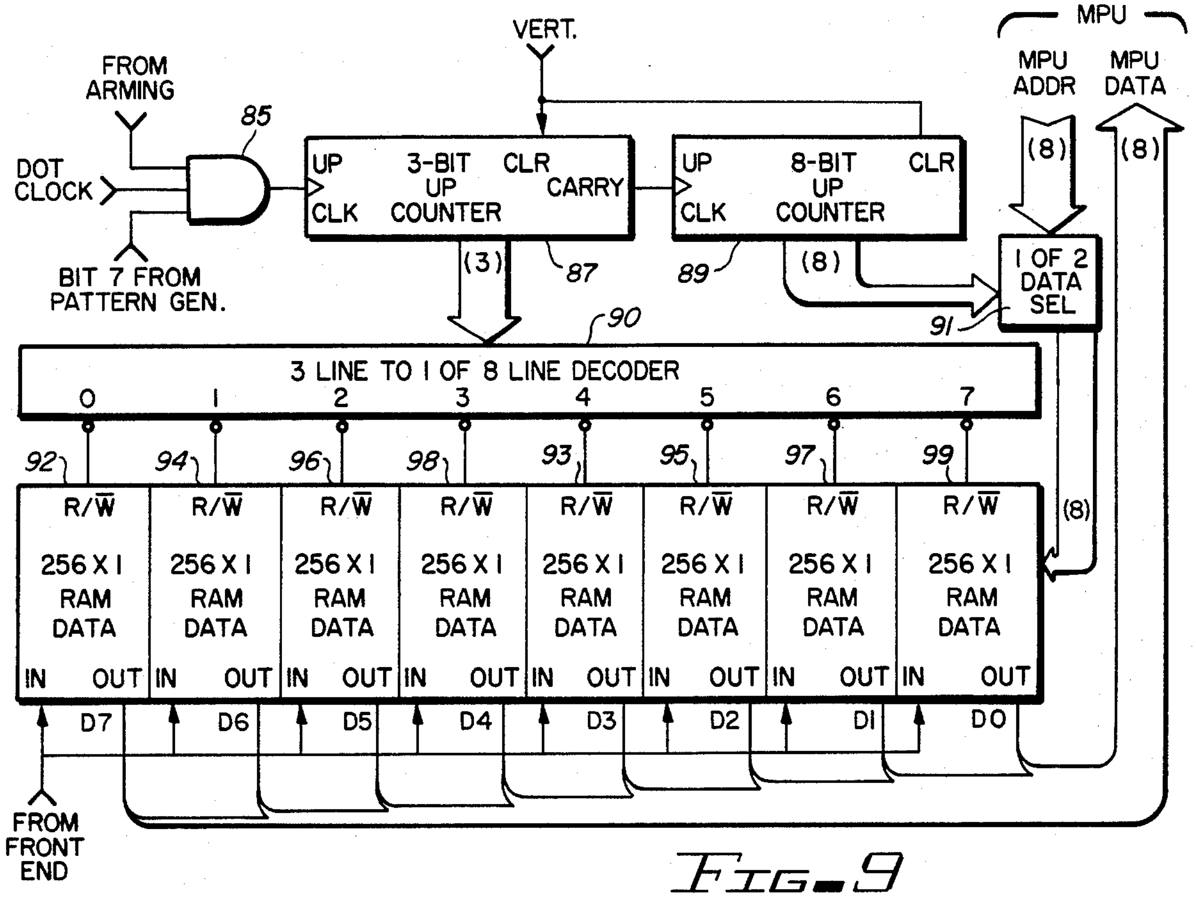
FIG. 9 is a more detailed diagram of the SNAPSHOT RAM circuit shown in FIG. 4.

FIG. 9 is a more detailed block diagram of the SNAPSHOT RAM circuit 34 shown in FIG. 6. As can be seen, a three-to-one of eight line decoder has outputs coupled to a plurality of 256×1 RAMS 92 through 99. The outputs of the three-to-one of eight line decoder 90 are coupled to the R/$\overline{W}$ inputs of the RAMS. Each of the RAMS receives digitized data from the front end and transmits data bits D0, D1, D2, D3, D4, D5, D6, and D7 to the MPU. Bit 7 from the pattern generator, an ENABLE signal from the ARMING circuit and a DOT clock are applied to first, second and third inputs of AND gate 85 which, in turn, has an output coupled to the up clock input of a 3-bit up counter 87. Counter 87 has a carry output which is coupled to the up clock input of an 8-bit up counter 89. Both counters 87 and 89 are coupled to be cleared by the vertical SYNC pulse $\overline{\text{VERT}}$. A three line output from counter 87 is applied to the input of the three-to-one of eight line decoder 90. The output of 8-bit up counter 89 is applied to a first input of one-of-two data select 91, the second input of which is buffered and coupled to an address line from the MPU. The output of one-of-two data select 85 is applied as an eight line address to the input of RAMS 92, 94, 96, 98, 99, 97, 95, and 93.

As stated previously, the vertical SYNC pulse $\overline{\text{VERT}}$ will clear the three-bit up counters 89 and 87. When the ARMING circuit has been triggered, the ENABLE signal will cause the SNAPSHOT RAM 34 to load. When enabled, the DOT clock and bit 7 from the pattern generator are high, the 3-bit counter increments and writes 1 bit of video into snapshot memory. When 8 bits have been written, the carry increment will increment the up counter by one and allow the next 8 bits to be written. So when bit 7 of the pattern generator is on (a logical one), a video "street" is gated into the snapshot. This permits the MPU to see a part of the picture and check if the pattern is in a street or not.

Figure 10:
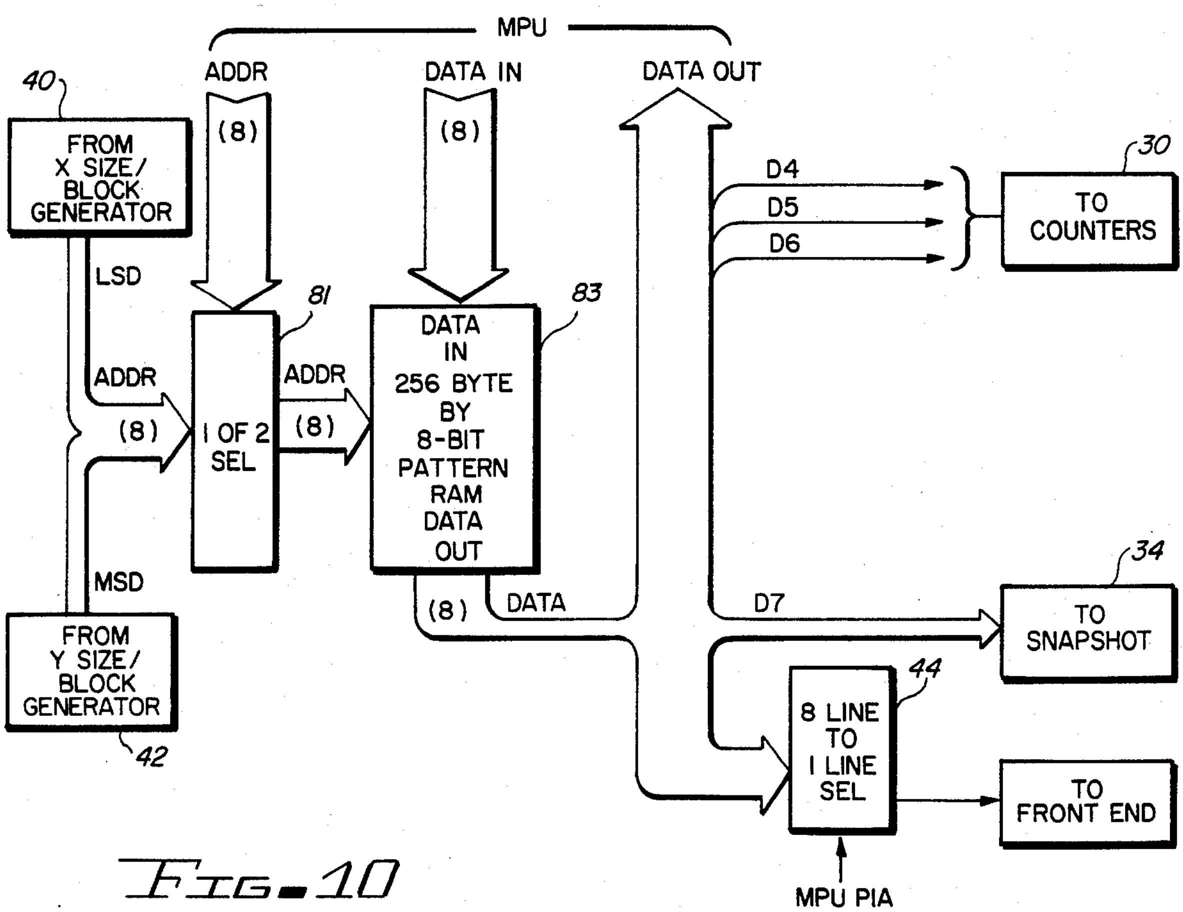
FIG. 10 illustrates the PATTERN LOOK UP RAM circuit of FIG. 4 in greater detail.

The PATTERN LOOK-UP RAM 38 of FIG. 4 is shown in more detail in FIG. 10. A 4-bit address from the X-SIZE block generator 40 and a 4-bit address from the Y-SIZE block generator 42 form an 8-bit address which is applied to a one-of-two select which also has an 8-bit address from the MPU applied thereto. The output of select 81 is an eight-line address which is applied to a 256 byte by 8-bit pattern RAM 83. Eight data lines from the MPU are applied to data inputs of RAM 83, and eight data lines are output lines from the RAM 83. Of these, D4, D5, and D6 are applied to COUNTER block 30 (as shown in FIG. 8), D7 is applied to the SNAPSHOT RAM 34 (as shown in FIG. 9), and eight lines are applied to the eight-to-one line select 44 whose output is coupled to the FRONT END as shown in FIG. 4.

As can be seen, data from the X block 40 and the Y block 42 are combined to form an address, or an X-Y position, starting at the top left corner of the CRT. The X block is the least significant digit and the Y block is the most significant digit of a hex address. There is a maximum of 256 blocks on the CRT. The data (8 bits) at a given address or X-Y position in the PATTERN LOOK-UP RAM 38 will determine eight patterns, one pattern per bit. A logical zero means pattern off and a logical one means pattern on. These bits or patterns are used to gate or enable the COUNTER block 30 and the SNAPSHOT RAM 34. Any of the patterns can be selected to be displayed on the CRT. By adjusting the X block 0 to a larger size (i.e. more dots), blocks 1, 2, 3, etc. will be pushed over by the same number of dots. Adding more dots to X block 0 will move the pattern to the right without changing its size or shape.

Figure 11:
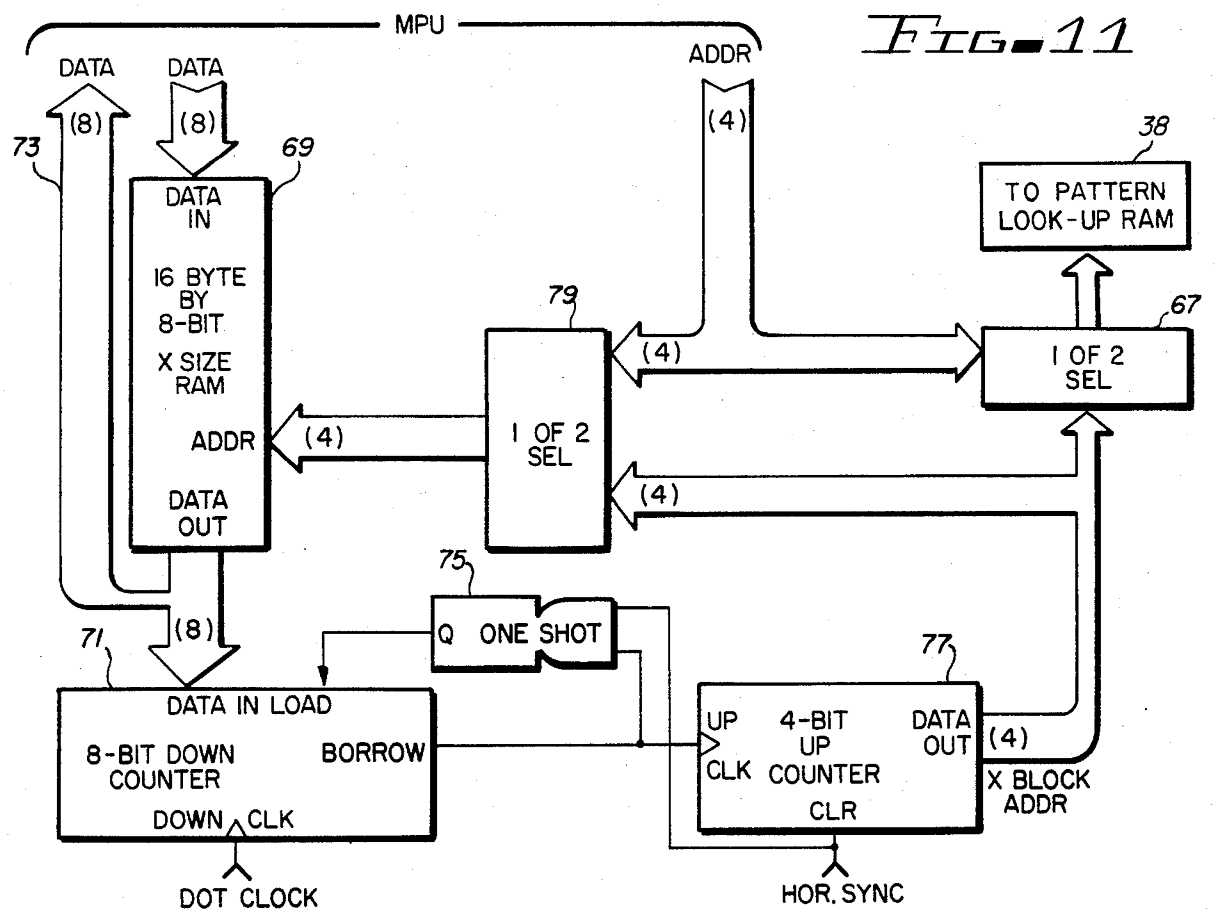
FIG. 11 illustrates the X-SIZE BLOCK GENERATOR shown in FIG. 4.

FIG. 11 is a more detailed diagram of the X-SIZE block generator 40 shown in FIG. 4. The 8-line data from the MPU is supplied to an X-SIZE RAM 69 whose "data out" is applied to the "data in" input of an 8-bit down counter 71. A 6.6 megacycle dot clock is applied to the down clock input of counter 71. The output terminals of the X-SIZE RAM 69 is also applied back to the MPU via data lines 73. Down counter 71 is loaded as a result of a one shot 75 which has a first input coupled to a horizontal SYNC pulse and a second input to the borrow output of counter 71. The borrow output of counter 71 and horizontal SYNC pulse are also applied to the up clock and clear inputs of a 4-bit up counter 77, the output of which corresponds to the X block address which is applied to one-of-two select 79 and to the one-of-two select 67. The one-of-two selects 67 and 79 also receive a four-line address from the MPU. The output of the one-of-two select 79 is applied back to X-SIZE RAM 69. The output of the one-of-two select 67 is applied to the PATTERN LOOK-UP RAM 38.

As stated previously, the horizontal SYNC pulse goes to the 4-bit up counter 77 and to the one shot 75. The up counter 77 is cleared and its data is routed through the one-of-two select 79 into the address of the X-SIZE RAM 69. The data from the X-SIZE RAM 69 is loaded into 8-bit counter 71 because the one shot 75 has not yet timed out. When the one shot times out, the dot clock counts down the number that was loaded into down counter 71. After the 8-bit down counter 71 counts to zero, a borrow pulse fires one shot 75 which loads the 8-bit counter 71 at a new address because the 4-bit counter 77 has been incremented by one.

Thus, each block size is determined by the X-SIZE RAM 69 which will define a number of dots (or vertical lines) in a block before going onto the next block. Each horizontal line is, therefore, chopped into a maximum of 16 blocks (the size of the X-SIZE RAM 69). Each block (or address) is programmable in size prior to the horizontal SYNC signal resetting the 4-bit counter 77 back to zero, corresponding to the left side of the CRT.

Figure 12:
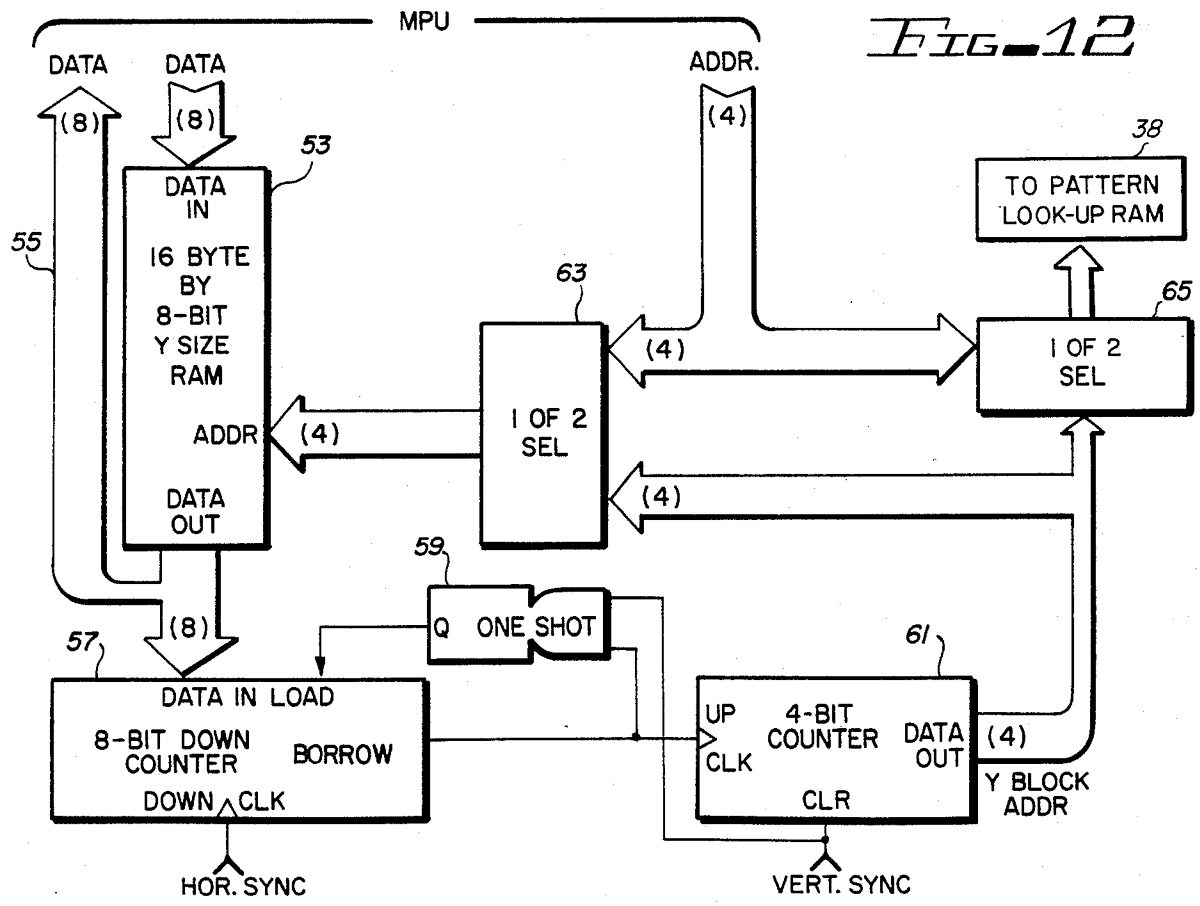
FIG. 12 is a block diagram of the Y-SIZE BLOCK GENERATOR shown in FIG. 4.

FIG. 12 is a block diagram of the Y-SIZE block generator 42 shown in FIG. 4. It is very similar to the X-SIZE block generator in that data from the microprocessor is applied to the data input of a Y-SIZE RAM 53. Data from the Y-SIZE RAM 53 is applied back to the MPU over line 55 and to the "data in" input of an 8 bit counter 57 which is clocked by a horizontal SYNC pulse and which is loaded by the output of a one shot 59. The output of down counter 57 triggers the one shot 59 and increments a 4-bit up counter 61. The vertical SYNC pulse is applied to the one shot 59 and utilized to clear the 4-bit up counter 61. Data from the 4-bit up counter 61 is applied to the inputs of one-of-two select 63 and one-of-two select 65. A 4-line address from the MPU is also applied to the selects 63 and 65. The output of the one-of-two select 63 is applied to the address input of Y-SIZE RAM 53. The output of the one-of-two select 65 is applied to the PATTERN LOOK-UP RAM 38.

The Y-SIZE block generator works in the same way as the X-SIZE block generator except for the fact that the 8-bit counter 57 counts lines (horizontal) and the Y block 4-bit counter 61 is reset by the vertical SYNC pulse. This will chop the vertical frame into a maximum of 16 blocks. Each block (or address) is programmable in size (the number of horizontal lines in each block) prior to the vertical SYNC reseting the Y block 4-bit counter 61 back to zero, corresponding to the top of the CRT.

Figure 13:
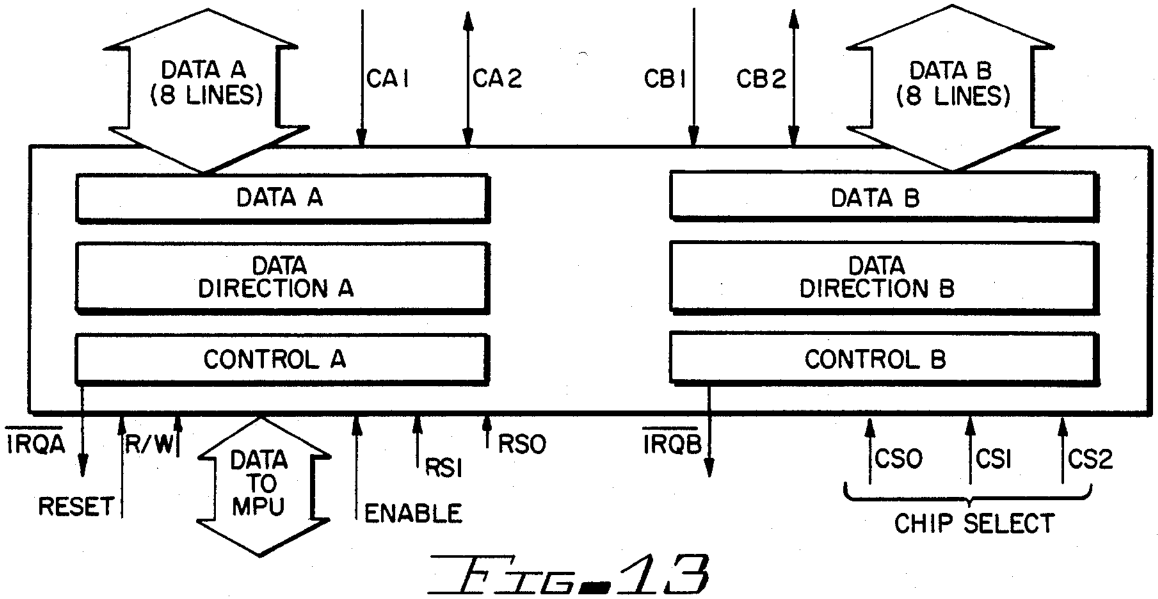
FIG. 13 is a block diagram of the peripheral interface adaptor.
Figure 16:
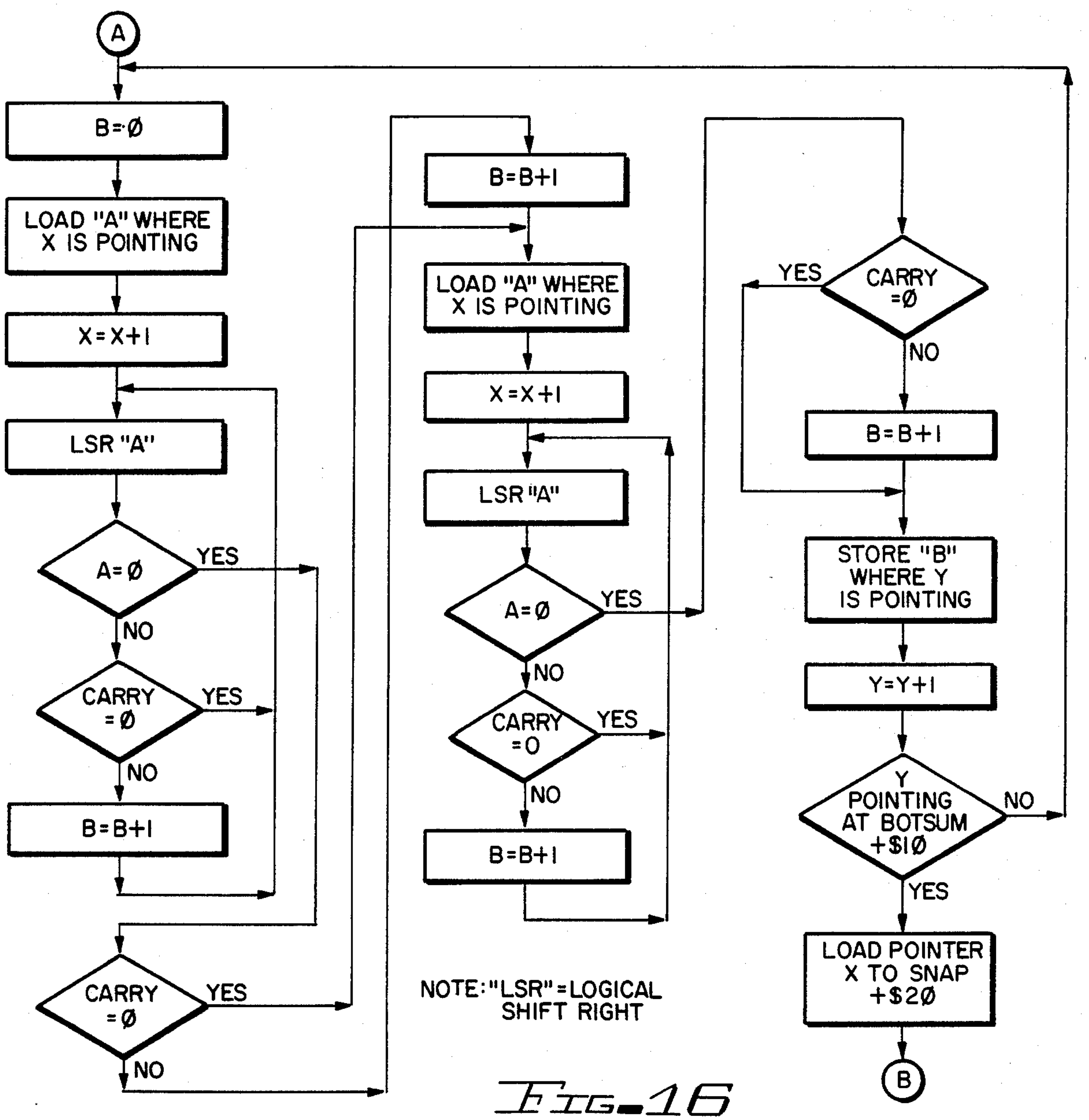
FIGS. 15–19 are a flow chart of the CRUNCH subroutine.

A peripheral interface adapter (PIA) shown in FIG. 13 is an input/output (I/O) device (MC6821) which is used to interface peripheral equipment with a microprocessor unit (MPU). The PIA communicates with the MPU by means of eight-bit bi-directional peripheral data busses, three chip selects, two register selects, two interrupt request lines, one read/write line, an enable line and a reset line. Both data A and data B may be programmed to act as input or output data lines. Each PIA contains two control registers, two data direction registers, and two peripheral interface registers. The control and data direction registers are used to control the data in and out of the PIA.

Figure 14:
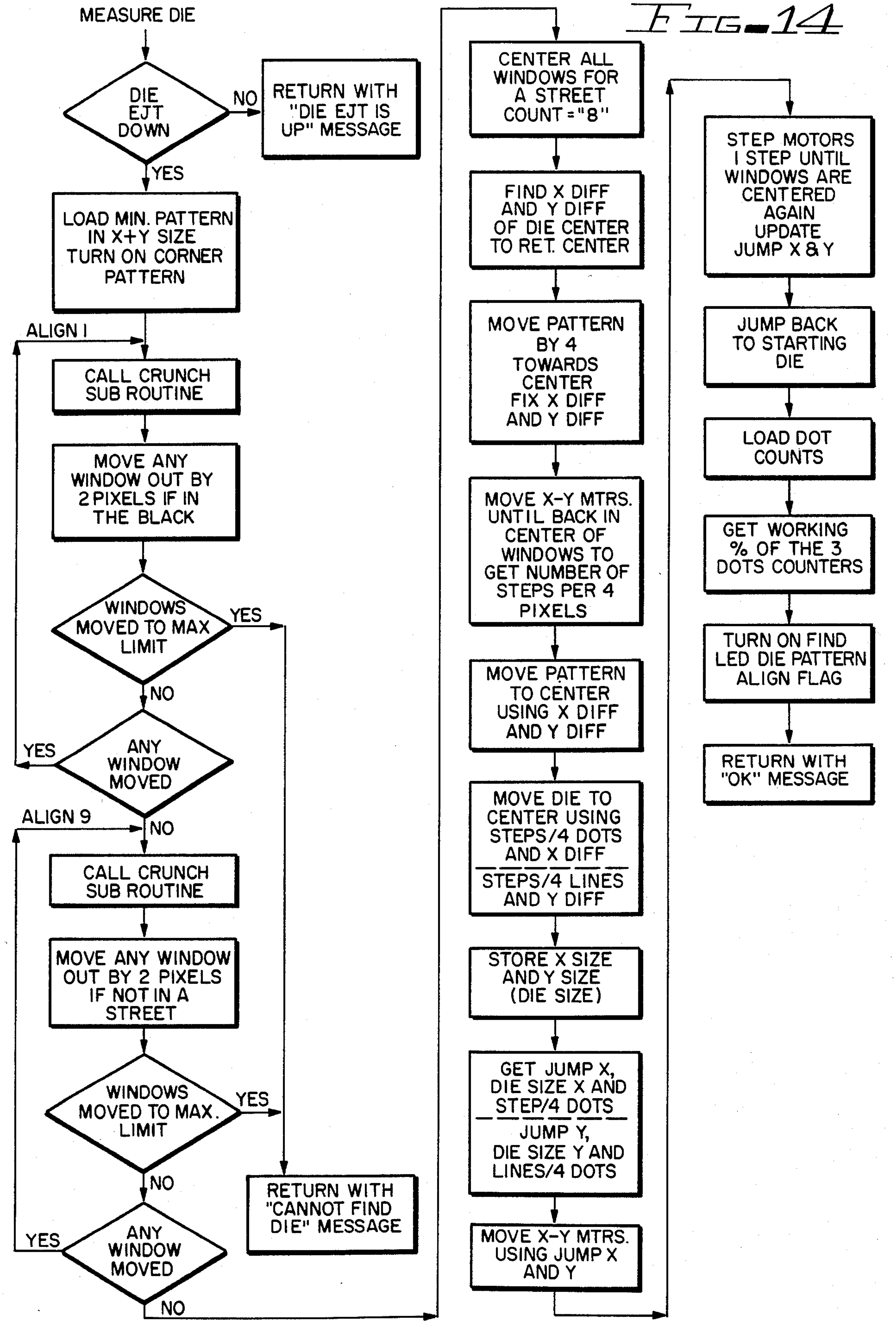
FIG. 14 is a flow chart of the MEASURE DIE process.
Figure 15A:
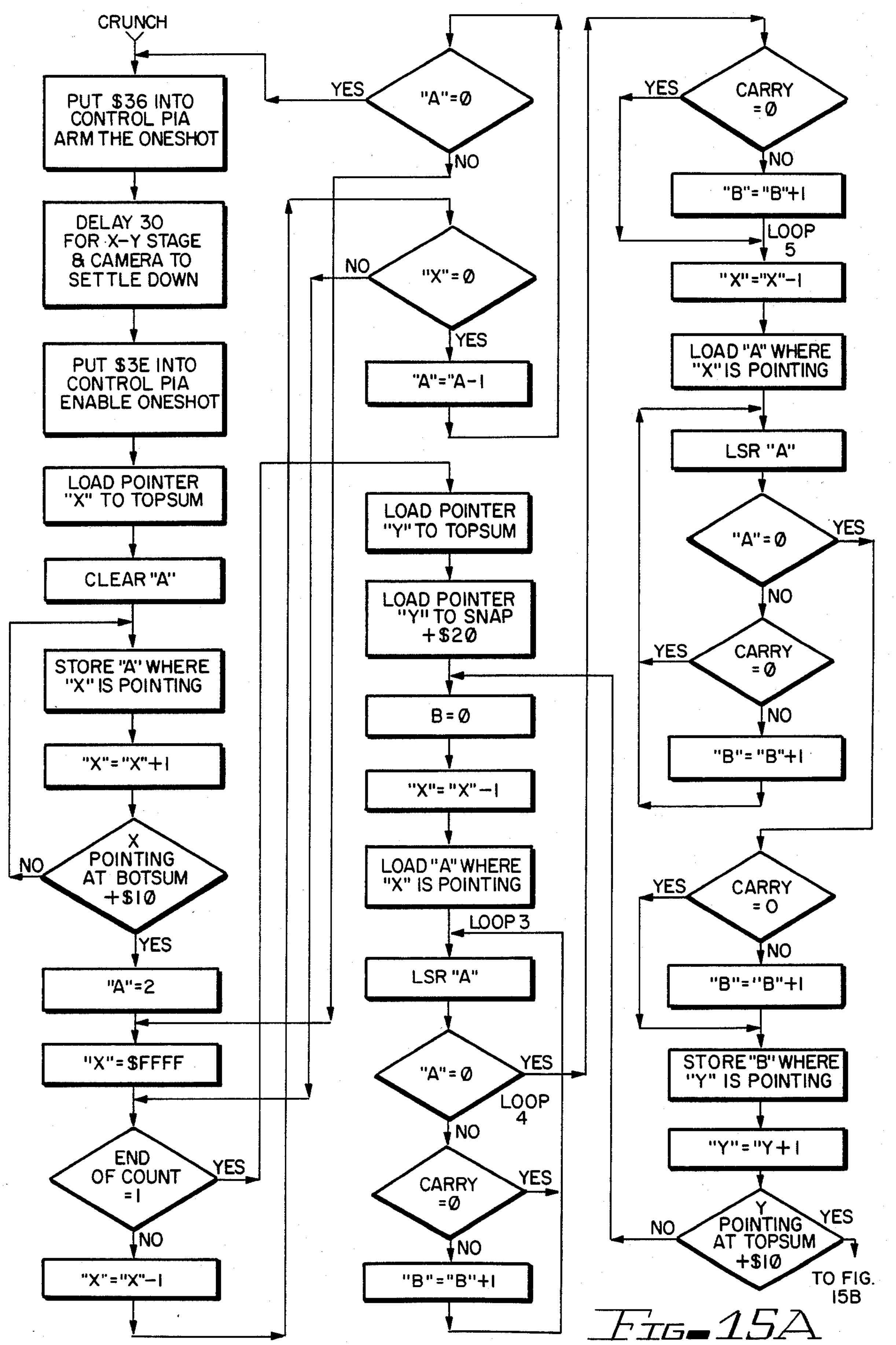
Figure 15B:
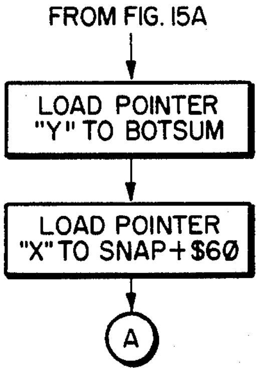
Figure 17A:
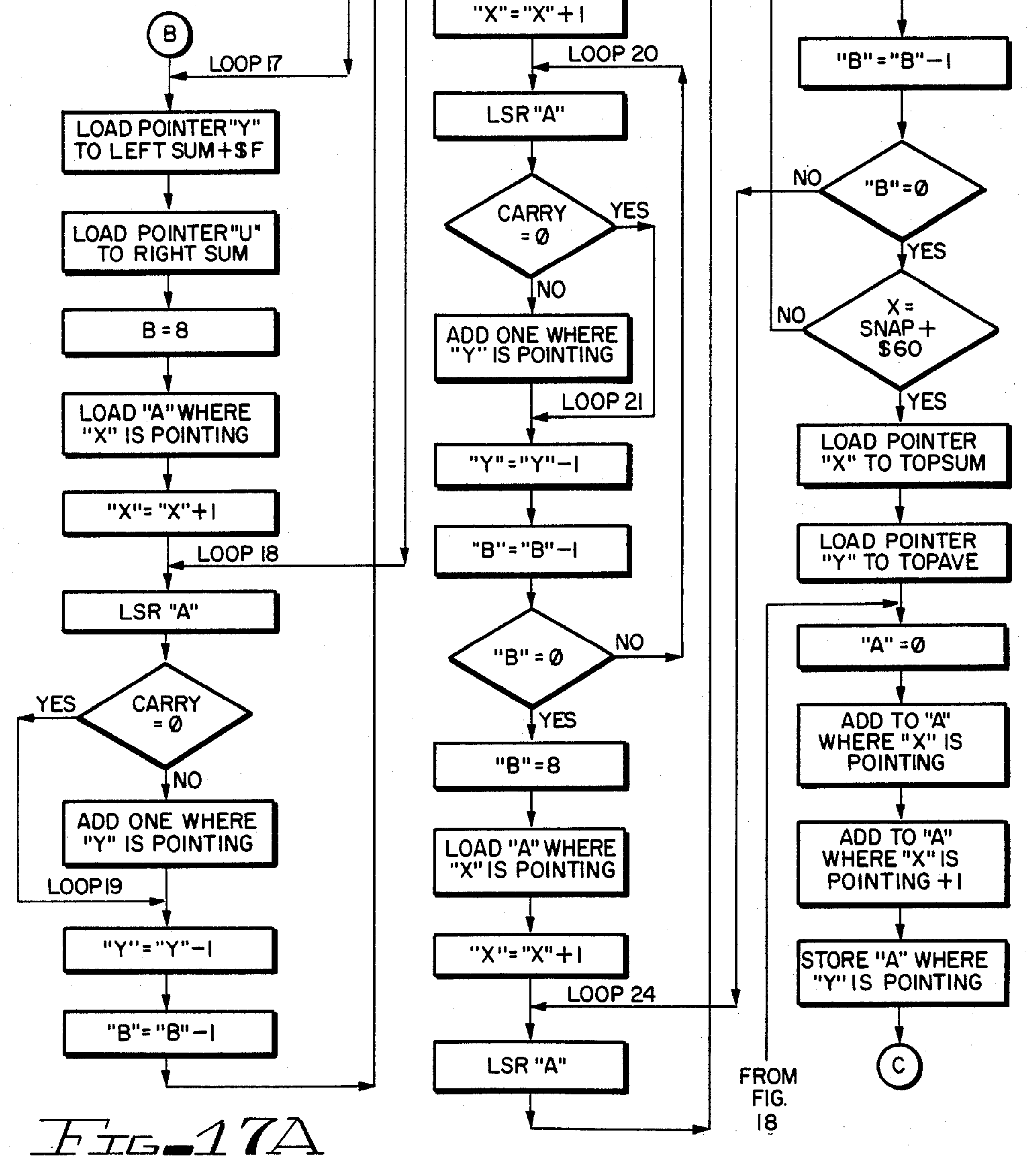
Figure 18:
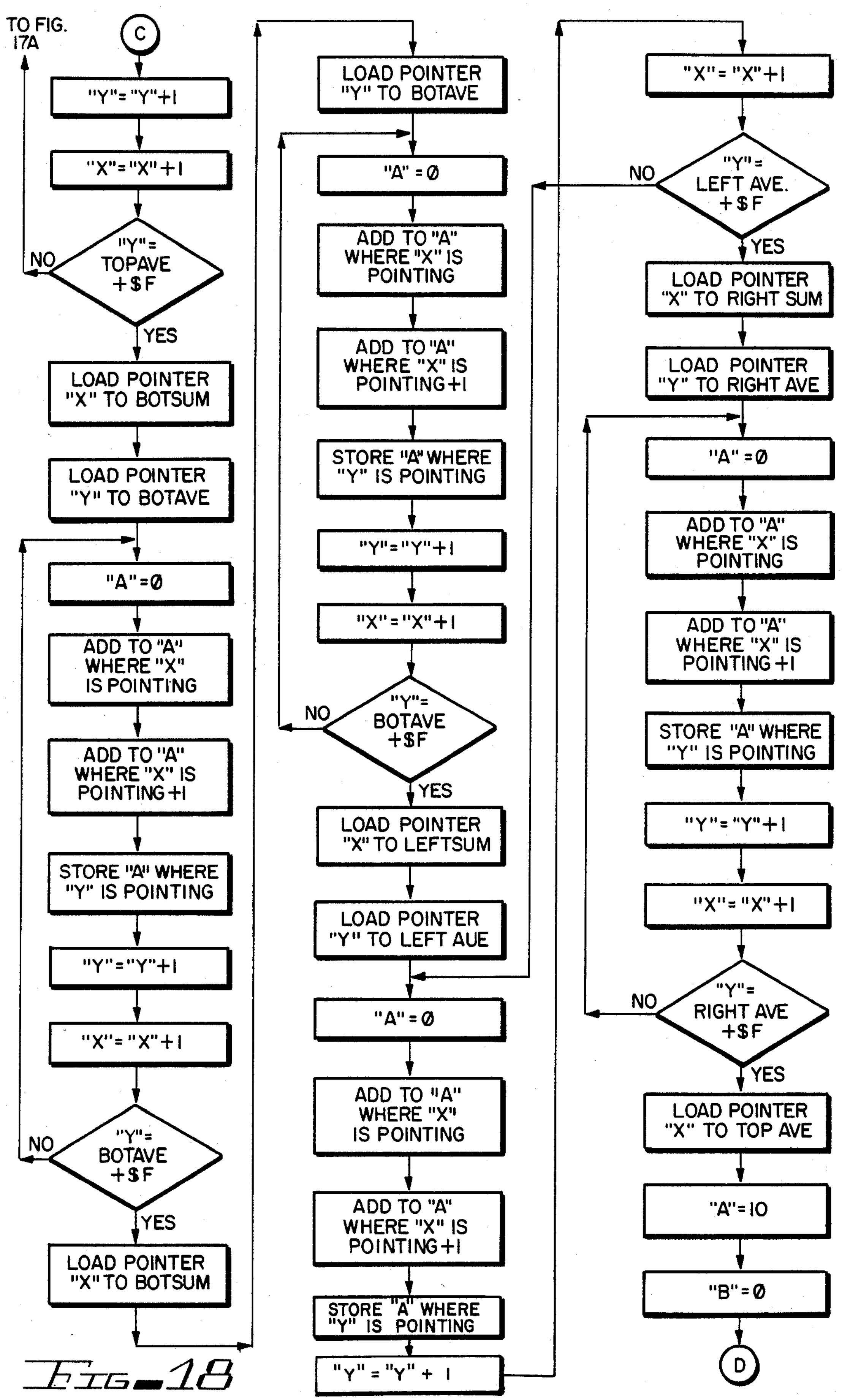
Figure 19:
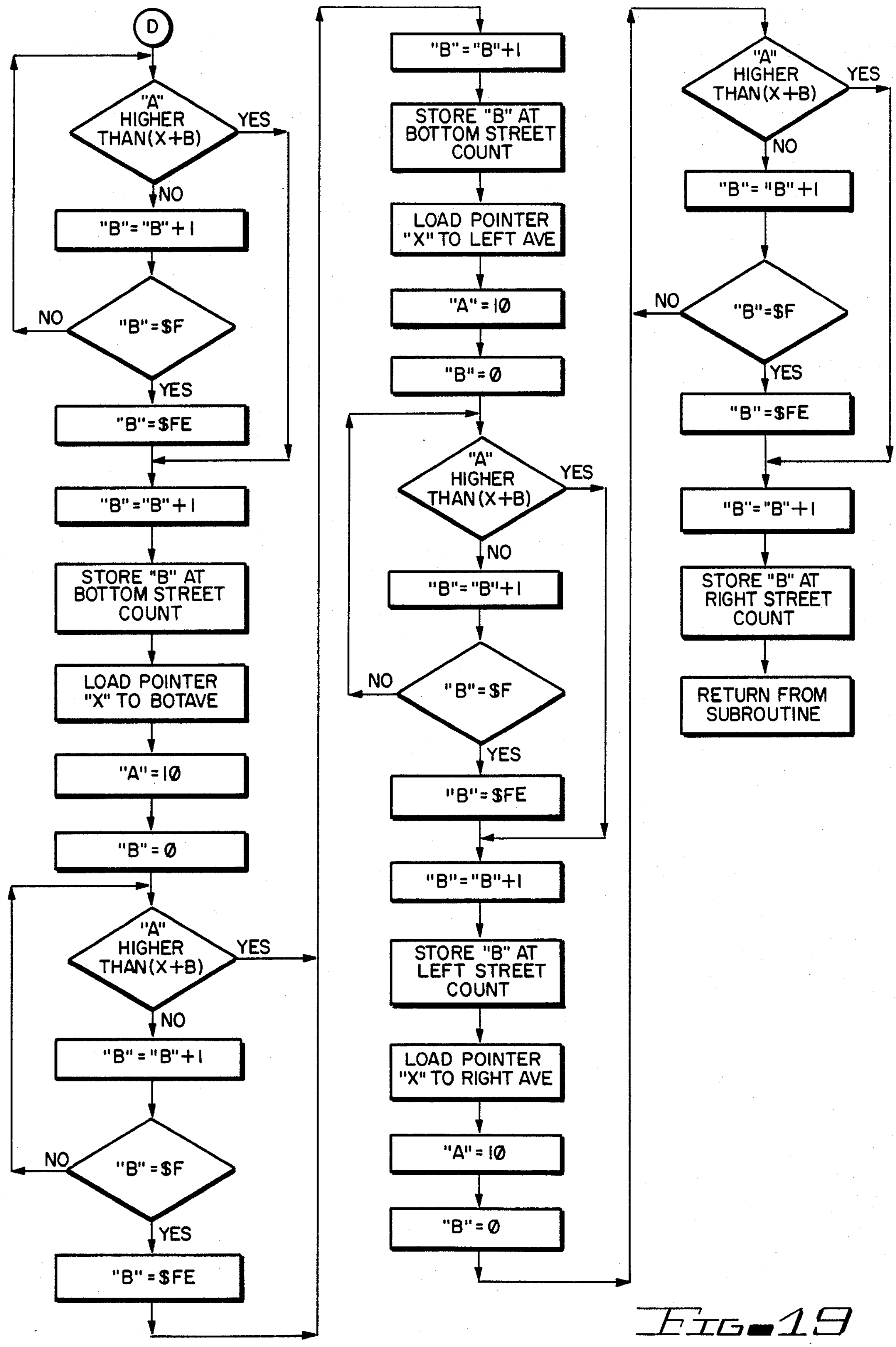

To measure a die, an operator moves an X-Y stage to find a good die more or less centered to the corner pattern described previously. With the "street adj" and the "die adj" adjusted, the operator goes into a "MEASURE DIE" mode. This subroutine is described by the flow chart shown in FIGS. 14. A subroutine referred to as "CRUNCH", shown in FIGS. 15A through 19, performs the following. The MPU outputs a low to the "START OF COUNT" in the ARMING circuit 36 which gets the one shot ready and clears the COUNTER block 30. The SNAPSHOT RAM 34 and the COUNTER block 30 are then loaded. Assume that a "0" is black and a "1" is white. Starting at the bottom horizontal line of the top window 4, the number of 1's is summed and stored in the TOPSUM+0 table. This process continues towards the top of the window line by line with the results being stored in TOPSUM+1, TOPSUM+2, etc. The same process is performed with respect to the bottom window 8 except that the process starts at the top horizontal line of the bottom window and the sums are stored in the BOTSUM table. The left and right windows 10 and 6, respectively, are rotated 90 degrees, the number of 1's in each vertical line is counted, and the results stored in LEFTSUM and RIGHTSUM, respectively. Next, a sliding average is done on the four sum tables top, bottom, left and right. If an average count of less than a first predetermined number is found, it represents a street, and the number of rows (into sum tables TOPSUM and LEFTSUM) and number of columns (into sum tables LEFTSUM and RIGHTSUM) is stored into a "street count" table. If the average count is greater than the predetermined number, a negative number is stored meaning that the window is in the white (a die) and no edge has been found. There are four street count tables; i.e. top street count (TOPSTC), bottom street count (BOTSTC), left street count (LFTSK), and right street, count (RHTSTC). The "MEASURE DIE" and "CRUNCH" subroutines are included in the source code listing shown in Appendix A.

APPENDIX A

Title

Semiconductor Testing And Apparatus Therefor

Inventors

Laurence L. Allred, Jr.

Bradley N. Lange

Advanced Semiconductor Materials Die Bonding, Inc.

```
                         **************************************************
                         *  COPYRIGHT BY ASM DIE BONDING INC.   1982
                         *     SOFTWARE FOR THE D2KH DIE BONDER
                         *             EQUD2K REV.  2.0A
                         *
                         *  DISK ID          : VIDEO 1
                         *  DATE             :
                         *  DWG NO           .
                         *  ASSM NUMBER      .
                         *  EPROM ID TAG     .
                         *  ORGINATOR        :
                         *  REVISED          .
                         **************************************************
                         *
                                  TTL    EQU'S FOR THE D2KH.
                                  OPT    MEX
                         *
6000                   A HOSTAD EQU      $6000     REPLY TO HOST
6001                   A HOSTBD EQU      $6001     COMMAND FROM HOST
6002                   A HOSTAC EQU      $6002     REPLY ACK FLAG
6003                   A HOSTBC EQU      $6003     NEW COMMAND FLAG
6010                   A DIEEJT EQU      $6010     DIE EJT STATUS
6028                   A XMTR   EQU      $6028     X MOTOR
```

```
          6020  A YMTR   EQU  $6020  Y MOTOR
          E000  A LEDS   EQU  $E000  LEDS FOR KEYBOARD
          EDC5  A KYCODE EQU  $EDC5  KEY CODE
                  *
          7000  A CRT    EQU  $7000  CRT BUFFER
          7200  A XSIZE  EQU  $7200  X SIZE FOR PATTERNS
          7300  A YSIZE  EQU  $7300  Y SIZE FOR PATTERNS
          7400  A PATERN EQU  $7400  PATTERN ROM FOR REF. OI
          7500  A SNAP   EQU  $7500  SNAPSHOT BUFFER
          7600  A CNTRAD EQU  $7600  CONTROL PIA FOR VIDEO
          7602  A CNTRAC EQU  $7602
          7700  A ACNT   EQU  $7700  A COUNTER CORNER
          7702  A ACNTC  EQU  $7702
          7800  A BCNT   EQU  $7800  B COUNTER SIDES
          7802  A BCNTC  EQU  $7802
          7900  A CCNT   EQU  $7900  C COUNTER CENTER
          7902  A CCNTC  EQU  $7902
                  *
A 0000                   ORG  0000
A 0000    0010  A TOPSUM RMB  16     TOP SUM TABLE
A 0010    0010  A LHTSUM RMB  16     LEFT SUM TABLE
A 0020    0010  A RHTSUM RMB  16     RIGHT SUM TABLE
A 0030    0010  A BOTSUM RMB  16     BOTTOM SUM TABLE
A 0040    0010  A TOPAVE RMB  16     TOP AVE TABLE FROM TOP:
A 0050    0010  A LHTAVE RMB  16     LEFT AVE TABLE FROM LH'
A 0060    0010  A RHTAVE RMB  16     RIGHT AVE TABLE FROM RI
A 0070    0010  A BOTAVE RMB  16     BOTTOM AVE TABLE FROM I
A 0080    0001  A TOPSTC RMB  1      TOP STREET COUNT
A 0081    0001  A LHTSTC RMB  1      LEFT STREET COUNT
A 0082    0001  A RHTSTC RMB  1      RIGHT STREET COUNT
A 0083    0001  A BOTSTC RMB  1      BOTTOM STREET COUNT
A 0084    0001  A EXTOP  RMB  1      EXPANDED TOP FLAG
A 0085    0001  A EXBOT  RMB  1      EXPANDED BOT FLAG
A 0086    0001  A EXLHT  RMB  1      EXPANDED LHT FLAG
A 0087    0001  A EXRHT  RMB  1      EXPANDED RHT FLAG
A 0088    0001  A WIERDF RMB  1      WIERD DIE SIZE COUNTER
A 0089    0001  A TOPDIF RMB  1      Y DIF FROM DIE TO CENTE
A 008A    0001  A RHTDIF RMB  1      X DIF FROM DIE TO CENTI
A 008B    0001  A LINE   RMB  1      CRT CURSOR FOR LINE
A 008C    0001  A COL    RMB  1      CRT CURSOR FOR COL.
A 008D    0003  A XSTR   RMB  3      X MOTOR STRING
A 0090    0003  A YSTR   RMB  3      Y MOTOR STRING
A 0093    0004  A XMAX2  RMB  4      X MAX ^2
A 0097    0004  A YMAX2  RMB  4      Y MAX ^2
A 009B    0006  A TEMP   RMB  6      FOR BEGIN
A 00A1    0004  A TEMP1  RMB  4      FOR SUBTRACT MACRO
A 00A5    0002  A XTEMP  RMB  2      NEW STAGE POSITION
A 00A7    0002  A YTEMP  RMB  2      NEW STAGE POSITION
A 00A9    0001  A FLAG   RMB  1      ALIGN IN BLACK FLAG
A 00AA    0001  A LFLAG  RMB  1      LOAD PAGE FLAG
A 00AB    0002  A XSPTMP RMB  2      X STAGE TEMP
A 00AD    0002  A YSPTMP RMB  2      Y STAGE TEMP
A 00AF    0002  A XCEN   RMB  2      X CENTER
A 00B1    0002  A YCEN   RMB  2      Y CENTER
A 00B3    0002  A XDIECN RMB  2      X DIE CENTER
A 00B5    0002  A YDIECN RMB  2      Y DIE CENTER
A 00B7    0002  A XDIF   RMB  2      X DIE CENTER-XCENTER
A 00B9    0002  A YDIF   RMB  2      Y DIE CENTER-YCENTER
A 00BB    0002  A XDIFNW RMB  2      NEW X DIFF
A 00BD    0002  A YDIFNW RMB  2      NEW Y DIFF
A 00BF    0002  A XDIESZ RMB  2      #DOTS ACROSS DIE
A 00C1    0002  A YDIESZ RMB  2      #LINES ACROSS DIE
A 00C3    0002  A SFTEMP RMB  2      SCALE FACTOR TEMP
A 00C5    0001  A MISFLG RMB  1      MISSING DIE FLAG
A 00C6    0001  A LOSTF  RMB  1      LOST FLAG
A 00C7    0001  A POLLF  RMB  1      POLL FLAG
A 00C8    0001  A PASSF  RMB  1      CRUNCH COUNTER
A 00C9    00FF  A SNAPTP RMB  255    SNAPSHOT TEMP
A 01C8    00FF  A STRING RMB  255    PARM STORAGE
                  *
A 1C00                   ORG  $1C00
                  *
A 1C00    0003  A JMPX   RMB  3      STEPS TO JUMP IN X
A 1C03    0003  A JMPY   RMB  3      STEPS TO JUMP IN Y
```

```
00950 00098A 1C06      0002     A ACOUNT RMB     2        SURFACE A COUNT
00960 00099A 1C08      0002     A BCOUNT RMB     2        SURFACE B COUNT
00970 00100A 1C0A      0002     A CCOUNT RMB     2        SURFACE C COUNT
00980 00101A 1C0C      0002     A WKSR1  RMB     2        WORKING SR1
00990 00102A 1C0E      0002     A WKSR2  RMB     2        WORKING SR2
01000 00103A 1C10      0002     A WKSR3  RMB     2        WORKING SR3
01010 00104A 1C12      0001     A WKMIS  RMB     1        # MISSING DIE BEFORE TU
01020 00105A 1C13      0002     A SR1    RMB     2        SURFACE 1 %
01030 00106A 1C15      0002     A SR2    RMB     2        SURFACE 2 %
01040 00107A 1C17      0002     A SR3    RMB     2        SURFACE 3 %
01050 00108A 1C19      0002     A MISDIE RMB     2        NUMBER OF TRYS BEFORE
01060 00109A 1C1B      0002     A PARTFL RMB     2        WAFER/MATRIX 1/0
01070 00110A 1C1D      0002     A WAFSIZ RMB     2        WAFER SIZE (1,2,3,4,5,
01080 00111A 1C1F      0002     A REJDIE RMB     2        NUMBER OF REJ DIE FOUND
01090 00112A 1C21      0002     A WCOUNT RMB     2        NUMBER OF WAFERS LOADED
01100 00113A 1C23      0001     A LDPTFL RMB     1        LOAD POINT FLAG
01110 00114A 1C24      0001     A CSTEPX RMB     1        SF FOR STEPS/DOTS
01120 00115A 1C25      0001     A CSTEPY RMB     1        SF FOR STEPS/LINES
01130 00116A 1C26      0010     A MINX   RMB     16       CENTER POINT OF X
01140 00117A 1C36      0010     A MINY   RMB     16       CENTER POINT OF Y
01150 00118A 1C46      0010     A XDIE   RMB     16       DIE SIZE IN X
01160 00119A 1C56      0010     A YDIE   RMB     16       DIE SIZE IN Y
01170 00120A 1C66      0004     A MAXR   RMB     4        MAX RADIUS^2
01180 00121A 1C6A      0004     A MAXMAT RMB     4        MAX MATRIX
01190 00122A 1C6E      0001     A ALIGNF RMB     1        ALIGN FLAG
01200 00123A 1C6F      0001     A BEGINF RMB     1        BEGIN FLAG
01210 00124A 1C70      0001     A GETFLG RMB     1        1 TRY AT PICK-UP IN GET
01220 00125A 1C71      0003     A XSPP   RMB     3        X STAGE PRESENT POSITIO
01230 00126A 1C74      0003     A YSPP   RMB     3        Y STAGE PRESENT POSITIO
01240 00127                       *
01250 00128A 1CFC                        ORG     $1CFC
01260 00129                       *
01270 00130A 1CFC      0001     A DEFEFL RMB     1        $1CFC     DEFAULT ERROR
01280 00131A 1CFD      0001     A CMOSFL RMB     1        $1CFF     CMOS FLAG
00010 00132                              TTL     OPSYST


00030 00134                       ****************************************
00040 00135                       *  COPYRIGHT BY ASM DIE BONDING INC.   1982
00050 00136                       *     SOFTWARE FOR THE D2KH DIE BONDER
00060 00137                       *            OPSYST REV. 2.0A
00070 00138                       *
00080 00139                       *  DISK ID        : VIDEO 1
00090 00140                       *  DATE           :
00100 00141                       *  DWG NO         :
00110 00142                       *  ASSM NUMBER    :
00120 00143                       *  EPROM ID TAG   :
00130 00144                       *  ORGINATOR      :
00140 00145                       *  REVISED        :
00150 00146                       ****************************************
00160 00147                       *    O P E R A T I N G   S Y S T E M
00170 00148                       *             F O R
00180 00149                       *    D 2 K   A L I G N   M P U
00190 00150                       ****************************************
00200 00151                       *
00210 00152A 8000                        ORG     $8000
00220 00153                       *
00230 00154A 8000      00       A        FCB     0,0,0,1,$20
00240 00155A 8005      44       A        FCC     "D2KH REV. A"
00250 00156A 8010      20       A        FCC     "                "
00260 00157A 8020      30       A        FCC     "01 DW 2028      "
00270 00158A 8030      20       A        FCC     "  COPYRIGHT BY  "
00280 00159A 8040      41       A        FCC     "ASM DIE BONDING "
00290 00160A 8050      43       A        FCC     "CHANDER,ARIZONA "
00300 00161A 8060      20       A        FCC     "      1982      "
00310 00162A 8070      20       A        FCC     "                "
00320 00163                       *
00330 00164A 8080 7E   86AB     A        JMP     PWRUP    SET UP HOST COMM
00340 00165A 8083 7E   876D     A        JMP     RESET    SET UP PIA/MOTOR COMM
00350 00166A 8086 7E   86B7     A        JMP     BOOT     CHECK CMOS IF CRASHED
00360 00167A 8089 7E   84D8     A        JMP     INPUT
00370 00168A 808C 7E   87CA     A        JMP     MTRST    CHECK X-Y TABLE POS.
00380 00169                       *
00390 00170A 808F 8E   8097     A NULL   LDX     #REPLY0
```

```
00171A 8092 39              RTS
00172                     *
00173A 8093 8E   809A    A ERROR  LDX    #REPLY1
00174A 8096 39              RTS
00175                     *
00176A 8097      8F      A REPLY0 FCB    $8F,4,$8F
00177                     *
00178A 809A      D1      A REPLY1 FCB    $D1,4,$D1
00179                     *
00180A 809D      D0      A REPLY2 FCB    $D0
00181A 809E              A        FCC    "M   URE DIE HAS"
00182A 80AD      0A      A        FCB    $A
00183A 80AE      4E      A        FCC    "NOT BEEN PROGRAMMED"
00184A 80C1      0A      A        FCB    $A,4,$D0
00185                     *
00186A 80C4      D5      A REPLY3 FCB    $D5
00187A 80C5      20      A        FCC    " X-Y LIMIT REACHED"
00188A 80D7      0A      A        FCB    $A
00189A 80D8      20      A        FCC    " ON WAFER STAGE"
00190A 80E7      0A      A        FCB    $A,4,$D5
00191                     *

00192A 80EA      82      A REPLY4 FCB    $82,$8F,4,$8F BUSY/READY
00193                     *
00194A 80EE      D5      A REPLY5 FCB    $D5
00195A 80EF      54      A        FCC    "THE DIE EJECTOR PIN IS UP"
00196A 8108      0A      A        FCB    $A,4,$D5
00197                     *
00198A 810B      D2      A REPLY6 FCB    $D2
00199A 810C      41      A        FCC    "ALIGN HAS DEFAULT VALUES"
00200A 8124      0A      A        FCB    $A,4,$D2
00201                     *
00202A 8127      D0      A REPLY7 FCB    $D0
00203A 8128      58      A        FCC    "X-Y  LIMIT REACHED"
00204A 813A      0A      A        FCB    $A
00205A 813B      4F      A        FCC    "ON WAFER STAGE"
00206A 8149      0A      A        FCB    $A,4,$D0
00207                     *
00208A 814C      D5      A REPLY8 FCB    $D5
00209A 814D      43      A        FCC    "CAN NOT FIND THE DIE"
00210A 8161      0A      A        FCB    $A,4,$D5
00211                     *
00212A 8164      DF      A REPLYC FCB    $DF
00213A 8165      4D      A        FCC    "MATRIX HAS BEEN COMPLETED"
00214A 817E      0A      A        FCB    $A,4,$DF
00215                     *
00216A 8181      DF      A REPLYD FCB    $DF
00217A 8182      57      A        FCC    "WAFER HAS BEEN COMPLETED"
00218A 819A      0A      A        FCB    $A,4,$DF
00219                     *
00220A 819D      D5      A REPLYE FCB    $D5
00221A 819E      54      A        FCC    "THE DIE EJECTOR PIN IS UP"
00222A 81B7      0A      A        FCB    $A,4,$D5
00223                     *
00224A 81BA      D5      A REPLYF FCB    $D5
00225A 81BB      4D      A        FCC    "MEASURE DIE HAS"
00226A 81CA      0A      A        FCB    $A
00227A 81CB      4E      A        FCC    "NOT BEEN PROGRAMMED"
00228A 81DE      0A      A        FCB    $A,4,$D5
00229                     *
00230A 81E1      D4      A REPYHX FCB    $D4
00231A 81E2      20      A        FCC    " HARD ERROR WITH X MOTOR"
00232A 81FA      0A      A        FCB    $A
00233A 81FB      20      A        FCC    " ON WAFER STAGE"
00234A 820A      0A      A        FCB    $A,4,$D4
00235                     *
00236A 820D      D4      A REPYAX FCB    $D4
00237A 820E      20      A        FCC    " X MOTOR DID NOT ACCEPT COMMANI
00238A 822D      0A      A        FCB    $A
00239A 822E      20      A        FCC    " ON WAFER STAGE"
00240A 823D      0A      A        FCB    $A,4,$D4
00241                     *
00242A 8240      D4      A REPYBX FCB    $D4
00243A 8241      20      A        FCC    " X MOTOR DID NOT GO BUSY"
```

```
01130 00244A 8259      0A     A        FCB    $A
01140 00245A 825A      20     A        FCC    " ON WAFER STAGE"
01150 00246A 8269      0A     A        FCB    $A,4,$D4
01160 00247                    *
01170 00248A 826C      D4     A REPYRX FCB    $D4
01180 00249A 826D      20     A        FCC    " X MOTOR DID NOT GO READY"
01190 00250A 8286      0A     A        FCB    $A
01200 00251A 8287      20     A        FCC    " ON WAFER STAGE"
01210 00252A 8296      0A     A        FCB    $A,4,$D4
01220 00253                    *
01230 00254A 8299      D4     A REPYLX FCB    $D4
01240 00255A 829A      20     A        FCC    " X MOTOR HIT LIMIT SWITCH"
01250 00256A 82B3      0A     A        FCB    $A
01260 00257A 82B4      20     A        FCC    " ON WAFER STAGE"
01270 00258A 82C3      0A     A        FCB    $A,4,$D4
01280 00259                    *
01290 00260A 82C6      D4     A REPYHY FCB    $D4
01300 00261A 82C7      20     A        FCC    " HARD ERROR WITH Y MOTOR"
01310 00262A 82DF      0A     A        FCB    $A
01320 00263A 82E0      20     A        FCC    " ON WAFER STAGE"
01330 00264A 82EF      0A     A        FCB    $A,4,$D4
01340 00265                    *
01350 00266A 82F2      D4     A REPYAY FCB    $D4
01360 00267A 82F3      20     A        FCC    " Y MOTOR DID NOT ACCEPT COMMAND
01370 00268A 8312      0A     A        FCB    $A
01380 00269A 8313      20     A        FCC    " ON WAFER STAGE"
01390 00270A 8322      0A     A        FCB    $A,4,$D4
01400 00271                    *
01410 00272A 8325      D4     A REPYBY FCB    $D4
01420 00273A 8326      20     A        FCC    " Y MOTOR DID NOT GO BUSY"
01430 00274A 833E      0A     A        FCB    $A
01440 00275A 833F      20     A        FCC    " ON WAFER STAGE"
01450 00276A 834E      0A     A        FCB    $A,4,$D4
01460 00277                    *
01470 00278A 8351      D4     A REPYRY FCB    $D4
01480 00279A 8352      20     A        FCC    " Y MOTOR DID NOT GO READY"
01490 00280A 836B      0A     A        FCB    $A
01500 00281A 836C      20     A        FCC    " ON WAFER STAGE"
01510 00282A 837B      0A     A        FCB    $A,4,$D4
01520 00283                    *
01530 00284A 837E      D4     A REPYLY FCB    $D4
01540 00285A 837F      20     A        FCC    " Y MOTOR HIT LIMIT SWITCH"
01550 00286A 8398      0A     A        FCB    $A
01560 00287A 8399      20     A        FCC    " ON WAFER STAGE"
01570 00288A 83A8      0A     A        FCB    $A,4,$D4
01580 00289                    *
01590 00290A 83AB      D5     A REPYPW FCB    $D5
01600 00291A 83AC      20     A        FCC    " X-Y MOTORS DID NOT GO READY"
01610 00292A 83C8      0A     A        FCB    $A
01620 00293A 83C9      20     A        FCC    " ON WAFER STAGE"
01630 00294A 83D8      0A     A        FCB    $A
01640 00295A 83D9      4D     A        FCC    "M O T O R   P O W E R   ON ?"
01650 00296A 83F5      0A     A        FCB    $A,4,$D5
01660 00297                    *
01670 00298A 83F8      D4     A REPYRB FCB    $D4
01680 00299A 83F9      20     A        FCC    " X-Y MOTORS DID NOT GO READY"
01690 00300A 8415      0A     A        FCB    $A
01700 00301A 8416      20     A        FCC    " ON WAFER STAGE"
01710 00302A 8425      0A     A        FCB    $A,4,$D4
01720 00303                    *
01730 00304A 8428      D4     A REPYPX FCB    $D4
01740 00305A 8429      20     A        FCC    " X MOTOR POLL ERROR"
01750 00306A 843C      0A     A        FCB    $A
01760 00307A 843D      20     A        FCC    " ON WAFER STAGE"
01770 00308A 844C      0A     A        FCB    $A,4,$D4
01780 00309                    *
01790 00310A 844F      D4     A REPYPY FCB    $D4
01800 00311A 8450      20     A        FCC    " Y MOTOR POLL ERROR"
01810 00312A 8463      0A     A        FCB    $A
01820 00313A 8464      20     A        FCC    " ON WAFER STAGE"
01830 00314A 8473      0A     A        FCB    $A,4,$D4
01840 00315                    *
01850 00316A 8476      D4     A REPYPP FCB    $D4
01860 00317A 8477      20     A        FCC    " POLL ERROR BY ALIGN SOFTWARE"
```

```
01870 00318A 8494      0A      A          FCB     $A,4,$D4
01880 00319                       *
01890 00320                       *
01900 00321                       *DEFAULT FOR X SIZE
01910 00322A 8497      BB      A TAB1     FCB     $BB,$07,$07,$01,$0F,$01,$07,$07
01920 00323A 849F      FF      A          FCB     $FF,$FF,$FF,$FF,$FF,$FF,$FF,$FF
01930 00324                       *
01940 00325                       *DEFAULT FOR Y SIZE
01950 00326A 84A7      70      A TAB2     FCB     $70,$07,$07,$01,$0F,$01,$07,$07
01960 00327A 84AF      FF      A          FCB     $FF,$FF,$FF,$FF,$FF,$FF,$FF,$FF
01970 00328                       *
01980 00329                       * OUTPUT ROUTINE WILL SEND A REPLY BACK
01990 00330                       * ,BY THE "X" INDEX,TO THE HOST.THE REPLY
02000 00331                       * IS ENDED BY A EOT ($04) AND THE STATUS
02010 00332                       * IS PUT BACK ON THE COMM PORT
02020 00333                       *
02030 00334A 84B7 7D   6003    A OUTPUT   TST     HOSTBC    LAST REPLY ACK?
02040 00335A 84BA 2A   FB   84B7          BPL     OUTPUT    NO,GO TO OUTPUT
02050 00336                       *
02060 00337A 84BC B6   6001    A          LDA     HOSTBD    DUMMY READ
02070 00338A 84BF A6   80      A          LDA     ,X+
02080 00339A 84C1 B7   6001    A          STA     HOSTBD    OUTPUT COMMAN
02090 00340                       *
02100 00341A 84C4 81   04      A          CMPA    #4        OUTPUT=EOT?
02110 00342A 84C6 26   EF   84B7          BNE     OUTPUT
02120 00343                       *
02130 00344A 84C8 7D   6000    A          TST     HOSTAD    DUMMY READ COMMAN PORT
02140 00345                       *
02150 00346A 84CB 7D   6003    A OUT1     TST     HOSTBC    LAST COMMAN ACK?
02160 00347A 84CE 2A   FB   84CB          BPL     OUT1      NO,LOOP
02170 00348                       *
02180 00349A 84D0 B6   6001    A          LDA     HOSTBD    DUMMY READ
02190 00350A 84D3 A6   84      A          LDA     ,X
02200 00351A 84D5 B7   6001    A          STA     HOSTBD    OUTPUT STATUS
02210 00352                       *
02220 00353                       * INPUT ROUTINE WILL WAIT UNTILL A "NEW COMMAN
02230 00354                       * IS RECIVED,THEN THEN DO A TRICK JSR TO THE
02240 00355                       * COMMAN WITH THE RETURN TO OUTPUT .
02250 00356                       *
02260 00357A 84D8 B6   7600    A INPUT    LDA     CNTRAD    DIE ADJ?
02270 00358A 84DB 2A   3F   851C          BPL     DIEADJ
02280 00359                       *
02290 00360A 84DD B6   7601    A          LDA     CNTRAD+1  STREET ADJ?
02300 00361A 84E0 2A   59   853B          BPL     STRADJ
02310 00362                       *
02320 00363A 84E2 7D   6002    A          TST     HOSTAC    NEW COMMAN?
02330 00364A 84E5 2A   F1   84D8          BPL     INPUT     NO,LOOP
02340 00365A 84E7 F6   6000    A          LDB     HOSTAD    LOAD COMMAN
02350 00366                       *
02360 00367A 84EA C1   08      A          CMPB    #8
02370 00368A 84EC 27   EA   84D8          BEQ     INPUT
02380 00369                       *
02390 00370A 84EE C1   7F      A          CMPB    #$7F
02400 00371A 84F0 2E   71   8563          BGT     MAIN      RETURN TO MAIN
02410 00372                       *
02420 00373A 84F2 C1   74      A          CMPB    #$74      LPAGE?
02430 00374A 84F4 27   19   850F          BEQ     INPUT2    YES,DON'T OUT A BUSY
02440 00375                       *
02450 00376A 84F6 C1   78      A          CMPB    #$78      VARON?
02460 00377A 84F8 27   15   850F          BEQ     INPUT2
02470 00378                       *
02480 00379A 84FA C1   79      A          CMPB    #$79      VAROFF?
02490 00380A 84FC 27   11   850F          BEQ     INPUT2
02500 00381                       *
02510 00382A 84FE C1   7A      A          CMPB    #$7A      PARAM?
02520 00383A 8500 27   0D   850F          BEQ     INPUT2
02530 00384                       *
02540 00385                       * OUTPUT A BUSY
02550 00386                       *
02560 00387A 8502 7D   6003    A INPUT1   TST     HOSTBC    LAST REPLY ACK?
02570 00388A 8505 2A   FB   8502          BPL     INPUT1    NO
02580 00389                       *
02590 00390A 8507 7D   6001    A          TST     HOSTBD    DUMMY READ
02600 00391A 850A 86   82      A          LDA     #$82
```

```
00392A 850C B7    6001     A        STA    HOSTBD     YES OUTPUT BUSY
00393                      *
00394A 850F 4F               INPUT2 CLRA
00395A 8510 58                      LSLB              D TIMES 2 = D
00396A 8511 49                      ROLA
00397A 8512 8E    84B7     A        LDX    #OUTPUT    TRICK RETURN TO OUTPUT
00398A 8515 34    10       A        PSHS   X          FROM JMP [D,X]
00399A 8517 8E    8567     A        LDX    #COMTAB    LOAD X TO COMMAN TABLE
00400A 851A 6E    9B       A        JMP    [D,X]      JUMP TO COMMAN AND RET
00401                      *
00402A 851C FC    7600     A DIEADJ LDD    CNTRAD
00403A 851F 34    06       A        PSHS   D
00404A 8521 86    08       A        LDA    #8
00405A 8523 B7    7601     A        STA    CNTRAD+1
00406A 8526 8D    33   855B         BSR    DLY30
00407A 8528 7D    7600     A DIEAD1 TST    CNTRAD
00408A 852B 2A    FB   8528         BPL    DIEAD1
00409A 852D 8D    2C   855B         BSR    DLY30
00410A 852F 7D    7600     A        TST    CNTRAD
00411A 8532 2A    F4   8528         BPL    DIEAD1
00412A 8534 35    06       A        PULS   D
00413A 8536 FD    7600     A        STD    CNTRAD
00414A 8539 20    9D   84D8         BRA    INPUT
00415                      *
00416A 853B FC    7600     A STRADJ LDD    CNTRAD
00417A 853E 34    06       A        PSHS   D
00418A 8540 86    04       A        LDA    #4
00419A 8542 B7    7601     A        STA    CNTRAD+1
00420A 8545 8D    14   855B         BSR    DLY30
00421A 8547 7D    7601     A STRAD1 TST    CNTRAD+1
00422A 854A 2A    FB   8547         BPL    STRAD1
00423A 854C 8D    0D   855B         BSR    DLY30
00424A 854E 7D    7601     A        TST    CNTRAD+1
00425A 8551 2A    F4   8547         BPL    STRAD1
00426A 8553 35    06       A        PULS   D
00427A 8555 FD    7600     A        STD    CNTRAD
00428A 8558 16    FF7D 84D8         LBRA   INPUT
00429                      *
00430A 855B 8E    2B67     A DLY30  LDX    #$2B67
00431A 855E 30    1F       A DLYLP  LEAX   -1,X
00432A 8560 26    FC   855E         BNE    DLYLP
00433A 8562 39                      RTS
00434                      *
00435A 8563 F7    EDC5     A MAIN   STB    KYCODE     STORE COMMAN INTO KEYC(
00436A 8566 39                      RTS               RETURN TO MAIN PROGRAM
00437                      *
00438                      *        THIS IS THE COMMAN TABLE
00439                      *
00440A 8567       808F     A COMTAB FDB    NULL       COMMAN 00 NO ACTION
00441A 8569       876D     A        FDB    RESET      COMMAN 01 SOFTWARE SYS
00442A 856B       808F     A        FDB    NULL       COMMAN 02 STOP
00443A 856D       8093     A        FDB    ERROR      COMMAN 03
00444A 856F       8093     A        FDB    ERROR      COMMAN 04
00445A 8571       808F     A        FDB    NULL       COMMAN 05 ENABLE SERVI(
00446A 8573       8823     A        FDB    MTRPIA     COMMAN 06 MOTOR SYNC,RI
00447A 8575       8093     A        FDB    ERROR      COMMAN 07
00448A 8577       8093     A        FDB    ERROR      COMMAN 08
00449A 8579       8093     A        FDB    ERROR      COMMAN 09
00450A 857B       8093     A        FDB    ERROR      COMMAN 0A
00451A 857D       8093     A        FDB    ERROR      COMMAN 0B
00452A 857F       8093     A        FDB    ERROR      COMMAN 0C
00453A 8581       8093     A        FDB    ERROR      COMMAN 0D
00454A 8583       8093     A        FDB    ERROR      COMMAN 0E
00455A 8585       8E96     A        FDB    RURDY      COMMAN 0F ARE YOU READ'
00456A 8587       8093     A        FDB    ERROR      COMMAN 10
00457A 8589       8093     A        FDB    ERROR      COMMAN 11
00458A 858B       8093     A        FDB    ERROR      COMMAN 12
00459A 858D       8093     A        FDB    ERROR      COMMAN 13
00460A 858F       8093     A        FDB    ERROR      COMMAN 14
00461A 8591       8093     A        FDB    ERROR      COMMAN 15
00462A 8593       8093     A        FDB    ERROR      COMMAN 16
00463A 8595       8093     A        FDB    ERROR      COMMAN 17
00464A 8597       8093     A        FDB    ERROR      COMMAN 18
```

```
00465A 8599     8093    A    FDB    ERROR     COMMAN 19
00466A 859B     8093    A    FDB    ERROR     COMMAN 1A
00467A 859D     8093    A    FDB    ERROR     COMMAN 1B
00468A 859F     8093    A    FDB    ERROR     COMMAN 1C
00469A 85A1     8093    A    FDB    ERROR     COMMAN 1D
00470A 85A3     8093    A    FDB    ERROR     COMMAN 1E
00471A 85A5     8093    A    FDB    ERROR     COMMAN 1F
00472A 85A7     8093    A    FDB    ERROR     COMMAN 20
00473A 85A9     8093    A    FDB    ERROR     COMMAN 21
00474A 85AB     8093    A    FDB    ERROR     COMMAN 22
00475A 85AD     8093    A    FDB    ERROR     COMMAN 23
00476A 85AF     8093    A    FDB    ERROR     COMMAN 24
00477A 85B1     8093    A    FDB    ERROR     COMMAN 25
00478A 85B3     8093    A    FDB    ERROR     COMMAN 26
00479A 85B5     8093    A    FDB    ERROR     COMMAN 27
00480A 85B7     8093    A    FDB    ERROR     COMMAN 28
00481A 85B9     8093    A    FDB    ERROR     COMMAN 29
00482A 85BB     8093    A    FDB    ERROR     COMMAN 2A
00483A 85BD     8093    A    FDB    ERROR     COMMAN 2B
00484A 85BF     8093    A    FDB    ERROR     COMMAN 2C
00485A 85C1     8093    A    FDB    ERROR     COMMAN 2D
00486A 85C3     8093    A    FDB    ERROR     COMMAN 2E
00487A 85C5     8093    A    FDB    ERROR     COMMAN 2F
00488A 85C7     8093    A    FDB    ERROR     COMMAN 30
00489A 85C9     8093    A    FDB    ERROR     COMMAN 31
00490A 85CB     8093    A    FDB    ERROR     COMMAN 32
00491A 85CD     8093    A    FDB    ERROR     COMMAN 33
00492A 85CF     8093    A    FDB    ERROR     COMMAN 34
00493A 85D1     8093    A    FDB    ERROR     COMMAN 35
00494A 85D3     8093    A    FDB    ERROR     COMMAN 36
00495A 85D5     8093    A    FDB    ERROR     COMMAN 37
00496A 85D7     8093    A    FDB    ERROR     COMMAN 38
00497A 85D9     8093    A    FDB    ERROR     COMMAN 39
00498A 85DB     8093    A    FDB    ERROR     COMMAN 3A
00499A 85DD     8093    A    FDB    ERROR     COMMAN 3B
00500A 85DF     8093    A    FDB    ERROR     COMMAN 3C
00501A 85E1     8093    A    FDB    ERROR     COMMAN 3D
00502A 85E3     8093    A    FDB    ERROR     COMMAN 3E
00503A 85E5     8093    A    FDB    ERROR     COMMAN 3F
00504A 85E7     8093    A    FDB    ERROR     COMMAN 40
00505A 85E9     8093    A    FDB    ERROR     COMMAN 41
00506A 85EB     8093    A    FDB    ERROR     COMMAN 42
00507A 85ED     8093    A    FDB    ERROR     COMMAN 43
00508A 85EF     8093    A    FDB    ERROR     COMMAN 44
00509A 85F1     8093    A    FDB    ERROR     COMMAN 45
00510A 85F3     8093    A    FDB    ERROR     COMMAN 46
00511A 85F5     8093    A    FDB    ERROR     COMMAN 47
00512A 85F7     8093    A    FDB    ERROR     COMMAN 48
00513A 85F9     8093    A    FDB    ERROR     COMMAN 49
00514A 85FB     8093    A    FDB    ERROR     COMMAN 4A
00515A 85FD     8093    A    FDB    ERROR     COMMAN 4B
00516A 85FF     8093    A    FDB    ERROR     COMMAN 4C
00517A 8601     8093    A    FDB    ERROR     COMMAN 4D
00518A 8603     8093    A    FDB    ERROR     COMMAN 4E
00519A 8605     8093    A    FDB    ERROR     COMMAN 4F
00520A 8607     8093    A    FDB    ERROR     COMMAN 50
00521A 8609     8093    A    FDB    ERROR     COMMAN 51
00522A 860B     8093    A    FDB    ERROR     COMMAN 52
00523A 860D     8093    A    FDB    ERROR     COMMAN 53
00524A 860F     8093    A    FDB    ERROR     COMMAN 54
00525A 8611     8093    A    FDB    ERROR     COMMAN 55
00526A 8613     8093    A    FDB    ERROR     COMMAN 56
00527A 8615     8093    A    FDB    ERROR     COMMAN 57
00528A 8617     8093    A    FDB    ERROR     COMMAN 58
00529A 8619     8093    A    FDB    ERROR     COMMAN 59
00530A 861B     8093    A    FDB    ERROR     COMMAN 5A
00531A 861D     8093    A    FDB    ERROR     COMMAN 5B
00532A 861F     8093    A    FDB    ERROR     COMMAN 5C
00533A 8621     8093    A    FDB    ERROR     COMMAN 5D
00534A 8623     8093    A    FDB    ERROR     COMMAN 5E
00535A 8625     8093    A    FDB    ERROR     COMMAN 5F
00536A 8627     8FC4    A    FDB    LWAFER    COMMAN 60 LOAD WAFER
00537A 8629     9058    A    FDB    ALIGN0    COMMAN 61 ALIGN 0
00538A 862B     9AD9    A    FDB    BEGIN     COMMAN 62 BEGIN
00539A 862D     946D    A    FDB    JUMP      COMMAN 63 JUMP (NEXT D
```

```
04090 00540A 862F       9262      A          FDB     STEP      COMMAN 64 STEP
04100 00541A 8631       A19F      A          FDB     FIND      COMMAN 65 FIND DIE
04110 00542A 8633       9C3F      A          FDB     ALIGN     COMMAN 66 MEASURE DIE
04120 00543A 8635       97E9      A          FDB     RETADJ    COMMAN 67 RETICLE ADJU
04130 00544A 8637       8EB8      A          FDB     CLEAR     COMMAN 68 CLEAR MONITO
04140 00545A 8639       8093      A          FDB     ERROR     COMMAN 69
04150 00546A 863B       8093      A          FDB     ERROR     COMMAN 6A
04160 00547A 863D       8093      A          FDB     ERROR     COMMAN 6B
04170 00548A 863F       8093      A          FDB     ERROR     COMMAN 6C
04180 00549A 8641       8093      A          FDB     ERROR     COMMAN 6D
04190 00550A 8643       8093      A          FDB     ERROR     COMMAN 6E
04200 00551A 8645       8093      A          FDB     ERROR     COMMAN 6F
04210 00552A 8647       8EA6      A          FDB     PAGON     COMMAN 70 PAGE ON
04220 00553A 8649       8EAF      A          FDB     PAGOFF    COMMAN 71 PAGE OFF
04230 00554A 864B       8093      A          FDB     ERROR     COMMAN 72
04240 00555A 864D       9A9F      A          FDB     COUNT     COMMAN 73 COUNT
04250 00556A 864F       8EDE      A          FDB     LPAGE     COMMAN 74 CRT MESSAGE
04260 00557A 8651       8093      A          FDB     ERROR     COMMAN 75 DUMP CRT BUFF
04270 00558A 8653       A56C      A          FDB     GETONE    COMMAN 76 FIND,JUMP NE
04280 00559A 8655       8ECE      A          FDB     ALLOFF    COMMAN 77 PNL VARIANCE
04290 00560A 8657       8FB0      A          FDB     VARON     COMMAN 78 PNL VARIANCE
04300 00561A 8659       8F99      A          FDB     VAROFF    COMMAN 79 PNL VARIANCE
04310 00562A 865B       9919      A          FDB     PARAM     COMMAN 7A PARAM
04320 00563A 865D       8093      A          FDB     ERROR     COMMAN 7B
04330 00564A 865F       8093      A          FDB     ERROR     COMMAN 7C
04340 00565A 8661       8093      A          FDB     ERROR     COMMAN 7D
04350 00566A 8663       8093      A          FDB     ERROR     COMMAN 7E
04360 00567A 8665       A598      A          FDB     GET2      COMMAN 7F JUMP,FIND NE
04370 00568                         *
04380 00569                         *
04390 00570                         *        NEXT......INPUT A COMMAN
04400 00571                         *                  OUTPUT A BUSY
04410 00572                         *                  RETURN TO CALLER
04420 00573                         *
04430 00574                         *        THIS WILL INPUT MICRO COMMAN
04440 00575                         *        AFTER THE "KEY" COMMAN
04450 00576                         *        WAS RECIVED FOR MULTI-BYTE COMMAN
04460 00577                         *        ACC A WILL HAVE NEW COMMAN
04470 00578                         *        THEN OUTPUT MICRO BUSY
04480 00579                         *        AND THEN RETURN TO CALLER
04490 00580                         *
04500 00581A 8667 34    04        A NEXT     PSHS    B
04510 00582A 8669 B6    6002      A NEXT1    LDA     HOSTAC    NEW COMMAN?
04520 00583A 866C 2A    FB   8669            BPL     NEXT1
04530 00584                         *
04540 00585A 866E B6    6000      A          LDA     HOSTAD    LOAD COMMAN
04550 00586                         *
04560 00587A 8671 7D    6003      A NEXT2    TST     HOSTBC    LAST REPLY ACK?
04570 00588A 8674 2A    FB   8671            BPL     NEXT2
04580 00589                         *
04590 00590A 8676 7D    6001      A          TST     HOSTBD    DUMMY READ
04600 00591A 8679 C6    82        A          LDB     #$82      OUTPUT MICRO BUSY
04610 00592A 867B F7    6001      A          STB     HOSTBD    TO HOST
04620 00593A 867E 35    04        A          PULS    B
04630 00594A 8680 39                         RTS               RETURN WITH COMMAN IN A
04640 00595                         *
04650 00596A 8681 B6    6003      A OUTOK    LDA     HOSTBC    LAST REPLY ACK?
04660 00597A 8684 2A    FB   8681            BPL     OUTOK     NO LOOP
04670 00598                         *
04680 00599A 8686 7D    6001      A          TST     HOSTBD    DUMMY READ
04690 00600A 8689 86    8F        A          LDA     #$8F
04700 00601A 868B B7    6001      A          STA     HOSTBD    OUTPUT "READY"
04710 00602                         *
04720 00603A 868E B6    6003      A OUTOK2   LDA     HOSTBC    "READY"ACK?
04730 00604A 8691 2A    FB   868E            BPL     OUTOK2    NO LOOP
04740 00605                         *
04750 00606A 8693 B6    6001      A          LDA     HOSTBD    DUMMY READ
04760 00607A 8696 34    02        A          PSHS    A         AND SAVE IT
04770 00608A 8698 86    04        A          LDA     #$04
04780 00609A 869A B7    6001      A          STA     HOSTBD    OUTPUT "EOT"
04790 00610                         *
04800 00611A 869D B6    6003      A OUTOK3   LDA     HOSTBC    "EOT"ACK?
04810 00612A 86A0 2A    FB   869D            BPL     OUTOK3    NO LOOP
```

```
04820 00613                              *
04830 00614A 86A2 7D    6001     A              TST     HOSTBD   DUMMY READ
04840 00615A 86A5 35    02       A              PULS    A
04850 00616A 86A7 B7    6001     A              STA     HOSTBD   OUTPUT "READY"
04860 00617A 86AA 39                            RTS
00010 00618                                     TTL     POWER-UP

00030 00620                              ***********************************************
00040 00621                              *  COPYRIGHT BY ASM DIE BONDING INC.   1982
00050 00622                              *     SOFTWARE FOR THE D2KH DIE BONDER
00060 00623                              *              PWRUP  REV. 2.0A
00070 00624                              *
00080 00625                              *  DISK ID       : VIDEO 1
00090 00626                              *  DATE          :
00100 00627                              *  DWG NO        :
00110 00628                              *  ASSM NUMBER   :
00120 00629                              *  EPROM ID TAG  :
00130 00630                              *  ORGINATOR     :
00140 00631                              *  REVISED       :
00150 00632                              ***********************************************
00160 00633                              *
00170 00634A 86AB 8E    0400     A PWRUP  LDX     #1024    CLEAR RAM
00180 00635A 86AE 6F    1F       A PWRUP1 CLR     -1,X
00190 00636A 86B0 30    1F       A        LEAX    -1,X
00200 00637A 86B2 26    FA   86AE         BNE     PWRUP1
00210 00638A 86B4 7E    876D     A        JMP     RESET    AND RETURN
00010 00639                               TTL     BOOT

00030 00641                              ***********************************************
00040 00642                              *  COPYRIGHT BY ASM DIE BONDING INC.   1982
00050 00643                              *     SOFTWARE FOR THE D2KH DIE BONDER
00060 00644                              *              BOOT   REV. 2.0A
00070 00645                              *
00080 00646                              *  DISK ID       : VIDEO 1
00090 00647                              *  DATE          :
00100 00648                              *  DWG NO        :
00110 00649                              *  ASSM NUMBER   :
00120 00650                              *  EPROM ID TAG  :
00130 00651                              *  ORGINATOR     :
00140 00652                              *  REVISED       :
00150 00653                              ***********************************************
00160 00654                              * BOOT WILL CLEAR RAM AND CHECK
00170 00655                              * IF CMOS DIED, THEN LOAD
00180 00656                              * DEFAULT VALUES IN AND SET DEFAULT FLAG
00190 00657                              * ELSE CLEAR DEFAULT FLAG
00200 00658                              ***********************************************
00210 00659                              *
00220 00660A 86B7 B6    1CFD     A BOOT   LDA     CMOSFL   GET CMOS FLAG
00230 00661A 86BA 81    A5       A        CMPA    #$A5     A5 IS OK FLAG?
00240 00662A 86BC 26    0A   86C8         BNE     BOOT1
00250 00663A 86BE 7F    1CFC     A        CLR     DEFEFL   CLEAR DEFAULT FLAG
00260 00664A 86C1 86    9C       A        LDA     #$9C
00270 00665A 86C3 B7    EDC3     A        STA     $EDC3
00280 00666A 86C6 20    51   8719         BRA     BOOT6
00290 00667                              *
00300 00668A 86C8 8E    1C00     A BOOT1  LDX     #$1C00   CMOS CRASH
00310 00669A 86CB C6    FF       A        LDB     #255     CLEAR IT
00320 00670A 86CD 6F    80       A BOOT2  CLR     ,X+
00330 00671A 86CF 5A                      DECB
00340 00672A 86D0 26    FB   86CD         BNE     BOOT2
00350 00673                              *
00360 00674A 86D2 8E    1C26     A        LDX     #MINX    AND LOAD DEFAULT
00370 00675A 86D5 31    8D FDBE           LEAY    TAB1,PCR
00380 00676A 86D9 C6    20       A        LDB     #32
00390 00677A 86DB A6    A0       A BOOT3  LDA     ,Y+
00400 00678A 86DD A7    88 20    A        STA     32,X
00410 00679A 86E0 A7    80       A        STA     ,X+
00420 00680A 86E2 5A                      DECB
00430 00681A 86E3 26    F6   86DB         BNE     BOOT3
00440 00682A 86E5 CC    03EB     A        LDD     #$03EB   MSD 3"E2
00450 00683A 86E8 FD    1C66     A        STD     MAXR
00460 00684A 86EB CC    D9A1     A        LDD     #$D9A1   LSD 3"E2
00470 00685A 86EE FD    1C68     A        STD     MAXR+2
```

```
00480 00686A 86F1 CC   1FAF     A         LDD    #$1FAF
00490 00687A 86F4 FD   1C6C     A         STD    MAXMAT+2
00500 00688A 86F7 86   5F       A         LDA    #95
00510 00689A 86F9 B7   1C14     A         STA    SR1+1
00520 00690A 86FC B7   1C16     A         STA    SR2+1
00530 00691A 86FF B7   1C18     A         STA    SR3+1
00540 00692                      *
00550 00693A 8702 86   01       A         LDA    #1
00560 00694A 8704 B7   1CFC     A         STA    DEFEFL
00570 00695A 8707 B7   1C1C     A         STA    PARTFL+1 SET FOR WAFER
00580 00696A 870A 86   A5       A         LDA    #$A5
00590 00697A 870C B7   1CFD     A         STA    CMOSFL
00600 00698A 870F 86   9C       A         LDA    #$9C
```

---

```
00610 00699A 8711 B7   EDC3     A         STA    $EDC3
00620 00700A 8714 86   03       A         LDA    #3
00630 00701A 8716 B7   1C1E     A         STA    WAFSIZ+1
00640 00702                      *
00650 00703A 8719 86   03       A BOOT6   LDA    #3
00660 00704A 871B 8E   FFFF     A BOOT7   LDX    #$FFFF
00670 00705A 871E 30   1F       A BOOT8   LEAX   -1,X
00680 00706A 8720 26   FC  871E           BNE    BOOT8
00690 00707A 8722 4A                      DECA
00700 00708A 8723 26   F6  871B           BNE    BOOT7
00710 00709                      *
00720 00710A 8725 BD   8EB8     A BOOTC   JSR    CLEAR
00730 00711A 8728 8E   8732     A         LDX    #PWROK
00740 00712A 872B BD   8F15     A         JSR    DISPLY
00750 00713A 872E BD   8EA6     A         JSR    PAGON
00760 00714A 8731 39                      RTS
00770 00715                      *
00780 00716A 8732      0A       A PWROK   FCB    $0A
00790 00717A 8733      20       A         FCC    "       PRESS SYSTEM RESET"
00800 00718A 874B      0A       A         FCB    $A,$A
00810 00719A 874D      2A       A         FCC    "***WARNING MOTORS WILL MOVE***
00820 00720A 876B      0A       A         FCB    $0A,4
00010 00721                               TTL    RESET
00030 00723                      ************************************************
00040 00724                      *  COPYRIGHT BY ASM DIE BONDING INC.   1982
00050 00725                      *      SOFTWARE FOR THE D2KH DIE BONDER
00060 00726                      *               RESET  REV. 2.0A
00070 00727                      *
00080 00728                      *  DISK ID        : VIDEO 1
00090 00729                      *  DATE           :
00100 00730                      *  DWG NO         :
00110 00731                      *  ASSM NUMBER    :
00120 00732                      *  EPROM ID TAG   :
00130 00733                      *  ORGINATOR      :
00140 00734                      *  REVISED        :
00150 00735                      ************************************************
00160 00736                      *
00170 00737                      *      SETUP THE VIDIO INTERFACE PIA'S
00180 00738                      *
00190 00739A 876D CC   0000     A RESET   LDD    #0        DO A SOFTWARE RESET
00200 00740A 8770 1F   8B       A         TFR    A,DP
00210 00741A 8772 FD   7702     A         STD    ACNTC     IN "A" COUNTER
00220 00742A 8775 FD   7802     A         STD    BCNTC     IN "B" COUNTER
00230 00743A 8778 FD   7902     A         STD    CCNTC     IN "C" COUNTER
00240 00744A 877B FD   7602     A         STD    CNTRAC    IN "CONTROL"
00250 00745                      *                         NOW SETUP DATA INPUTS
00260 00746A 877E FD   7700     A         STD    ACNT      FOR "A" COUNTER
00270 00747A 8781 FD   7800     A         STD    BCNT      FOR "B" COUNTER
00280 00748A 8784 FD   7900     A         STD    CCNT      FOR "C" COUNTER
00290 00749                      *
00300 00750                      *      NOW FOR DATA OUTPUTS FOR CONTROL
00310 00751                      *
00320 00752A 8787 CC   7F7F     A         LDD    #$7F7F
00330 00753A 878A FD   7600     A         STD    CNTRAD    FOR CONTROL
00340 00754                      *
00350 00755                      *    SETUP THE CONTROL LINES
```

```
00360 00756                        *      FOR CA1=NEG. TRIG, MASKED
00370 00757                        *          CA2=NEG. TRIG, MASKED
00380 00758                        *          CB1=NEG. TRIG, MASKED
00390 00759                        *          CB2=NEG. TRIG, MASKED
00400 00760                        *
00410 00761A 878D CC   0404     A         LDD    ##$0404
00420 00762A 8790 FD   7702     A         STD    ACNTC    IN "A" COUNTER, CA1 IS
00430 00763A 8793 FD   7802     A         STD    BCNTC    IN "B" COUNTER, CA1 IS
00440 00764A 8796 FD   7902     A         STD    CCNTC    IN "C" COUNTER, CA1 IS
00450 00765A 8799 FD   6012     A         STD    DIEEJT+2
00460 00766                        *
00470 00767                        *     SETUP THE CONTROL LINES
00480 00768                        *      IN CONTROL CA1=END OF COUNT (EOC)
00490 00769                        *                 CA2=START OF COUNT (SOC)
00500 00770                        *
00510 00771A 879C CC   3636     A         LDD    ##$3636
00520 00772A 879F FD   7602     A         STD    CNTRAC
00530 00773                        *
00540 00774                        *     SET ALL OUTPUTS TO ZERO
00550 00775                        *
00560 00776A 87A2 CC   0000     A         LDD    #0
00570 00777A 87A5 FD   7600     A         STD    CNTRAD
00580 00778                        *
00590 00779                        *    NOW CLEAR THE IRQ FLAGS
00600 00780                        *
00610 00781A 87A8 FC   7700     A         LDD    ACNT
00620 00782A 87AB FC   7800     A         LDD    BCNT
00630 00783A 87AE FC   7900     A         LDD    CCNT
00640 00784A 87B1 FC   7600     A         LDD    CNTRAD
00650 00785                        *
00660 00786                        *    SET-UP LED PIA
00670 00787                        *
00680 00788A 87B4 CC   0000     A         LDD    #0
00690 00789A 87B7 FD   E002     A         STD    LEDS+2
00700 00790A 87BA FD   E000     A         STD    LEDS
00710 00791                        *
00720 00792A 87BD 7A   E001     A         DEC    LEDS+1
00730 00793A 87C0 CC   0434     A         LDD    ##$0434
00740 00794A 87C3 FD   E002     A         STD    LEDS+2
00750 00795A 87C6 7F   E001     A         CLR    LEDS+1
00760 00796A 87C9 39                      RTS
00010 00797                               TTL    MOTOR RESET

00030 00799                        ***********************************************
00040 00800                        *  COPYRIGHT BY ASM DIE BONDING INC.   1982
00050 00801                        *     SOFTWARE FOR THE D2KH DIE BONDER
00060 00802                        *            MTRST  REV.  2.0A
00070 00803                        *
00080 00804                        *  DISK ID          : VIDEO 1
00090 00805                        *  DATE             :
00100 00806                        *  DWG NO           :
00110 00807                        *  ASSM NUMBER      :
00120 00808                        *  EPROM ID TAG     :
00130 00809                        *  ORGINATOR        :
00140 00810                        *  REVISED          :
00150 00811                        ***********************************************
00160 00812                        * 1 SYNC WITH HOST
00170 00813                        ***********************************************
00180 00814                        *
00190 00815A 87CA BD   8EAF     A MTRST   JSR    PAGOFF
00200 00816A 87CD BD   8EB8     A         JSR    CLEAR
00210 00817A 87D0 8E   89FB     A         LDX    #MESS6
00220 00818A 87D3 BD   8F15     A         JSR    DISPLY
00230 00819A 87D6 BD   8EA6     A         JSR    PAGON
00240 00820                        *
00250 00821A 87D9 CC   0000     A         LDD    #0       SYNC WITH HOST
00260 00822A 87DC FD   6000     A         STD    HOSTAD
00270 00823A 87DF 7A   6001     A         DEC    HOSTBD
00280 00824A 87E2 CC   2424     A         LDD    ##$2424
00290 00825A 87E5 FD   6002     A         STD    HOSTAC
00300 00826                        *
00310 00827A 87E8 C6   09       A         LDB    #9
00320 00828A 87EA 8E   FFFF     A MTRST0  LDX    ##$FFFF
```

```
00829A 87ED 30   1F      A MTRST1 LEAX   -1,X
00830A 87EF 26   0B   87FC        BNE    MTRST2
00831A 87F1 5A                    DECB
00832A 87F2 26   F6   87EA        BNE    MTRST0
00833                      *
00834A 87F4 BD   8EB8    A        JSR    CLEAR
00835A 87F7 8E   8901    A        LDX    #MSYNC
00836A 87FA 20   22   881E        BRA    MERROR
00837                      *
00838A 87FC B6   6000    A MTRST2 LDA    HOSTAD   GET COMMAN
00839A 87FF 81   83      A        CMPA   #$83
00840A 8801 26   EA   87ED        BNE    MTRST1   NOT SYNC,LOOP
00841                      *
00842A 8803 B6   6001    A        LDA    HOSTBD   DUMMY READ
00843A 8806 86   85      A        LDA    #$85
00844A 8808 B7   6001    A        STA    HOSTBD
00845                      *
00846A 880B 8E   FFFF    A        LDX    #$FFFF
00847A 880E 30   1F      A MTRST3 LEAX   -1,X
00848A 8810 27   06   8818        BEQ    HACK
00849A 8812 7D   6003    A        TST    HOSTBC   REPLY ACK?
00850A 8815 2A   F7   880E        BPL    MTRST3   NO,LOOP
00851A 8817 39                    RTS
00852                      *
00853A 8818 BD   8EB8    A HACK   JSR    CLEAR
00854A 881B 8E   893B    A        LDX    #MACK
00855                      *
00856A 881E BD   8F15    A MERROR JSR    DISPLY

00857A 8821 20   FE   8821        BRA    *
00858                      *
00859                      ***********************************************
00860                      *
00861                      * SYNC MOTORS THEN RESET X-Y STAGE
00862                      *
00863                      ***********************************************
00864                      *
00865                      *  MOTOR CONTROL PIA SET-UP
00866                      *
00867A 8823 7D   6010    A MTRPIA TST    DIEEJT
00868A 8826 2A   04   882C        BPL    MTRPI1
00869A 8828 8E   88C5    A        LDX    #MDIE
00870A 882B 39                    RTS
00871                      *
00872A 882C CC   0000    A MTRPI1 LDD    #0
00873A 882F FD   602A    A        STD    XMTR+2
00874A 8832 FD   6022    A        STD    YMTR+2
00875A 8835 86   FF      A        LDA    #$FF
00876A 8837 B7   6029    A        STA    XMTR+1
00877A 883A B7   6021    A        STA    YMTR+1   SETUP FOR OUTPUT
00878                      * STORE $24 IN A&B CONTROL
00879A 883D CC   2424    A        LDD    #$2424
00880A 8840 FD   602A    A        STD    XMTR+2
00881A 8843 FD   6022    A        STD    YMTR+2
00882                      *
00883A 8846 86   83      A SYNC   LDA    #$83
00884A 8848 B7   6029    A        STA    XMTR+1
00885A 884B B7   6021    A        STA    YMTR+1
00886                      *
00887A 884E 8E   FFFF    A        LDX    #$FFFF
00888A 8851 30   1F      A SYNC1  LEAX   -1,X
00889                      *      BEQ    FAILX
00890A 8853 F6   6028    A        LDB    XMTR
00891A 8856 C1   8F      A        CMPB   #$8F     READY?
00892A 8858 26   F7   8851        BNE    SYNC1    NO,LOOP
00893                      *
00894A 885A 8E   FFFF    A        LDX    #$FFFF
00895A 885D 30   1F      A SYNC2  LEAX   -1,X
00896                      *      BEQ    FAILY
00897A 885F F6   6020    A        LDB    YMTR
00898A 8862 C1   8F      A        CMPB   #$8F
00899A 8864 26   F7   885D        BNE    SYNC2
00900                      *
```

```
00901A 8866 20   1A   8882          BRA    SETOK
00902                        *
00903A 8868 8E   FFFF    A FAILX  LDX    #$FFFF
00904A 886B 30   1F      A FAILX1 LEAX   -1,X
00905A 886D 27   0B   887A          BEQ    FAILXY
00906A 886F F6   6020    A          LDB    YMTR
00907A 8872 C1   8F      A          CMPB   #$8F
00908A 8874 26   F5   886B          BNE    FAILX1
00909                        *
00910A 8876 8E   8977    A          LDX    #MESS3
00911A 8879 39                      RTS
00912                        *
00913A 887A 8E   8999    A FAILXY LDX    #MESS4
00914A 887D 39                      RTS
00915                        *
00916A 887E 8E   89D9    A FAILY  LDX    #MESS5
00917A 8881 39                      RTS
00918                        *
00919A 8882 FC   1C72    A SETOK  LDD    XSPP+1
00920A 8885 DD   AB      A          STD    XSPTMP
00921A 8887 FC   1C75    A          LDD    YSPP+1
00922A 888A DD   AD      A          STD    YSPTMP
00923A 888C 17   04B3 8D42          LBSR   GTCEN
00924A 888F 8C   8097    A          CMPX   #REPLY0
00925A 8892 27   01   8895          BEQ    RST4
00926A 8894 39                      RTS
00927                        * THE STAGE WILL BE AT CENTER WHEN
00928                        * THE SUBROUTINE RETURNS
00929A 8895 86   01      A RST4   LDA    #1
00930A 8897 94   8D      A          ANDA   XSTR
00931A 8899 27   0A   88A5          BEQ    RST6       IF EQUAL MOVEX CCW
00932A 889B 86   50      A          LDA    #$50       IF N.E.  X DIRECTION CW
00933A 889D 97   8D      A          STA    XSTR
00934                        *
00935A 889F DC   AB      A RST5   LDD    XSPTMP
00936A 88A1 DD   8E      A          STD    XSTR+1     SET-UP X STRING
00937A 88A3 20   06   88AB          BRA    RST7       GO CHECK FOR Y
00938                        *
00939A 88A5 86   51      A RST6   LDA    #$51
00940A 88A7 97   8D      A          STA    XSTR       SET X DIR. CW
00941A 88A9 20   F4   889F          BRA    RST5
00942                        *
00943A 88AB 86   01      A RST7   LDA    #1
00944A 88AD 94   90      A          ANDA   YSTR
00945A 88AF 27   0A   88BB          BEQ    RST9       IF = Y EQUALS CW
00946                        *
00947A 88B1 86   50      A          LDA    #$50
00948A 88B3 97   90      A          STA    YSTR
00949A 88B5 DC   AD      A RST8   LDD    YSPTMP
00950A 88B7 DD   91      A          STD    YSTR+1
00951A 88B9 20   06   88C1          BRA    RST10
00952                        *
00953A 88BB 86   51      A RST9   LDA    #$51
00954A 88BD 97   90      A          STA    YSTR
00955A 88BF 20   F4   88B5          BRA    RST8
00956                        *
00957A 88C1 BD   8C79    A RST10  JSR    MOVEXY
00958A 88C4 39                      RTS
00959                        *
00960A 88C5      D4      A MDIE   FCB    $D4,$A
00961A 88C7      20      A          FCC    "  THE DIE EJECTOR PIN IS UP"
00962A 88E2      0A      A          FCB    $A,$A
00963A 88E4      20      A          FCC    "  ***RESET AND TRY AGAIN***"
00964A 88FF      D4      A          FCB    $D4,4
00965                        *
00966A 8901      0A      A MSYNC  FCB    $A
00967A 8902      20      A          FCC    "  SYNC COMMAND NOT RECEIVED"
00968A 891D      0A      A          FCB    $A,$A
00969A 891F      20      A          FCC    "  ***RESET AND TRY AGAIN***"
00970A 893A      04      A          FCB    4
00971                        *
00972A 893B      0A      A MACK   FCB    $A
```

```
01770 00973A 893C     20    A          FCC    "   SYNC ACCEPT COMMAND ERROR"
01780 00974A 8958     0A    A          FCB    $A,$A
01790 00975A 895A     20    A          FCC    "   ***RESET AND TRY AGAIN***"
01800 00976A 8976     04    A          FCB    4
01810 00977                  *
01820 00978A 8977     D4    A MESS3    FCB    $D4,$A
01830 00979A 8979     20    A          FCC    " WAFER STAGE X MOTOR NOT SYNC"
01840 00980A 8996     0A    A          FCB    $A,$D4,4
01850 00981                  *
01860 00982A 8999     D4    A MESS4    FCB    $D4,$A
01870 00983A 899B     20    A          FCC    " WAFER STAGE X MOTOR NOT SYNC"
01880 00984A 89B8     0A    A          FCB    $A
01890 00985A 89B9     20    A          FCC    ." WAFER STAGE Y MOTOR NOT SYNC"
01900 00986A 89D6     0A    A          FCB    $A,$D4,4
01910 00987                  *
01920 00988A 89D9     D4    A MESS5    FCB    $D4,$A
01930 00989A 89DB     20    A          FCC    " WAFER STAGE Y MOTOR NOT SYNC"
01940 00990A 89F8     0A    A          FCB    $A,$D4,4
01950 00991                  *
01960 00992A 89FB     0A    A MESS6    FCB    $A
01970 00993A 89FC     20    A          FCC    "      MOTORS ARE BEING RESET"
01980 00994A 8A17     0A    A          FCB    $A,$A
01990 00995A 8A19     20    A          FCC    " ***WARNING MOTORS WILL MOVE***
02000 00996A 8A38     04    A          FCB    4
00010 00997                            TTL    MOTOR DRIVER

00030 00999                  ***************************************************
00040 01000                  *  COPYRIGHT BY ASM DIE BONDING INC.   1982
00050 01001                  *     SOFTWARE FOR THE D2KH DIE BONDER
00060 01002                  *            MOTOR  REV. 2.0A
00070 01003                  *
00080 01004                  *  DISK ID          : VIDEO 1
00090 01005                  *  DATE             :
00100 01006                  *  DWG NO           :
00110 01007                  *  ASSM NUMBER      :
00120 01008                  *  EPROM ID TAG     :
00130 01009                  *  ORGINATOR        :
00140 01010                  *  REVISED          :
00150 01011                  ***************************************************
00160 01012                  *
00170 01013                  *  OUTPUT COMMAN TO MOTORS SUBROUTINE
00180 01014                  *
00190 01015                  * RETURNS WITH "X"#REPLY0 MOTOR ERROR
00200 01016                  *         AND "A"=0 MOVEN OK
00210 01017                  *                 1 MOVEX LMT REACHED
00220 01018                  *                 2 MOVEY LMT REACHED
00230 01019                  *                 3 MOVEXY LMT REACHED
00240 01020                  *
00250 01021                  SUBTR  MACR
      01022                  0260         LDU    #\0
      01023                  0270         LDY    #YMAX2
      01024                  0280         LDX    #XMAX2
      01025                  0290         LDD    2,X      X^2 LSD
      01026                  0300         ADDD   2,Y      Y^2 LSD
      01027                  0310         STD    TEMP1+2
      01028                  0320         LDD    ,X       X^2 MSD
      01029                  0330         BCC    \.0      CARRY?
      01030                  0340         ADDD   #1       YES
      01031                  0350 \.0     ADDD   ,Y       X^2+Y^2=TEMP1
      01032                  0360         STD    TEMP1
      01033                  0370         LDD    2,U      R^2-(X^2+Y^2)
      01034                  0380         SUBD   TEMP1+2
      01035                  0390         LDD    ,U
      01036                  0400         BCC    \.1      BORROW?
      01037                  0410         SUBD   #1       YES
      01038                  0420 \.1     SUBD   TEMP1
      01039                  0430         ENDM
00440 01040                  *
00450 01041                  CPOLL  MACR
      01042                  0460         LDY    #\0
      01043                  0470         JSR    POLL
      01044                  0480         CMPX   #REPLY0
      01045                  0490         BEQ    *+3
```

```
        01046                          0500         RTS
        01047                          0510         ENDM
00520 01048                            *
00530 01049                            *
00540 01050                            *
00550 01051A 8A39 BD   8B2F     A MOVEX   JSR     UPDATX
00560 01052A 8A3C 8C   8097     A         CMPX    #REPLY0
00570 01053A 8A3F 27   01    8A42         BEQ     MOVEX1
00580 01054A 8A41 39                      RTS
00590 01055                            *
00600 01056A 8A42 7D   1C1C     A MOVEX1  TST     PARTFL+1

00610 01057A 8A45 26   08    8A4F         BNE     MOVEX2
00620 01058                            *
00630 01059A 8A47 FC   1C6C     A         LDD     MAXMAT+2
00640 01060A 8A4A 1093 A5       A         CMPD    XTEMP
00650 01061A 8A4D 20   3E    8A8D         BRA     MOVEX3
00660 01062                            *
00670 01063A 8A4F 8E   00A5     A MOVEX2  LDX     #XTEMP
00680 01064A 8A52 1F   12       A         TFR     X,Y
00690 01065A 8A54 CE   0093     A         LDU     #XMAX2
00700 01066A 8A57 BD   8D13     A         JSR     MULT
00710 01067A 8A5A 8E   1C75     A         LDX     #YSPP+1
00720 01068A 8A5D 1F   12       A         TFR     X,Y
00730 01069A 8A5F CE   0097     A         LDU     #YMAX2
00740 01070A 8A62 BD   8D13     A         JSR     MULT
00750 01071A 8A65                         SUBTR   MAXR
00750        A 8A65 CE   1C66     A         LDU     #MAXR
00750        A 8A68 108E 0097     A         LDY     #YMAX2
00750        A 8A6C 8E   0093     A         LDX     #XMAX2
00750        A 8A6F EC   02       A         LDD     2,X       X^2 LSD
00750        A 8A71 E3   22       A         ADDD    2,Y       Y^2 LSD
00750        A 8A73 DD   A3       A         STD     TEMP1+2
00750        A 8A75 EC   84       A         LDD     ,X        X^2 MSD
00750        A 8A77 24   03    8A7C         BCC     .00000    CARRY?
00750        A 8A79 C3   0001     A         ADDD    #1        YES
00750        A 8A7C E3   A4       A .00000  ADDD    ,Y        X^2+Y^2=TEMP1
00750        A 8A7E DD   A1       A         STD     TEMP1
00750        A 8A80 EC   42       A         LDD     2,U       R^2-(X^2+Y^2)
00750        A 8A82 93   A3       A         SUBD    TEMP1+2
00750        A 8A84 EC   C4       A         LDD     ,U
00750        A 8A86 24   03    8A8B         BCC     .00001    BORROW?
00750        A 8A88 83   0001     A         SUBD    #1        YES
00750        A 8A8B 93   A1       A .00001  SUBD    TEMP1
00760 01072                            *
00770 01073A 8A8D 25   19    8AA8 MOVEX3  BCS     TOFARX    TO FAR X
00780 01074A 8A8F BD   8AAE     A         JSR     MOVX
00790 01075A 8A92 8C   8097     A         CMPX    #REPLY0
00800 01076A 8A95 27   01    8A98         BEQ     MOVEX4
00810 01077A 8A97 39                      RTS
00820 01078                            *
00830 01079A 8A98 BD   8B00     A MOVEX4  JSR     MOVXOK
00840 01080A 8A9B 8C   8097     A         CMPX    #REPLY0
00850 01081A 8A9E 27   01    8AA1         BEQ     MOVEX5
00860 01082A 8AA0 39                      RTS
00870 01083                            *
00880 01084A 8AA1 DC   A5       A MOVEX5  LDD     XTEMP
00890 01085A 8AA3 FD   1C72     A         STD     XSPP+1
00900 01086A 8AA6 4F                      CLRA
00910 01087A 8AA7 39                      RTS
00920 01088                            *
00930 01089                            *
00940 01090                            *
00950 01091A 8AA8 86   01       A TOFARX  LDA     #$1
00960 01092A 8AAA 8E   8097     A         LDX     #REPLY0
00970 01093A 8AAD 39                      RTS
00980 01094                            *
00990 01095A 8AAE 8E   008D     A MOVX    LDX     #XSTR
01000 01096A 8AB1 FC   602A     A         LDD     XMTR+2
01010 01097A 8AB4 1083 24A4     A         CMPD    #$24A4

01020 01098A 8AB8 27   04    8ABE         BEQ     MOVX1
01030 01099A 8ABA 8E   81E1     A         LDX     #REPYHX   HARD ERROR WITH XMOTOR
```

```
01040 01100A 8ABD 39                    RTS
01050 01101                     *
01060 01102A 8ABE B6    6029     A MOVX1  LDA    XMTR+1   DUMMY READ
01070 01103A 8AC1 A6    80       A        LDA    ,X+
01080 01104A 8AC3 B7    6029     A        STA    XMTR+1   OUTPUT COMMAND
01090 01105                     *
01100 01106A 8AC6 108E FFFF      A        LDY    #$FFFF
01110 01107A 8ACA 31    3F       A MOVX2  LEAY   -1,Y
01120 01108A 8ACC 26    04   8AD2         BNE    MOVX3
01130 01109A 8ACE 8E    820D     A        LDX    #REPYAX  XMOTOR DID NOT ACK CMD
01140 01110A 8AD1 39                      RTS
01150 01111                     *
01160 01112A 8AD2 B6    602B     A MOVX3  LDA    XMTR+3
01170 01113A 8AD5 81    24       A        CMPA   #$24
01180 01114A 8AD7 27    F1   8ACA         BEQ    MOVX2
01190 01115                     *
01200 01116A 8AD9 8C    0090     A        CMPX   #XSTR+3
01210 01117A 8ADC 26    E0   8ABE         BNE    MOVX1
01220 01118                     *
01230 01119A 8ADE 108E FFFF      A        LDY    #$FFFF
01240 01120A 8AE2 31    3F       A MOVX4  LEAY   -1,Y
01250 01121A 8AE4 26    04   8AEA         BNE    MOVX5
01260 01122A 8AE6 8E    8240     A        LDX    #REPYBX  XMOTOR DID NOT GO BUSY
01270 01123A 8AE9 39                      RTS
01280 01124                     *
01290 01125A 8AEA B6    602A     A MOVX5  LDA    XMTR+2
01300 01126A 8AED 81    24       A        CMPA   #$24
01310 01127A 8AEF 27    F1   8AE2         BEQ    MOVX4
01320 01128                     *
01330 01129A 8AF1 B6    6028     A        LDA    XMTR
01340 01130A 8AF4 81    82       A        CMPA   #$82
01350 01131A 8AF6 27    04   8AFC         BEQ    MOVX6
01360 01132A 8AF8 8E    8240     A        LDX    #REPYBX  XMOTOR DID NOT GO BUSY
01370 01133A 8AFB 39                      RTS
01380 01134                     *
01390 01135A 8AFC 8E    8097     A MOVX6  LDX    #REPLY0
01400 01136A 8AFF 39                      RTS
01410 01137                     *
01420 01138                     *
01430 01139                     *
01440 01140             8B00     A MOVXOK EQU    *
01450 01141A 8B00 DC    8E       A MOVX01 LDD    XSTR+1
01460 01142A 8B02 108E 0090      A MOVX02 LDY    #$90
01470 01143A 8B06 31    3F       A MOVX03 LEAY   -1,Y
01480 01144A 8B08 26    09   8B13         BNE    MOVX04
01490 01145A 8B0A 83    0001     A        SUBD   #1
01500 01146A 8B0D 26    F3   8B02         BNE    MOVX02
01510 01147A 8B0F 8E    826C     A        LDX    #REPYRX  XMOTOR DID NOT GO READ'
01520 01148A 8B12 39                      RTS
01530 01149                     *
01540 01150A 8B13 7D    602A     A MOVX04 TST    XMTR+2
01550 01151A 8B16 2A    EE   8B06         BPL    MOVX03
01560 01152                     *
01570 01153A 8B18 B6    6028     A        LDA    XMTR
01580 01154A 8B1B 81    8F       A        CMPA   #$8F
01590 01155A 8B1D 26    04   8B23         BNE    MOVX05
01600 01156A 8B1F 8E    8097     A        LDX    #REPLY0
01610 01157A 8B22 39                      RTS
01620 01158                     *
01630 01159A 8B23 81    C2       A MOVX05 CMPA   #$C2
01640 01160A 8B25 26    04   8B2B         BNE    MOVX06
01650 01161A 8B27 8E    8299     A        LDX    #REPYLX  XMOTOR HIT LIMIT SW
01660 01162A 8B2A 39                      RTS
01670 01163                     *
01680 01164A 8B2B 8E    81E1     A MOVX06 LDX    #REPYHX  HARD ERROR WITH XMOTOR
01690 01165A 8B2E 39                      RTS
01700 01166                     *
01710 01167                     *
01720 01168                     *
01730 01169A 8B2F                 UPDATX CPOLL  XMTR
01730      A 8B2F 108E 6028      A        LDY    #XMTR
01730      A 8B33 BD    8E1B     A        JSR    POLL
01730      A 8B36 8C    8097     A        CMPX   #REPLY0
```

```
01730         A 8B39 27    01    8B3C          BEQ    *+3
01730         A 8B3B 39                        RTS
01740 01170A 8B3C 49                           ROLA              C < 7 - 0 < C
01750 01171A 8B3D 49                           ROLA              C < 7 - 0 < C
01760 01172A 8B3E 98    8D       A             EORA   XSTR
01770 01173A 8B40 44                           LSRA              0 > 7 - 0 > C
01780 01174A 8B41 24    07    8B4A             BCC    UPDTX1     DO A SUB
01790 01175                          *
01800 01176A 8B43 FC    1C72     A             LDD    XSPP+1     DO A ADD
01810 01177A 8B46 D3    8E       A             ADDD   XSTR+1
01820 01178A 8B48 20    0C    8B56             BRA    UPDTX2
01830 01179                          *
01840 01180A 8B4A FC    1C72     A UPDTX1      LDD    XSPP+1
01850 01181A 8B4D 93    8E       A             SUBD   XSTR+1
01860 01182A 8B4F 24    05    8B56             BCC    UPDTX2     BORROW?
01870 01183A 8B51 43                           COMA              YES, HAVE CROSSED
01880 01184A 8B52 53                           COMB              ZERO POINT
01890 01185A 8B53 C3    0001     A             ADDD   #1
01900 01186                          *
01910 01187A 8B56 DD    A5       A UPDTX2      STD    XTEMP
01920 01188A 8B58 39                           RTS
01930 01189                          *
01940 01190                          *
01950 01191                          *
01960 01192A 8B59 BD    8C4F     A MOVEY       JSR    UPDATY
01970 01193A 8B5C 8C    8097     A             CMPX   #REPLY0
01980 01194A 8B5F 27    01    8B62             BEQ    MOVEY1
01990 01195A 8B61 39                           RTS
02000 01196                          *
02010 01197A 8B62 7D    1C1C     A MOVEY1      TST    PARTFL+1
02020 01198A 8B65 26    08    8B6F             BNE    MOVEY2
02030 01199                          *
02040 01200A 8B67 FC    1C6C     A             LDD    MAXMAT+2
02050 01201A 8B6A 1093 A7        A             CMPD   YTEMP
02060 01202A 8B6D 20    3E    8BAD             BRA    MOVEY3
02070 01203                          *
02080 01204A 8B6F 8E    00A7     A MOVEY2      LDX    #YTEMP
02090 01205A 8B72 1F    12       A             TFR    X,Y
02100 01206A 8B74 CE    0097     A             LDU    #YMAX2
02110 01207A 8B77 BD    8D13     A             JSR    MULT
02120 01208A 8B7A 8E    1C72     A             LDX    #XSPP+1
02130 01209A 8B7D 1F    12       A             TFR    X,Y
02140 01210A 8B7F CE    0093     A             LDU    #XMAX2
02150 01211A 8B82 BD    8D13     A             JSR    MULT
02160 01212A 8B85                              SUBTR  MAXR
02160         A 8B85 CE    1C66     A          LDU    #MAXR
02160         A 8B88 108E 0097      A          LDY    #YMAX2
02160         A 8B8C 8E    0093     A          LDX    #XMAX2
02160         A 8B8F EC    02       A          LDD    2,X        X^2 LSD
02160         A 8B91 E3    22       A          ADDD   2,Y        Y^2 LSD
02160         A 8B93 DD    A3       A          STD    TEMP1+2
02160         A 8B95 EC    84       A          LDD    ,X         X^2 MSD
02160         A 8B97 24    03    8B9C          BCC    .00002     CARRY?
02160         A 8B99 C3    0001     A          ADDD   #1         YES
02160         A 8B9C E3    A4       A .00002   ADDD   ,Y         X^2+Y^2=TEMP1
02160         A 8B9E DD    A1       A          STD    TEMP1
02160         A 8BA0 EC    42       A          LDD    2,U        R^2-(X^2+Y^2)
02160         A 8BA2 93    A3       A          SUBD   TEMP1+2
02160         A 8BA4 EC    C4       A          LDD    ,U
02160         A 8BA6 24    03    8BAB          BCC    .00003     BORROW?
02160         A 8BA8 83    0001     A          SUBD   #1         YES
02160         A 8BAB 93    A1       A .00003   SUBD   TEMP1
02170 01213                          *
02180 01214A 8BAD 25    19    8BC8 MOVEY3      BCS    TOFARY
02190 01215A 8BAF BD    8BCE     A             JSR    MOVY
02200 01216A 8BB2 8C    8097     A             CMPX   #REPLY0
02210 01217A 8BB5 27    01    8BB8             BEQ    MOVEY4
02220 01218A 8BB7 39                           RTS
02230 01219                          *
02240 01220A 8BB8 BD    8C20     A MOVEY4      JSR    MOVYOK
02250 01221A 8BBB 8C    8097     A             CMPX   #REPLY0
02260 01222A 8BBE 27    01    8BC1             BEQ    MOVEY5
02270 01223A 8BC0 39                           RTS
```

```
                        *
A 8BC1 DC    A7       A MOVEY5 LDD    YTEMP
A 8BC3 FD    1C75     A        STD    YSPP+1
A 8BC6 4F                      CLRA
A 8BC7 39                      RTS
                        *
A 8BC8 86    02       A TOFARY LDA    #2
A 8BCA 8E    8097     A        LDX    #REPLY0
A 8BCD 39                      RTS
                        *
A 8BCE 8E    0090     A MOVY   LDX    #YSTR
A 8BD1 FC    6022     A        LDD    YMTR+2
A 8BD4 1083  24A4     A        CMPD   #$24A4
A 8BD8 27    04   8BDE         BEQ    MOVY1
A 8BDA 8E    82C6     A        LDX    #REPYHY  HARD ERROR WITH YMOTOR
A 8BDD 39                      RTS
                        *
A 8BDE B6    6021     A MOVY1  LDA    YMTR+1   DUMMY READ
A 8BE1 A6    80       A        LDA    ,X+
A 8BE3 B7    6021     A        STA    YMTR+1   OUTPUT COMMAND
                        *
A 8BE6 108E  FFFF     A        LDY    #$FFFF
A 8BEA 31    3F       A MOVY2  LEAY   -1,Y
A 8BEC 26    04   8BF2         BNE    MOVY3
A 8BEE 8E    82F2     A        LDX    #REPYAY  YMOTOR DID NOT ACK CMD
A 8BF1 39                      RTS
                        *
A 8BF2 B6    6023     A MOVY3  LDA    YMTR+3
A 8BF5 81    24       A        CMPA   #$24
A 8BF7 27    F1   8BEA         BEQ    MOVY2
                        *
A 8BF9 8C    0093     A        CMPX   #YSTR+3
A 8BFC 26    E0   8BDE         BNE    MOVY1
                        *
A 8BFE 108E  FFFF     A        LDY    #$FFFF
A 8C02 31    3F       A MOVY4  LEAY   -1,Y
A 8C04 26    04   8C0A         BNE    MOVY5
A 8C06 8E    8325     A        LDX    #REPYBY  YMOTOR DID NOT GO BUSY
A 8C09 39                      RTS
                        *
A 8C0A B6    6022     A MOVY5  LDA    YMTR+2
A 8C0D 81    24       A        CMPA   #$24
A 8C0F 27    F1   8C02         BEQ    MOVY4
                        *
A 8C11 B6    6020     A        LDA    YMTR
A 8C14 81    82       A        CMPA   #$82
A 8C16 27    04   8C1C         BEQ    MOVY6
A 8C18 8E    8325     A        LDX    #REPYBY  YMOTOR DID NOT SEND BU:
A 8C1B 39                      RTS
                        *
A 8C1C 8E    8097     A MOVY6  LDX    #REPLY0
A 8C1F 39                      RTS
                        *
                        *
                        *
             8C20     A MOVYOK EQU    *
A 8C20 DC    91       A MOVYO1 LDD    YSTR+1
A 8C22 108E  0090     A MOVYO2 LDY    #$90
A 8C26 31    3F       A MOVYO3 LEAY   -1,Y
A 8C28 26    09   8C33         BNE    MOVYO4
A 8C2A 83    0001     A        SUBD   #1
A 8C2D 26    F3   8C22         BNE    MOVYO2
A 8C2F 8E    8351     A        LDX    #REPYRY  YMOTOR DID NOT GO READY
A 8C32 39                      RTS
                        *
A 8C33 7D    6022     A MOVYO4 TST    YMTR+2
A 8C36 2A    EE   8C26         BPL    MOVYO3
                        *
A 8C38 B6    6020     A        LDA    YMTR
A 8C3B 81    8F       A        CMPA   #$8F
A 8C3D 26    04   8C43         BNE    MOVYO5
A 8C3F 8E    8097     A        LDX    #REPLY0
A 8C42 39                      RTS
```

```
03010 01297                        *
03020 01298A 8C43 81   C2       A MOVYO5 CMPA    #$C2
03030 01299A 8C45 26   04   8C4B         BNE     MOVYO6
03040 01300A 8C47 8E   837E     A        LDX     #REPYLY  YMOTOR HIT LIMIT SW
03050 01301A 8C4A 39                     RTS
03060 01302                        *
03070 01303A 8C4B 8E   82C6     A MOVYO6 LDX     #REPYHY  HARD ERROR WITH YMOTOR
03080 01304A 8C4E 39                     RTS
03090 01305                        *
03100 01306                        *
03110 01307                        *
03120 01308A 8C4F                 UPDATY CPOLL   YMTR
03120       A 8C4F 108E 6020    A        LDY     #YMTR
03120       A 8C53 BD   8E1B    A        JSR     POLL
03120       A 8C56 8C   8097    A        CMPX    #REPLY0
03120       A 8C59 27   01   8C5C        BEQ     *+3
03120       A 8C5B 39                    RTS
03130 01309A 8C5C 49                     ROLA
03140 01310A 8C5D 49                     ROLA
03150 01311A 8C5E 98   90       A        EORA    YSTR
03160 01312A 8C60 44                     LSRA
03170 01313A 8C61 24   07   8C6A         BCC     UPDTY1
03180 01314                        *
03190 01315A 8C63 FC   1C75     A        LDD     YSPP+1
03200 01316A 8C66 D3   91       A        ADDD    YSTR+1
03210 01317A 8C68 20   0C   8C76         BRA     UPDTY2
03220 01318                        *
03230 01319A 8C6A FC   1C75     A UPDTY1 LDD     YSPP+1
03240 01320A 8C6D 93   91       A        SUBD    YSTR+1
03250 01321A 8C6F 24   05   8C76         BCC     UPDTY2   BORROW?
03260 01322A 8C71 43                     COMA
03270 01323A 8C72 53                     COMB
03280 01324A 8C73 C3   0001     A        ADDD    #1
03290 01325                        *
03300 01326A 8C76 DD   A7       A UPDTY2 STD     YTEMP
03310 01327A 8C78 39                     RTS
03320 01328                        *
03330 01329                        *
03340 01330                        *
03350 01331A 8C79 BD   8B2F     A MOVEXY JSR     UPDATX
03360 01332A 8C7C 8C   8097     A        CMPX    #REPLY0
03370 01333A 8C7F 27   01   8C82         BEQ     MOVXY1
03380 01334A 8C81 39                     RTS
03390 01335                        *
03400 01336A 8C82 BD   8C4F     A MOVXY1 JSR     UPDATY
03410 01337A 8C85 8C   8097     A        CMPX    #REPLY0
03420 01338A 8C88 27   01   8C8B         BEQ     MOVXY2
03430 01339A 8C8A 39                     RTS
03440 01340                        *
03450 01341A 8C8B 7D   1C1C     A MOVXY2 TST     PARTFL+1
03460 01342A 8C8E 26   0D   8C9D         BNE     MOVXY3
03470 01343                        *
03480 01344A 8C90 FC   1C6C     A        LDD     MAXMAT+2
03490 01345A 8C93 1093 A5       A        CMPD    XTEMP
03500 01346A 8C96 25   75   8D0D         BCS     OPPXY
03510 01347A 8C98 1093 A7       A        CMPD    YTEMP
03520 01348A 8C9B 20   3E   8CDB         BRA     MOVXY4
03530 01349                        *
03540 01350A 8C9D 8E   00A5     A MOVXY3 LDX     #XTEMP
03550 01351A 8CA0 1F   12       A        TFR     X,Y
03560 01352A 8CA2 CE   0093     A        LDU     #XMAX2
03570 01353A 8CA5 BD   8D13     A        JSR     MULT
03580 01354A 8CA8 8E   00A7     A        LDX     #YTEMP
03590 01355A 8CAB 1F   12       A        TFR     X,Y
03600 01356A 8CAD CE   0097     A        LDU     #YMAX2
03610 01357A 8CB0 BD   8D13     A        JSR     MULT
03620 01358A 8CB3                        SUBTR   MAXR
03620       A 8CB3 CE   1C66    A        LDU     #MAXR
03620       A 8CB6 108E 0097    A        LDY     #YMAX2
```

```
03620       A 8CBA 8E   0093    A         LDX    #XMAX2
03620       A 8CBD EC   02      A         LDD    2,X       X^2 LSD
03620       A 8CBF E3   22      A         ADDD   2,Y       Y^2 LSD
03620       A 8CC1 DD   A3      A         STD    TEMP1+2
03620       A 8CC3 EC   84      A         LDD    ,X        X^2 MSD
03620       A 8CC5 24   03   8CCA         BCC    .00004    CARRY?
03620       A 8CC7 C3   0001    A         ADDD   #1        YES
03620       A 8CCA E3   A4      A .00004  ADDD   ,Y        X^2+Y^2=TEMP1
03620       A 8CCC DD   A1      A         STD    TEMP1
03620       A 8CCE EC   42      A         LDD    2,U       R^2-(X^2+Y^2)
03620       A 8CD0 93   A3      A         SUBD   TEMP1+2
03620       A 8CD2 EC   C4      A         LDD    ,U
03620       A 8CD4 24   03   8CD9         BCC    .00005    BORROW?
03620       A 8CD6 83   0001    A         SUBD   #1        YES
03620       A 8CD9 93   A1      A .00005  SUBD   TEMP1
03630 01359                      *
03640 01360A 8CDB 25    30   8D0D MOVXY4  BCS    OPPXY
03650 01361A 8CDD BD    8AAE    A         JSR    MOVX
03660 01362A 8CE0 8C    8097    A         CMPX   #REPLY0
03670 01363A 8CE3 27    01   8CE6         BEQ    *+3
03680 01364A 8CE5 39                      RTS
03690 01365                      *
03700 01366A 8CE6 BD    8BCE    A         JSR    MOVY
03710 01367A 8CE9 8C    8097    A         CMPX   #REPLY0
03720 01368A 8CEC 27    01   8CEF         BEQ    *+3
03730 01369A 8CEE 39                      RTS
03740 01370                      *
03750 01371A 8CEF BD    8B00    A         JSR    MOVXOK
03760 01372A 8CF2 8C    8097    A         CMPX   #REPLY0
03770 01373A 8CF5 27    01   8CF8         BEQ    *+3
03780 01374A 8CF7 39                      RTS
03790 01375                      *
03800 01376A 8CF8 BD    8C20    A         JSR    MOVYOK
03810 01377A 8CFB 8C    8097    A         CMPX   #REPLY0
03820 01378A 8CFE 27    01   8D01         BEQ    *+3
03830 01379A 8D00 39                      RTS
03840 01380                      *
03850 01381A 8D01 DC    A5      A         LDD    XTEMP
03860 01382A 8D03 FD    1C72    A         STD    XSPP+1
03870 01383A 8D06 DC    A7      A         LDD    YTEMP
03880 01384A 8D08 FD    1C75    A         STD    YSPP+1
03890 01385A 8D0B 4F                      CLRA
03900 01386A 8D0C 39                      RTS
03910 01387                      *
03920 01388A 8D0D 8E    8097    A OPPXY   LDX    #REPLY0
03930 01389A 8D10 86    03      A         LDA    #3
03940 01390A 8D12 39                      RTS
03950 01391                      *
03960 01392                      *
03970 01393                      * MULTIPLY TWO POSITIVE 16 BIT
03980 01394                      * TO GET A 32 BIT PRODUCT
03990 01395                      * SET-UP "X" &"Y" TO BE MULTIPLY
04000 01396                      *               "U" FOR STORING THE RESULT
04010 01397A 8D13 6F    C4      A MULT    CLR    ,U
04020 01398A 8D15 6F    41      A         CLR    1,U
04030 01399A 8D17 A6    01      A         LDA    1,X
04040 01400A 8D19 E6    21      A         LDB    1,Y
04050 01401A 8D1B 3D                      MUL
04060 01402A 8D1C ED    42      A         STD    2,U
04070 01403A 8D1E A6    84      A         LDA    ,X
04080 01404A 8D20 E6    21      A         LDB    1,Y
04090 01405A 8D22 3D                      MUL
04100 01406A 8D23 E3    41      A         ADDD   1,U
04110 01407A 8D25 ED    41      A         STD    1,U
04120 01408A 8D27 24    02   8D2B         BCC    MUL1
04130 01409A 8D29 6C    C4      A         INC    ,U
04140 01410A 8D2B A6    01      A MUL1    LDA    1,X
04150 01411A 8D2D E6    A4      A         LDB    ,Y
04160 01412A 8D2F 3D                      MUL
04170 01413A 8D30 E3    41      A         ADDD   1,U
04180 01414A 8D32 ED    41      A         STD    1,U
04190 01415A 8D34 24    02   8D38         BCC    MUL2
04200 01416A 8D36 6C    C4      A         INC    ,U
```

```
04210 01417A 8D38 A6    84       A MUL2   LDA    ,X
04220 01418A 8D3A E6    A4       A        LDB    ,Y
04230 01419A 8D3C 3D                      MUL
04240 01420A 8D3D E3    C4       A        ADDD   ,U
04250 01421A 8D3F ED    C4       A        STD    ,U
04260 01422A 8D41 39                      RTS
04270 01423                        *
00010 01424                               TTL    GET CENTER

00030 01426                        ***********************************************
00040 01427                        * COPYRIGHT BY ELMONT INTERNATIONAL INC. 1981
00050 01428                        *   VIDEO SOFTWARE FOR THE D2K DIE BONDER
00060 01429                        *             GTCEN  REV. 2.0A
00070 01430                        *
00080 01431                        *  DISK ID    : VIDEO 1
00090 01432                        *  DATE       :
00100 01433                        *  DWG NO     :
00110 01434                        *  ORGINATOR  :
00120 01435                        ***********************************************
00130 01436                        *     THIS SUBROUTINE WILL MOVE X-Y STAGE
00140 01437                        *     TO CENTER    CLEAR LOAD POINT FLAG
00150 01438                        *                  CLEAR X-Y STAGE
00160 01439                        ***********************************************
00170 01440                        *
00180 01441A 8D42                  GTCEN  CPOLL  XMTR
00180        A 8D42 108E 6028    A        LDY    #XMTR
00180        A 8D46 BD   8E1B    A        JSR    POLL
00180        A 8D49 8C   8097    A        CMPX   #REPLY0
00180        A 8D4C 27   01   8D4F        BEQ    *+3
00180        A 8D4E 39                    RTS
00190 01442A 8D4F 4D                      TSTA
00200 01443A 8D50 2B    0C   8D5E         BMI    CCWX
00210 01444                        *
00220 01445A 8D52 FC    8E15     A CWX    LDD    MOVE1
00230 01446A 8D55 DD    8D       A        STD    XSTR
00240 01447A 8D57 B6    8E17     A        LDA    MOVE1+2
00250 01448A 8D5A 97    8F       A        STA    XSTR+2
00260 01449A 8D5C 20    0A   8D68         BRA    GTCEN1
00270 01450                        *
00280 01451A 8D5E FC    8E18     A CCWX   LDD    MOVE2
00290 01452A 8D61 DD    8D       A        STD    XSTR
00300 01453A 8D63 B6    8E1A     A        LDA    MOVE2+2
00310 01454A 8D66 97    8F       A        STA    XSTR+2
00320 01455                        *
00330 01456A 8D68                  GTCEN1 CPOLL  YMTR
00330        A 8D68 108E 6020    A        LDY    #YMTR
00330        A 8D6C BD   8E1B    A        JSR    POLL
00330        A 8D6F 8C   8097    A        CMPX   #REPLY0
00330        A 8D72 27   01   8D75        BEQ    *+3
00330        A 8D74 39                    RTS
00340 01457A 8D75 4D                      TSTA
00350 01458A 8D76 2B    0C   8D84         BMI    CCWY
00360 01459                        *
00370 01460A 8D78 FC    8E15     A CWY    LDD    MOVE1
00380 01461A 8D7B DD    90       A        STD    YSTR
00390 01462A 8D7D B6    8E17     A        LDA    MOVE1+2
00400 01463A 8D80 97    92       A        STA    YSTR+2
00410 01464A 8D82 20    0A   8D8E         BRA    GTCEN2
00420 01465                        *
00430 01466A 8D84 FC    8E18     A CCWY   LDD    MOVE2
00440 01467A 8D87 DD    90       A        STD    YSTR
00450 01468A 8D89 B6    8E1A     A        LDA    MOVE2+2
00460 01469A 8D8C 97    92       A        STA    YSTR+2
00470 01470                        *
00480 01471                        * OUTPUT COMMAN TO X MOTOR
00490 01472                        *
00500 01473A 8D8E BD    8AAE     A GTCEN2 JSR    MOVX

00510 01474A 8D91 8C    8097     A        CMPX   #REPLY0
00520 01475A 8D94 27    01   8D97         BEQ    *+3
00530 01476A 8D96 39                      RTS
00540 01477A 8D97 BD    8BCE     A        JSR    MOVY
00550 01478A 8D9A 8C    8097     A        CMPX   #REPLY0
00560 01479A 8D9D 27    01   8DA0         BEQ    *+3
```

```
01480A 8D9F 39                        RTS
01481                          *
01482A 8DA0 86   20       A GTCEN4 LDA     #$20
01483A 8DA2 8E   FFFF     A GTCEN5 LDX     #$FFFF
01484A 8DA5 30   1F       A GTCEN6 LEAX    -1,X
01485A 8DA7 26   07   8DB0         BNE     GTCEN7
01486A 8DA9 4A                     DECA
01487A 8DAA 26   F6   8DA2         BNE     GTCEN5
01488A 8DAC 8E   83AB     A        LDX     #REPYPW  TIME OUT FOR X/Y TO GO
01489A 8DAF 39                     RTS
01490                          *
01491A 8DB0 7D   602A     A GTCEN7 TST     XMTR+2
01492A 8DB3 2B   1F   8DD4         BMI     GTCENC
01493A 8DB5 7D   6022     A        TST     YMTR+2
01494A 8DB8 2B   05   8DBF         BMI     GTCEN9
01495A 8DBA 20   E9   8DA5         BRA     GTCEN6
01496                          *
01497A 8DBC 8E   FFFF     A GTCEN8 LDX     #$FFFF
01498A 8DBF 30   1F       A GTCEN9 LEAX    -1,X
01499A 8DC1 26   07   8DCA         BNE     GTCENA
01500A 8DC3 4A                     DECA
01501A 8DC4 26   F6   8DBC         BNE     GTCEN8
01502A 8DC6 8E   826C     A        LDX     #REPYRX  XMOTOR DID NOT GO READY
01503A 8DC9 39                     RTS
01504                          *
01505A 8DCA 7D   602A     A GTCENA TST     XMTR+2
01506A 8DCD 2A   F0   8DBF         BPL     GTCEN9
01507A 8DCF 20   13   8DE4         BRA     GTCENE
01508                          *
01509A 8DD1 8E   FFFF     A GTCENB LDX     #$FFFF
01510A 8DD4 30   1F       A GTCENC LEAX    -1,X
01511A 8DD6 26   07   8DDF         BNE     GTCEND
01512A 8DD8 4A                     DECA
01513A 8DD9 26   F6   8DD1         BNE     GTCENB
01514A 8DDB 8E   8351     A        LDX     #REPYRY  YMOTOR DID NOT GO READY
01515A 8DDE 39                     RTS
01516                          *
01517A 8DDF 7D   6022     A GTCEND TST     YMTR+2
01518A 8DE2 2A   F0   8DD4         BPL     GTCENC
01519                          *
01520A 8DE4 B6   6028     A GTCENE LDA     XMTR
01521A 8DE7 81   8F       A        CMPA    #$8F
01522A 8DE9 27   0F   8DFA         BEQ     GTCENG
01523A 8DEB B6   6020     A        LDA     YMTR
01524A 8DEE 81   8F       A        CMPA    #$8F
01525A 8DF0 27   04   8DF6         BEQ     GTCENF
01526A 8DF2 8E   83F8     A        LDX     #REPYRB  X+Y MOTOR NOT READY
01527A 8DF5 39                     RTS
01528                          *
01529A 8DF6 8E   826C     A GTCENF LDX     #REPYRX  XMOTOR NOT READY
01530A 8DF9 39                     RTS
01531                          *
01532A 8DFA B6   6020     A GTCENG LDA     YMTR
01533A 8DFD 81   8F       A        CMPA    #$8F
01534A 8DFF 27   04   8E05         BEQ     GTCENH
01535A 8E01 8E   8351     A        LDX     #REPYRY  YMOTOR NOT READY
01536A 8E04 39                     RTS
01537                          *
01538A 8E05 CC   0000     A GTCENH LDD     #0
01539A 8E08 FD   1C72     A        STD     XSPP+1
01540A 8E0B FD   1C75     A        STD     YSPP+1
01541A 8E0E B7   1C23     A        STA     LDPTFL
01542A 8E11 8E   8097     A        LDX     #REPLY0
01543A 8E14 39                     RTS
01544                          *
01545A 8E15      54       A MOVE1  FCB     $54,$80,$80
01546A 8E18      55       A MOVE2  FCB     $55,$80,$00
01547                              TTL     POLL
```

```
                                  ************************************************
                                  *  COPYRIGHT BY ASM DIE BONDING INC.  1982
                                  *     SOFTWARE FOR THE D2KH DIE BONDER
                                  *              POLL   REV. 2.0A
                                  *
                                  *  DISK ID          : VIDEO 1
                                  *  DATE             :
                                  *  DWG NO           :
                                  *  ASSM NUMBER      :
                                  *  EPROM ID TAG     :
                                  *  ORGINATOR        :
                                  *  REVISED          :
                                  ************************************************
                                  *
                                  * Y MUST BE PRELOADED WITH MOTOR ADDRESS
                                  *
                                  * "A" WILL RETURN WITH THE POLL INFO
                                  * "X"=REPLY0 POLL OK
                                  * "X"#REPLY0 POLL ERROR
                                  *
A 8E1B EC   22          A POLL    LDD    2,Y
A 8E1D 1083 24A4        A         CMPD   #$24A4
A 8E21 26   55     8E78           BNE    MTRERR
                                  *
A 8E23 A6   21          A         LDA    1,Y      DUMMY READ
A 8E25 86   5A          A         LDA    #$5A     CMD POLL SENSOR
A 8E27 A7   21          A         STA    1,Y      SEND CMD
                                  *
A 8E29 8E   FFFF        A         LDX    #$FFFF
A 8E2C 30   1F          A POLL1   LEAX   -1,X
A 8E2E 27   48     8E78           BEQ    MTRERR
A 8E30 A6   23          A         LDA    3,Y
A 8E32 2A   F8     8E2C           BPL    POLL1    LOOK FOR ACCEPT
                                  *
A 8E34 8E   FFFF        A         LDX    #$FFFF
A 8E37 30   1F          A POLL2   LEAX   -1,X
A 8E39 27   3D     8E78           BEQ    MTRERR
A 8E3B A6   22          A         LDA    2,Y
A 8E3D 2A   F8     8E37           BPL    POLL2    LOOK FOR NEW REPLY
                                  *
A 8E3F A6   A4          A         LDA    0,Y
A 8E41 81   82          A         CMPA   #$82
A 8E43 26   33     8E78           BNE    MTRERR   LOOK FOR BUSY
                                  *
A 8E45 8E   FFFF        A         LDX    #$FFFF
A 8E48 30   1F          A POLL3   LEAX   -1,X
A 8E4A 27   2C     8E78           BEQ    MTRERR
A 8E4C A6   22          A         LDA    2,Y
A 8E4E 2A   F8     8E48           BPL    POLL3    LOOK FOR NEW REPLY
                                  *
A 8E50 A6   A4          A         LDA    0,Y
A 8E52 81   C4          A         CMPA   #$C4     LOOK FOR SENSOR READY
A 8E54 26   22     8E78           BNE    MTRERR
                                  *
A 8E56 8E   FFFF        A         LDX    #$FFFF
A 8E59 30   1F          A POLL4   LEAX   -1,X
A 8E5B 27   1B     8E78           BEQ    MTRERR
A 8E5D A6   22          A         LDA    2,Y
---
A 8E5F 2A   F8     8E59           BPL    POLL4    LOOK FOR NEW REPLY
                                  *
A 8E61 A6   A4          A         LDA    0,Y      THIS IS SENSOR INFO
                                  *
A 8E63 8E   FFFF        A         LDX    #$FFFF
A 8E66 30   1F          A POLL5   LEAX   -1,X
A 8E68 27   0E     8E78           BEQ    MTRERR
A 8E6A E6   22          A         LDB    2,Y
A 8E6C 2A   F8     8E66           BPL    POLL5    LOOK FOR NEW REPLY
                                  *
A 8E6E E6   A4          A         LDB    0,Y
A 8E70 C1   8F          A         CMPB   #$8F     LOOK FOR READY
A 8E72 26   04     8E78           BNE    MTRERR
A 8E74 8E   8097        A         LDX    #REPLY0
```

```
00750 01621A 8E77 39                       RTS
00760 01622                         *
00770 01623A 8E78 108C 6028      A MTRERR CMPY    #XMTR
00780 01624A 8E7C 26   04   8E82          BNE     ERRSEN
00790 01625A 8E7E 8E   8428      A        LDX     #REPYPX   POLL ERROR XMOTOR
00800 01626A 8E81 39                       RTS
00810 01627                         *
00820 01628A 8E82 108C 6020      A ERRSEN CMPY    #YMTR
00830 01629A 8E86 26   04   8E8C          BNE     ERSEN1
00840 01630A 8E88 8E   844F      A        LDX     #REPYPY   POLL ERROR YMOTOR
00850 01631A 8E8B 39                       RTS
00860 01632                         *
00870 01633A 8E8C 8E   8476      A ERSEN1 LDX     #REPYPP   NO SUCH MOTOR FOR POLL
00880 01634A 8E8F 39                       RTS
00010 01635                               TTL     PATTERN OFF
00030 01637                         ***********************************************
00040 01638                         *  COPYRIGHT BY ASM DIE BONDING INC.   1982
00050 01639                         *     SOFTWARE FOR THE D2KH DIE BONDER
00060 01640                         *            PATOFF REV.  2.0A
00070 01641                         *
00080 01642                         *  DISK ID         : VIDEO 1
00090 01643                         *  DATE            :
00100 01644                         *  DWG NO          :
00110 01645                         *  ASSM NUMBER     :
00120 01646                         *  EPROM ID TAG    :
00130 01647                         *  ORGINATOR       :
00140 01648                         *  REVISED         :
00150 01649                         ***********************************************
00160 01650                         * ALIGN SUBROUTINE "PATTERN OFF"
00170 01651                         * WHICH WILL LEAVE THE SEL. PATTERN BUT TURN
00520 01598                         *
00530 01599A 8E50 A6   A4        A        LDA     0,Y
00540 01600A 8E52 81   C4        A        CMPA    #$C4      LOOK FOR SENSOR READY
00550 01601A 8E54 26   22   8E78          BNE     MTRERR
00560 01602                         *
00570 01603A 8E56 8E   FFFF      A        LDX     #$FFFF
00580 01604A 8E59 30   1F        A POLL4  LEAX    -1,X
00590 01605A 8E5B 27   1B   8E78          BEQ     MTRERR
00600 01606A 8E5D A6   22        A        LDA     2,Y
00610 01607A 8E5F 2A   F8   8E59          BPL     POLL4     LOOK FOR NEW REPLY
00620 01608                         *
00630 01609A 8E61 A6   A4        A        LDA     0,Y       THIS IS SENSOR INFO
00640 01610                         *
00650 01611A 8E63 8E   FFFF      A        LDX     #$FFFF
00660 01612A 8E66 30   1F        A POLL5  LEAX    -1,X
00670 01613A 8E68 27   0E   8E78          BEQ     MTRERR
00680 01614A 8E6A E6   22        A        LDB     2,Y
00690 01615A 8E6C 2A   F8   8E66          BPL     POLL5     LOOK FOR NEW REPLY
00700 01616                         *
00710 01617A 8E6E E6   A4        A        LDB     0,Y
00720 01618A 8E70 C1   8F        A        CMPB    #$8F      LOOK FOR READY
00730 01619A 8E72 26   04   8E78          BNE     MTRERR
00740 01620A 8E74 8E   8097      A        LDX     #REPLY0
```

```
00750 01621A 8E77 39                       RTS
00760 01622                         *
00770 01623A 8E78 108C 6028      A MTRERR CMPY    #XMTR
00780 01624A 8E7C 26   04   8E82          BNE     ERRSEN
00790 01625A 8E7E 8E   8428      A        LDX     #REPYPX   POLL ERROR XMOTOR
00800 01626A 8E81 39                       RTS
00810 01627                         *
00820 01628A 8E82 108C 6020      A ERRSEN CMPY    #YMTR
00830 01629A 8E86 26   04   8E8C          BNE     ERSEN1
00840 01630A 8E88 8E   844F      A        LDX     #REPYPY   POLL ERROR YMOTOR
00850 01631A 8E8B 39                       RTS
00860 01632                         *
00870 01633A 8E8C 8E   8476      A ERSEN1 LDX     #REPYPP   NO SUCH MOTOR FOR POLL
00880 01634A 8E8F 39                       RTS
00010 01635                               TTL     PATTERN OFF
```

```
00030 01637                              ************************************************
00040 01638                              *  COPYRIGHT BY ASM DIE BONDING INC.  1982
00050 01639                              *     SOFTWARE FOR THE D2KH DIE BONDER
00060 01640                              *            PATOFF REV. 2.0A
00070 01641                              *
00080 01642                              *  DISK ID        : VIDEO 1
00090 01643                              *  DATE           :
00100 01644                              *  DWG NO         :
00110 01645                              *  ASSM NUMBER    :
00120 01646                              *  EPROM ID TAG   :
00130 01647                              *  ORGINATOR      :
00140 01648                              *  REVISED        :
00150 01649                              ************************************************
00160 01650                              * ALIGN SUBROUTINE "PATTERN OFF"
00170 01651                              * WHICH WILL LEAVE THE SEL. PATTERN BUT TURN
00180 01652                              * OFF THE PATTERN TO THE CRT & RETURN NORM
00190 01653                              *
00200 01654A 8E90 86    80         A PATOFF LDA    #$80
00210 01655A 8E92 B7    7601       A        STA    CNTRAD+1
00220 01656A 8E95 39                        RTS
00010 01657                                 TTL    ARE YOU READY?
00030 01659                              ************************************************
00040 01660                              *  COPYRIGHT BY ASM DIE BONDING INC.  1982
00050 01661                              *     SOFTWARE FOR THE D2KH DIE BONDER
00060 01662                              *            RURDY  REV. 2.0A
00070 01663                              *
00080 01664                              *  DISK ID        : VIDEO 1
00090 01665                              *  DATE           :
00100 01666                              *  DWG NO         :
00110 01667                              *  ASSM NUMBER    :
00120 01668                              *  EPROM ID TAG   :
00130 01669                              *  ORGINATOR      :
00140 01670                              *  REVISED        :
00150 01671                              ************************************************
00160 01672                              *    H O S T  C O M M A N D   $0F
00170 01673                              *
00180 01674                              *    A R E  Y O U  R E A D Y ?
00190 01675                              ************************************************
00200 01676                              *
00210 01677                              * THIS WILL CHECK FOR DEFAULT FLAG
00220 01678                              * IF SET THEN OUTPUT REPLY 6(DEFAULT)CLR FLAG
00230 01679                              * ELSE OUTPUT REPLY 0 (CMOS IS OK)
00240 01680                              *
00250 01681A 8E96 B6    1CFC       A RURDY  LDA    DEFEFL
00260 01682A 8E99 27    07    8EA2          BEQ    RURDY1
00270 01683A 8E9B 8E    810B       A        LDX    #REPLY6
00280 01684A 8E9E 7F    1CFC       A        CLR    DEFEFL
00290 01685A 8EA1 39                        RTS
00300 01686A 8EA2 8E    8097       A RURDY1 LDX    #REPLY0
00310 01687A 8EA5 39                        RTS
00010 01688                                 TTL    PAGON
00030 01690                              ************************************************
00040 01691                              *  COPYRIGHT BY ASM DIE BONDING INC.  1982
00050 01692                              *     SOFTWARE FOR THE D2KH DIE BONDER
00060 01693                              *            PAGON  REV. 2.0A
00070 01694                              *
00080 01695                              *  DISK ID        : VIDEO 1
00090 01696                              *  DATE           :
00100 01697                              *  DWG NO         :
00110 01698                              *  ASSM NUMBER    :
00120 01699                              *  EPROM ID TAG   :
00130 01700                              *  ORGINATOR      :
00140 01701                              *  REVISED        :
00150 01702                              ************************************************
00160 01703                              *      H O S T   C O M M A N D  $70
00170 01704                              *
00180 01705                              *          P A G E  O N
00190 01706                              ************************************************
00200 01707                              *
00210 01708                              * TURN ON THE CRT & DISPLAY THE CRT BUFFER
00220 01709                              *
00230 01710A 8EA6 C6    81         A PAGON  LDB    #$81
00240 01711A 8EA8 F7    7601       A        STB    CNTRAD+1
00250 01712A 8EAB 8E    8097       A        LDX    #REPLY0
```

```
A 8EAE 39                      RTS
                               TTL     PAGE OFF
                      ***********************************************
                      *  COPYRIGHT BY ASM DIE BONDING INC.   1982
                      *     SOFTWARE FOR THE D2KH DIE BONDER
                      *            PAGOFF REV. 2.0A
                      *
                      *  DISK ID         : VIDEO 1
                      *  DATE            :
                      *  DWG NO          :
                      *  ASSM NUMBER     :
                      *  EPROM ID TAG    :
                      *  ORGINATOR       :
                      *  REVISED         :
                      ***********************************************
                      *       H O S T   C O M M A N D  $71
                      *
                      *         P A G E  O F F
                      ***********************************************
                      *
                      *  WILL TURN OFF THE CRT DISPLAY
                      *  BUT NOT MESS WITH THE CRT BUFFER
                      *  RETURN TO NORMAL VIDEO (NO PATTERN)
                      *
A 8EAF C6   80      A PAGOFF LDB     #$80
A 8EB1 F7   7601    A        STB     CNTRAD+1
A 8EB4 8E   8097    A        LDX     #REPLY0
A 8EB7 39                    RTS
                             TTL     CLEAR
                      ***********************************************
                      *  COPYRIGHT BY ASM DIE BONDING INC.   1982
                      *     SOFTWARE FOR THE D2KH DIE BONDER
                      *            CLEAR  REV. 2.0A
                      *
                      *  DISK ID         : VIDEO 1
                      *  DATE            :
                      *  DWG NO          :
                      *  ASSM NUMBER     :
                      *  EPROM ID TAG    :
                      *  ORGINATOR       :
                      *  REVISED         :
                      ***********************************************
                      *     K E Y   C O M M A N D  $68
                      *
                      *         C L E A R
                      ***********************************************
                      *
                      * CLEAR THE CRT BUFFER ($20)
                      * RESET LINE/COL. TO 1/0
                      *
A 8EB8 8E   7000    A CLEAR  LDX     #CRT
A 8EBB C6   20      A        LDB     #$20
A 8EBD E7   80      A CLEAR1 STB     ,X+
A 8EBF 8C   7200    A        CMPX    #CRT+512
A 8EC2 26   F9  8EBD         BNE     CLEAR1
A 8EC4 5F                    CLRB
A 8EC5 D7   8C      A        STB     COL
A 8EC7 5C                    INCB
A 8EC8 D7   8B      A        STB     LINE
A 8ECA 8E   8097    A        LDX     #REPLY0
A 8ECD 39                    RTS
                             TTL     ALL OFF
                      ***********************************************
                      *  COPYRIGHT BY ASM DIE BONDING INC.. 1982
                      *     SOFTWARE FOR THE D2KH DIE BONDER
                      *            ALLOFF REV. 2.0A
                      *
                      *  DISK ID         : VIDEO 1
                      *  DATE            :
                      *  DWG NO          :
                      *  ASSM NUMBER     :
                      *  EPROM ID TAG    :
```

```
00130 01788                         *  ORGINATOR      :
00140 01789                         *  REVISED        :
00150 01790                         ***********************************************
00160 01791                         *      H O S T   C O M M A N D  $77
00170 01792                         *
00180 01793                         *            A L L O F F
00190 01794                         ***********************************************
00200 01795                         *
00210 01796                         *     TURN ALL VAR. LEDS OFF
00220 01797                         *
00230 01798A 8ECE CC   0834     A ALLOFF LDD    #$0834
00240 01799A 8ED1 B4   E001     A        ANDA   LEDS+1
00250 01800A 8ED4 B7   E001     A        STA    LEDS+1
00260 01801A 8ED7 F7   E003     A        STB    LEDS+3
00270 01802A 8EDA 8E   8097     A        LDX    #REPLY0
00280 01803A 8EDD 39                     RTS
00010 01804                              TTL    LOAD PAGE

00030 01806                         ***********************************************
00040 01807                         *  COPYRIGHT BY ASM DIE BONDING INC.   1982
00050 01808                         *     SOFTWARE FOR THE D2KH DIE BONDER
00060 01809                         *              LPAGE  REV. 2.0A
00070 01810                         *
00080 01811                         *  DISK ID          : VIDEO 1
00090 01812                         *  DATE             :
00100 01813                         *  DWG NO           :
00110 01814                         *  ASSM NUMBER      :
00120 01815                         *  EPROM ID TAG     :
00130 01816                         *  ORGINATOR        :
00140 01817                         *  REVISED          :
00150 01818                         ***********************************************
00160 01819                         *    H O S T   M U L T - C O M M A N D  $74
00170 01820                         *
00180 01821                         *            L O A D   P A G E
00190 01822                         ***********************************************
00200 01823                         *
00210 01824                         * THE FORMAT IS
00220 01825                         * COMMAND / LINE / COL.  / DATA STRING /EOT
00230 01826                         * NOTE THAT THIS WILL NOT ENABLE OR
00240 01827                         * DISABLE THE CRT
00250 01828                         *
00260 01829A 8EDE 0F   AA       A LPAGE  CLR    LFLAG
00270 01830A 8EE0 BD   8F89     A        JSR    NEXTL     GET LINE#
00280 01831A 8EE3 D7   8B       A        STB    LINE      AND STORE IT
00290 01832A 8EE5 BD   8F89     A        JSR    NEXTL     GET COL.#
00300 01833A 8EE8 D7   8C       A        STB    COL       AND STORE IT
00310 01834A 8EEA C0   1F       A LPAGE1 SUBB   #31       COL - 31
00320 01835A 8EEC 23   06   8EF4         BLS    LPAGE2
00330 01836A 8EEE 0C   8B       A        INC    LINE
00340 01837A 8EF0 D7   8C       A        STB    COL
00350 01838A 8EF2 20   F6   8EEA         BRA    LPAGE1
00360 01839A 8EF4 96   8B       A LPAGE2 LDA    LINE
00370 01840A 8EF6 81   0F       A        CMPA   #15
00380 01841A 8EF8 23   1F   8F19         BLS    LPAGE4
00390 01842A 8EFA 0A   8B       A        DEC    LINE
00400 01843A 8EFC 108E 7000     A        LDY    #CRT
00410 01844A 8F00 A6   A8 20    A LPAGE3 LDA    32,Y
00420 01845A 8F03 A7   A0       A        STA    ,Y+
00430 01846A 8F05 108C 71E0     A        CMPY   #CRT+32*15
00440 01847A 8F09 26   F5   8F00         BNE    LPAGE3
00450 01848A 8F0B CC   2020     A        LDD    #$2020
00460 01849A 8F0E A7   A0       A ELINE  STA    ,Y+
00470 01850A 8F10 5A                     DECB
00480 01851A 8F11 26   FB   8F0E         BNE    ELINE
00490 01852A 8F13 20   DF   8EF4         BRA    LPAGE2
00500 01853                         *
00510 01854                         * NOW START STORING DATA INTO CRT BUFFER
00520 01855                         *
00530 01856A 8F15 86   01       A DISPLY LDA    #1
00540 01857A 8F17 97   AA       A        STA    LFLAG
00550 01858A 8F19 8D   6E   8F89 LPAGE4  BSR    NEXTL     GET DATA IN "B"
00560 01859A 8F1B 8D   2A   8F47         BSR    CRTADD    LOAD CURSOR ADDRESS INT
00570 01860A 8F1D C1   04       A        CMPB   #$04      IS IT EOT?
00580 01861A 8F1F 27   22   8F43         BEQ    LPAGE6    YES,EXIT
```

```
00590 01862A 8F21 C1   0A       A        CMPB   #$0A    IS IT CRLF ?
00600 01863A 8F23 26   04   8F29         BNE    LPAGE5  NO,GO AROUND CR
00610 01864A 8F25 8D   31   8F58         BSR    CRLF    YES,CALL CRLF
00620 01865A 8F27 20   F0   8F19         BRA    LPAGE4
00630 01866A 8F29 E7   A4       A LPAGE5 STB    ,Y      ELSE STORE DATA
00640 01867A 8F2B 96   8C       A        LDA    COL     AND INC COL
00650 01868A 8F2D 4C                     INCA
00660 01869A 8F2E 97   8C       A        STA    COL
00670 01870A 8F30 81   20       A        CMPA   #32     AT END OF LINE?
00680 01871A 8F32 26   E5   8F19         BNE    LPAGE4  NO,GO AROUND CR
00690 01872A 8F34 0F   8C       A        CLR    COL
00700 01873A 8F36 96   8B       A        LDA    LINE
00710 01874A 8F38 4C                     INCA
00720 01875A 8F39 97   8B       A        STA    LINE
00730 01876A 8F3B 81   10       A        CMPA   #16
00740 01877A 8F3D 26   DA   8F19         BNE    LPAGE4
00750 01878A 8F3F 8D   25   8F66         BSR    SCROLL
00760 01879A 8F41 20   D6   8F19         BRA    LPAGE4
00770 01880A 8F43 8E   80EA     A LPAGE6 LDX    #REPLY4
00780 01881A 8F46 39                     RTS
00790 01882                       *
00800 01883                       * LINE*32+COL+CRT BASE=Y
00810 01884                       *
00820 01885A 8F47 34   04       A CRTADD PSHS   B
00830 01886A 8F49 96   8B       A        LDA    LINE
00840 01887A 8F4B C6   20       A        LDB    #32
00850 01888A 8F4D 3D                     MUL
00860 01889A 8F4E DB   8C       A        ADDB   COL
00870 01890A 8F50 C3   7000     A        ADDD   #CRT
00880 01891A 8F53 1F   02       A        TFR    D,Y
00890 01892A 8F55 35   04       A        PULS   B
00900 01893A 8F57 39                     RTS
00910 01894                       *
00920 01895A 8F58 0F   8C       A CRLF   CLR    COL
00930 01896A 8F5A 96   8B       A        LDA    LINE
00940 01897A 8F5C 4C                     INCA
00950 01898A 8F5D 97   8B       A        STA    LINE
00960 01899A 8F5F 81   10       A        CMPA   #16
00970 01900A 8F61 26   02   8F65         BNE    CRLF1
00980 01901A 8F63 8D   01   8F66         BSR    SCROLL
00990 01902A 8F65 39              CRLF1  RTS
01000 01903                       *
01010 01904A 8F66 34   04       A SCROLL PSHS   B
01020 01905A 8F68 108E 7000     A        LDY    #CRT
01030 01906A 8F6C E6   A8 20    A SCROL1 LDB    32,Y
01040 01907A 8F6F E7   A0       A        STB    0,Y+
01050 01908A 8F71 108C 71E0     A        CMPY   #CRT+32*15
01060 01909A 8F75 26   F5   8F6C         BNE    SCROL1
01070 01910A 8F77 CC   2020     A        LDD    #$2020
01080 01911A 8F7A A7   A0       A SCROL2 STA    ,Y+
01090 01912A 8F7C 5A                     DECB
01100 01913A 8F7D 26   FB   8F7A         BNE    SCROL2
01110 01914A 8F7F CC   0F00     A        LDD    #$F00
01120 01915A 8F82 DD   8B       A        STD    LINE
01130 01916A 8F84 8D   C1   8F47         BSR    CRTADD
01140 01917A 8F86 35   04       A        PULS   B
01150 01918A 8F88 39                     RTS
01160 01919                       *
01170 01920A 8F89 0D   AA       A NEXTL  TST    LFLAG
01180 01921A 8F8B 27   03   8F90         BEQ    NEXTH
01190 01922A 8F8D E6   80       A        LDB    ,X+
01200 01923A 8F8F 39                     RTS
01210 01924A 8F90 7D   6002     A NEXTH  TST    HOSTAC  NEW DATA?
01220 01925A 8F93 2A   FB   8F90         BPL    NEXTH   NO,LOOP
01230 01926A 8F95 F6   6000     A        LDB    HOSTAD
01240 01927A 8F98 39                     RTS
00010 01928                              TTL    VAROFF
00030 01930                       ************************************************
00040 01931                       *  COPYRIGHT BY ASM DIE BONDING INC.   1982
00050 01932                       *      SOFTWARE FOR THE D2KH DIE BONDER
00060 01933                       *              VAROFF REV. 2.0A
```

```
                                 *
                                 *  DISK ID         : VIDEO 1
                                 *  DATE            :
                                 *  DWG NO          :
                                 *  ASSM NUMBER     :
                                 *  EPROM ID TAG    :
                                 *  ORGINATOR       :
                                 *  REVISED         :
                                 ************************************************
                                 *   H O S T   M U L T - C O M M A N D  $79
                                 *
                                 *          V A R O F F
                                 ************************************************
                                 *
                                 * VAROFF/SELECT
                                 *
A 8F99 8D    F5    8F90 VAROFF BSR    NEXTH
A 8F9B C4    F0       A VAROF1 ANDB   #$F0
A 8F9D 53                      COMB
A 8F9E C4    F8       A        ANDB   #$F8
A 8FA0 F4    E001     A        ANDB   LEDS+1
A 8FA3 F7    E001     A        STB    LEDS+1
A 8FA6 8D    E8    8F90        BSR    NEXTH
A 8FA8 C1    04       A        CMPB   #$04
A 8FAA 26    EF    8F9B        BNE    VAROF1
A 8FAC 8E    80EA     A        LDX    #REPLY4
A 8FAF 39                      RTS
                               TTL    VARON
                                 ************************************************
                                 *  COPYRIGHT BY ASM DIE BONDING INC.   1982
                                 *     SOFTWARE FOR THE D2KH DIE BONDER
                                 *            VARON  REV. 2.0A
                                 *
                                 *  DISK ID         : VIDEO 1
                                 *  DATE            :
                                 *  DWG NO          :
                                 *  ASSM NUMBER     :
                                 *  EPROM ID TAG    :
                                 *  ORGINATOR       :
                                 *  REVISED         :
                                 ************************************************
                                 *   H O S T   M U L T - C O M M A N D  $78
                                 *
                                 *            V A R O N
                                 ************************************************
                                 *
                                 * VARON/SEL
                                 *
A 8FB0 8D    DE    8F90 VARON  BSR    NEXTH
A 8FB2 C4    F0       A VARON1 ANDB   #$F0
A 8FB4 FA    E001     A        ORB    LEDS+1
A 8FB7 F7    E001     A        STB    LEDS+1
A 8FBA 8D    D4    8F90        BSR    NEXTH
A 8FBC C1    04       A        CMPB   #4
A 8FBE 26    F2    8FB2        BNE    VARON1
A 8FC0 8E    80EA     A        LDX    #REPLY4
A 8FC3 39                      RTS
                               TTL    LOAD WAFER

                                 ************************************************
                                 *  COPYRIGHT BY ASM DIE BONDING INC.   1982
                                 *     SOFTWARE FOR THE D2KH DIE BONDER
                                 *            LWAFER REV. 2.0A
                                 *
                                 *  DISK ID         : VIDEO 1
                                 *  DATE            :
                                 *  DWG NO          :
                                 *  ASSM NUMBER     :
                                 *  EPROM ID TAG    :
                                 *  ORGINATOR       :
                                 *  REVISED         :
```

```
02006                           ************************************************
02007                           *   K E Y   C O M M A N D  $60
02008                           *
02009                           *     L O A D  W A F E R
02010                           ************************************************
02011                           *
02012                           * IF AT "LOAD POINT" THEN MOVE TO CENTER
02013                           * ELSE MOVE TO LOAD POINT
02014                           *
02015A 8FC4 7D   6010      A LWAFER TST    DIEEJT
02016A 8FC7 2A   04   8FCD          BPL    LWAF1
02017A 8FC9 8E   80EE      A        LDX    #REPLY5
02018A 8FCC 39              LWAF   RTS
02019                           *
02020                           * LOAD POINT  0 = OFF LOAD POINT
02021                           *             1 = ON LOAD POINT
02022                           *
02023A 8FCD 7D   1C23      A LWAF1  TST    LDPTFL
02024A 8FD0 26   30   9002          BNE    CENTER
02025A 8FD2 BD   8D42      A        JSR    GTCEN
02026A 8FD5 8C   8097      A        CMPX   #REPLY0
02027A 8FD8 27   01   8FDB          BEQ    *+3
02028A 8FDA 39                      RTS
02029A 8FDB B6   1C1E      A        LDA    WAFSIZ+1
02030A 8FDE 27   04   8FE4          BEQ    WAFERR
02031A 8FE0 81   05        A        CMPA   #5
02032A 8FE2 2F   04   8FE8          BLE    LWAF2
02033A 8FE4 8E   9041      A WAFERR LDX    #REPYWS
02034A 8FE7 39                      RTS
02035A 8FE8 4A              LWAF2  DECA
02036A 8FE9 C6   03        A        LDB    #3
02037A 8FEB 3D                      MUL
02038A 8FEC 8E   9023      A        LDX    #WAFTAB
02039A 8FEF A6   85        A        LDA    B,X
02040A 8FF1 A6   80        A        LDA    ,X+
02041A 8FF3 97   8D        A        STA    XSTR
02042A 8FF5 EC   84        A        LDD    ,X
02043A 8FF7 DD   8E        A        STD    XSTR+1
02044A 8FF9 BD   8A39      A        JSR    MOVEX
02045A 8FFC 86   01        A        LDA    #1
02046A 8FFE B7   1C23      A        STA    LDPTFL
02047                           *WE ARE NOW AT LOAD POINT
02048A 9001 39                      RTS
02049                           *
02050A 9002 B6   1C1E      A CENTER LDA    WAFSIZ+1
02051A 9005 4A                      DECA
02052A 9006 2B   DC   8FE4          BMI    WAFERR
02053A 9008 81   04        A        CMPA   #4
02054A 900A 22   D8   8FE4          BHI    WAFERR
02055A 900C C6   03        A        LDB    #3
02056A 900E 3D                      MUL
02057A 900F 8E   9032      A        LDX    #CENTAB
02058A 9012 A6   85        A        LDA    B,X
02059A 9014 A6   80        A CNTR   LDA    ,X+
02060A 9016 97   8D        A        STA    XSTR
02061A 9018 EC   84        A        LDD    ,X
02062A 901A DD   8E        A        STD    XSTR+1
02063A 901C BD   8A39      A        JSR    MOVEX
02064A 901F 7F   1C23      A        CLR    LDPTFL
02065A 9022 39                      RTS
02066                           *
02067A 9023      51        A WAFTAB FCB    $51,$16,$ED 1IN
02068A 9026      51        A        FCB    $51,$16,$ED 2IN
02069A 9029      51        A        FCB    $51,$16,$ED 3IN
02070A 902C      51        A        FCB    $51,$1D,$40 4IN
02071A 902F      51        A        FCB    $51,$25,$10 5IN
02072                           *
02073A 9032      50        A CENTAB FCB    $50,$16,$ED 1IN
02074A 9035      50        A        FCB    $50,$16,$ED 2IN
02075A 9038      50        A        FCB    $50,$16,$ED 3IN
02076A 903B      50        A        FCB    $50,$1D,$40 4IN
02077A 903E      50        A        FCB    $50,$25,$10 5IN
02078                           *
```

```
00880 02079A 9041       D5      A REPYWS FCB    $D5
00890 02080A 9042       4E      A        FCC    "NO SUCH WAFER SIZE"
00900 02081A 9054       0A      A        FCB    $A,$A,4,$D5
00010 02082                              TTL    ALIGN0
00030 02084                       ***********************************************
00040 02085                       *  COPYRIGHT BY ASM DIE BONDING INC.   1982
00050 02086                       *     SOFTWARE FOR THE D2KH DIE BONDER
00060 02087                       *            ALIGN0 REV. 2.0A
00070 02088                       *
00080 02089                       *  DISK ID        : VIDEO 1
00090 02090                       *  DATE           :
00100 02091                       *  DWG NO         :
00110 02092                       *  ASSM NUMBER    :
00120 02093                       *  EPROM ID TAG   :
00130 02094                       *  ORGINATOR      :
00140 02095                       *  REVISED        :
00150 02096                       ***********************************************
00160 02097                       *  M U L T - K E Y   C O M M A N D   $61
00170 02098                       *
00180 02099                       *          A L I G N   T H E T A
00190 02100                       ***********************************************
00200 02101                       *
00210 02102A 9058 7D    6010    A ALIGN0 TST    DIEEJT
00220 02103A 905B 2A    04   9061        BPL    THETA
00230 02104A 905D 8E    80EE    A        LDX    #REPLY5  DIE EJT UP ERROR
00240 02105A 9060 39                     RTS
00250 02106A 9061 86    01      A THETA  LDA    #1
00260 02107A 9063 B7    E001    A        STA    LEDS+1   TURN ON ALIGN0 LED
00270 02108                       *
00280 02109A 9066 BD    8681    A THETA1 JSR    OUTOK    OUTPUT READY
00290 02110A 9069 BD    8667    A THETA2 JSR    NEXT     INPUT COMMAN/OUT BUSY
00300 02111A 906C 34    02      A        PSHS   A
00310 02112A 906E BD    8D42    A        JSR    GTCEN    GO TO CENTER
00320 02113A 9071 8C    8097    A        CMPX   #REPLY0
00330 02114A 9074 27    01   9077        BEQ    *+3
00340 02115A 9076 39                     RTS
00350 02116A 9077 B6    1C1E    A        LDA    WAFSIZ+1
00360 02117A 907A 4A                     DECA
00370 02118A 907B 48                     LSLA
00380 02119A 907C 8E    9258    A        LDX    #THETAB
00390 02120A 907F EC    86      A        LDD    A,X
00400 02121A 9081 DD    8E      A        STD    XSTR+1
00410 02122A 9083 DD    91      A        STD    YSTR+1
00420 02123                       *
00430 02124A 9085 35    02      A        PULS   A
00440 02125A 9087 81    02      A        CMPA   #2       STOP?
00450 02126A 9089 1027  00CA 9157        LBEQ   ALEND
00460 02127                       *
00470 02128A 908D 81    05      A        CMPA   #5
00480 02129A 908F 1027  00C4 9157        LBEQ   ALEND
00490 02130                       *
00500 02131A 9093 81    61      A        CMPA   #$61     ALIGN0?
00510 02132A 9095 1027  00BE 9157        LBEQ   ALEND
00520 02133                       *
00530 02134A 9099 81    1A      A        CMPA   #$1A     UP VAR?
00540 02135A 909B 27    65   9102        BEQ    UP0
00550 02136                       *
00560 02137A 909D 81    1B      A        CMPA   #$1B     DOWN VAR?
00570 02138A 909F 1027  008A 912D        LBEQ   DWN0
00580 02139                       *
00590 02140A 90A3 81    1C      A        CMPA   #$1C     RIGHT VAR?
00600 02141A 90A5 27    2F   90D6        BEQ    RHT0
00610 02142                       *
00620 02143A 90A7 81    1D      A        CMPA   #$1D     LEFT VAR?
00630 02144A 90A9 26    BB   9066        BNE    THETA1
00640 02145                       *
00650 02146A 90AB BD    9181    A LFT0   JSR    XAL0
00660 02147A 90AE 86    51      A        LDA    #$51
00670 02148A 90B0 97    8D      A        STA    XSTR
00680 02149A 90B2 BD    8AAE    A        JSR    MOVX
00690 02150A 90B5 8C    8097    A        CMPX   #REPLY0
00700 02151A 90B8 27    01   90BB        BEQ    *+3
00710 02152A 90BA 39                     RTS
00720 02153A 90BB BD    8681    A        JSR    OUTOK
```

```
00730 02154A 90BE B6   6002    A LFT01   LDA   HOSTAC
00740 02155A 90C1 2A   05   90C8         BPL   LFT02
00750 02156A 90C3 BD   91F0    A         JSR   WHOLX
00760 02157A 90C6 20   A1   9069         BRA   THETA2
00770 02158A 90C8 B6   602A    A LFT02   LDA   XMTR+2
00780 02159A 90CB 2A   F1   90BE         BPL   LFT01
00790 02160A 90CD 86   50      A         LDA   #$50
00800 02161A 90CF 97   8D      A         STA   XSTR
00810 02162A 90D1 BD   91A6    A         JSR   RMPX
00820 02163A 90D4 20   13   90E9         BRA   RHT01
00830 02164                      *
00840 02165A 90D6 BD   9181    A RHT0    JSR   XAL0
00850 02166A 90D9 86   50      A         LDA   #$50
00860 02167A 90DB 97   8D      A         STA   XSTR
00870 02168A 90DD BD   8AAE    A         JSR   MOVX
00880 02169A 90E0 8C   8097    A         CMPX  #REPLY0
00890 02170A 90E3 27   01   90E6         BEQ   *+3
00900 02171A 90E5 39                     RTS
00910 02172A 90E6 BD   8681    A         JSR   OUTOK
00920 02173A 90E9 B6   6002    A RHT01   LDA   HOSTAC
00930 02174A 90EC 2A   06   90F4         BPL   RHT02
00940 02175A 90EE BD   91F0    A         JSR   WHOLX
00950 02176A 90F1 16   FF75 9069         LBRA  THETA2
00960 02177A 90F4 B6   602A    A RHT02   LDA   XMTR+2
00970 02178A 90F7 2A   F0   90E9         BPL   RHT01
00980 02179A 90F9 86   51      A         LDA   #$51
00990 02180A 90FB 97   8D      A         STA   XSTR
01000 02181A 90FD BD   91A6    A         JSR   RMPX
01010 02182A 9100 20   BC   90BE         BRA   LFT01
01020 02183                      *
01030 02184A 9102 8D   60   9164 UP0     BSR   YAL0      TURN ON Y PATTERN
01040 02185A 9104 86   50      A         LDA   #$50
01050 02186A 9106 97   90      A         STA   YSTR
01060 02187A 9108 BD   8BCE    A         JSR   MOVY      RAMP UP HALF WAY
01070 02188A 910B 8C   8097    A         CMPX  #REPLY0
01080 02189A 910E 27   01   9111         BEQ   *+3
01090 02190A 9110 39                     RTS
01100 02191A 9111 BD   8681    A         JSR   OUTOK     GO READY
01110 02192A 9114 B6   6002    A UP01    LDA   HOSTAC    NEW COMMAN?
01120 02193A 9117 2A   06   911F         BPL   UP02      NO
01130 02194A 9119 BD   9207    A         JSR   WHOLY
01140 02195A 911C 16   FF4A 9069         LBRA  THETA2
01150 02196A 911F B6   6022    A UP02    LDA   YMTR+2    RAMP DONE?
01160 02197A 9122 2A   F0   9114         BPL   UP01      NO, GO LOOP
01170 02198A 9124 86   51      A         LDA   #$51
01180 02199A 9126 97   90      A         STA   YSTR
01190 02200A 9128 BD   91CB    A         JSR   RMPY
01200 02201A 912B 20   12   913F         BRA   DWN01
01210 02202                      *
01220 02203A 912D 8D   35   9164 DWN0    BSR   YAL0
01230 02204A 912F 86   51      A         LDA   #$51
01240 02205A 9131 97   90      A         STA   YSTR
01250 02206A 9133 BD   8BCE    A         JSR   MOVY      RAMP DOWN HALF WAY
01260 02207A 9136 8C   8097    A         CMPX  #REPLY0
01270 02208A 9139 27   01   913C         BEQ   *+3
01280 02209A 913B 39                     RTS
01290 02210A 913C BD   8681    A         JSR   OUTOK
01300 02211A 913F B6   6002    A DWN01   LDA   HOSTAC
01310 02212A 9142 2A   06   914A         BPL   DWN02
01320 02213A 9144 BD   9207    A         JSR   WHOLY
01330 02214A 9147 7E   9069    A         JMP   THETA2
01340 02215A 914A B6   6022    A DWN02   LDA   YMTR+2
01350 02216A 914D 2A   F0   913F         BPL   DWN01
01360 02217A 914F 86   50      A         LDA   #$50
01370 02218A 9151 97   90      A         STA   YSTR
01380 02219A 9153 8D   76   91CB         BSR   RMPY
01390 02220A 9155 20   BD   9114         BRA   UP01
01400 02221                      *
01410 02222A 9157 7F   E001    A ALEND   CLR   LEDS+1
01420 02223A 915A BD   8E90    A         JSR   PATOFF
01430 02224A 915D BD   A101    A         JSR   DIEPAT
01440 02225A 9160 8E   8097    A         LDX   #REPLY0   OK EXIT
01450 02226A 9163 39                     RTS
```

```
02227                               *
02228A 9164 8E   921E     A YAL0    LDX    #TAB4
02229A 9167 108E 7200     A         LDY    #XSIZE    LOAD-UP X SIZE
02230A 916B C6   0F       A         LDB    #$F
02231A 916D 8D   2F   919E          BSR    AL0STO
02232A 916F 8E   922E     A         LDX    #TAB5     LOAD-UP Y SIZE
02233A 9172 108E 7300     A         LDY    #YSIZE
02234A 9176 C6   0F       A         LDB    #$F
02235A 9178 8D   24   919E          BSR    AL0STO
02236A 917A CC   8B82     A         LDD    #$8B82    PATTERN "3" PATTERN "ON
02237A 917D FD   7600     A         STD    CNTRAD
02238A 9180 39                      RTS
02239                               *
02240A 9181 8E   922E     A XAL0    LDX    #TAB5     LOAD-UP XSIZE
02241A 9184 108E 7200     A         LDY    #XSIZE
02242A 9188 C6   0F       A         LDB    #$F
02243A 918A 8D   12   919E          BSR    AL0STO
02244                               *
02245A 918C 8E   923E     A         LDX    #TAB6     LOAD-UP YSIZE
02246A 918F 108E 7300     A         LDY    #YSIZE
02247A 9193 C6   0F       A         LDB    #$F
02248A 9195 8D   07   919E          BSR    AL0STO
02249                               *
02250A 9197 CC   8A82     A         LDD    #$8A82    PATTERN "4" PATTERN "ON
02251A 919A FD   7600     A         STD    CNTRAD
02252A 919D 39                      RTS
02253                               *
02254A 919E A6   80       A AL0STO  LDA    ,X+
02255A 91A0 A7   A0       A         STA    ,Y+
02256A 91A2 5A                      DECB
02257A 91A3 26   F9   919E          BNE    AL0STO
02258A 91A5 39                      RTS
02259                               *
02260A 91A6 BD   855B     A RMPX    JSR    DLY30
02261A 91A9 B6   6028     A         LDA    XMTR
02262A 91AC 81   8F       A         CMPA   #$8F
02263A 91AE 27   04   91B4          BEQ    RMPX1
02264A 91B0 8E   8299     A         LDX    #REPYLX
02265A 91B3 39                      RTS
02266A 91B4 B6   1C1E     A RMPX1   LDA    WAFSIZ+1
02267A 91B7 4A                      DECA
02268A 91B8 8E   924E     A         LDX    #XTAB
02269A 91BB 48                      LSLA
02270A 91BC EC   86       A         LDD    A,X
02271A 91BE DD   8E       A         STD    XSTR+1
02272A 91C0 BD   8AAE     A         JSR    MOVX
02273A 91C3 8C   8097     A         CMPX   #REPLY0
02274A 91C6 27   02   91CA          BEQ    RMPX2
02275A 91C8 35   20       A         PULS   Y
02276A 91CA 39              RMPX2   RTS
02277                               *
02278A 91CB BD   855B     A RMPY    JSR    DLY30
02279A 91CE B6   6020     A         LDA    YMTR
02280A 91D1 81   8F       A         CMPA   #$8F
02281A 91D3 27   04   91D9          BEQ    RMPY1
02282A 91D5 8E   837E     A         LDX    #REPYLY
02283A 91D8 39                      RTS
02284A 91D9 B6   1C1E     A RMPY1   LDA    WAFSIZ+1
02285A 91DC 4A                      DECA
02286A 91DD 8E   924E     A         LDX    #XTAB
02287A 91E0 48                      LSLA
02288A 91E1 EC   86       A         LDD    A,X
02289A 91E3 DD   91       A         STD    YSTR+1
02290A 91E5 BD   8BCE     A         JSR    MOVY
02291A 91E8 8C   8097     A         CMPX   #REPLY0
02292A 91EB 27   02   91EF          BEQ    RMPY2
02293A 91ED 35   20       A         PULS   Y
02294A 91EF 39              RMPY2   RTS
02295                               *
02296A 91F0 B6   602A     A WHOLX   LDA    XMTR+2
02297A 91F3 2A   FB   91F0          BPL    WHOLX
02298A 91F5 B6   6028     A         LDA    XMTR
02299A 91F8 81   8F       A         CMPA   #$8F
02300A 91FA 26   01   91FD          BNE    WHOLX1
```

```
02200 02301A 91FC 39                     RTS
02210 02302A 91FD 81   82      A WHOLX1 CMPA    ##$82
02220 02303A 91FF 27   EF   91F0        BEQ     WHOLX
02230 02304A 9201 8E   8299    A        LDX     #REPYLX
02240 02305A 9204 35   20      A        PULS    Y
02250 02306A 9206 39                    RTS
02260 02307                      *
02270 02308A 9207 B6   6022    A WHOLY  LDA     YMTR+2
02280 02309A 920A 2A   FB   9207        BPL     WHOLY
02290 02310A 920C B6   6020    A        LDA     YMTR
02300 02311A 920F 81   8F      A        CMPA    ##$8F
02310 02312A 9211 26   01   9214        BNE     WHOLY1
02320 02313A 9213 39                    RTS
02330 02314A 9214 81   82      A WHOLY1 CMPA    ##$82
02340 02315A 9216 27   EF   9207        BEQ     WHOLY
02350 02316A 9218 8E   837E    A        LDX     #REPYLY
02360 02317A 921B 35   20      A        PULS    Y
02370 02318A 921D 39                    RTS
02380 02319                      *
02390 02320A 921E      80      A TAB4   FCB     $80,$03,$20,$38,$03,$20,$38,$03
02400 02321A 9226      FF      A        FCB     $FF,$FF,$FF,$FF,$FF,$FF,$FF,$FF
02410 02322A 922E      05      A TAB5   FCB     $05,$FF,$FF,$FF,$FF,$FF,$FF,$FF
02420 02323A 9236      FF      A        FCB     $FF,$FF,$FF,$FF,$FF,$FF,$FF,$FF
02430 02324A 923E      34      A TAB6   FCB     $34,$03,$26,$26,$03,$26,$26,$03
02440 02325A 9246      FF      A        FCB     $FF,$FF,$FF,$FF,$FF,$FF,$FF,$FF
02450 02326                      *
02460 02327A 924E      19B3    A XTAB   FDB     $19B3      1.25IN
02470 02328A 9250      2E42    A        FDB     $2E42      2.25IN
02480 02329A 9252      3F5E    A        FDB     $3F5E      3   IN
02490 02330A 9254      4F4C    A        FDB     $4F4C      4.06IN
02500 02331A 9256      61A8    A        FDB     $61A8      5   IN
02510 02332                      *
02520 02333A 9258      0CD9    A THETAB FDB     $0CD9      1/2 1.25IN
02530 02334A 925A      1721    A        FDB     $1721      1/2 2.25IN
02540 02335A 925C      1FAF    A        FDB     $1FAF      1/2 3   IN
02550 02336A 925E      27A6    A        FDB     $27A6      1/2 4.06IN
02560 02337A 9260      30D4    A        FDB     $30D4      1/2 5   IN
00010 02338                             TTL     STEP

00030 02340                      ***********************************************
00040 02341                      *  COPYRIGHT BY ASM DIE BONDING INC.   1982
00050 02342                      *     SOFTWARE FOR THE D2KH DIE BONDER
00060 02343                      *             STEP   REV. 2.0A
00070 02344                      *
00080 02345                      *  DISK ID          : VIDEO 2
00090 02346                      *  DATE             :
00100 02347                      *  DWG NO           :
00110 02348                      *  ASSM NUMBER      :
00120 02349                      *  EPROM ID TAG     :
00130 02350                      *  ORGINATOR        :
00140 02351                      *  REVISED          :
00150 02352                      ***********************************************
00160 02353                      *   M U L T - K E Y   C O M M A N D   $64
00170 02354                      *
00180 02355                      *               S T E P
00190 02356                      ***********************************************
00200 02357                      *
00210 02358A 9262 7D   6010    A STEP   TST     DIEEJT
00220 02359A 9265 2A   04   926B        BPL     STEPOK
00230 02360A 9267 8E   819D    A        LDX     #REPLYE
00240 02361A 926A 39                    RTS
00250 02362                      *
00260 02363A 926B 86   3C      A STEPOK LDA     ##$3C      STEP LED ON
00270 02364A 926D B7   E003    A        STA     LEDS+3
00280 02365A 9270 86   F0      A        LDA     ##$F0
00290 02366A 9272 B4   E001    A        ANDA    LEDS+1
00300 02367A 9275 B7   E001    A        STA     LEDS+1
00310 02368A 9278 BD   A101    A        JSR     DIEPAT
00320 02369A 927B BD   A124    A        JSR     DPLY8
00330 02370                      *
00340 02371A 927E BD   8681    A INSTEP JSR     OUTOK
00350 02372A 9281 BD   8667    A INSTP2 JSR     NEXT
00360 02373A 9284 BD   9449    A        JSR     LOADPG
```

```
00370 02374A 9287 81    64       A        CMPA   #$64     STEP?
00380 02375A 9289 1027  01B2 943F         LBEQ   ENDSTP
00390 02376A 928D 81    05       A        CMPA   #5       DISABLE SERVICE?
00400 02377A 928F 1027  01AC 943F         LBEQ   ENDSTP
00410 02378A 9293 81    02       A        CMPA   #2       STOP?
00420 02379A 9295 1027  01A6 943F         LBEQ   ENDSTP
00430 02380A 9299 81    63       A        CMPA   #$63     JUMP?
00440 02381A 929B 1027  01A3 9442         LBEQ   CALJMP
00450 02382A 929F 81    1A       A        CMPA   #$1A     VAR UP?
00460 02383A 92A1 1027  0122 93C7         LBEQ   STPUP
00470 02384A 92A5 81    1B       A        CMPA   #$1B     VAR DOWN?
00480 02385A 92A7 1027  012B 93D6         LBEQ   STPDWN
00490 02386A 92AB 81    1C       A        CMPA   #$1C     VAR RIGHT?
00500 02387A 92AD 1027  0134 93E5         LBEQ   STPRHT
00510 02388A 92B1 81    1D       A        CMPA   #$1D     VAR LEFT?
00520 02389A 92B3 1027  013D 93F4         LBEQ   STPLFT
00530 02390A 92B7 81    1E       A        CMPA   #$1E     VAR UP-RIGHT
00540 02391A 92B9 1027  0146 9403         LBEQ   UPRHT
00550 02392A 92BD 81    1F       A        CMPA   #$1F     VAR UP-LEFT?
00560 02393A 92BF 1027  014F 9412         LBEQ   UPLFT
00570 02394A 92C3 81    20       A        CMPA   #$20     VAR DOWN-LEFT?
00580 02395A 92C5 1027  0158 9421         LBEQ   DWNLFT
00590 02396A 92C9 81    21       A        CMPA   #$21     VAR DOWN-RIGHT?
00600 02397A 92CB 1027  0161 9430         LBEQ   DWNRHT
00610 02398A 92CF 20    AD   927E         BRA    INSTEP
00620 02399                        *
00630 02400A 92D1 7F    E001     A STEP1  CLR    LEDS+1
00640 02401A 92D4 8C    8097     A        CMPX   #REPLY0
00650 02402A 92D7 26    28   9301         BNE    STPERR
00660 02403A 92D9 81    01       A        CMPA   #1       1=X MOTOR AT LIMIT
00670 02404A 92DB 27    0A   92E7         BEQ    XVAR1
00680 02405A 92DD 81    02       A        CMPA   #2       2=Y MOTOR AT LIMIT
00690 02406A 92DF 27    0A   92EB         BEQ    YVAR1
00700 02407A 92E1 81    03       A        CMPA   #3       3=X&Y MOTOR AT LIMIT
00710 02408A 92E3 27    0A   92EF         BEQ    XYVAR1
00720 02409A 92E5 20    97   927E         BRA    INSTEP
00730 02410                        *
00740 02411A 92E7 8D    0A   92F3 XVAR1   BSR    XVARON
00750 02412A 92E9 20    93   927E         BRA    INSTEP
00760 02413                        *
00770 02414A 92EB 8D    1E   930B YVAR1   BSR    YVARON
00780 02415A 92ED 20    8F   927E         BRA    INSTEP
00790 02416                        *
00800 02417A 92EF 8D    32   9323 XYVAR1  BSR    XYVAR
00810 02418A 92F1 20    8B   927E         BRA    INSTEP
00820 02419                        *
00830 02420A 92F3 D6    8D       A XVARON LDB    XSTR
00840 02421A 92F5 C4    01       A        ANDB   #1
00850 02422A 92F7 27    09   9302         BEQ    XLFTON
00860 02423A 92F9 86    40       A        LDA    #$40
00870 02424A 92FB BA    E001     A        ORA    LEDS+1
00880 02425A 92FE B7    E001     A        STA    LEDS+1
00890 02426A 9301 39               STPERR RTS
00900 02427                        *
00910 02428A 9302 86    80       A XLFTON LDA    #$80
00920 02429A 9304 BA    E001     A        ORA    LEDS+1
00930 02430A 9307 B7    E001     A        STA    LEDS+1
00940 02431A 930A 39                      RTS
00950 02432                        *
00960 02433A 930B D6    90       A YVARON LDB    YSTR
00970 02434A 930D C4    01       A        ANDB   #1
00980 02435A 930F 27    09   931A         BEQ    YDWNON
00990 02436A 9311 86    10       A        LDA    #$10
01000 02437A 9313 BA    E001     A        ORA    LEDS+1
01010 02438A 9316 B7    E001     A        STA    LEDS+1
01020 02439A 9319 39                      RTS
01030 02440                        *
01040 02441A 931A 86    20       A YDWNON LDA    #$20
01050 02442A 931C BA    E001     A        ORA    LEDS+1
01060 02443A 931F B7    E001     A        STA    LEDS+1
01070 02444A 9322 39                      RTS
01080 02445                        *
```

```
02446A 9323 96   8D        A XYVAR  LDA    XSTR
02447A 9325 84   01        A        ANDA   #1        IS X=LEFT?
02448A 9327 27   0C   9335          BEQ    XLY       YES, X=LEFT/Y=?
02449A 9329 96   90        A        LDA    YSTR      NO, X=RIGHT/Y=?
02450A 932B 84   01        A        ANDA   #1        IS Y=DOWN?
02451A 932D 27   12   9341          BEQ    XRYD      YES, X=RIGHT/Y=DOWN
02452A 932F 86   50        A XRYU   LDA    #$50      NO, X=RIGHT/Y=UP
02453A 9331 B7   E001      A        STA    LEDS+1
02454A 9334 39                      RTS
02455                        *
02456A 9335 96   90        A XLY    LDA    YSTR
02457A 9337 84   01        A        ANDA   #1        IS Y=DOWN?
02458A 9339 27   0C   9347          BEQ    XLYD      YES, X=LEFT/Y=DOWN
02459A 933B 86   90        A XLYU   LDA    #$90      NO, X=LEFT/Y=UP
02460A 933D B7   E001      A        STA    LEDS+1
02461A 9340 39                      RTS
02462                        *
02463A 9341 86   60        A XRYD   LDA    #$60      X=RIGHT/Y=DOWN
02464A 9343 B7   E001      A        STA    LEDS+1
02465A 9346 39                      RTS
02466                        *
02467A 9347 86   A0        A XLYD   LDA    #$A0      X=LEFT/Y=DOWN
02468A 9349 B7   E001      A        STA    LEDS+1
02469A 934C 39                      RTS
02470                        *
02471A 934D 86   53        A STEPU  LDA    #$53
02472A 934F 97   90        A        STA    YSTR
02473A 9351 CC   0001      A        LDD    #1
02474A 9354 DD   91        A        STD    YSTR+1
02475A 9356 BD   8B59      A        JSR    MOVEY
02476A 9359 39                      RTS
02477                        *
02478A 935A 86   52        A STEPD  LDA    #$52
02479A 935C 97   90        A        STA    YSTR
02480A 935E CC   0001      A        LDD    #1
02481A 9361 DD   91        A        STD    YSTR+1
02482A 9363 BD   8B59      A        JSR    MOVEY
02483A 9366 39                      RTS
02484                        *
02485A 9367 86   53        A STEPR  LDA    #$53
02486A 9369 97   8D        A        STA    XSTR
02487A 936B CC   0001      A        LDD    #1
02488A 936E DD   8E        A        STD    XSTR+1
02489A 9370 BD   8A39      A        JSR    MOVEX
02490A 9373 39                      RTS
02491                        *
02492A 9374 86   52        A STEPL  LDA    #$52
02493A 9376 97   8D        A        STA    XSTR
02494A 9378 CC   0001      A        LDD    #1
02495A 937B DD   8E        A        STD    XSTR+1
02496A 937D BD   8A39      A        JSR    MOVEX
02497A 9380 39                      RTS
02498                        *
02499A 9381 86   53        A STEPUR LDA    #$53
02500A 9383 97   8D        A        STA    XSTR
02501A 9385 97   90        A        STA    YSTR
02502A 9387 CC   0001      A        LDD    #1
02503A 938A DD   8E        A        STD    XSTR+1
02504A 938C DD   91        A        STD    YSTR+1
02505A 938E BD   8C79      A        JSR    MOVEXY
02506A 9391 39                      RTS
02507                        *
02508A 9392 86   53        A STEPUL LDA    #$53
02509A 9394 97   90        A        STA    YSTR
02510A 9396 4A                      DECA
02511A 9397 97   8D        A        STA    XSTR
02512A 9399 CC   0001      A        LDD    #1
02513A 939C DD   8E        A        STD    XSTR+1
02514A 939E DD   91        A        STD    YSTR+1
02515A 93A0 BD   8C79      A        JSR    MOVEXY
02516A 93A3 39                      RTS
```

```
02517                              *
02518A 93A4 86    53          A STEPDR LDA    #$53
02519A 93A6 97    8D          A        STA    XSTR
02520A 93A8 4A                         DECA
02521A 93A9 97    90          A        STA    YSTR
02522A 93AB CC    0001        A        LDD    #1
02523A 93AE DD    8E          A        STD    XSTR+1
02524A 93B0 DD    91          A        STD    YSTR+1
02525A 93B2 BD    8C79        A        JSR    MOVEXY
02526A 93B5 39                         RTS
02527                              *
02528A 93B6 86    52          A STEPDL LDA    #$52
02529A 93B8 97    8D          A        STA    XSTR
02530A 93BA 97    90          A        STA    YSTR
02531A 93BC CC    0001        A        LDD    #1
02532A 93BF DD    8E          A        STD    XSTR+1
02533A 93C1 DD    91          A        STD    YSTR+1
02534A 93C3 BD    8C79        A        JSR    MOVEXY
02535A 93C6 39                         RTS
02536                              *
02537A 93C7 B6    E001        A STPUP  LDA    LEDS+1
02538A 93CA 84    10          A        ANDA   #$10      UP LED
02539A 93CC 1026  FEAE 927E            LBNE   INSTEP
02540A 93D0 BD    934D        A        JSR    STEPU
02541A 93D3 7E    92D1        A        JMP    STEP1
02542                              *
02543A 93D6 B6    E001        A STPDWN LDA    LEDS+1
02544A 93D9 84    20          A        ANDA   #$20      DOWN LED
02545A 93DB 1026  FE9F 927E            LBNE   INSTEP
02546A 93DF BD    935A        A        JSR    STEPD
02547A 93E2 7E    92D1        A        JMP    STEP1
02548                              *
02549A 93E5 B6    E001        A STPRHT LDA    LEDS+1
02550A 93E8 84    40          A        ANDA   #$40      RIGHT LED
02551A 93EA 1026  FE90 927E            LBNE   INSTEP
02552A 93EE BD    9367        A        JSR    STEPR
02553A 93F1 7E    92D1        A        JMP    STEP1
02554                              *
02555A 93F4 B6    E001        A STPLFT LDA    LEDS+1
02556A 93F7 84    80          A        ANDA   #$80      LEFT LED
02557A 93F9 1026  FE81 927E            LBNE   INSTEP
02558A 93FD BD    9374        A        JSR    STEPL
02559A 9400 7E    92D1        A        JMP    STEP1
02560                              *
02561A 9403 B6    E001        A UPRHT  LDA    LEDS+1
02562A 9406 84    50          A        ANDA   #$50      UP/RIGHT LEDS+1
02563A 9408 1026  FE72 927E            LBNE   INSTEP
02564A 940C BD    9381        A        JSR    STEPUR
02565A 940F 7E    92D1        A        JMP    STEP1
02566                              *
02567A 9412 B6    E001        A UPLFT  LDA    LEDS+1
02568A 9415 84    90          A        ANDA   #$90
02569A 9417 1026  FE63 927E            LBNE   INSTEP
02570A 941B BD    9392        A        JSR    STEPUL
02571A 941E 7E    92D1        A        JMP    STEP1
02572                              *
02573A 9421 B6    E001        A DWNLFT LDA    LEDS+1
02574A 9424 84    A0          A        ANDA   #$A0
02575A 9426 1026  FE54 927E            LBNE   INSTEP
02576A 942A BD    93B6        A        JSR    STEPDL
02577A 942D 7E    92D1        A        JMP    STEP1
02578                              *
02579A 9430 B6    E001        A DWNRHT LDA    LEDS+1
02580A 9433 84    60          A        ANDA   #$60
02581A 9435 1026  FE45 927E            LBNE   INSTEP
02582A 9439 BD    93A4        A        JSR    STEPDR
02583A 943C 7E    92D1        A        JMP    STEP1
02584                              *
02585A 943F 7E    8ECE        A ENDSTP JMP    ALLOFF
02586                              *
02587A 9442 86    34          A CALJMP LDA    #$34
02588A 9444 B7    E003        A        STA    LEDS+3
02589A 9447 20    24    946D           BRA    JUMP
```

```
02530 02590                          *
02540 02591A 9449 81   74      A LOADPG CMPA   #$74      LPAGE?
02550 02592A 944B 27   10   945D        BEQ    LPAG
02560 02593A 944D 81   68      A        CMPA   #$68      CLEAR?
02570 02594A 944F 27   14   9465        BEQ    CLR1
02580 02595A 9451 81   70      A        CMPA   #$70      PAGON?
02590 02596A 9453 27   14   9469        BEQ    PAGON1
02600 02597A 9455 81   71      A        CMPA   #$71      PAGOFF?
02610 02598A 9457 26   03   945C        BNE    PGEND
02620 02599A 9459 BD   8EAF    A        JSR    PAGOFF
02630 02600A 945C 39             PGEND  RTS
02640 02601                      *
02650 02602A 945D 34   02      A LPAG   PSHS   A
02660 02603A 945F BD   8EDE    A        JSR    LPAGE
02670 02604A 9462 35   02      A        PULS   A
02680 02605A 9464 39                    RTS
02690 02606A 9465 BD   8EB8    A CLR1   JSR    CLEAR
02700 02607A 9468 39                    RTS
02710 02608A 9469 BD   8EA6    A PAGON1 JSR    PAGON
02720 02609A 946C 39                    RTS
00010 02610                             TTL    JUMP

00030 02612                      ***********************************************
00040 02613                      *  COPYRIGHT BY ASM DIE BONDING INC.  1982
00050 02614                      *     SOFTWARE FOR THE D2KH DIE BONDER
00060 02615                      *            JUMP   REV. 2.0A
00070 02616                      *
00080 02617                      *  DISK ID        : VIDEO 2
00090 02618                      *  DATE           :
00100 02619                      *  DWG NO         :
00110 02620                      *  ASSM NUMBER    :
00120 02621                      *  EPROM ID TAG   :
00130 02622                      *  ORGINATOR      :
00140 02623                      *  REVISED        :
00150 02624                      ***********************************************
00160 02625                      *    M U L T - K E Y   C O M M A N D   $63
00170 02626                      *
00180 02627                      *              J U M P
00190 02628                      ***********************************************
00200 02629                      *
00210 02630                      FINDIT MACR
      02631                      0220        CMPX   #REPLY0
      02632                      0230        BNE    \.0
      02633                      0240        TSTA
      02634                      0250        BNE    \.0
      02635                      0260        JSR    FIND
      02636                      0270        PSHS   A
      02637                      0280        JSR    \.0
      02638                      0290        PULS   A
      02639                      0300 \.0    RTS
      02640                      0310        ENDM
00320 02641                      *
00330 02642A 946D 7D   6010    A JUMP   TST    DIEEJT
00340 02643A 9470 2A   04   9476        BPL    JUMPOK
00350 02644A 9472 8E   819D    A        LDX    #REPLYE  SOFT "DIE IS UP"
00360 02645A 9475 39                    RTS
00370 02646                      *
00380 02647A 9476 7D   1C6E    A JUMPOK TST    ALIGNF
00390 02648A 9479 26   04   947F        BNE    JUMP01
00400 02649A 947B 8E   81BA    A        LDX    #REPLYF  SOFT"NO MEASURE DIE"
00410 02650A 947E 39                    RTS
00420 02651                      *
00430 02652A 947F 86   02      A JUMP01 LDA    ##02
00440 02653A 9481 BA   E001    A        ORA    LEDS+1
00450 02654A 9484 B7   E001    A        STA    LEDS+1   TURN ON JUMP LED
00460 02655A 9487 BD   A124    A        JSR    DPLY8    TURN ON PATTERN
00470 02656                      *
00480 02657A 948A BD   8681    A INJUMP JSR    OUTOK
00490 02658A 948D BD   8667    A INJMP2 JSR    NEXT     GET NEXT MICRO CMD
00500 02659A 9490 BD   9449    A        JSR    LOADPG   CHECK TO SEE LOAD PAGE
00510 02660                      *
00520 02661A 9493 34   02      A        PSHS   A
00530 02662A 9495 BD   A124    A        JSR    DPLY8
00540 02663A 9498 35   02      A        PULS   A
```

```
02664                                    *
02665A 949A 81   64        A             CMPA    ##$64     STEP?
02666A 949C 1027 00EB 958B               LBEQ    CALSTP
02667A 94A0 81   63        A             CMPA    ##$63     JUMP?
02668A 94A2 1027 00EB 9591               LBEQ    ENDJMP
02669A 94A6 81   05        A             CMPA    ##$5      DISABLE SERVICE?

02670A 94A8 1027 00E5 9591               LBEQ    ENDJMP
02671A 94AC 81   02        A             CMPA    ##$2      STOP?
02672A 94AE 1027 00DF 9591               LBEQ    ENDJMP
02673A 94B2 81   1A        A             CMPA    ##$1A     VAR UP?
02674A 94B4 1027 00E0 9598               LBEQ    JMPUP
02675A 94B8 81   1B        A             CMPA    ##$1B     VAR DOWN?
02676A 94BA 1027 00E8 95A6               LBEQ    JMPDWN
02677A 94BE 81   1D        A             CMPA    ##$1D     VAR RIGHT?
02678A 94C0 1027 00F1 95B5               LBEQ    JMPRHT
02679A 94C4 81   1C        A             CMPA    ##$1C     VAR LEFT?
02680A 94C6 1027 00FA 95C4               LBEQ    JMPLFT
02681A 94CA 81   1F        A             CMPA    ##$1F     VAR UP-RIGHT?
02682A 94CC 1027 0103 95D3               LBEQ    JUPRHT
02683A 94D0 81   1E        A             CMPA    ##$1E     VAR UP-LEFT?
02684A 94D2 1027 010C 95E2               LBEQ    JUPLFT
02685A 94D6 81   21        A             CMPA    ##$21     VAR DOWN-LEFT
02686A 94D8 1027 0115 95F1               LBEQ    JDNLFT
02687A 94DC 81   20        A             CMPA    ##$20     VAR DOWN-RIGHT?
02688A 94DE 1027 011E 9600               LBEQ    JDNRHT
02689A 94E2 20   A6   948A               BRA     INJUMP
02690                                    *
02691A 94E4 8C   8097      A JUMP1       CMPX    #REPLY0
02692A 94E7 27   07   94F0               BEQ     JUMP2
02693A 94E9 8C   8127      A             CMPX    #REPLY7
02694A 94EC 1026 00A4 9594               LBNE    JMPERR
02695A 94F0 C6   08        A JUMP2       LDB     #8
02696A 94F2 F4   E001      A             ANDB    LEDS+1
02697A 94F5 27   07   94FE               BEQ     JUMP4
02698A 94F7 8E   FFFF      A             LDX     ##FFFF
02699A 94FA 30   1F        A JUMP3       LEAX    -1,X
02700A 94FC 26   FC   94FA               BNE     JUMP3
02701A 94FE C6   0A        A JUMP4       LDB     ##A
02702A 9500 F4   E001      A             ANDB    LEDS+1
02703A 9503 F7   E001      A             STB     LEDS+1    JUMP ON , VAR OFF
02704A 9506 81   01        A             CMPA    ##1
02705A 9508 27   0B   9515               BEQ     XMAL
02706A 950A 81   02        A             CMPA    ##$2
02707A 950C 27   23   9531               BEQ     YMAL
02708A 950E 81   03        A             CMPA    ##$3
02709A 9510 27   3B   954D               BEQ     XYMAL
02710A 9512 7E   948A      A             JMP     INJUMP
02711                                    *
02712A 9515 D6   8D        A XMAL        LDB     XSTR
02713A 9517 C4   01        A             ANDB    #1
02714A 9519 27   0B   9526               BEQ     XLFT
02715A 951B 86   40        A             LDA     ##$40
02716A 951D BA   E001      A             ORA     LEDS+1
02717A 9520 B7   E001      A             STA     LEDS+1
02718A 9523 7E   948A      A             JMP     INJUMP
02719                                    *
02720A 9526 86   80        A XLFT        LDA     ##$80
02721A 9528 BA   E001      A             ORA     LEDS+1
02722A 952B B7   E001      A             STA     LEDS+1
02723A 952E 7E   948A      A             JMP     INJUMP
02724                                    *
02725A 9531 D6   90        A YMAL        LDB     YSTR
02726A 9533 C4   01        A             ANDB    #1
02727A 9535 27   0B   9542               BEQ     YDWN

02728A 9537 86   10        A             LDA     ##$10
02729A 9539 BA   E001      A             ORA     LEDS+1
02730A 953C B7   E001      A             STA     LEDS+1
02731A 953F 7E   948A      A             JMP     INJUMP
02732                                    *
02733A 9542 86   20        A YDWN        LDA     ##$20
02734A 9544 BA   E001      A             ORA     LEDS+1
```

```
02735A 9547 B7   E001      A          STA    LEDS+1
02736A 954A 7E   948A      A          JMP    INJUMP
02737                        *
02738A 954D 96   8D        A XYMAL    LDA    XSTR
02739A 954F 84   01        A          ANDA   #1
02740A 9551 27   11   9564            BEQ    XLY1
02741A 9553 96   90        A          LDA    YSTR
02742A 9555 84   01        A          ANDA   #1
02743A 9557 27   1C   9575            BEQ    XRYD1
02744A 9559 86   50        A XRYU1    LDA    #$50
02745A 955B BA   E001      A          ORA    LEDS+1
02746A 955E B7   E001      A          STA    LEDS+1
02747A 9561 7E   948A      A          JMP    INJUMP
02748                        *
02749A 9564 96   90        A XLY1     LDA    YSTR
02750A 9566 84   01        A          ANDA   #1
02751A 9568 27   16   9580            BEQ    XLYD1
02752A 956A 86   90        A XLYU1    LDA    #$90
02753A 956C BA   E001      A          ORA    LEDS+1
02754A 956F B7   E001      A          STA    LEDS+1
02755A 9572 7E   948A      A          JMP    INJUMP
02756                        *
02757A 9575 86   60        A XRYD1    LDA    #$60
02758A 9577 BA   E001      A          ORA    LEDS+1
02759A 957A B7   E001      A          STA    LEDS+1
02760A 957D 7E   948A      A          JMP    INJUMP
02761                        *
02762A 9580 86   A0        A XLYD1    LDA    #$A0
02763A 9582 BA   E001      A          ORA    LEDS+1
02764A 9585 B7   E001      A          STA    LEDS+1
02765A 9588 7E   948A      A          JMP    INJUMP
02766                        *
02767A 958B 7F    )01      A CALSTP   CLR    LEI  1
02768A 958E 7E   )262      A          JMP    STEr
02769                        *
02770A 9591 7E   8ECE      A ENDJMP   JMP    ALLOFF
02771                        *
02772A 9594 7F   E001      A JMPERR   CLR    LEDS+1
02773A 9597 39                        RTS
02774                        *
02775A 9598 B6   E001      A JMPUP    LDA    LEDS+1
02776A 959B 84   10        A          ANDA   #$10
02777A 959D 1026 FECC 946D            LBNE   JUMP
02778A 95A1 8D   6C   960F            BSR    JMPU
02779A 95A3 7E   94E4      A          JMP    JUMP1
02780                        *
02781A 95A6 B6   E001      A JMPDWN   LDA    LEDS+1
02782A 95A9 84   20        A          ANDA   #$20
02783A 95AB 1026 FEBE 946D            LBNE   JUMP
02784A 95AF BD   9634      A          JSR    JMPD
02785A 95B2 7E   94E4      A          JMP    JUMP1
02786                        *
02787A 95B5 B6   E001      A JMPRHT   LDA    LEDS+1
02788A 95B8 84   80        A          ANDA   #$80
02789A 95BA 1026 FEAF 946D            LBNE   JUMP
02790A 95BE BD   9659      A          JSR    JMPR
02791A 95C1 7E   94E4      A          JMP    JUMP1
02792                        *
02793A 95C4 B6   E001      A JMPLFT   LDA    LEDS+1
02794A 95C7 84   40        A          ANDA   #$40
02795A 95C9 1026 FEA0 946D            LBNE   JUMP
02796A 95CD BD   967E      A          JSR    JMPL
02797A 95D0 7E   94E4      A          JMP    JUMP1
02798                        *
02799A 95D3 B6   E001      A JUPRHT   LDA    LEDS+1
02800A 95D6 84   50        A          ANDA   #$50
02801A 95D8 1026 FE91 946D            LBNE   JUMP
02802A 95DC BD   9731      A          JSR    JMPUR
02803A 95DF 7E   94E4      A          JMP    JUMP1
02804                        *
02805A 95E2 B6   E001      A JUPLFT   LDA    LEDS+1
02806A 95E5 84   90        A          ANDA   #$90
02807A 95E7 1026 FE82 946D            LBNE   JUMP
02808A 95EB BD   9702      A          JSR    JMPUL
```

```
02000 02809A 95EE 7E   94E4      A        JMP    JUMP1
02010 02810                        *
02020 02811A 95F1 B6   E001      A JDNLFT LDA    LEDS+1
02030 02812A 95F4 84   A0        A        ANDA   #$A0
02040 02813A 95F6 1026 FE73 946D          LBNE   JUMP
02050 02814A 95FA BD   96D2      A        JSR    JMPDL
02060 02815A 95FD 7E   94E4      A        JMP    JUMP1
02070 02816                        *
02080 02817A 9600 B6   E001      A JDNRHT LDA    LEDS+1
02090 02818A 9603 84   60        A        ANDA   #$60
02100 02819A 9605 1026 FE64 946D          LBNE   JUMP
02110 02820A 9609 BD   96A3      A        JSR    JMPDR
02120 02821A 960C 7E   94E4      A        JMP    JUMP1
02130 02822                        *
02140 02823                        *
02150 02824A 960F BD   9761      A JMPU   JSR    FNDOFF
02160 02825A 9612 86   51        A        LDA    #$51
02170 02826A 9614 97   90        A        STA    YSTR
02180 02827A 9616 B7   1C03      A        STA    JMPY
02190 02828A 9619 FC   1C04      A        LDD    JMPY+1
02200 02829A 961C DD   91        A        STD    YSTR+1
02210 02830A 961E BD   8B59      A        JSR    MOVEY
02220 02831A 9621                         FINDIT UPDTY
02220        A 9621 8C   8097      A        CMPX   #REPLY0
02220        A 9624 26   0D   9633          BNE    .00006
02220        A 9626 4D                      TSTA
02220        A 9627 26   0A   9633          BNE    .00006
02220        A 9629 BD   A19F      A        JSR    FIND
02220        A 962C 34   02        A        PSHS   A
02220        A 962E BD   97AA      A        JSR    UPDTY
02220        A 9631 35   02        A        PULS   A
02220        A 9633 39                 .00006 RTS
02230 02832                        *
02240 02833A 9634 BD   9761      A JMPD   JSR    FNDOFF
02250 02834A 9637 86   50        A        LDA    #$50
02260 02835A 9639 97   90        A        STA    YSTR
02270 02836A 963B B7   1C03      A        STA    JMPY
02280 02837A 963E FC   1C04      A        LDD    JMPY+1
02290 02838A 9641 DD   91        A        STD    YSTR+1
02300 02839A 9643 BD   8B59      A        JSR    MOVEY
02310 02840A 9646                         FINDIT UPDTY
02310        A 9646 8C   8097      A        CMPX   #REPLY0
02310        A 9649 26   0D   9658          BNE    .00007
02310        A 964B 4D                      TSTA
02310        A 964C 26   0A   9658          BNE    .00007
02310        A 964E BD   A19F      A        JSR    FIND
02310        A 9651 34   02        A        PSHS   A
02310        A 9653 BD   97AA      A        JSR    UPDTY
02310        A 9656 35   02        A        PULS   A
02310        A 9658 39                 .00007 RTS
02320 02841                        *
02330 02842A 9659 BD   9761      A JMPR   JSR    FNDOFF
02340 02843A 965C 86   50        A        LDA    #$50
02350 02844A 965E 97   8D        A        STA    XSTR
02360 02845A 9660 B7   1C00      A        STA    JMPX
02370 02846A 9663 FC   1C01      A        LDD    JMPX+1
02380 02847A 9666 DD   8E        A        STD    XSTR+1
02390 02848A 9668 BD   8A39      A        JSR    MOVEX
02400 02849A 966B                         FINDIT UPDTX
02400        A 966B 8C   8097      A        CMPX   #REPLY0
02400        A 966E 26   0D   967D          BNE    .00008
02400        A 9670 4D                      TSTA
02400        A 9671 26   0A   967D          BNE    .00008
02400        A 9673 BD   A19F      A        JSR    FIND
02400        A 9676 34   02        A        PSHS   A
02400        A 9678 BD   9771      A        JSR    UPDTX
02400        A 967B 35   02        A        PULS   A
02400        A 967D 39                 .00008 RTS
02410 02850                        *
02420 02851A 967E BD   9761      A JMPL   JSR    FNDOFF
02430 02852A 9681 86   51        A        LDA    #$51
02440 02853A 9683 97   8D        A        STA    XSTR
02450 02854A 9685 B7   1C00      A        STA    JMPX
```

```
02460 02855A 9688 FC   1C01      A           LDD    JMPX+1
02470 02856A 968B DD   8E        A           STD    XSTR+1
02480 02857A 968D BD   8A39      A           JSR    MOVEX
02490 02858A 9690                            FINDIT UPDTX
02490        A 9690 8C   8097      A           CMPX   #REPLY0
02490        A 9693 26   0D    96A2            BNE    .00009
02490        A 9695 4D                         TSTA
02490        A 9696 26   0A    96A2            BNE    .00009
02490        A 9698 BD   A19F      A           JSR    FIND
02490        A 969B 34   02        A           PSHS   A
02490        A 969D BD   9771      A           JSR    UPDTX
02490        A 96A0 35   02        A           PULS   A
02490        A 96A2 39                  .00009 RTS
02500 02859                            *
02510 02860A 96A3 BD   9761      A JMPDR    JSR    FNDOFF
02520 02861A 96A6 86   50        A           LDA    #$50
02530 02862A 96A8 97   8D        A           STA    XSTR
02540 02863A 96AA B7   1C00      A           STA    JMPX
02550 02864A 96AD 97   90        A           STA    YSTR
02560 02865A 96AF B7   1C03      A           STA    JMPY
02570 02866A 96B2 FC   1C01      A           LDD    JMPX+1
02580 02867A 96B5 DD   8E        A           STD    XSTR+1
02590 02868A 96B7 FC   1C04      A           LDD    JMPY+1
02600 02869A 96BA DD   91        A           STD    YSTR+1
02610 02870A 96BC BD   8C79      A           JSR    MOVEXY
02620 02871A 96BF                            FINDIT UPDATE
02620        A 96BF 8C   8097      A           CMPX   #REPLY0
02620        A 96C2 26   0D    96D1            BNE    .00010
02620        A 96C4 4D                         TSTA
02620        A 96C5 26   0A    96D1            BNE    .00010
02620        A 96C7 BD   A19F      A           JSR    FIND
02620        A 96CA 34   02        A           PSHS   A
02620        A 96CC BD   97A5      A           JSR    UPDATE
02620        A 96CF 35   02        A           PULS   A
02620        A 96D1 39                  .00010 RTS
02630 02872                            *
02640 02873A 96D2 BD   9761      A JMPDL    JSR    FNDOFF
02650 02874A 96D5 86   51        A           LDA    #$51
02660 02875A 96D7 97   8D        A           STA    XSTR
02670 02876A 96D9 B7   1C00      A           STA    JMPX
02680 02877A 96DC 4A                         DECA
02690 02878A 96DD 97   90        A           STA    YSTR
02700 02879A 96DF B7   1C03      A           STA    JMPY
02710 02880A 96E2 FC   1C01      A           LDD    JMPX+1
02720 02881A 96E5 DD   8E        A           STD    XSTR+1
02730 02882A 96E7 FC   1C04      A           LDD    JMPY+1
02740 02883A 96EA DD   91        A           STD    YSTR+1
02750 02884A 96EC BD   8C79      A           JSR    MOVEXY
02760 02885A 96EF                            FINDIT UPDATE
02760        A 96EF 8C   8097      A           CMPX   #REPLY0
02760        A 96F2 26   0D    9701            BNE    .00011
02760        A 96F4 4D                         TSTA
02760        A 96F5 26   0A    9701            BNE    .00011
02760        A 96F7 BD   A19F      A           JSR    FIND
02760        A 96FA 34   02        A           PSHS   A
02760        A 96FC BD   97A5      A           JSR    UPDATE
02760        A 96FF 35   02        A           PULS   A
02760        A 9701 39                  .00011 RTS
02770 02886                            *
02780 02887A 9702 BD   9761      A JMPUL    JSR    FNDOFF
02790 02888A 9705 86   51        A           LDA    #$51
02800 02889A 9707 97   8D        A           STA    XSTR
02810 02890A 9709 B7   1C00      A           STA    JMPX
02820 02891A 970C 97   90        A           STA    YSTR
02830 02892A 970E B7   1C03      A           STA    JMPY
02840 02893A 9711 FC   1C01      A           LDD    JMPX+1
02850 02894A 9714 DD   8E        A           STD    XSTR+1
02860 02895A 9716 FC   1C04      A           LDD    JMPY+1
02870 02896A 9719 DD   91        A           STD    YSTR+1
02880 02897A 971B BD   8C79      A           JSR    MOVEXY
02890 02898A 971E                            FINDIT UPDATE
02890        A 971E 8C   8097      A           CMPX   #REPLY0
02890        A 9721 26   0D    9730            BNE    .00012
02890        A 9723 4D                         TSTA
```

```
02890        A 9724 26   0A   9730          BNE    .00012
02890        A 9726 BD   A19F      A        JSR    FIND
02890        A 9729 34   02        A        PSHS   A
02890        A 972B BD   97A5      A        JSR    UPDATE
02890        A 972E 35   02        A        PULS   A
02890        A 9730 39                .00012 RTS
02900 02899                           *
02910 02900A 9731 BD   9761      A JMPUR   JSR    FNDOFF
02920 02901A 9734 86   51        A         LDA    #$51
02930 02902A 9736 97   90        A         STA    YSTR
02940 02903A 9738 B7   1C03      A         STA    JMPY
02950 02904A 973B 4A                       DECA
02960 02905A 973C 97   8D        A         STA    XSTR
02970 02906A 973E B7   1C00      A         STA    JMPX
02980 02907A 9741 FC   1C01      A         LDD    JMPX+1
02990 02908A 9744 DD   8E        A         STD    XSTR+1
03000 02909A 9746 FC   1C04      A         LDD    JMPY+1
03010 02910A 9749 DD   91        A         STD    YSTR+1
03020 02911A 974B BD   8C79      A         JSR    MOVEXY
03030 02912A 974E                          FINDIT UPDATE
03030        A 974E 8C   8097      A        CMPX   #REPLY0
03030        A 9751 26   0D   9760          BNE    .00013
03030        A 9753 4D                      TSTA
03030        A 9754 26   0A   9760          BNE    .00013
03030        A 9756 BD   A19F      A        JSR    FIND
03030        A 9759 34   02        A        PSHS   A
03030        A 975B BD   97A5      A        JSR    UPDATE
03030        A 975E 35   02        A        PULS   A
03030        A 9760 39                .00013 RTS
03040 02913                           *
03050 02914A 9761 BD   A124      A FNDOFF  JSR    DPLY8
03060 02915A 9764 86   0A        A         LDA    #$A
03070 02916A 9766 B4   E001      A         ANDA   LEDS+1
03080 02917A 9769 B7   E001      A         STA    LEDS+1
03090 02918A 976C 39                       RTS
03100 02919                           *
03110 02920A 976D 8E   809D      A ERRJMP  LDX    #REPLY2
03120 02921A 9770 39                       RTS
03130 02922                           *
03140 02923A 9771 FC   1C01      A UPDTX   LDD    JMPX+1
03150 02924A 9774 44                       LSRA
03160 02925A 9775 56                       RORB
03170 02926A 9776 44                       LSRA
03180 02927A 9777 56                       RORB
03190 02928A 9778 44                       LSRA
03200 02929A 9779 56                       RORB
03210 02930A 977A 44                       LSRA
03220 02931A 977B 56                       RORB
03230 02932A 977C 1093 8E        A         CMPD   XSTR+1
03240 02933A 977F 25   22   97A3           BLO    UPDAT2
03250 02934A 9781 04   8E        A         LSR    XSTR+1
03260 02935A 9783 06   8F        A         ROR    XSTR+2
03270 02936A 9785 04   8E        A         LSR    XSTR+1
03280 02937A 9787 06   8F        A         ROR    XSTR+2
03290 02938A 9789 B6   1C00      A         LDA    JMPX
03300 02939A 978C 98   8D        A         EORA   XSTR
03310 02940A 978E 44                       LSRA
03320 02941A 978F 24   0A   979B           BCC    UPDAT1
03330 02942A 9791 FC   1C01      A         LDD    JMPX+1
03340 02943A 9794 93   8E        A         SUBD   XSTR+1
03350 02944A 9796 FD   1C01      A         STD    JMPX+1
03360 02945A 9799 20   08   97A3           BRA    UPDAT2
03370 02946A 979B FC   1C01      A UPDAT1  LDD    JMPX+1
03380 02947A 979E D3   8E        A         ADDD   XSTR+1
03390 02948A 97A0 FD   1C01      A         STD    JMPX+1
03400 02949A 97A3 4F               UPDAT2  CLRA
03410 02950A 97A4 39                       RTS
03420 02951                           *
03430 02952A 97A5 8D   CA   9771 UPDATE  BSR    UPDTX
03440 02953A 97A7 8D   01   97AA         BSR    UPDTY
03450 02954A 97A9 39                       RTS
03460 02955                           *
03470 02956A 97AA FC   1C04      A UPDTY   LDD    JMPY+1
```

```
03480 02957A 97AD 44                          LSRA
03490 02958A 97AE 56                          RORB
03500 02959A 97AF 44                          LSRA
03510 02960A 97B0 56                          RORB
03520 02961A 97B1 44                          LSRA
03530 02962A 97B2 56                          RORB
03540 02963A 97B3 44                          LSRA
03550 02964A 97B4 56                          RORB
03560 02965A 97B5 1093 91       A             CMPD   YSTR+1
03570 02966A 97B8 25   22   97DC              BLO    UPDAT4
03580 02967A 97BA 04   91       A             LSR    YSTR+1
03590 02968A 97BC 06   92       A             ROR    YSTR+2
03600 02969A 97BE 04   91       A             LSR    YSTR+1
03610 02970A 97C0 06   92       A             ROR    YSTR+2
03620 02971A 97C2 B6   1C03     A             LDA    JMPY
03630 02972A 97C5 98   90       A             EORA   YSTR
03640 02973A 97C7 44                          LSRA
03650 02974A 97C8 24   0A   97D4              BCC    UPDAT3
03660 02975A 97CA FC   1C04     A             LDD    JMPY+1
03670 02976A 97CD 93   91       A             SUBD   YSTR+1
03680 02977A 97CF FD   1C04     A             STD    JMPY+1
03690 02978A 97D2 20   08   97DC              BRA    UPDAT4
03700 02979A 97D4 FC   1C04     A UPDAT3      LDD    JMPY+1
03710 02980A 97D7 D3   91       A             ADDD   YSTR+1
03720 02981A 97D9 FD   1C04     A             STD    JMPY+1
03730 02982A 97DC 4F              UPDAT4      CLRA
03740 02983A 97DD 39                          RTS
00010 02984                                   TTL    RETADJ
00030 02986                       ***********************************************
00040 02987                       *  COPYRIGHT BY ASM DIE BONDING INC.   1982
00050 02988                       *     SOFTWARE FOR THE D2KH DIE BONDER
00060 02989                       *            RETADJ REV. 2.0A
00070 02990                       *
00080 02991                       *  DISK ID        : VIDEO 2
00090 02992                       *  DATE           :
00100 02993                       *  DWG NO         :
00110 02994                       *  ASSM NUMBER    :
00120 02995                       *  EPROM ID TAG   :
00130 02996                       *  ORGINATOR      :
00140 02997                       *  REVISED        :
00150 02998                       ***********************************************
00160 02999                       *   M U L T - K E Y   C O M M A N D   $67
00170 03000                       *
00180 03001                       *      R E T I C L E   A D J U S T
00190 03002                       ***********************************************
00200 03003                       *
00210 03004                       TEST    MACR              WHAT,LIMIT,TURNON,LIMIT
      03005                       0220          LDA     \0
      03006                       0230          CMPA    #$\1
      03007                       0240          BLO     \.0
      03008                       0250          LDA     #$\2
      03009                       0260          COMA
      03010                       0270          ANDA    LEDS+1
      03011                       0280          ORA     #4
      03012                       0290          STA     LEDS+1
      03013                       0300          BRA     \.1
      03014                       0310 \.0      LDA     LEDS+1
      03015                       0320          ORA     #$\2
      03016                       0330          STA     LEDS+1
      03017                       0340 \.1      EQU     *
      03018                       0350          LDA     \0
      03019                       0360          CMPA    #$\3
      03020                       0370          BHI     \.2
      03021                       0380          LDA     #$\4
      03022                       0390          COMA
      03023                       0400          ANDA    LEDS+1
      03024                       0410          ORA     #4
      03025                       0420          STA     LEDS+1
      03026                       0430          BRA     \.3
      03027                       0440 \.2      EQU     *
      03028                       0450          LDA     LEDS+1
      03029                       0460          ORA     #$\4
      03030                       0470          STA     LEDS+1
      03031                       0480 \.3      EQU     *
```

```
      03032                          0490         ENDM
00500 03033                          *
00510 03034A 97DE 86    0F        A DISPLF LDA     #$F
00520 03035A 97E0 B7    7600      A        STA     CNTRAD
00530 03036A 97E3 86    02        A        LDA     #2
00540 03037A 97E5 B7    7601      A        STA     CNTRAD+1 AND TURN IT ON (WINDOW)
00550 03038A 97E8 39                       RTS
00560 03039                          *
00570 03040A 97E9 86    04        A RETADJ LDA     #$04
00580 03041A 97EB B4    E001      A        ANDA    LEDS+1
00590 03042A 97EE B7    E001      A        STA     LEDS+1   TURN ON RETADJ LED
00600 03043A 97F1 BD    8E90      A        JSR     PATOFF
00610 03044A 97F4 BD    A0DE      A        JSR     MINPAT
00620 03045A 97F7 8D    E5   97DE          BSR     DISPLF
00630 03046                          *
00640 03047A 97F9 BD    990B      A RET1   JSR     DELAY
00650 03048A 97FC BD    8681      A        JSR     OUTOK
00660 03049A 97FF                   RET2   TEST    YSIZE,40,10,A0,20
00660        A 97FF B6  7300      A        LDA     YSIZE
00660        A 9802 81  40        A        CMPA    #$40
00660        A 9804 25  0D   9813          BLO     .00014
00660        A 9806 86  10        A        LDA     #$10
00660        A 9808 43                     COMA
00660        A 9809 B4  E001      A        ANDA    LEDS+1
00660        A 980C 8A  04        A        ORA     #4
00660        A 980E B7  E001      A        STA     LEDS+1
00660        A 9811 20  08   981B          BRA     .00015
00660        A 9813 B6  E001      A .00014 LDA     LEDS+1
00660        A 9816 8A  10        A        ORA     #$10
00660        A 9818 B7  E001      A        STA     LEDS+1
00660                   981B      A .00015 EQU     *
00660        A 981B B6  7300      A        LDA     YSIZE
00660        A 981E 81  A0        A        CMPA    #$A0
00660        A 9820 22  0D   982F          BHI     .00016
00660        A 9822 86  20        A        LDA     #$20
00660        A 9824 43                     COMA
00660        A 9825 B4  E001      A        ANDA    LEDS+1
00660        A 9828 8A  04        A        ORA     #4
00660        A 982A B7  E001      A        STA     LEDS+1
00660        A 982D 20  08   9837          BRA     .00017
00660                   982F      A .00016 EQU     *
00660        A 982F B6  E001      A        LDA     LEDS+1
00660        A 9832 8A  20        A        ORA     #$20
00660        A 9834 B7  E001      A        STA     LEDS+1
00660                   9837      A .00017 EQU     *
00670 03050A 9837                          TEST    XSIZE,8B,80,EB,40
00670        A 9837 B6  7200      A        LDA     XSIZE
00670        A 983A 81  8B        A        CMPA    #$8B
00670        A 983C 25  0D   984B          BLO     .00018
00670        A 983E 86  80        A        LDA     #$80
00670        A 9840 43                     COMA
00670        A 9841 B4  E001      A        ANDA    LEDS+1
00670        A 9844 8A  04        A        ORA     #4
00670        A 9846 B7  E001      A        STA     LEDS+1
00670        A 9849 20  08   9853          BRA     .00019
00670        A 984B B6  E001      A .00018 LDA     LEDS+1
00670        A 984E 8A  80        A        ORA     #$80
00670        A 9850 B7  E001      A        STA     LEDS+1
00670                   9853      A .00019 EQU     *
00670        A 9853 B6  7200      A        LDA     XSIZE
00670        A 9856 81  EB        A        CMPA    #$EB
00670        A 9858 22  0D   9867          BHI     .00020
00670        A 985A 86  40        A        LDA     #$40
00670        A 985C 43                     COMA
00670        A 985D B4  E001      A        ANDA    LEDS+1
00670        A 9860 8A  04        A        ORA     #4
00670        A 9862 B7  E001      A        STA     LEDS+1
00670        A 9865 20  08   986F          BRA     .00021
00670                   9867      A .00020 EQU     *
00670        A 9867 B6  E001      A        LDA     LEDS+1
00670        A 986A 8A  40        A        ORA     #$40
00670        A 986C B7  E001      A        STA     LEDS+1
00670                   986F      A .00021 EQU     *
00680 03051A 986F BD    8667      A        JSR     NEXT
```

```
03052A 9872 81   02        A         CMPA   #$02       STOP?
03053A 9874 27   67   98DD           BEQ    END
03054A 9876 81   05        A         CMPA   #$5        DISABLE SERVICE?
03055A 9878 27   63   98DD           BEQ    END
03056A 987A 81   67        A         CMPA   #$67       RETADJ?
03057A 987C 27   5F   98DD           BEQ    END
03058A 987E 81   1A        A         CMPA   #$1A       VAR UP?
03059A 9880 26   12   9894           BNE    TSTBOT
03060A 9882 86   10        A         LDA    #$10
03061A 9884 B4   E001      A         ANDA   LEDS+1
03062A 9887 1026 FF6E 97F9           LBNE   RET1
03063A 988B 7A   7300      A         DEC    YSIZE
03064A 988E 7A   1C56      A         DEC    YDIE
03065A 9891 7E   97F9      A         JMP    RET1
03066A 9894 81   1B        A TSTBOT  CMPA   #$1B       VAR DOWN?
03067A 9896 26   12   98AA           BNE    TSTLFT
03068A 9898 86   20        A         LDA    #$20
03069A 989A B4   E001      A         ANDA   LEDS+1
03070A 989D 1026 FF58 97F9           LBNE   RET1
03071A 98A1 7C   7300      A         INC    YSIZE
03072A 98A4 7C   1C56      A         INC    YDIE
03073A 98A7 7E   97F9      A         JMP    RET1
03074A 98AA 81   1D        A TSTLFT  CMPA   #$1D       VAR LEFT?
03075A 98AC 26   12   98C0           BNE    TSTRHT
03076A 98AE 86   80        A         LDA    #$80
03077A 98B0 B4   E001      A         ANDA   LEDS+1
03078A 98B3 1026 FF42 97F9           LBNE   RET1
03079A 98B7 7A   7200      A         DEC    XSIZE
03080A 98BA 7A   1C46      A         DEC    XDIE
03081A 98BD 7E   97F9      A         JMP    RET1
03082A 98C0 81   1C        A TSTRHT  CMPA   #$1C       VAR RIGHT?
03083A 98C2 26   12   98D6           BNE    INVA       OUTPUT INVALD COMMAN
03084A 98C4 86   40        A         LDA    #$40
03085A 98C6 B4   E001      A         ANDA   LEDS+1
03086A 98C9 1026 FF2C 97F9           LBNE   RET1
03087A 98CD 7C   7200      A         INC    XSIZE
03088A 98D0 7C   1C46      A         INC    XDIE
03089A 98D3 7E   97F9      A         JMP    RET1
03090A 98D6 81   05        A INVA    CMPA   #5
03091A 98D8 27   03   98DD           BEQ    END
03092A 98DA 7E   97F9      A         JMP    RET1
03093                        *
03094A 98DD 86   0B        A END     LDA    #$0B
03095A 98DF B4   E001      A         ANDA   LEDS+1
03096A 98E2 B7   E001      A         STA    LEDS+1
03097A 98E5 BD   8E90      A         JSR    PATOFF
03098                        *
03099                        * UPDATE CENTER POINT
03100                        *
03101A 98E8 8E   1C26      A         LDX    #MINX
03102A 98EB 108E 7200      A         LDY    #XSIZE
03103A 98EF C6   10        A         LDB    #16
03104A 98F1 A6   A0        A END1    LDA    ,Y+
03105A 98F3 A7   80        A         STA    ,X+
03106A 98F5 5A                       DECB
03107A 98F6 26   F9   98F1           BNE    END1
03108A 98F8 8E   1C36      A         LDX    #MINY
03109A 98FB 108E 7300      A         LDY    #YSIZE
03110A 98FF C6   10        A         LDB    #16
03111A 9901 A6   A0        A END2    LDA    ,Y+
03112A 9903 A7   80        A         STA    ,X+
03113A 9905 5A                       DECB
03114A 9906 26   F9   9901           BNE    END2
03115                        *
03116                        * FALL INTO ALLOFF TO EXIT
03117                        *
03118A 9908 7E   8ECE      A         JMP    ALLOFF
03119                        *
03120A 990B 86   01        A DELAY   LDA    #1
03121A 990D 108E FFFF      A DELAY1  LDY    #$FFFF
03122A 9911 31   3F        A DELAY2  LEAY   -1,Y
03123A 9913 26   FC   9911           BNE    DELAY2
03124A 9915 4A                       DECA
```

```
01420 03125A 9916 26   F5   990D        BNE    DELAY1
01430 03126A 9918 39                    RTS
00010 03127                             TTL    PARM

00030 03129                    ************************************************
00040 03130                    *  COPYRIGHT BY ASM DIE BONDING INC.   1982
00050 03131                    *     SOFTWARE FOR THE D2KH DIE BONDER
00060 03132                    *            PARAM  REV. 2.0A
00070 03133                    *
00080 03134                    *  DISK ID        : VIDEO 2
00090 03135                    *  DATE           :
00100 03136                    *  DWG NO         :
00110 03137                    *  ASSM NUMBER    :
00120 03138                    *  EPROM ID TAG   :
00130 03139                    *  ORGINATOR      :
00140 03140                    *  REVISED        :
00150 03141                    ************************************************
00160 03142                    *   H O S T  M U L T - C O M M A N D  $7A
00170 03143                    *
00180 03144                    *            P A R A M
00190 03145                    ************************************************
00200 03146                    *
00210 03147                    * THIS WILL INPUT FROM HOST
00220 03148                    * SR1,SR2,SR3,MISSING DIE BEFORE TURNAROUND,
00230 03149                    * WAFER/MATRIX,WAFER SIZE
00240 03150                    *
00250 03151A 9919 8E   01C8       A PARAM  LDX    #STRING
00260 03152A 991C BD   8F90       A PARAM1 JSR    NEXTH
00270 03153A 991F E7   80         A        STB    ,X+
00280 03154A 9921 8C   01E9       A        CMPX   #STRING+33 [(16 HEX)*2]+1
00290 03155A 9924 26   F6   991C           BNE    PARAM1
00300 03156                    *
00310 03157A 9926 B6   6003       A PARAM2 LDA    HOSTBC   LAST REPLY ACK?
00320 03158A 9929 2A   FB   9926           BPL    PARAM2   NO,LOOP
00330 03159A 992B B6   6001       A        LDA    HOSTBD   DUMMY READ
00340 03160A 992E 86   82         A        LDA    #$82
00350 03161A 9930 B7   6001       A        STA    HOSTBD   OUTPUT BUSY
00360 03162                    *
00370 03163A 9933 C1   04         A        CMPB   #4
00380 03164A 9935 26   36   996D           BNE    PARAMX
00390 03165                    *
00400 03166A 9937 8E   01C8       A        LDX    #STRING  START OF ASCII
00410 03167A 993A 108E 1C13       A        LDY    #SR1     START OF "LOAD" HEX
00420 03168                    *
00430 03169A 993E BD   9A12       A PARAM3 JSR    INHEX
00440 03170A 9941 48                       ASLA
00450 03171A 9942 48                       ASLA
00460 03172A 9943 48                       ASLA
00470 03173A 9944 48                       ASLA
00480 03174A 9945 1F   89         A        TFR    A,B
00490 03175A 9947 BD   9A12       A        JSR    INHEX
00500 03176A 994A 34   04         A        PSHS   B
00510 03177A 994C AB   E0         A        ADDA   ,S+
00520 03178A 994E A7   A0         A        STA    ,Y+
00530 03179A 9950 108C 1C23       A        CMPY   #LDPTFL  END OF "LOAD" HEX
00540 03180A 9954 26   E8   993E           BNE    PARAM3
00550 03181                    *
00560 03182A 9956 B6   1C1E       A        LDA    WAFSIZ+1
00570 03183A 9959 4A                       DECA
00580 03184A 995A 2B   11   996D           BMI    PARAMX
00590 03185A 995C 81   04         A        CMPA   #4
00600 03186A 995E 22   0D   996D           BHI    PARAMX
00610 03187A 9960 48                       LSLA
00620 03188A 9961 8E   9A95       A        LDX    #PARTAB
00630 03189A 9964 AD   96         A        JSR    [A,X]
00640 03190A 9966 BD   9A2F       A        JSR    WKSR
00650 03191A 9969 8E   8097       A        LDX    #REPLY0
00660 03192A 996C 39                       RTS
00670 03193                    *
00680 03194A 996D BD   8EB8       A PARAMX JSR    CLEAR
00690 03195A 9970 8E   997B       A        LDX    #MESPAR
00700 03196A 9973 BD   8F15       A        JSR    DISPLY
00710 03197A 9976 BD   8EA6       A        JSR    PAGON
00720 03198A 9979 20   FE   9979           BRA    *
```

```
00730 03199                          *
00740 03200A 997B      20         A MESPAR FCC     "   THERE IS A TRANSMIT ERROR"
00750 03201A 9997      0A         A        FCB     $A
00760 03202A 9998      20         A        FCC     /    OF "STORE" BY THE HOST/
00770 03203A 99B2      04         A        FCB     4
00780 03204                          *
00790 03205A 99B3 CC   0CD9       A SQ1IN  LDD     ##0CD9
00800 03206A 99B6 FD   1C6C       A        STD     MAXMAT+2
00810 03207A 99B9 CC   00A5       A        LDD     ##00A5
00820 03208A 99BC FD   1C66       A        STD     MAXR
00830 03209A 99BF CC   0FF1       A        LDD     ##0FF1
00840 03210A 99C2 FD   1C68       A        STD     MAXR+2
00850 03211A 99C5 39                       RTS
00860 03212                          *
00870 03213A 99C6 CC   1721       A SQ2IN  LDD     ##1721
00880 03214A 99C9 FD   1C6C       A        STD     MAXMAT+2
00890 03215A 99CC CC   0216       A        LDD     ##0216
00900 03216A 99CF FD   1C66       A        STD     MAXR
00910 03217A 99D2 CC   F241       A        LDD     ##F241
00920 03218A 99D5 FD   1C68       A        STD     MAXR+2
00930 03219A 99D8 39                       RTS
00940 03220                          *
00950 03221A 99D9 CC   1FAF       A SQ3IN  LDD     ##1FAF
00960 03222A 99DC FD   1C6C       A        STD     MAXMAT+2 SEE BOOT IF CHANGED
00970 03223A 99DF CC   03EB       A        LDD     ##03EB
00980 03224A 99E2 FD   1C66       A        STD     MAXR
00990 03225A 99E5 CC   D9A1       A        LDD     ##D9A1
01000 03226A 99E8 FD   1C68       A        STD     MAXR+2
01010 03227A 99EB 39                       RTS
01020 03228                          *
01030 03229A 99EC CC   27A6       A SQ4IN  LDD     ##27A6
01040 03230A 99EF FD   1C6C       A        STD     MAXMAT+2
01050 03231A 99F2 CC   0623       A        LDD     ##0623
01060 03232A 99F5 FD   1C66       A        STD     MAXR
01070 03233A 99F8 CC   FFA4       A        LDD     ##FFA4
01080 03234A 99FB FD   1C68       A        STD     MAXR+2
01090 03235A 99FE 39                       RTS
01100 03236                          *
01110 03237A 99FF CC   30D4       A SQ5IN  LDD     ##30D4
01120 03238A 9A02 FD   1C6C       A        STD     MAXMAT+2
01130 03239A 9A05 CC   0950       A        LDD     ##0950
01140 03240A 9A08 FD   1C66       A        STD     MAXR
01150 03241A 9A0B CC   2F90       A        LDD     ##2F90
01160 03242A 9A0E FD   1C68       A        STD     MAXR+2
01170 03243A 9A11 39                       RTS
01180 03244                          *
01190 03245A 9A12 A6   80         A INHEX  LDA     ,X+
01200 03246A 9A14 80   30         A        SUBA    #$30
01210 03247A 9A16 2B   0F    9A27          BMI     INHEXE     NOT HEX
01220 03248A 9A18 81   09         A        CMPA    #9
01230 03249A 9A1A 2F   0A    9A26          BLE     INHEX1     DONE
01240 03250A 9A1C 81   11         A        CMPA    ##11
01250 03251A 9A1E 2B   07    9A27          BMI     INHEXE     NOT HEX
01260 03252A 9A20 81   16         A        CMPA    ##16
01270 03253A 9A22 2E   03    9A27          BGT     INHEXE     NOT HEX
01280 03254A 9A24 80   07         A        SUBA    #7
01290 03255A 9A26 39                INHEX1 RTS
01300 03256                          *
01310 03257A 9A27 35   10         A INHEXE PULS    X          FIX STACK
01320 03258A 9A29 8E   996D       A        LDX     #PARAMX
01330 03259A 9A2C 34   10         A        PSHS    X
01340 03260A 9A2E 39                       RTS                RETURN TO PARAMX
01350 03261                          *
01360 03262                          *
01370 03263                          * THIS ROUTINE WILL SET
01380 03264                          * UP THE WORKING VALUES
01390 03265                          * SURFACE REFERANCES
01400 03266                          *
01410 03267A 9A2F 8E   1C06       A WKSR   LDX     #ACOUNT
01420 03268A 9A32 BD   9A42       A        JSR     PERCNT
01430 03269A 9A35 8E   1C08       A        LDX     #BCOUNT
01440 03270A 9A38 BD   9A42       A        JSR     PERCNT
01450 03271A 9A3B 8E   1C0A       A        LDX     #CCOUNT
01460 03272A 9A3E BD   9A42       A        JSR     PERCNT
01470 03273A 9A41 39                       RTS
```

```
01480 03274                                  *
01490 03275A 9A42 A6    0E        A PERCNT LDA    14,X
01500 03276A 9A44 81    64        A        CMPA   #100
01510 03277A 9A46 26    05    9A4D         BNE    PERCN1
01520 03278A 9A48 EC    84        A        LDD    0,X
01530 03279A 9A4A ED    06        A        STD    6,X
01540 03280A 9A4C 39                       RTS
01550 03281                                *
01560 03282A 9A4D 5F                PERCN1 CLRB
01570 03283A 9A4E 81    32        A        CMPA   #50
01580 03284A 9A50 25    04    9A56         BLO    PERCN2
01590 03285A 9A52 80    32        A        SUBA   #50
01600 03286A 9A54 CB    80        A        ADDB   #$80
01610 03287A 9A56 81    19        A PERCN2 CMPA   #25
01620 03288A 9A58 25    04    9A5E         BLO    PERCN3
01630 03289A 9A5A 80    19        A        SUBA   #25
01640 03290A 9A5C CB    40        A        ADDB   #$40
01650 03291A 9A5E 81    0C        A PERCN3 CMPA   #12
01660 03292A 9A60 25    04    9A66         BLO    PERCN4
01670 03293A 9A62 80    0C        A        SUBA   #12
01680 03294A 9A64 CB    20        A        ADDB   #$20
01690 03295A 9A66 81    06        A PERCN4 CMPA   #6
01700 03296A 9A68 25    04    9A6E         BLO    PERCN5
01710 03297A 9A6A 80    06        A        SUBA   #6
01720 03298A 9A6C CB    10        A        ADDB   #$10
01730 03299A 9A6E 81    03        A PERCN5 CMPA   #3
01740 03300A 9A70 25    04    9A76         BLO    PERCN6
01750 03301A 9A72 80    03        A        SUBA   #3
01760 03302A 9A74 CB    08        A        ADDB   #$8
01770 03303A 9A76 81    02        A PERCN6 CMPA   #2
01780 03304A 9A78 25    04    9A7E         BLO    PERCN7
01790 03305A 9A7A 80    02        A        SUBA   #2
01800 03306A 9A7C CB    04        A        ADDB   #$4
01810 03307A 9A7E 81    01        A PERCN7 CMPA   #1
01820 03308A 9A80 25    02    9A84         BLO    PERCN8
01830 03309A 9A82 CB    02        A        ADDB   #2
01840 03310A 9A84 D7    A1        A PERCN8 STB    TEMP1
01850 03311A 9A86 CE    009B      A        LDU    #TEMP
01860 03312A 9A89 108E  00A1      A        LDY    #TEMP1
01870 03313A 9A8D BD    8D13      A        JSR    MULT
01880 03314A 9A90 EC    C4        A        LDD    ,U
01890 03315A 9A92 ED    06        A        STD    6,X
01900 03316A 9A94 39                       RTS
01910 03317                                *
01920 03318A 9A95       99B3      A PARTAB FDB    SQ1IN
01930 03319A 9A97       99C6      A        FDB    SQ2IN
01940 03320A 9A99       99D9      A        FDB    SQ3IN
01950 03321A 9A9B       99EC      A        FDB    SQ4IN
01960 03322A 9A9D       99FF      A        FDB    SQ5IN
01970 03323                                *
01980 03324                                * SIZE    D     R        R*R
01990 03325                                * 1.25   19B3  0CD9   00A5 0FF1
02000 03326                                * 2.25   2E42  1721   0216 F241
02010 03327                                * 3      3F5E  1FAF   03EB D9A1
02020 03328                                * 4.06   4F4C  27A6   0623 FFA4
02030 03329                                * 5      61A8  30D4   0950 2F90
00010 03330                                        TTL    COUNT
00030 03332                                **************************************************
00040 03333                                *  COPYRIGHT BY ASM DIE BONDING INC.   1982
00050 03334                                *     SOFTWARE FOR THE D2KH DIE BONDER
00060 03335                                *             COUNT  REV.  2.0A
00070 03336                                *
00080 03337                                *  DISK ID          : VIDEO 2
00090 03338                                *  DATE             :
00100 03339                                *  DWG NO           :
00110 03340                                *  ASSM NUMBER      :
00120 03341                                *  EPROM ID TAG     :
00130 03342                                *  ORGINATOR        :
00140 03343                                *  REVISED          :
00150 03344                                **************************************************
00160 03345                                *      H O S T   C O M M A N D  $73
00170 03346                                *
00180 03347                                *          C O U N T
00190 03348                                **************************************************
```

```
                               *
9A9F 8E    01C8      A COUNT   LDX    #STRING
9AA2 86    D3        A         LDA    #$D3
9AA4 A7    80        A         STA    ,X+
9AA6 108E  1C21      A         LDY    #WCOUNT
9AAA 8D    0F   9ABB           BSR    OUT4H
9AAC 108E  1C1F      A         LDY    #REJDIE
9AB0 8D    09   9ABB           BSR    OUT4H
9AB2 CC    04D3      A         LDD    #$04D3
9AB5 ED    84        A         STD    ,X
9AB7 8E    01C8      A         LDX    #STRING
9ABA 39                        RTS              OUTPUT STRING
                               *
9ABB 8D    03   9AC0 OUT4H     BSR    OUT2H
9ABD 8D    01   9AC0           BSR    OUT2H
9ABF 39                        RTS
                               *
9AC0 A6    A4        A OUT2H   LDA    ,Y
9AC2 8D    04   9AC8           BSR    OUTHL
9AC4 A6    A0        A         LDA    ,Y+
9AC6 20    04   9ACC           BRA    OUTHR
9AC8 44                OUTHL   LSRA
9AC9 44                        LSRA
9ACA 44                        LSRA
9ACB 44                        LSRA
9ACC 84    0F        A OUTHR   ANDA   #$F
9ACE 8B    30        A         ADDA   #$30
9AD0 81    39        A         CMPA   #$39
9AD2 23    02   9AD6           BLS    OUTCH
9AD4 8B    07        A         ADDA   #7
9AD6 A7    80        A OUTCH   STA    ,X+
9AD8 39                        RTS
                               TTL    BEGIN
                       ***************************************************
                       *  COPYRIGHT BY ASM DIE BONDING INC.   1982
                       *     SOFTWARE FOR THE D2KH DIE BONDER
                       *              BEGIN  REV. 2.0A
                       *
                       *  DISK ID        : VIDEO 2
                       *  DATE           :
                       *  DWG NO         :
                       *  ASSM NUMBER    :
                       *  EPROM ID TAG   :
                       *  ORGINATOR      :
                       *  REVISED        :
                       ***************************************************
                       *      K E Y   C O M M A N D   $62
                       *
                       *         B E G I N
                       ***************************************************
                       *
                       CJMP   MACR
                       0220          JSR    \0
                       0230          CMPX   #REPLY0
                       0240          BEQ    \.0
                       0250          CMPX   #REPLY7
                       0260 \.0      BEQ    *+3
                       0270          RTS
                       0280          ENDM
                       *
                       CFIND  MACR
                       0310          JSR    FIND
                       0320          CMPX   #REPLY0
                       0330          BEQ    \.0
                       0340          CMPX   #REPLY7
                       0350 \.0      BEQ    *+3
                       0360          RTS
                       0370          ENDM
                       *
                       STOP   MACR
                       0400          TST    HOSTAC
                       0410          BPL    \.0
                       0420          LDA    HOSTAD
                       0430          JMP    NULL
                       0440 \.0      EQU    *
```

```
      03425                        0450         ENDM
00460 03426                        *
00470 03427A 9AD9 7D   1C6E     A BEGIN  TST    ALIGNF    MEASURE FLAG ON?
00480 03428A 9ADC 26   04   9AE2         BNE    BEG1
00490 03429A 9ADE 8E   809D     A        LDX    #REPLY2   NO MEASURE DIE
00500 03430A 9AE1 39                     RTS
00510 03431                        *
00520 03432A 9AE2 7D   6010     A BEG1   TST    DIEEJT    IS EJECT UP?
00530 03433A 9AE5 2A   04   9AEB         BPL    BEG2
00540 03434A 9AE7 8E   80EE     A        LDX    #REPLY5   DIE EJT UP
00550 03435A 9AEA 39                     RTS
00560 03436                        *
00570 03437A 9AEB 7F   1C70     A BEG2   CLR    GETFLG
00580 03438A 9AEE B6   1C1A     A        LDA    MISDIE+1
00590 03439A 9AF1 B7   1C12     A        STA    WKMIS
00600 03440A 9AF4 BD   A101     A        JSR    DIEPAT
00610 03441A 9AF7                        CFIND
00610        A 9AF7 BD   A19F     A        JSR    FIND
00610        A 9AFA 8C   8097     A        CMPX   #REPLY0
00610        A 9AFD 27   03   9B02         BEQ    .00022
00610        A 9AFF 8C   8127     A        CMPX   #REPLY7
00610        A 9B02 27   01   9B05 .00022 BEQ    *+3
00610        A 9B04 39                     RTS
00620 03442A 9B05                        CPOLL  XMTR
00620        A 9B05 108E 6028     A        LDY    #XMTR
00620        A 9B09 BD   8E1B     A        JSR    POLL
00620        A 9B0C 8C   8097     A        CMPX   #REPLY0
00620        A 9B0F 27   01   9B12         BEQ    *+3
00620        A 9B11 39                     RTS
00630 03443A 9B12 97   C7       A        STA    POLLF
00640 03444A 9B14 4D                     TSTA
00650 03445A 9B15 2B   6A   9B81         BMI    BEG4
00660 03446                        *
00670 03447A 9B17                 BEG3   STOP
00670        A 9B17 7D   6002     A        TST    HOSTAC
00670        A 9B1A 2A   06   9B22         BPL    .00023
00670        A 9B1C B6   6000     A        LDA    HOSTAD
00670        A 9B1F 7E   808F     A        JMP    NULL
00670                    9B22     A .00023 EQU    *
00680 03448A 9B22                        CJMP   JMPDR
00680        A 9B22 BD   96A3     A        JSR    JMPDR
00680        A 9B25 8C   8097     A        CMPX   #REPLY0
00680        A 9B28 27   03   9B2D         BEQ    .00024
00680        A 9B2A 8C   8127     A        CMPX   #REPLY7
00680        A 9B2D 27   01   9B30 .00024 BEQ    *+3
00680        A 9B2F 39                     RTS
00690 03449A 9B30 4D                     TSTA
00700 03450A 9B31 27   0E   9B41         BEQ    BEG31
00710 03451A 9B33                        CJMP   JMPUR
00710        A 9B33 BD   9731     A        JSR    JMPUR
00710        A 9B36 8C   8097     A        CMPX   #REPLY0
00710        A 9B39 27   03   9B3E         BEQ    .00025
00710        A 9B3B 8C   8127     A        CMPX   #REPLY7
00710        A 9B3E 27   01   9B41 .00025 BEQ    *+3
00710        A 9B40 39                     RTS
00720 03452A 9B41                 BEG31  CPOLL  XMTR
00720        A 9B41 108E 6028     A        LDY    #XMTR
00720        A 9B45 BD   8E1B     A        JSR    POLL
00720        A 9B48 8C   8097     A        CMPX   #REPLY0
00720        A 9B4B 27   01   9B4E         BEQ    *+3
00720        A 9B4D 39                     RTS
00730 03453A 9B4E 98   C7       A        EORA   POLLF
00740 03454A 9B50 27   C5   9B17         BEQ    BEG3
00750 03455A 9B52                 BEG32  STOP
00750        A 9B52 7D   6002     A        TST    HOSTAC
00750        A 9B55 2A   06   9B5D         BPL    .00026
00750        A 9B57 B6   6000     A        LDA    HOSTAD
00750        A 9B5A 7E   808F     A        JMP    NULL
00750                    9B5D     A .00026 EQU    *
00760 03456A 9B5D                        CJMP   JMPDL
00760        A 9B5D BD   96D2     A        JSR    JMPDL
00760        A 9B60 8C   8097     A        CMPX   #REPLY0
00760        A 9B63 27   03   9B68         BEQ    .00027
00760        A 9B65 8C   8127     A        CMPX   #REPLY7
```

```
00760        A 9B68 27   01   9B6B .00027 BEQ   *+3
00760        A 9B6A 39                   RTS
00770 03457A 9B6B 4D                     TSTA
00780 03458A 9B6C 26   7D   9BEB         BNE   CROSSX
00790 03459A 9B6E                        CJMP  JMPDR
00790        A 9B6E BD   96A3   A        JSR   JMPDR
00790        A 9B71 8C   8097   A        CMPX  #REPLY0
00790        A 9B74 27   03   9B79       BEQ   .00028
00790        A 9B76 8C   8127   A        CMPX  #REPLY7
00790        A 9B79 27   01   9B7C .00028 BEQ  *+3
00790        A 9B7B 39                   RTS
00800 03460A 9B7C 4D                     TSTA
00810 03461A 9B7D 26   6C   9BEB         BNE   CROSSX
00820 03462A 9B7F 20   D1   9B52         BRA   BEG32
00830 03463                        *
00840 03464A 9B81                  BEG4  STOP
00840        A 9B81 7D   6002   A        TST   HOSTAC
00840        A 9B84 2A   06   9B8C       BPL   .00029
00840        A 9B86 B6   6000   A        LDA   HOSTAD
00840        A 9B89 7E   808F   A        JMP   NULL
00840                    9B8C   A .00029 EQU   *
00850 03465A 9B8C                        CJMP  JMPDL
00850        A 9B8C BD   96D2   A        JSR   JMPDL
00850        A 9B8F 8C   8097   A        CMPX  #REPLY0
00850        A 9B92 27   03   9B97       BEQ   .00030
00850        A 9B94 8C   8127   A        CMPX  #REPLY7
00850        A 9B97 27   01   9B9A .00030 BEQ  *+3
00850        A 9B99 39                   RTS
00860 03466A 9B9A 4D                     TSTA
00870 03467A 9B9B 27   0E   9BAB         BEQ   BEG41
00880 03468A 9B9D                        CJMP  JMPUL
00880        A 9B9D BD   9702   A        JSR   JMPUL
00880        A 9BA0 8C   8097   A        CMPX  #REPLY0
00880        A 9BA3 27   03   9BA8       BEQ   .00031
00880        A 9BA5 8C   8127   A        CMPX  #REPLY7
00880        A 9BA8 27   01   9BAB .00031 BEQ  *+3
00880        A 9BAA 39                   RTS
00890 03469A 9BAB                  BEG41 CPOLL XMTR
00890        A 9BAB 108E 6028   A        LDY   #XMTR
00890        A 9BAF BD   8E1B   A        JSR   POLL
00890        A 9BB2 8C   8097   A        CMPX  #REPLY0
00890        A 9BB5 27   01   9BB8       BEQ   *+3
00890        A 9BB7 39                   RTS
00900 03470A 9BB8 98   C7     A          EORA  POLLF
00910 03471A 9BBA 27   C5   9B81         BEQ   BEG4
00920 03472A 9BBC                  BEG42 STOP
00920        A 9BBC 7D   6002   A        TST   HOSTAC
00920        A 9BBF 2A   06   9BC7       BPL   .00032
00920        A 9BC1 B6   6000   A        LDA   HOSTAD
00920        A 9BC4 7E   808F   A        JMP   NULL
00920                    9BC7   A .00032 EQU   *
00930 03473A 9BC7                        CJMP  JMPDR
00930        A 9BC7 BD   96A3   A        JSR   JMPDR
00930        A 9BCA 8C   8097   A        CMPX  #REPLY0
00930        A 9BCD 27   03   9BD2       BEQ   .00033
00930        A 9BCF 8C   8127   A        CMPX  #REPLY7
00930        A 9BD2 27   01   9BD5 .00033 BEQ  *+3
00930        A 9BD4 39                   RTS
00940 03474A 9BD5 4D                     TSTA
00950 03475A 9BD6 26   13   9BEB         BNE   CROSSX
00960 03476A 9BD8                        CJMP  JMPDL
00960        A 9BD8 BD   96D2   A        JSR   JMPDL
00960        A 9BDB 8C   8097   A        CMPX  #REPLY0
00960        A 9BDE 27   03   9BE3       BEQ   .00034
00960        A 9BE0 8C   8127   A        CMPX  #REPLY7
00960        A 9BE3 27   01   9BE6 .00034 BEQ  *+3
00960        A 9BE5 39                   RTS
00970 03477A 9BE6 4D                     TSTA
00980 03478A 9BE7 26   02   9BEB         BNE   CROSSX
00990 03479A 9BE9 20   D1   9BBC         BRA   BEG42
01000 03480                        *
01010 03481A 9BEB                  CROSSX CPOLL XMTR
01010        A 9BEB 108E 6028   A        LDY   #XMTR
01010        A 9BEF BD   8E1B   A        JSR   POLL
01010        A 9BF2 8C   8097   A        CMPX  #REPLY0
```

```
01010        A 9BF5 27   01   9BF8        BEQ     *+3
01010        A 9BF7 39                    RTS
01020 03482A 9BF8 4D                      TSTA
01030 03483A 9BF9 2B   22   9C1D          BMI     CROSS2
01040 03484                          *
01050 03485A 9BFB                    CROSS1 STOP
01050        A 9BFB 7D   6002    A        TST     HOSTAC
01050        A 9BFE 2A   06   9C06        BPL     .00035
01050        A 9C00 B6   6000    A        LDA     HOSTAD
01050        A 9C03 7E   808F    A        JMP     NULL
01050                    9C06    A .00035 EQU     *
01060 03486A 9C06                         CJMP    JMPL
01060        A 9C06 BD   967E    A        JSR     JMPL
01060        A 9C09 8C   8097    A        CMPX    #REPLY0
01060        A 9C0C 27   03   9C11        BEQ     .00036
01060        A 9C0E 8C   8127    A        CMPX    #REPLY7
01060        A 9C11 27   01   9C14 .00036 BEQ     *+3
01060        A 9C13 39                    RTS
01070 03487A 9C14 4D                      TSTA
01080 03488A 9C15 27   E4   9BFB          BEQ     CROSS1
01090 03489A 9C17 BD   A732    A          JSR     CHGX
01100 03490A 9C1A 7E   A575    A          JMP     GET1
01110 03491                          *
01120 03492A 9C1D                    CROSS2 STOP
01120        A 9C1D 7D   6002    A        TST     HOSTAC
01120        A 9C20 2A   06   9C28        BPL     .00037
01120        A 9C22 B6   6000    A        LDA     HOSTAD
01120        A 9C25 7E   808F    A        JMP     NULL
01120                    9C28    A .00037 EQU     *
01130 03493A 9C28                         CJMP    JMPR
01130        A 9C28 BD   9659    A        JSR     JMPR
01130        A 9C2B 8C   8097    A        CMPX    #REPLY0
01130        A 9C2E 27   03   9C33        BEQ     .00038
01130        A 9C30 8C   8127    A        CMPX    #REPLY7
01130        A 9C33 27   01   9C36 .00038 BEQ     *+3
01130        A 9C35 39                    RTS
01140 03494A 9C36 4D                      TSTA
01150 03495A 9C37 27   E4   9C1D          BEQ     CROSS2
01160 03496A 9C39 BD   A732    A          JSR     CHGX
01170 03497A 9C3C 7E   A575    A          JMP     GET1
00010 03498                               TTL     ALIGN
00030 03500                          ************************************************
00040 03501                          *  COPYRIGHT BY ASM DIE BONDING INC.   1982
00050 03502                          *     SOFTWARE FOR THE D2KH DIE BONDER
00060 03503                          *             ALIGN  REV. 2.0A
00070 03504                          *
00080 03505                          *  DISK ID         : VIDEO 2
00090 03506                          *  DATE            :     ..
00100 03507                          *  DWG NO          :
00110 03508                          *  ASSM NUMBER     :
00120 03509                          *  EPROM ID TAG    :
00130 03510                          *  ORGINATOR       :
00140 03511                          *  REVISED         :
00150 03512                          ************************************************
00160 03513                          *     K E Y   C O M M A N D   $66
00170 03514                          *
00180 03515                          *     M E A S U R E   D I E
00190 03516                          ************************************************
00200 03517                          *
00210 03518                          SFXADJ MACR
      03519                          0220         LDA    CSTEPX
      03520                          0230         TST    PARTFL+1
      03521                          0240         BEQ    \.0
      03522                          0250         LSRA
      03523                          0260         LSRA
      03524                          0270         NEGA
      03525                          0280         ADDA   CSTEPX
      03526                          0290 \.0     STA    CSTEPX
      03527                          0300         ENDM
00310 03528                          *
00320 03529                          SFYADJ MACR
      03530                          0330         LDA    CSTEPY
      03531                          0340         TST    PARTFL+1
      03532                          0350         BEQ    \.0
```

```
      03533                    0360        LSRA
      03534                    0370        LSRA
      03535                    0380        NEGA
      03536                    0390        ADDA     CSTEPY
      03537                    0400 \.0    STA      CSTEPY
      03538                    0410        ENDM
00420 03539                    *
00430 03540                    STOPBK MACR
      03541                    0440        TST      HOSTAC
      03542                    0450        BPL      \.0
      03543                    0460        LDA      HOSTAD
      03544                    0470        LDA      #$50
      03545                    0480        STA      XSTR
      03546                    0490        STA      YSTR
      03547                    0500        LDD      JMPX+1
      03548                    0510        STD      XSTR+1
      03549                    0520        LDD      JMPY+1
      03550                    0530        STD      YSTR+1
      03551                    0540        JSR      MOVEXY
      03552                    0550        JMP      NULL
      03553                    0560 \.0    EQU      *
      03554                    0570        ENDM
00580 03555                    *
00590 03556A 9C3F 7D  6010    A ALIGN  TST     DIEEJT
00600 03557A 9C42 2A  04  9C48         BPL     AOK
00610 03558A 9C44 8E  80EE    A        LDX     #REPLY5
00620 03559A 9C47 39                   RTS
00630 03560A 9C48 BD  A0DE    A AOK    JSR     MINPAT    GET MIN PATTERN
00640 03561A 9C4B BD  A124    A        JSR     DPLY8
00650 03562A 9C4E 7F  1C6E    A        CLR     ALIGNF    CLEAR MEASURE FLAG
00660 03563                     *
00670 03564                     * CHECK IF ANY WINDOW IS IN THE BLACK
00680 03565                     * IF SO MOVE IT OUT UNTIL IN THE WHITE
00690 03566                     * OR IN A STREET
00700 03567                     *
00710 03568A 9C51               ALIGN1 STOP
00710      A 9C51 7D  6002    A        TST     HOSTAC
00710      A 9C54 2A  06  9C5C         BPL     .00039
00710      A 9C56 B6  6000    A        LDA     HOSTAD
00710      A 9C59 7E  808F    A        JMP     NULL
00710                 9C5C    A .00039 EQU     *
00720 03569A 9C5C BD  A741    A        JSR     CRUNCH
00730 03570                     *
00740 03571A 9C5F 86  FF      A        LDA     #$FF
00750 03572A 9C61 97  A9      A        STA     FLAG      SET "BLACK CHECK FLAG"
00760 03573                     *
00770 03574A 9C63 90  83      A        SUBA    BOTSTC
00780 03575A 9C65 27  09  9C70         BEQ     ALIGN2    IF IN WHITE CHECK TOP
00790 03576A 9C67 84  0F      A        ANDA    #$F
00800 03577A 9C69 81  0C      A        CMPA    #$C
00810 03578A 9C6B 25  03  9C70         BLO     ALIGN2    IF GOT A STREET
00820 03579A 9C6D BD  A137    A        JSR     MOVBOT
00830 03580                     *
00840 03581A 9C70 86  FF      A ALIGN2 LDA     #$FF
00850 03582A 9C72 90  80      A        SUBA    TOPSTC
00860 03583A 9C74 27  09  9C7F         BEQ     ALIGN3    TOP IS IN THE WHITE
00870 03584A 9C76 84  0F      A        ANDA    #$F
00880 03585A 9C78 81  0C      A        CMPA    #$C
00890 03586A 9C7A 25  03  9C7F         BLO     ALIGN3    GOT STREET @ TOP
00900 03587A 9C7C BD  A12F    A        JSR     MOVTOP
00910 03588                     *
00920 03589A 9C7F 86  FF      A ALIGN3 LDA     #$FF
00930 03590A 9C81 90  82      A        SUBA    RHTSTC
00940 03591A 9C83 27  09  9C8E         BEQ     ALIGN4    IN THE WHITE
00950 03592A 9C85 84  0F      A        ANDA    #$F
00960 03593A 9C87 81  0C      A        CMPA    #$C
00970 03594A 9C89 25  03  9C8E         BLO     ALIGN4    GOT A STREET
00980 03595A 9C8B BD  A152    A        JSR     MOVRHT
00990 03596                     *
01000 03597A 9C8E 86  FF      A ALIGN4 LDA     #$FF
01010 03598A 9C90 90  81      A        SUBA    LHTSTC
01020 03599A 9C92 27  09  9C9D         BEQ     ALIGN5    IN THE WHITE
01030 03600A 9C94 84  0F      A        ANDA    #$F
01040 03601A 9C96 81  0C      A        CMPA    #$C
```

```
01050 03602A 9C98 25   03   9C9D        BLO    ALIGN5   GOT A STRRET
01060 03603A 9C9A BD   A14A      A       JSR    MOVLHT
01070 03604                        *
01080 03605A 9C9D BD   A165      A ALIGN5 JSR    LMTCHK
01090 03606A 9CA0 8C   814C      A       CMPX   #REPLY8
01100 03607A 9CA3 26   01   9CA6        BNE    *+3
01110 03608A 9CA5 39                     RTS
01120 03609A 9CA6 0D   A9        A       TST    FLAG
01130 03610A 9CA8 27   A7   9C51        BEQ    ALIGN1
01140 03611                        *
01150 03612                        * NOW CHECK AND MOVE (BY 2)
01160 03613                        * IF NO STREET IS IN THE WINDOW
01170 03614                        *
01180 03615A 9CAA                  ALIGN6 STOP
01180        A 9CAA 7D   6002      A       TST    HOSTAC
01180        A 9CAD 2A   06   9CB5        BPL    .00040
01180        A 9CAF B6   6000      A       LDA    HOSTAD
01180        A 9CB2 7E   808F      A       JMP    NULL
01180                  9CB5      A .00040 EQU    *
01190 03616A 9CB5 0C   A9        A       INC    FLAG
01200 03617A 9CB7 BD   A741      A       JSR    CRUNCH
01210 03618                        *
01220 03619A 9CBA 0D   83        A       TST    BOTSTC   STREET IN BOTTOM WINDOW
01230 03620A 9CBC 2A   03   9CC1        BPL    *+5      YES, GOT IT IN, CHECK TOP
01240 03621A 9CBE BD   A137      A       JSR    MOVBOT
01250 03622                        *
01260 03623A 9CC1 0D   80        A       TST    TOPSTC   STREET IN TOP WINDOW?
01270 03624A 9CC3 2A   03   9CC8        BPL    *+5      YES, GOT IT IN, CHECK RIG
01280 03625A 9CC5 BD   A12F      A       JSR    MOVTOP
01290 03626                        *
01300 03627A 9CC8 0D   82        A       TST    RHTSTC
01310 03628A 9CCA 2A   03   9CCF        BPL    *+5
01320 03629A 9CCC BD   A152      A       JSR    MOVRHT
01330 03630                        *
01340 03631A 9CCF 0D   81        A       TST    LHTSTC
01350 03632A 9CD1 2A   03   9CD6        BPL    *+5
01360 03633A 9CD3 BD   A14A      A       JSR    MOVLHT
01370 03634                        *
01380 03635A 9CD6 BD   A165      A       JSR    LMTCHK
01390 03636A 9CD9 8C   814C      A       CMPX   #REPLY8
01400 03637A 9CDC 26   01   9CDF        BNE    *+3
01410 03638A 9CDE 39                     RTS
01420 03639A 9CDF 0D   A9        A       TST    FLAG
01430 03640A 9CE1 27   C7   9CAA        BEQ    ALIGN6
01440 03641                        *
01450 03642                        *  IF WE GET THIS FAR IT MEANS THERE
01460 03643                        *  ARE STREETS IN ALL THE WINDOWS
01470 03644                        *
01480 03645A 9CE3 96   80        A       LDA    TOPSTC
01490 03646A 9CE5 80   08        A       SUBA   #8
01500 03647A 9CE7 102B 0095 9D80        LBMI   ALIGN8
01510 03648A 9CEB 34   02        A       PSHS   A
01520 03649A 9CED 44                     LSRA            0>7 > 0 >C
01530 03650A 9CEE 1F   89        A       TFR    A,B
01540 03651A 9CF0 B9   7303      A       ADCA   YSIZE+3
01550 03652A 9CF3 81   05        A       CMPA   #5
01560 03653A 9CF5 1023 0085 9D7E        LBLS   ALIGN7
01570 03654A 9CF9 B7   7303      A       STA    YSIZE+3
01580 03655A 9CFC FB   7305      A       ADDB   YSIZE+5
01590 03656A 9CFF C1   05        A       CMPB   #5
01600 03657A 9D01 23   7B   9D7E        BLS    ALIGN7
01610 03658A 9D03 F7   7305      A       STB    YSIZE+5
01620 03659A 9D06 35   02        A       PULS   A
01630 03660A 9D08 40                     NEGA
01640 03661A 9D09 BB   7300      A       ADDA   YSIZE
01650 03662A 9D0C 81   05        A       CMPA   #5
01660 03663A 9D0E 23   70   9D80        BLS    ALIGN8
01670 03664A 9D10 B7   7300      A       STA    YSIZE
01680 03665                        *
01690 03666A 9D13 96   83        A       LDA    BOTSTC
01700 03667A 9D15 80   08        A       SUBA   #8
01710 03668A 9D17 2B   67   9D80        BMI    ALIGN8
01720 03669A 9D19 44                     LSRA
```

```
01730 03670A 9D1A 1F    89        A          TFR     A,B
01740 03671A 9D1C B9    7305      A          ADCA    YSIZE+5
01750 03672A 9D1F 81    05        A          CMPA    #5
01760 03673A 9D21 23    5D    9D80           BLS     ALIGN8
01770 03674A 9D23 B7    7305      A          STA     YSIZE+5
01780 03675A 9D26 FB    7303      A          ADDB    YSIZE+3
01790 03676A 9D29 C1    05        A          CMPB    #5
01800 03677A 9D2B 23    53    9D80           BLS     ALIGN8
01810 03678A 9D2D F7    7303      A          STB     YSIZE+3
01820 03679                         *
01830 03680A 9D30 96    81        A          LDA     LHTSTC
01840 03681A 9D32 80    08        A          SUBA    #8
01850 03682A 9D34 2B    4A    9D80           BMI     ALIGN8
01860 03683A 9D36 34    02        A          PSHS    A
01870 03684A 9D38 44                         LSRA
01880 03685A 9D39 1F    89        A          TFR     A,B
01890 03686A 9D3B B9    7203      A          ADCA    XSIZE+3
01900 03687A 9D3E 81    05        A          CMPA    #5
01910 03688A 9D40 23    3C    9D7E           BLS     ALIGN7
01920 03689A 9D42 B7    7203      A          STA     XSIZE+3
01930 03690A 9D45 FB    7205      A          ADDB    XSIZE+5
01940 03691A 9D48 C1    05        A          CMPB    #5
01950 03692A 9D4A 23    32    9D7E           BLS     ALIGN7
01960 03693A 9D4C F7    7205      A          STB     XSIZE+5
01970 03694A 9D4F 35    02        A          PULS    A
01980 03695A 9D51 40                         NEGA
01990 03696A 9D52 BB    7200      A          ADDA    XSIZE
02000 03697A 9D55 81    05        A          CMPA    #5
02010 03698A 9D57 23    27    9D80           BLS     ALIGN8
02020 03699A 9D59 B7    7200      A          STA     XSIZE
02030 03700                         *
02040 03701A 9D5C 96    82        A          LDA     RHTSTC
02050 03702A 9D5E 80    08        A          SUBA    #8
02060 03703A 9D60 2B    1E    9D80           BMI     ALIGN8
02070 03704A 9D62 44                         LSRA
02080 03705A 9D63 1F    89        A          TFR     A,B
02090 03706A 9D65 B9    7205      A          ADCA    XSIZE+5
02100 03707A 9D68 81    05        A          CMPA    #5
02110 03708A 9D6A 23    14    9D80           BLS     ALIGN8
02120 03709A 9D6C B7    7205      A          STA     XSIZE+5
02130 03710A 9D6F FB    7203      A          ADDB    XSIZE+3
02140 03711A 9D72 C1    05        A          CMPB    #5
02150 03712A 9D74 23    0A    9D80           BLS     ALIGN8
02160 03713A 9D76 F7    7203      A          STB     XSIZE+3
02170 03714                         *
02180 03715A 9D79 8E    8097      A          LDX     #REPLY0
02190 03716A 9D7C 20    06    9D84           BRA     ALIGN9
02200 03717                         *
02210 03718A 9D7E 35    02        A ALIGN7   PULS    A
02220 03719A 9D80 8E    814C      A ALIGN8   LDX     #REPLY8
02230 03720A 9D83 39                         RTS
02240 03721                         *
02250 03722                         * HERE THE DIE SIZE IS FOUND BUT
02260 03723                         * OFFSET FROM CENTER
02270 03724                         * FIRST FIND THE OFFSET OF THE PATTERN
02280 03725                         * FROM "CENTER"
02290 03726                         *
02300 03727A 9D84                   ALIGN9   STOP
02300        A 9D84 7D  6002      A          TST     HOSTAC
02300        A 9D87 2A  06    9D8F           BPL     .00041
02300        A 9D89 B6  6000      A          LDA     HOSTAD
02300        A 9D8C 7E  808F      A          JMP     NULL
02300                   9D8F      A .00041   EQU     *
02310 03728                         *
02320 03729A 9D8F 8E    1C28      A          LDX     #MINX+2
02330 03730A 9D92 CC    0000      A          LDD     #0
02340 03731A 9D95 EB    80        A ALIGNA   ADDB    ,X+
02350 03732A 9D97 89    00        A          ADCA    #0
02360 03733A 9D99 8C    1C2D      A          CMPX    #MINX+7
02370 03734A 9D9C 26    F7    9D95           BNE     ALIGNA
02380 03735                         *
02390 03736A 9D9E 44                         LSRA
02400 03737A 9D9F 56                         RORB
02410 03738A 9DA0 FB    1C26      A          ADDB    MINX
```

```
03739A 9DA3 89   00        A          ADCA   #0
03740A 9DA5 DD   AF        A          STD    XCEN
03741                        *
03742A 9DA7 8E   7202      A          LDX    #XSIZE+2
03743A 9DAA CC   0000      A          LDD    #0
03744A 9DAD EB   80        A ALIGNB   ADDB   ,X+
03745A 9DAF 89   00        A          ADCA   #0
03746A 9DB1 8C   7207      A          CMPX   #XSIZE+7
03747A 9DB4 26   F7   9DAD            BNE    ALIGNB
03748                        *
03749A 9DB6 44                        LSRA
03750A 9DB7 56                        RORB
03751A 9DB8 FB   7200      A          ADDB   XSIZE
03752A 9DBB 89   00        A          ADCA   #0
03753A 9DBD DD   B3        A          STD    XDIECN
03754A 9DBF 93   AF        A          SUBD   XCEN
03755A 9DC1 DD   B7        A          STD    XDIF
03756                        *
03757A 9DC3 8E   7302      A          LDX    #YSIZE+2
03758A 9DC6 CC   0000      A          LDD    #0
03759A 9DC9 EB   80        A ALIGNC   ADDB   ,X+
03760A 9DCB 89   00        A          ADCA   #0
03761A 9DCD 8C   7307      A          CMPX   #YSIZE+7
03762A 9DD0 26   F7   9DC9            BNE    ALIGNC
03763                        *
03764A 9DD2 44                        LSRA
03765A 9DD3 56                        RORB
03766A 9DD4 FB   7300      A          ADDB   YSIZE
03767A 9DD7 89   00        A          ADCA   #0
03768A 9DD9 DD   B5        A          STD    YDIECN
03769                        *
03770A 9DDB 8E   1C38      A          LDX    #MINY+2
03771A 9DDE CC   0000      A          LDD    #0
03772A 9DE1 EB   80        A ALIGND   ADDB   ,X+
03773A 9DE3 89   00        A          ADCA   #0
03774A 9DE5 8C   1C3D      A          CMPX   #MINY+7
03775A 9DE8 26   F7   9DE1            BNE    ALIGND
03776                        *
03777A 9DEA 44                        LSRA
03778A 9DEB 56                        RORB
03779A 9DEC FB   1C36      A          ADDB   MINY
03780A 9DEF 89   00        A          ADCA   #0
03781A 9DF1 DD   B1        A          STD    YCEN
03782A 9DF3 93   B5        A          SUBD   YDIECN
03783A 9DF5 DD   B9        A          STD    YDIF
03784                        *
03785                        * NOW MOVE PATTERN IN DIR
03786                        * SHOWN IN "X"DIFF
03787                        * AND "Y"DIFF
03788                        * BY 8 LINES/PIX AND UPDATE DIFF
03789                        *
03790                        *
03791A 9DF7 DC   B7        A          LDD    XDIF
03792A 9DF9 2B   0F   9E0A            BMI    XPLUS
03793A 9DFB 83   0008      A          SUBD   #8
03794A 9DFE DD   BB        A          STD    XDIFNW
03795A 9E00 B6   7200      A          LDA    XSIZE
03796A 9E03 80   08        A          SUBA   #8
03797A 9E05 B7   7200      A          STA    XSIZE
03798A 9E08 20   0D   9E17            BRA    YTST       MOVE Y
03799                        *
03800A 9E0A C3   0008      A XPLUS    ADDD   #8
03801A 9E0D DD   BB        A          STD    XDIFNW
03802A 9E0F B6   7200      A          LDA    XSIZE
03803A 9E12 8B   08        A          ADDA   #8
03804A 9E14 B7   7200      A          STA    XSIZE
03805                        *
03806A 9E17 DC   B9        A YTST     LDD    YDIF
03807A 9E19 2B   0F   9E2A            BMI    ALIGNE
03808A 9E1B 83   0008      A          SUBD   #8
03809A 9E1E DD   BD        A          STD    YDIFNW
03810A 9E20 B6   7300      A          LDA    YSIZE
03811A 9E23 8B   08        A          ADDA   #8
03812A 9E25 B7   7300      A          STA    YSIZE
```

```
03813A 9E28 20   0D    9E37          BRA     MAG
03814                          *
03815A 9E2A C3   0008      A ALIGNE ADDD    #8
03816A 9E2D DD   BD        A        STD     YDIFNW
03817A 9E2F B6   7300      A        LDA     YSIZE
03818A 9E32 80   08        A        SUBA    #8
03819A 9E34 B7   7300      A        STA     YSIZE
03820                          *
03821                          * MAG WILL MOVE X-Y MOTORS
03822                          * 1 STEP UNTILL BACK IN CENTER
03823                          * OF WINDOWS,KEEPING TRACK OF
03824                          * NUMBER OF STEPS TO MOVE 8 LINES/PIX
03825                          *
03826A 9E37 7F   1C24      A MAG    CLR     CSTEPX
03827A 9E3A 7F   1C25      A        CLR     CSTEPY
03828A 9E3D 96   B9        A        LDA     YDIF
03829A 9E3F 2B   06    9E47         BMI     MAGUP     UP/?
03830A 9E41 96   B7        A        LDA     XDIF
03831A 9E43 2B   08    9E4D         BMI     MAGDR     DOWN/RIGHT
03832A 9E45 20   2A    9E71         BRA     MAGDL     DOWN/LEFT
03833A 9E47 96   B7        A MAGUP  LDA     XDIF
03834A 9E49 2B   49    9E94         BMI     MAGUR     UP/RIGHT
03835A 9E4B 20   6A    9EB7         BRA     MAGUL     UP/LEFT
03836                          *
03837A 9E4D BD   9392      A MAGDR  JSR     STEPUL
03838A 9E50 BD   A741      A MAGDR1 JSR     CRUNCH
03839A 9E53 96   80        A        LDA     TOPSTC
03840A 9E55 81   08        A        CMPA    #8
03841A 9E57 22   02    9E5B         BHI     MAGDR2
03842A 9E59 0F   92        A        CLR     YSTR+2
03843A 9E5B 96   81        A MAGDR2 LDA     LHTSTC
03844A 9E5D 81   08        A        CMPA    #8
03845A 9E5F 22   02    9E63         BHI     MAGDR3
03846A 9E61 0F   8F        A        CLR     XSTR+2
03847A 9E63 BD   9EDA      A MAGDR3 JSR     MAGMOV
03848A 9E66 96   8F        A        LDA     XSTR+2
03849A 9E68 26   E6    9E50         BNE     MAGDR1
03850A 9E6A 96   92        A        LDA     YSTR+2
03851A 9E6C 26   E2    9E50         BNE     MAGDR1
03852A 9E6E 7E   9F02      A        JMP     MOVCEN
03853                          *
03854A 9E71 BD   9381      A MAGDL  JSR     STEPUR
03855A 9E74 BD   A741      A MAGDL1 JSR     CRUNCH
03856A 9E77 96   80        A        LDA     TOPSTC
03857A 9E79 81   08        A        CMPA    #8
03858A 9E7B 22   02    9E7F         BHI     MAGDL2
03859A 9E7D 0F   92        A        CLR     YSTR+2
03860A 9E7F 96   82        A MAGDL2 LDA     RHTSTC
03861A 9E81 81   08        A        CMPA    #8
03862A 9E83 22   02    9E87         BHI     MAGDL3
03863A 9E85 0F   8F        A        CLR     XSTR+2
03864A 9E87 BD   9EDA      A MAGDL3 JSR     MAGMOV
03865A 9E8A 96   8F        A        LDA     XSTR+2
03866A 9E8C 26   E6    9E74         BNE     MAGDL1
03867A 9E8E 96   92        A        LDA     YSTR+2
03868A 9E90 26   E2    9E74         BNE     MAGDL1
03869A 9E92 20   6E    9F02         BRA     MOVCEN
03870                          *
03871A 9E94 BD   93B6      A MAGUR  JSR     STEPDL
03872A 9E97 BD   A741      A MAGUR1 JSR     CRUNCH
03873A 9E9A 96   83        A        LDA     BOTSTC
03874A 9E9C 81   08        A        CMPA    #8
03875A 9E9E 22   02    9EA2         BHI     MAGUR2
03876A 9EA0 0F   92        A        CLR     YSTR+2
03877A 9EA2 96   81        A MAGUR2 LDA     LHTSTC
03878A 9EA4 81   08        A        CMPA    #8
03879A 9EA6 22   02    9EAA         BHI     MAGUR3
03880A 9EA8 0F   8F        A        CLR     XSTR+2
03881A 9EAA BD   9EDA      A MAGUR3 JSR     MAGMOV
03882A 9EAD 96   8F        A        LDA     XSTR+2
03883A 9EAF 26   E6    9E97         BNE     MAGUR1
03884A 9EB1 96   92        A        LDA     YSTR+2
03885A 9EB3 26   E2    9E97         BNE     MAGUR1
03886A 9EB5 20   4B    9F02         BRA     MOVCEN
```

```
03887                          *
03888A 9EB7 BD   93A4     A MAGUL   JSR    STEPDR
03889A 9EBA BD   A741     A MAGUL1  JSR    CRUNCH
03890A 9EBD 96   83       A         LDA    BOTSTC
03891A 9EBF 81   08       A         CMPA   #8
03892A 9EC1 22   02  9EC5           BHI    MAGUL2
03893A 9EC3 0F   92       A         CLR    YSTR+2
03894A 9EC5 96   82       A MAGUL2  LDA    RHTSTC
03895A 9EC7 81   08       A         CMPA   #8
03896A 9EC9 22   02  9ECD           BHI    MAGUL3
03897A 9ECB 0F   8F       A         CLR    XSTR+2
03898A 9ECD BD   9EDA     A MAGUL3  JSR    MAGMOV
03899A 9ED0 96   8F       A         LDA    XSTR+2
03900A 9ED2 26   E6  9EBA           BNE    MAGUL1
03901A 9ED4 96   92       A         LDA    YSTR+2
03902A 9ED6 26   E2  9EBA           BNE    MAGUL1
03903A 9ED8 20   28  9F02           BRA    MOVCEN
03904                          *
03905A 9EDA B6   1C24     A MAGMOV  LDA    CSTEPX
03906A 9EDD 9B   8F       A         ADDA   XSTR+2
03907A 9EDF B7   1C24     A         STA    CSTEPX
03908A 9EE2 B6   1C25     A         LDA    CSTEPY
03909A 9EE5 9B   92       A         ADDA   YSTR+2
03910A 9EE7 B7   1C25     A         STA    CSTEPY
03911A 9EEA BD   8C79     A         JSR    MOVEXY
03912A 9EED 8C   8097     A         CMPX   #REPLY0
03913A 9EF0 26   04  9EF6           BNE    MAGERR
03914A 9EF2 4D                      TSTA
03915A 9EF3 26   01  9EF6           BNE    MAGERR
03916A 9EF5 39                      RTS
03917                          *
03918A 9EF6 35   20       A MAGERR  PULS   Y
03919A 9EF8 8C   8097     A MAGER1  CMPX   #REPLY0
03920A 9EFB 26   01  9EFE           BNE    *+3
03921A 9EFD 39                      RTS
03922A 9EFE 8E   80C4     A         LDX    #REPLY3
03923A 9F01 39                      RTS
03924                          *
03925                          * MOVCEN WILL MOVE PATTERN NOW TO CENTER
03926                          *
03927A 9F02 4F                MOVCEN CLRA
03928A 9F03 F6   7200     A         LDB    XSIZE
03929A 9F06 93   BB       A         SUBD   XDIFNW
03930A 9F08 F7   7200     A         STB    XSIZE
03931A 9F0B 4F                      CLRA
03932A 9F0C F6   7300     A         LDB    YSIZE
03933A 9F0F D3   BD       A         ADDD   YDIFNW
03934A 9F11 F7   7300     A         STB    YSIZE
03935                          *
03936                          * CNTER WILL MOVE DIE TO TRUE CENTER
03937                          *
03938A 9F14 86   53       A CNTER   LDA    #$53
03939A 9F16 0D   BB       A         TST    XDIFNW
03940A 9F18 2A   03  9F1D           BPL    CNTER1
03941A 9F1A 4A                      DECA
03942A 9F1B 00   BC       A         NEG    XDIFNW+1
03943A 9F1D 97   8D       A CNTER1  STA    XSTR
03944A 9F1F D6   BC       A         LDB    XDIFNW+1
03945A 9F21 B6   1C24     A         LDA    CSTEPX
03946A 9F24 44                      LSRA
03947A 9F25 3D                      MUL
03948A 9F26 44                      LSRA              0>>7 > 0 >C
03949A 9F27 56                      RORB              C>>7 > 0 >C
03950A 9F28 44                      LSRA
03951A 9F29 56                      RORB
03952A 9F2A DD   8E       A         STD    XSTR+1
03953                          *
03954A 9F2C 86   53       A         LDA    #$53
03955A 9F2E 0D   BD       A         TST    YDIFNW
03956A 9F30 2A   03  9F35           BPL    CNTER2
03957A 9F32 4A                      DECA
03958A 9F33 00   BE       A         NEG    YDIFNW+1
03959A 9F35 97   90       A CNTER2  STA    YSTR
```

```
03960A 9F37 D6   BE        A        LDB    YDIFNW+1
03961A 9F39 44                      LSRA
03962A 9F3A B6   1C25      A        LDA    CSTEPY
03963A 9F3D 44                      LSRA
03964A 9F3E 3D                      MUL
03965A 9F3F 44                      LSRA
03966A 9F40 56                      RORB
03967A 9F41 44                      LSRA
03968A 9F42 56                      RORB
03969A 9F43 DD   91        A        STD    YSTR+1
03970A 9F45 BD   8C79      A        JSR    MOVEXY
03971A 9F48 8C   8097      A        CMPX   #REPLY0
03972A 9F4B 26   AB   9EF8          BNE    MAGER1
03973A 9F4D 4D                      TSTA
03974A 9F4E 26   A8   9EF8          BNE    MAGER1
03975                      *
03976                      * NOW AT CENTER WITH DIE FOUND
03977                      *
03978A 9F50 8E   7200      A        LDX    #XSIZE   LOAD DIE SIZE
03979A 9F53 108E 1C46      A        LDY    #XDIE
03980A 9F57 A6   80        A STRX   LDA    ,X+
03981A 9F59 A7   A0        A        STA    ,Y+
03982A 9F5B 8C   7210      A        CMPX   #XSIZE+16
03983A 9F5E 26   F7   9F57          BNE    STRX
03984                      *
03985A 9F60 8E   7300      A        LDX    #YSIZE
03986A 9F63 108E 1C56      A        LDY    #YDIE
03987A 9F67 A6   80        A STRY   LDA    ,X+
03988A 9F69 A7   A0        A        STA    ,Y+
03989A 9F6B 8C   7310      A        CMPX   #YSIZE+16
03990A 9F6E 26   F7   9F67          BNE    STRY
03991                      *
03992A 9F70 8E   7202      A        LDX    #XSIZE+2
03993A 9F73 CC   0000      A        LDD    #0
03994A 9F76 EB   80        A ADXSZE ADDB   ,X+
03995A 9F78 89   00        A        ADCA   #0
03996A 9F7A 8C   7207      A        CMPX   #XSIZE+7
03997A 9F7D 26   F7   9F76          BNE    ADXSZE
03998A 9F7F DD   BF        A        STD    XDIESZ
03999                      *
04000A 9F81 8E   7302      A        LDX    #YSIZE+2
04001A 9F84 CC   0000      A        LDD    #0
04002A 9F87 EB   80        A ADYSZE ADDB   ,X+
04003A 9F89 89   00        A        ADCA   #0
04004A 9F8B 8C   7307      A        CMPX   #YSIZE+7
04005A 9F8E 26   F7   9F87          BNE    ADYSZE
04006A 9F90 DD   C1        A        STD    YDIESZ
04007                      *
04008                      *        SFXADJ
04009A 9F92 8E   00BF      A        LDX    #XDIESZ  CAL. JUMP "X"
04010A 9F95 B6   1C24      A        LDA    CSTEPX
04011A 9F98 44                      LSRA
04012A 9F99 97   AE        A        STA    YSPTMP+1
04013A 9F9B 0F   AD        A        CLR    YSPTMP
04014A 9F9D 108E 00AD      A        LDY    #YSPTMP
04015A 9FA1 CE   009B      A        LDU    #TEMP
04016A 9FA4 BD   8D13      A        JSR    MULT
04017A 9FA7 04   9B        A        LSR    TEMP
04018A 9FA9 06   9C        A        ROR    TEMP+1
04019A 9FAB 06   9D        A        ROR    TEMP+2
04020A 9FAD 06   9E        A        ROR    TEMP+3
04021A 9FAF 04   9B        A        LSR    TEMP
04022A 9FB1 06   9C        A        ROR    TEMP+1
04023A 9FB3 06   9D        A        ROR    TEMP+2
04024A 9FB5 06   9E        A        ROR    TEMP+3
04025A 9FB7 DC   9D        A        LDD    TEMP+2
04026A 9FB9 FD   1C01      A        STD    JMPX+1
04027A 9FBC DD   8E        A        STD    XSTR+1
04028                      *
04029                      *        SFYADJ
04030A 9FBE 8E   00C1      A        LDX    #YDIESZ  CAL. JUMP "Y"
04031A 9FC1 B6   1C25      A        LDA    CSTEPY
04032A 9FC4 44                      LSRA
```

```
05360 04033A 9FC5 97   AC        A         STA    XSPTMP+1
05370 04034A 9FC7 0F   AB        A         CLR    XSPTMP
05380 04035A 9FC9 108E 00AB      A         LDY    #XSPTMP
05390 04036A 9FCD CE   009B      A         LDU    #TEMP
05400 04037A 9FD0 BD   8D13      A         JSR    MULT
05410 04038A 9FD3 04   9B        A         LSR    TEMP
05420 04039A 9FD5 06   9C        A         ROR    TEMP+1
05430 04040A 9FD7 06   9D        A         ROR    TEMP+2
05440 04041A 9FD9 06   9E        A         ROR    TEMP+3
05450 04042A 9FDB 04   9B        A         LSR    TEMP
05460 04043A 9FDD 06   9C        A         ROR    TEMP+1
05470 04044A 9FDF 06   9D        A         ROR    TEMP+2
05480 04045A 9FE1 06   9E        A         ROR    TEMP+3
05490 04046A 9FE3 DC   9D        A         LDD    TEMP+2
05500 04047A 9FE5 FD   1C04      A         STD    JMPY+1
05510 04048A 9FE8 DD   91        A         STD    YSTR+1
05520 04049                          *
05530 04050A 9FEA 86   51        A         LDA    #$51
05540 04051A 9FEC 97   8D        A         STA    XSTR
05550 04052A 9FEE 97   90        A         STA    YSTR
05560 04053A 9FF0 BD   8C79      A         JSR    MOVEXY
05570 04054A 9FF3 8C   8097      A         CMPX   #REPLY0
05580 04055A 9FF6 27   01   9FF9           BEQ    *+3
05590 04056A 9FF8 39                       RTS
05600 04057A 9FF9 4D                       TSTA
05610 04058A 9FFA 1026 00DC A0DA           LBNE   MOTLMT
05620 04059A 9FFE BD   9381      A         JSR    STEPUR
05630 04060A A001 BD   A741      A LOOPJP  JSR    CRUNCH
05640 04061A A004 96   80        A         LDA    TOPSTC
05650 04062A A006 81   08        A         CMPA   #8
05660 04063A A008 22   0C   A016           BHI    LOOPJ1
05670 04064A A00A 9B   83        A         ADDA   BOTSTC
05680 04065A A00C 81   0F        A         CMPA   #$F
05690 04066A A00E 25   06   A016           BLO    LOOPJ1
05700 04067A A010 81   11        A         CMPA   #$11
05710 04068A A012 22   02   A016           BHI    LOOPJ1
05720 04069A A014 0F   92        A         CLR    YSTR+2
05730 04070A A016 96   82        A LOOPJ1  LDA    RHTSTC
05740 04071A A018 81   08        A         CMPA   #8
05750 04072A A01A 22   0C   A028           BHI    LOOPJ2
05760 04073A A01C 9B   81        A         ADDA   LHTSTC
05770 04074A A01E 81   0F        A         CMPA   #$F
05780 04075A A020 25   06   A028           BLO    LOOPJ2
05790 04076A A022 81   11        A         CMPA   #$11
05800 04077A A024 22   02   A028           BHI    LOOPJ2
05810 04078A A026 0F   8F        A         CLR    XSTR+2
05820 04079A A028 DC   8E        A LOOPJ2  LDD    XSTR+1
05830 04080A A02A F3   1C01      A         ADDD   JMPX+1
05840 04081A A02D FD   1C01      A         STD    JMPX+1
05850 04082A A030 DC   91        A         LDD    YSTR+1
05860 04083A A032 F3   1C04      A         ADDD   JMPY+1
05870 04084A A035 FD   1C04      A         STD    JMPY+1
05880 04085A A038                          STOPBK
05880        A A038 7D   6002    A         TST    HOSTAC
05880        A A03B 2A   19   A056         BPL    .00042
05880        A A03D B6   6000    A         LDA    HOSTAD
05880        A A040 86   50      A         LDA    #$50
05880        A A042 97   8D      A         STA    XSTR
05880        A A044 97   90      A         STA    YSTR
05880        A A046 FC   1C01    A         LDD    JMPX+1
05880        A A049 DD   8E      A         STD    XSTR+1
05880        A A04B FC   1C04    A         LDD    JMPY+1
05880        A A04E DD   91      A         STD    YSTR+1
05880        A A050 BD   8C79    A         JSR    MOVEXY
05880        A A053 7E   808F    A         JMP    NULL
05880                    A056    A .00042  EQU    *
05890 04086A A056 BD   8C79      A         JSR    MOVEXY
05900 04087A A059 8C   8097      A         CMPX   #REPLY0
05910 04088A A05C 27   01   A05F           BEQ    *+3
05920 04089A A05E 39                       RTS
05930 04090A A05F 4D                       TSTA
05940 04091A A060 26   78   A0DA           BNE    MOTLMT
05950 04092A A062 96   8F        A         LDA    XSTR+2
05960 04093A A064 26   9A   A001           BNE    LOOPJP
```

```
05970 04094A A066 96    92      A          LDA     YSTR+2
05980 04095A A068 26    97    A001         BNE     LOOPJP
05990 04096                         *JUMP X 4 = SF X DIESIZE
06000 04097A A06A CC    0004    A          LDD     #4
06010 04098A A06D DD    C3      A          STD     SFTEMP   FOR NOW
06020 04099A A06F 8E    1C01    A          LDX     #JMPX+1
06030 04100A A072 108E  00C3    A          LDY     #SFTEMP
06040 04101A A076 CE    009B    A          LDU     #TEMP
06050 04102A A079 BD    8D13    A          JSR     MULT
06060 04103                         *NOW HAVE JUMPX X 4 > TEMP
06070 04104                         *          LDD     #1
06080 04105                         *SFXLOP STD     SFTEMP   REAL ONE NOW
06090 04106                         *          LDX     #XDIESZ
06100 04107                         *          LDY     #SFTEMP
06110 04108                         *          LDU     #TEMP1
06120 04109                         *          JSR     MULT
06130 04110                         **NOW GOT SF X XDIESIZE > TEMP1
06140 04111                         *          LDD     TEMP
06150 04112                         *          CMPD    TEMP1
06160 04113                         *          BLO     GOTITX
06170 04114                         *          LDD     TEMP+2
06180 04115                         *          CMPD    TEMP1+2
06190 04116                         *          BLS     GOTITX
06200 04117                         *          LDD     SFTEMP
06210 04118                         *          ADDD    #1
06220 04119                         *          BRA     SFXLOP
06230 04120                         *GOTITX LDA     SFTEMP+1
06240 04121                         *          STA     CSTEPX
06250 04122                         *
06260 04123                         *          LDD     #4
06270 04124                         *          STD     SFTEMP
06280 04125                         *          LDX     #JMPY+1
06290 04126                         *          LDY     #SFTEMP
06300 04127                         *          LDU     #TEMP
06310 04128                         *          JSR     MULT
06320 04129                         **
06330 04130                         *          LDD     #1
06340 04131                         *SFYLOP STD     SFTEMP
06350 04132                         *          LDX     #YDIESZ
06360 04133                         *          LDY     #SFTEMP
06370 04134                         *          LDU     #TEMP1
06380 04135                         *          JSR     MULT
06390 04136                         **
06400 04137                         *          LDD     TEMP
06410 04138                         *          CMPD    TEMP1
06420 04139                         *          BLO     GOTITY
06430 04140                         *          LDD     TEMP+2
06440 04141                         *          CMPD    TEMP1+2
06450 04142                         *          BLS     GOTITY
06460 04143                         *          LDD     SFTEMP
06470 04144                         *          ADDD    #1
06480 04145                         *          BRA     SFYLOP
06490 04146                         *GOTITY LDA     SFTEMP+1
06500 04147                         *          STA     CSTEPY
06510 04148                         *
06520 04149A A07C B6    1C24    A          LDA     CSTEPX
06530 04150A A07F 44                       LSRA
06540 04151A A080 B7    1C24    A          STA     CSTEPX
06550 04152A A083 B6    1C25    A          LDA     CSTEPY
06560 04153A A086 44                       LSRA
06570 04154A A087 B7    1C25    A          STA     CSTEPY
06580 04155                         *
06590 04156A A08A 86    50      A          LDA     #$50
06600 04157A A08C 97    8D      A          STA     XSTR
06610 04158A A08E 97    90      A          STA     YSTR
06620 04159A A090 FC    1C01    A          LDD     JMPX+1
06630 04160A A093 DD    8E      A          STD     XSTR+1
06640 04161A A095 FC    1C04    A          LDD     JMPY+1
06650 04162A A098 DD    91      A          STD     YSTR+1
06660 04163A A09A BD    8C79    A          JSR     MOVEXY
06670 04164A A09D 8C    8097    A          CMPX    #REPLY0
06680 04165A A0A0 27    01    A0A3         BEQ     *+3
06690 04166A A0A2 39                       RTS
06700 04167A A0A3 4D                       TSTA
```

```
06710 04168A A0A4 26   34   A0DA         BNE    MOTLMT
06720 04169                       *
06730 04170                       *NOW RECENTER DIE
06740 04171                       *
06750 04172A A0A6 86   01      A         LDA    #1
06760 04173A A0A8 B7   1C6E    A         STA    ALIGNF
06770 04174A A0AB BD   A19F    A         JSR    FIND
06780 04175A A0AE 8C   8097    A         CMPX   #REPLY0
06790 04176A A0B1 27   01   A0B4         BEQ    DOIT
06800 04177A A0B3 39                     RTS
06810 04178                       *
06820 04179                       *LOAD DOT COUNTS
06830 04180                       *
06840 04181A A0B4 BD   A741    A DOIT    JSR    CRUNCH
06850 04182A A0B7 FC   7700    A         LDD    ACNT
06860 04183A A0BA FD   1C06    A         STD    ACOUNT
06870 04184A A0BD FC   7800    A         LDD    BCNT
06880 04185A A0C0 FD   1C08    A         STD    BCOUNT
06890 04186A A0C3 FC   7900    A         LDD    CCNT
06900 04187A A0C6 FD   1C0A    A         STD    CCOUNT
06910 04188A A0C9 BD   9A2F    A         JSR    WKSR
06920 04189                       *
06930 04190                       *
06940 04191A A0CC 86   89      A         LDA    #$89
06950 04192A A0CE B7   7600    A         STA    CNTRAD   TURN ON "GOOD"PATTERN
06960 04193                       *
06970 04194A A0D1 86   08      A         LDA    #8
06980 04195A A0D3 B7   E001    A         STA    LEDS+1   TURN ON "FIND"LED
06990 04196                       *
07000 04197A A0D6 8E   8097    A         LDX    #REPLY0
07010 04198A A0D9 39                     RTS
07020 04199                       *
07030 04200A A0DA 8E   814C    A MOTLMT  LDX    #REPLY8
07040 04201A A0DD 39                     RTS
07050 04202                       *
07060 04203                       *      THIS WILL LOAD-UP
07070 04204                       *      AT "CENTER"
07080 04205A A0DE 30   8D 7B44   MINPAT  LEAX   MINX,PCR LOAD UP X SIZE TABLE
07090 04206A A0E2 108E 7200    A         LDY    #XSIZE
07100 04207A A0E6 C6   10      A         LDB    #16
07110 04208A A0E8 A6   80      A MINPA1  LDA    ,X+
07120 04209A A0EA A7   A0      A         STA    ,Y+
07130 04210A A0EC 5A                     DECB
07140 04211A A0ED 26   F9   A0E8         BNE    MINPA1
07150 04212A A0EF 30   8D 7B43           LEAX   MINY,PCR LOAD UP Y SIZE TABLE
07160 04213A A0F3 108E 7300    A         LDY    #YSIZE
07170 04214A A0F7 C6   10      A         LDB    #16
07180 04215A A0F9 A6   80      A MINPA2  LDA    ,X+
07190 04216A A0FB A7   A0      A         STA    ,Y+
07200 04217A A0FD 5A                     DECB
07210 04218A A0FE 26   F9   A0F9         BNE    MINPA2
07220 04219A A100 39                     RTS
07230 04220                       *
07240 04221                       * DIEPAT REMAIN IN NORM VIDEO
07250 04222                       * LOAD IN PRESENT DIE SIZE
07260 04223                       *
07270 04224A A101 30   8D 7B41   DIEPAT  LEAX   XDIE,PCR
07280 04225A A105 108E 7200    A         LDY    #XSIZE
07290 04226A A109 C6   10      A         LDB    #16
07300 04227A A10B A6   80      A DIEPA1  LDA    ,X+
07310 04228A A10D A7   A0      A         STA    ,Y+
07320 04229A A10F 5A                     DECB
07330 04230A A110 26   F9   A10B         BNE    DIEPA1
07340 04231A A112 30   8D 7B40           LEAX   YDIE,PCR
07350 04232A A116 108E 7300    A         LDY    #YSIZE
07360 04233A A11A C6   10      A         LDB    #16
07370 04234A A11C A6   80      A DIEPA2  LDA    ,X+
07380 04235A A11E A7   A0      A         STA    ,Y+
07390 04236A A120 5A                     DECB
07400 04237A A121 26   F9   A11C         BNE    DIEPA2
07410 04238A A123 39                     RTS
07420 04239                       *
07430 04240                       * THIS WILL TURN ON
```

```
07440 04241                          * STARTING PATTERN
07450 04242                          *
07460 04243A A124 86   08        A DPLY8  LDA    #$8       DISPLAY ON
07470 04244A A126 B7   7600      A        STA    CNTRAD
07480 04245A A129 86   02        A        LDA    #2        ENABLE PATTERN
07490 04246A A12B B7   7601      A        STA    CNTRAD+1
07500 04247A A12E 39                      RTS
07510 04248                          *
07520 04249                          *
07530 04250                          *
07540 04251A A12F B6   7300      A MOVTOP LDA    YSIZE
07550 04252A A132 80   02        A        SUBA   #2
07560 04253A A134 B7   7300      A        STA    YSIZE
07570 04254                          *
07580 04255A A137 B6   7303      A MOVBOT LDA    YSIZE+3
07590 04256A A13A 8B   01        A        ADDA   #1
07600 04257A A13C B7   7303      A        STA    YSIZE+3
07610 04258A A13F B6   7305      A        LDA    YSIZE+5
07620 04259A A142 8B   01        A        ADDA   #1
07630 04260A A144 B7   7305      A        STA    YSIZE+5
07640 04261A A147 0F   A9        A        CLR    FLAG
07650 04262A A149 39                      RTS
07660 04263                          *
07670 04264A A14A B6   7200      A MOVLHT LDA    XSIZE
07680 04265A A14D 80   02        A        SUBA   #2
07690 04266A A14F B7   7200      A        STA    XSIZE
07700 04267                          *
07710 04268A A152 B6   7203      A MOVRHT LDA    XSIZE+3
07720 04269A A155 8B   01        A        ADDA   #1
07730 04270A A157 B7   7203      A        STA    XSIZE+3
07740 04271A A15A B6   7205      A        LDA    XSIZE+5
07750 04272A A15D 8B   01        A        ADDA   #1
07760 04273A A15F B7   7205      A        STA    XSIZE+5
07770 04274A A162 0F   A9        A        CLR    FLAG
07780 04275A A164 39                      RTS
07790 04276                          *
07800 04277                          *
07810 04278                          *
07820 04279A A165 4F                 LMTCHK CLRA
07830 04280A A166 8E   7200      A        LDX    #XSIZE
07840 04281A A169 E6   80        A        LDB    ,X+
07850 04282A A16B C1   32        A        CMPB   #$32
07860 04283A A16D 25   2C   A19B          BLO    LMT
07870 04284                          *
07880 04285A A16F EB   80        A LMT1   ADDB   ,X+
07890 04286A A171 89   00        A        ADCA   #0
07900 04287A A173 8C   7208      A        CMPX   #XSIZE+8
07910 04288A A176 26   F7   A16F          BNE    LMT1
07920 04289A A178 1083 0153      A        CMPD   #$153
07930 04290A A17C 22   1D   A19B          BHI    LMT
07940 04291                          *
07950 04292A A17E 4F                      CLRA
07960 04293A A17F 8E   7300      A        LDX    #YSIZE
07970 04294A A182 E6   80        A        LDB    ,X+
07980 04295A A184 C1   20        A        CMPB   #$20
07990 04296A A186 25   13   A19B          BLO    LMT
08000 04297                          *
08010 04298A A188 EB   80        A LMT2   ADDB   ,X+
08020 04299A A18A 89   00        A        ADCA   #0
08030 04300A A18C 8C   7308      A        CMPX   #YSIZE+8
08040 04301A A18F 26   F7   A188          BNE    LMT2
08050 04302A A191 1083 00EE      A        CMPD   #$EE
08060 04303A A195 22   04   A19B          BHI    LMT
08070 04304                          *
08080 04305A A197 8E   8097      A        LDX    #REPLY0
08090 04306A A19A 39                      RTS
08100 04307                          *
08110 04308A A19B 8E   814C      A LMT    LDX    #REPLY8
08120 04309A A19E 39                      RTS
00010 04310                               TTL    FIND
```

```
                                  ***********************************************
                                  *  COPYRIGHT BY ASM DIE BONDING INC.   1982
                                  *     SOFTWARE FOR THE D2KH DIE BONDER
                                  *            FIND   REV. 2.0A
                                  *
                                  *  DISK ID        : VIDEO 2
                                  *  DATE           :
                                  *  DWG NO         :
                                  *  ASSM NUMBER    :
                                  *  EPROM ID TAG   :
                                  *  ORGINATOR      :
                                  *  REVISED        :
                                  ***********************************************
                                  *   K E Y  C O M M A N D   $65
                                  *
                                  *      F I N D
                                  ***********************************************
                                  *
A A19F 7D      6010      A FIND    TST    DIEEJT
A A1A2 2A      04   A1A8           BPL    FINDOK
A A1A4 8E      80EE      A         LDX    #REPLY5
A A1A7 39                          RTS
                                  *
A A1A8 86      F7        A FINDOK  LDA    #$F7
A A1AA B4      E001      A         ANDA   LEDS+1
A A1AD B7      E001      A         STA    LEDS+1
A A1B0 0F      C5        A         CLR    MISFLG
A A1B2 7D      1C6E      A         TST    ALIGNF
A A1B5 26      04   A1BB           BNE    FIND1
A A1B7 8E      809D      A         LDX    #REPLY2
A A1BA 39                          RTS
                                  *
A A1BB 4F                   FIND1  CLRA
A A1BC 97      84        A         STA    EXTOP
A A1BE 97      85        A         STA    EXBOT
A A1C0 97      87        A         STA    EXRHT
A A1C2 97      86        A         STA    EXLHT
A A1C4 97      8E        A         STA    XSTR+1
A A1C6 97      8F        A         STA    XSTR+2
A A1C8 97      91        A         STA    YSTR+1
A A1CA 97      92        A         STA    YSTR+2
A A1CC BD      A101      A         JSR    DIEPAT
A A1CF BD      A124      A         JSR    DPLY8
A A1D2 BD      A741      A         JSR    CRUNCH
A A1D5 FC      1C0A      A         LDD    CCOUNT
A A1D8 44                          LSRA
A A1D9 56                          RORB
A A1DA 44                          LSRA
A A1DB 56                          RORB
A A1DC 44                          LSRA
A A1DD 56                          RORB
A A1DE 10B3 7900         A         CMPD   CCNT
A A1E2 1022 012F A315              LBHI   NODIE
                                  *
A A1E6 96      80        A         LDA    TOPSTC
A A1E8 81      01        A         CMPA   #1
A A1EA 1027 012D A31B              LBEQ   CKNDIE
                                  *
A A1EE 96      83        A         LDA    BOTSTC
A A1F0 81      01        A         CMPA   #1
A A1F2 1027 0125 A31B              LBEQ   CKNDIE
                                  *
A A1F6 96      81        A         LDA    LHTSTC
A A1F8 81      01        A         CMPA   #1
A A1FA 1027 011D A31B              LBEQ   CKNDIE
                                  *
A A1FE 96      82        A         LDA    RHTSTC
A A200 81      01        A         CMPA   #1
A A202 1027 0115 A31B              LBEQ   CKNDIE
                                  *
A A206 96      80        A         LDA    TOPSTC
A A208 9B      83        A         ADDA   BOTSTC
A A20A 81      0D        A         CMPA   #$D
```

```
04385A A20C 1025 0126 A336         LBLO   FINDER
04386A A210 81   13      A         CMPA   #$13
04387A A212 1022 0120 A336         LBHI   FINDER
04388A A216 96   82      A         LDA    RHTSTC
04389A A218 9B   81      A         ADDA   LHTSTC
04390A A21A 81   0D      A         CMPA   #$D
04391A A21C 1025 0116 A336         LBLO   FINDER
04392A A220 81   13      A         CMPA   #$13
04393A A222 1022 0110 A336         LBHI   FINDER
04394                      *
04395A A226 96   80      A         LDA    TOPSTC
04396A A228 80   08      A         SUBA   #8
04397A A22A 2D   1F   A24B         BLT    YMOVEU
04398A A22C D6   83      A         LDB    BOTSTC
04399A A22E C0   08      A         SUBB   #8
04400A A230 102E 01A3 A3D7         LBGT   PARDIE
04401A A234 50                     NEGB
04402A A235 34   04      A         PSHS   B
04403A A237 AB   E0      A         ADDA   ,S+
04404A A239 F6   1C25    A         LDB    CSTEPY
04405A A23C 3D                     MUL
04406A A23D 44                     LSRA
04407A A23E 56                     RORB
04408A A23F 44                     LSRA
04409A A240 56                     RORB
04410A A241 44                     LSRA
04411A A242 56                     RORB
04412A A243 DD   91      A         STD    YSTR+1
04413A A245 86   53      A         LDA    #$53
04414A A247 97   90      A         STA    YSTR
04415A A249 20   1D   A268         BRA    XMOVER
04416                      *
04417A A24B 40             YMOVEU  NEGA
04418A A24C D6   83      A         LDB    BOTSTC
04419A A24E C0   08      A         SUBB   #8
04420A A250 102D 0183 A3D7         LBLT   PARDIE
04421A A254 34   04      A         PSHS   B
04422A A256 AB   E0      A         ADDA   ,S+
04423A A258 F6   1C25    A         LDB    CSTEPY
04424A A25B 3D                     MUL
04425A A25C 44                     LSRA
04426A A25D 56                     RORB
04427A A25E 44                     LSRA
04428A A25F 56                     RORB
04429A A260 44                     LSRA
04430A A261 56                     RORB
04431A A262 DD   91      A         STD    YSTR+1
04432A A264 86   52      A         LDA    #$52
04433A A266 97   90      A         STA    YSTR
04434                      *
04435A A268 96   81      A XMOVER  LDA    LHTSTC
04436A A26A 80   08      A         SUBA   #8
04437A A26C 2D   1F   A28D         BLT    XMOVEL
04438A A26E D6   82      A         LDB    RHTSTC
04439A A270 C0   08      A         SUBB   #8
04440A A272 102E 0161 A3D7         LBGT   PARDIE
04441A A276 50                     NEGB
04442A A277 34   04      A         PSHS   B
04443A A279 AB   E0      A         ADDA   ,S+
04444A A27B F6   1C24    A         LDB    CSTEPX
04445A A27E 3D                     MUL
04446A A27F 44                     LSRA
04447A A280 56                     RORB
04448A A281 44                     LSRA
04449A A282 56                     RORB
04450A A283 44                     LSRA
04451A A284 56                     RORB
04452A A285 DD   8E      A         STD    XSTR+1
04453A A287 86   52      A         LDA    #$52
04454A A289 97   8D      A         STA    XSTR
04455A A28B 20   1D   A2AA         BRA    SETUP
04456                      *
04457A A28D 40             XMOVEL  NEGA
```

```
01490 04458A A28E D6   82        A        LDB    RHTSTC
01500 04459A A290 C0   08        A        SUBB   #8
01510 04460A A292 102D 0141 A3D7          LBLT   PARDIE
01520 04461A A296 34   04        A        PSHS   B
01530 04462A A298 AB   E0        A        ADDA   ,S+
01540 04463A A29A F6   1C24      A        LDB    CSTEPX
01550 04464A A29D 3D                      MUL
01560 04465A A29E 44                      LSRA
01570 04466A A29F 56                      RORB
01580 04467A A2A0 44                      LSRA
01590 04468A A2A1 56                      RORB
01600 04469A A2A2 44                      LSRA
01610 04470A A2A3 56                      RORB
01620 04471A A2A4 DD   8E        A        STD    XSTR+1
01630 04472A A2A6 86   53        A        LDA    #$53
01640 04473A A2A8 97   8D        A        STA    XSTR
01650 04474A A2AA BD   A101      A SETUP  JSR    DIEPAT
01660 04475A A2AD BD   8C79      A        JSR    MOVEXY
01670 04476A A2B0 8C   8097      A        CMPX   #REPLY0
01680 04477A A2B3 1026 028A A541          LBNE   FMTERR
01690 04478A A2B7 4D                      TSTA
01700 04479A A2B8 1026 0288 A544          LBNE   FMTLMT
01710 04480                        *
01720 04481A A2BC BD   A741      A        JSR    CRUNCH
01730 04482A A2BF FC   7700      A        LDD    ACNT
01740 04483A A2C2 10B3 1C0C      A        CMPD   WKSR1
01750 04484A A2C6 25   46   A30E          BLO    NOGOOD
01760 04485                        *
01770 04486A A2C8 FC   7800      A        LDD    BCNT
01780 04487A A2CB 10B3 1C0E      A        CMPD   WKSR2
01790 04488A A2CF 25   3D   A30E          BLO    NOGOOD
01800 04489                        *
01810 04490A A2D1 FC   7900      A        LDD    CCNT
01820 04491A A2D4 10B3 1C10      A        CMPD   WKSR3
01830 04492A A2D8 25   34   A30E          BLO    NOGOOD
01840 04493                        *
01850 04494A A2DA 96   80        A        LDA    TOPSTC
01860 04495A A2DC 80   01        A        SUBA   #1
01870 04496A A2DE 2B   2E   A30E          BMI    NOGOOD
01880 04497A A2E0 27   2C   A30E          BEQ    NOGOOD
01890 04498                        *
01900 04499A A2E2 96   83        A        LDA    BOTSTC
01910 04500A A2E4 80   01        A        SUBA   #1
01920 04501A A2E6 2B   26   A30E          BMI    NOGOOD
01930 04502A A2E8 27   24   A30E          BEQ    NOGOOD
01940 04503                        *
01950 04504A A2EA 96   81        A        LDA    LHTSTC
01960 04505A A2EC 80   01        A        SUBA   #1
01970 04506A A2EE 2B   1E   A30E          BMI    NOGOOD
01980 04507A A2F0 27   1C   A30E          BEQ    NOGOOD
01990 04508                        *
02000 04509A A2F2 96   82        A        LDA    RHTSTC
02010 04510A A2F4 80   01        A        SUBA   #1
02020 04511A A2F6 2B   16   A30E          BMI    NOGOOD
02030 04512A A2F8 27   14   A30E          BEQ    NOGOOD
02040 04513                        *
02050 04514                        *  IF HERE, WE GOT A GOOD ONE
02060 04515                        *  TURN  ON GOOD PATTERN & FIND LED
02070 04516A A2FA 86   08        A        LDA    #8
02080 04517A A2FC BA   E001      A        ORA    LEDS+1
02090 04518A A2FF B7   E001      A        STA    LEDS+1
02100 04519A A302 86   89        A        LDA    #$89
02110 04520A A304 B7   7600      A        STA    CNTRAD
02120 04521A A307 86   82        A        LDA    #$82
02130 04522A A309 B7   7601      A        STA    CNTRAD+1
02140 04523A A30C 0F   88        A        CLR    WIERDF
02150 04524A A30E 8E   8097      A NOGOOD LDX    #REPLY0
02160 04525A A311 0F   C6        A        CLR    LOSTF
02170 04526A A313 4F               FIND8  CLRA
02180 04527A A314 39                      RTS
02190 04528A A315 86   01        A NODIE  LDA    #1
02200 04529A A317 97   C5        A        STA    MISFLG
02210 04530A A319 20   F3   A30E          BRA    NOGOOD
02220 04531                        *
```

```
04532A A31B CC    0001     A CKNDIE LDD     #1
04533A A31E D1    80       A        CMPB    TOPSTC
04534A A320 26    01   A323         BNE     *+3
04535A A322 4C                      INCA
04536A A323 D1    83       A        CMPB    BOTSTC
04537A A325 26    01   A328         BNE     *+3
04538A A327 4C                      INCA
04539A A328 D1    81       A        CMPB    LHTSTC
04540A A32A 26    01   A32D         BNE     *+3
04541A A32C 4C                      INCA
04542A A32D D1    82       A        CMPB    RHTSTC
04543A A32F 26    01   A332         BNE     *+3
04544A A331 4C                      INCA
04545A A332 81    03       A        CMPA    #3
04546A A334 2C    DF   A315         BGE     NODIE
04547                        *
04548A A336 86    FF       A FINDER LDA     #$FF
04549A A338 91    80       A        CMPA    TOPSTC
04550A A33A 26    1A   A356         BNE     EXBOTK
04551A A33C 0C    84       A        INC     EXTOP
04552A A33E F6    7300     A        LDB     YSIZE
04553A A341 C0    0D       A        SUBB    #$D
04554A A343 F7    7300     A        STB     YSIZE
04555A A346 F6    7303     A        LDB     YSIZE+3
04556A A349 CB    06       A        ADDB    #6
04557A A34B F7    7303     A        STB     YSIZE+3
04558A A34E F6    7305     A        LDB     YSIZE+5
04559A A351 CB    07       A        ADDB    #7
04560A A353 F7    7305     A        STB     YSIZE+5
04561                        *
04562A A356 91    83       A EXBOTK CMPA    BOTSTC
04563A A358 26    12   A36C         BNE     EXLHTK
04564A A35A 0C    85       A        INC     EXBOT
04565A A35C F6    7303     A        LDB     YSIZE+3
04566A A35F CB    06       A        ADDB    #6
04567A A361 F7    7303     A        STB     YSIZE+3
04568A A364 F6    7305     A        LDB     YSIZE+5
04569A A367 CB    07       A        ADDB    #7
04570A A369 F7    7305     A        STB     YSIZE+5
04571                        *
04572A A36C 91    81       A EXLHTK CMPA    LHTSTC
04573A A36E 26    1A   A38A         BNE     EXRHTK
04574A A370 0C    86       A        INC     EXLHT
04575A A372 F6    7200     A        LDB     XSIZE
04576A A375 C0    0D       A        SUBB    #$D
04577A A377 F7    7200     A        STB     XSIZE
04578A A37A F6    7203     A        LDB     XSIZE+3
04579A A37D CB    06       A        ADDB    #6
04580A A37F F7    7203     A        STB     XSIZE+3
04581A A382 F6    7205     A        LDB     XSIZE+5
04582A A385 CB    07       A        ADDB    #7
04583A A387 F7    7205     A        STB     XSIZE+5
04584                        *
04585A A38A 91    82       A EXRHTK CMPA    RHTSTC
04586A A38C 26    12   A3A0         BNE     EXDNE
04587A A38E 0C    87       A        INC     EXRHT
04588A A390 F6    7203     A        LDB     XSIZE+3
04589A A393 CB    06       A        ADDB    #6
04590A A395 F7    7203     A        STB     XSIZE+3
04591A A398 F6    7205     A        LDB     XSIZE+5
04592A A39B CB    07       A        ADDB    #7
04593A A39D F7    7205     A        STB     XSIZE+5
04594                        *
04595             A3A0     A EXDNE  EQU     *
04596A A3A0 96    84       A        LDA     EXTOP
04597A A3A2 26    30   A3D4         BNE     FIND2
04598A A3A4 96    85       A        LDA     EXBOT
04599A A3A6 26    2C   A3D4         BNE     FIND2
04600A A3A8 96    86       A        LDA     EXLHT
04601A A3AA 26    28   A3D4         BNE     FIND2
04602A A3AC 96    87       A        LDA     EXRHT
04603A A3AE 26    24   A3D4         BNE     FIND2
04604                        *
```

```
02960 04605A A3B0 86    01         A          LDA    #1
02970 04606A A3B2 91    80         A          CMPA   TOPSTC
02980 04607A A3B4 27    21    A3D7            BEQ    PARDIE
02990 04608A A3B6 91    83         A          CMPA   BOTSTC
03000 04609A A3B8 27    1D    A3D7            BEQ    PARDIE
03010 04610A A3BA 91    81         A          CMPA   LHTSTC
03020 04611A A3BC 27    19    A3D7            BEQ    PARDIE
03030 04612A A3BE 91    82         A          CMPA   RHTSTC
03040 04613A A3C0 27    15    A3D7            BEQ    PARDIE
03050 04614                          *
03060 04615A A3C2 96    88         A          LDA    WIERDF
03070 04616A A3C4 81    03         A          CMPA   #3
03080 04617A A3C6 26    06    A3CE            BNE    INCWIE
03090 04618A A3C8 0F    88         A          CLR    WIERDF
03100 04619A A3CA 8E    A549       A          LDX    #REPLYW
03110 04620A A3CD 39                          RTS
03120 04621                          *
03130 04622A A3CE 0C    88         A INCWIE   INC    WIERDF
03140 04623A A3D0 8E    8097       A          LDX    #REPLY0
03150 04624A A3D3 39                          RTS
03160 04625                          *
03170 04626A A3D4 BD    A741       A FIND2    JSR    CRUNCH
03180 04627A A3D7 D6    80         A PARDIE   LDB    TOPSTC
03190 04628A A3D9 DB    83         A          ADDB   BOTSTC
03200 04629A A3DB C1    02         A          CMPB   #2
03210 04630A A3DD 1027  FF2D  A30E            LBEQ   NOGOOD
03220 04631A A3E1 C1    FE         A          CMPB   #$FE
03230 04632A A3E3 1027  0148  A52F            LBEQ   FLOST
03240 04633A A3E7 D6    81         A          LDB    LHTSTC
03250 04634A A3E9 DB    82         A          ADDB   RHTSTC
03260 04635A A3EB C1    02         A          CMPB   #2
03270 04636A A3ED 1027  FF1D  A30E            LBEQ   NOGOOD
03280 04637A A3F1 C1    FE         A          CMPB   #$FE
03290 04638A A3F3 1027  0138  A52F            LBEQ   FLOST
03300 04639                          *
03310 04640A A3F7 96    80         A          LDA    TOPSTC
03320 04641A A3F9 81    01         A          CMPA   #1
03330 04642A A3FB 27    10    A40D            BEQ    BOTFIX
03340 04643A A3FD 81    FF         A          CMPA   #$FF
03350 04644A A3FF 27    0C    A40D            BEQ    BOTFIX
03360 04645A A401 96    81         A          LDA    LHTSTC
03370 04646A A403 81    01         A          CMPA   #1
03380 04647A A405 27    71    A478            BEQ    ADJTR
03390 04648A A407 81    FF         A          CMPA   #$FF
03400 04649A A409 27    6D    A478            BEQ    ADJTR
03410 04650A A40B 20    11    A41E            BRA    ADJTL
03420 04651                          *
03430 04652A A40D 96    81         A BOTFIX   LDA    LHTSTC
03440 04653A A40F 81    01         A          CMPA   #1
03450 04654A A411 1027  00EC  A501            LBEQ   ADJBR
03460 04655A A415 81    FF         A          CMPA   #$FF
03470 04656A A417 1027  00E6  A501            LBEQ   ADJBR
03480 04657A A41B 7E    A4D2       A          JMP    ADJBL
03490 04658                          *
03500 04659A A41E 96    80         A ADJTL    LDA    TOPSTC
03510 04660A A420 0D    84         A          TST    EXTOP
03520 04661A A422 27    02    A426            BEQ    *+4
03530 04662A A424 8B    0D         A          ADDA   #13
03540 04663A A426 80    08         A          SUBA   #8
03550 04664A A428 2D    10    A43A            BLT    YUMOVE
03560 04665A A42A F6    1C25       A          LDB    CSTEPY
03570 04666A A42D 3D                          MUL
03580 04667A A42E 44                          LSRA
03590 04668A A42F 56                          RORB
03600 04669A A430 44                          LSRA
03610 04670A A431 56                          RORB
03620 04671A A432 DD    91         A          STD    YSTR+1
03630 04672A A434 86    53         A          LDA    #$53
03640 04673A A436 97    90         A          STA    YSTR
03650 04674A A438 20    0F    A449            BRA    XRMOVE
03660 04675                          *
03670 04676A A43A 40                 YUMOVE   NEGA
03680 04677A A43B F6    1C25       A          LDB    CSTEPY
03690 04678A A43E 3D                          MUL
```

```
03700 04679A A43F 44                     LSRA
03710 04680A A440 56                     RORB
03720 04681A A441 44                     LSRA
03730 04682A A442 56                     RORB
03740 04683A A443 DD   91         A      STD    YSTR+1
03750 04684A A445 86   52         A      LDA    #$52
03760 04685A A447 97   90         A      STA    YSTR
03770 04686                         *
03780 04687A A449 96   81         A XRMOVE LDA  LHTSTC
03790 04688A A44B 0D   86         A      TST    EXLHT
03800 04689A A44D 27   02    A451        BEQ    *+4
03810 04690A A44F 8B   0D         A      ADDA   #13
03820 04691A A451 80   08         A      SUBA   #8
03830 04692A A453 2D   11    A466        BLT    XLMOVE
03840 04693A A455 F6   1C24       A      LDB    CSTEPX
03850 04694A A458 3D                     MUL
03860 04695A A459 44                     LSRA
03870 04696A A45A 56                     RORB
03880 04697A A45B 44                     LSRA
03890 04698A A45C 56                     RORB
03900 04699A A45D DD   8E         A      STD    XSTR+1
03910 04700A A45F 86   52         A      LDA    #$52
03920 04701A A461 97   8D         A      STA    XSTR
03930 04702A A463 7E   A2AA       A      JMP    SETUP
03940 04703                         *
03950 04704A A466 40                XLMOVE NEGA
03960 04705A A467 F6   1C24       A      LDB    CSTEPX
03970 04706A A46A 3D                     MUL
03980 04707A A46B 44                     LSRA
03990 04708A A46C 56                     RORB
04000 04709A A46D 44                     LSRA
04010 04710A A46E 56                     RORB
04020 04711A A46F DD   8E         A      STD    XSTR+1
04030 04712A A471 86   53         A      LDA    #$53
04040 04713A A473 97   8D         A      STA    XSTR
04050 04714A A475 7E   A2AA       A      JMP    SETUP
04060 04715                         *
04070 04716A A478 96   80         A ADJTR  LDA  TOPSTC
04080 04717A A47A 0D   84         A      TST    EXTOP
04090 04718A A47C 27   02    A480        BEQ    *+4
04100 04719A A47E 8B   0D         A      ADDA   #13
04110 04720A A480 80   08         A      SUBA   #8
04120 04721A A482 2D   10    A494        BLT    YMOVUA
04130 04722A A484 F6   1C25       A      LDB    CSTEPY
04140 04723A A487 3D                     MUL
04150 04724A A488 44                     LSRA
04160 04725A A489 56                     RORB
04170 04726A A48A 44                     LSRA
04180 04727A A48B 56                     RORB
04190 04728A A48C DD   91         A      STD    YSTR+1
04200 04729A A48E 86   53         A      LDA    #$53
04210 04730A A490 97   90         A      STA    YSTR
04220 04731A A492 20   0F    A4A3        BRA    XMOVLA
04230 04732                         *
04240 04733A A494 40                YMOVUA NEGA
04250 04734A A495 F6   1C25       A      LDB    CSTEPY
04260 04735A A498 3D                     MUL
04270 04736A A499 44                     LSRA
04280 04737A A49A 56                     RORB
04290 04738A A49B 44                     LSRA
04300 04739A A49C 56                     RORB
04310 04740A A49D DD   91         A      STD    YSTR+1
04320 04741A A49F 86   52         A      LDA    #$52
04330 04742A A4A1 97   90         A      STA    YSTR
04340 04743                         *
04350 04744A A4A3 96   82         A XMOVLA LDA  RHTSTC
04360 04745A A4A5 0D   87         A      TST    EXRHT
04370 04746A A4A7 27   02    A4AB        BEQ    *+4
04380 04747A A4A9 8B   0D         A      ADDA   #13
04390 04748A A4AB 80   08         A      SUBA   #8
04400 04749A A4AD 2D   11    A4C0        BLT    XMOVRA
04410 04750A A4AF F6   1C24       A      LDB    CSTEPX
04420 04751A A4B2 3D                     MUL
04430 04752A A4B3 44                     LSRA
```

```
04440 04753A A4B4 56                      RORB
04450 04754A A4B5 44                      LSRA
04460 04755A A4B6 56                      RORB
04470 04756A A4B7 DD    8E        A       STD     XSTR+1
04480 04757A A4B9 86    53        A       LDA     #$53
04490 04758A A4BB 97    8D        A       STA     XSTR
04500 04759A A4BD 7E    A2AA      A       JMP     SETUP
04510 04760                        *
04520 04761A A4C0 40               XMOVRA NEGA
04530 04762A A4C1 F6    1C24      A       LDB     CSTEPX
04540 04763A A4C4 3D                      MUL
04550 04764A A4C5 44                      LSRA
04560 04765A A4C6 56                      RORB
04570 04766A A4C7 44                      LSRA
04580 04767A A4C8 56                      RORB
04590 04768A A4C9 DD    8E        A       STD     XSTR+1
04600 04769A A4CB 86    52        A       LDA     #$52
04610 04770A A4CD 97    8D        A       STA     XSTR
04620 04771A A4CF 7E    A2AA      A       JMP     SETUP
04630 04772                        *
04640 04773A A4D2 96    83        A ADJBL  LDA     BOTSTC
04650 04774A A4D4 0D    85        A       TST     EXBOT
04660 04775A A4D6 27    02   A4DA         BEQ     *+4
04670 04776A A4D8 8B    0D        A       ADDA    #13
04680 04777A A4DA 80    08        A       SUBA    #8
04690 04778A A4DC 2D    11   A4EF         BLT     YDMOVE
04700 04779A A4DE F6    1C25      A       LDB     CSTEPY
04710 04780A A4E1 3D                      MUL
04720 04781A A4E2 44                      LSRA
04730 04782A A4E3 56                      RORB
04740 04783A A4E4 44                      LSRA
04750 04784A A4E5 56                      RORB
04760 04785A A4E6 DD    91        A       STD     YSTR+1
04770 04786A A4E8 86    52        A       LDA     #$52
04780 04787A A4EA 97    90        A       STA     YSTR
04790 04788A A4EC 7E    A449      A       JMP     XRMOVE
04800 04789                        *
04810 04790A A4EF 40               YDMOVE NEGA
04820 04791A A4F0 F6    1C25      A       LDB     CSTEPY
04830 04792A A4F3 3D                      MUL
04840 04793A A4F4 44                      LSRA
04850 04794A A4F5 56                      RORB
04860 04795A A4F6 44                      LSRA
04870 04796A A4F7 56                      RORB
04880 04797A A4F8 DD    91        A       STD     YSTR+1
04890 04798A A4FA 86    53        A       LDA     #$53
04900 04799A A4FC 97    90        A       STA     YSTR
04910 04800A A4FE 7E    A449      A       JMP     XRMOVE
04920 04801                        *
04930 04802A A501 96    83        A ADJBR  LDA     BOTSTC
04940 04803A A503 0D    85        A       TST     EXBOT
04950 04804A A505 27    02   A509         BEQ     *+4
04960 04805A A507 8B    0D        A       ADDA    #13
04970 04806A A509 80    08        A       SUBA    #8
04980 04807A A50B 2D    10   A51D         BLT     YMOVDA
04990 04808A A50D F6    1C25      A       LDB     CSTEPY
05000 04809A A510 3D                      MUL
05010 04810A A511 44                      LSRA
05020 04811A A512 56                      RORB
05030 04812A A513 44                      LSRA
05040 04813A A514 56                      RORB
05050 04814A A515 DD    91        A       STD     YSTR+1
05060 04815A A517 86    52        A       LDA     #$52
05070 04816A A519 97    90        A       STA     YSTR
05080 04817A A51B 20    86   A4A3         BRA     XMOVLA
05090 04818                        *
05100 04819A A51D 40               YMOVDA NEGA
05110 04820A A51E F6    1C25      A       LDB     CSTEPY
05120 04821A A521 3D                      MUL
05130 04822A A522 44                      LSRA
05140 04823A A523 56                      RORB
05150 04824A A524 44                      LSRA
05160 04825A A525 56                      RORB
05170 04826A A526 DD    91        A       STD     YSTR+1
```

```
05180 04827A A528 86   53       A        LDA    #$53
05190 04828A A52A 97   90       A        STA    YSTR
05200 04829A A52C 7E   A4A3     A        JMP    XMOVLA
05210 04830                       *
05220 04831                       *
05230 04832                       *  FMTLMT  HAVE GOT A SOFTWARE LIMIT REACH?
05240 04833                       *  FLOST   HAVE GOT LOST IN FIND
05250 04834                       *
05260 04835A A52F 96   C6       A FLOST  LDA    LOSTF
05270 04836A A531 4C                     INCA
05280 04837A A532 97   C6       A        STA    LOSTF
05290 04838A A534 81   02       A        CMPA   #2
05300 04839A A536 1026 FC65 A19F         LBNE   FIND
05310 04840A A53A 4F                     CLRA
05320 04841A A53B 97   C6       A        STA    LOSTF
05330 04842A A53D 8E   814C     A        LDX    #REPLY8
05340 04843A A540 39                     RTS
05350 04844                       *
05360 04845A A541 7E   A313     A FMTERR JMP    FIND8
05370 04846                       *
05380 04847A A544 8E   8127     A FMTLMT LDX    #REPLY7  "LIMIT REACHED ON X-Y :
05390 04848A A547 4F                     CLRA
05400 04849A A548 39                     RTS
05410 04850                       *
05420 04851A A549      D5       A REPLYW FCB    $D5
05430 04852A A54A      20       A        FCC    " THE DIE DOES NOT MATCH PATTERN
05440 04853A A569      0A       A        FCB    $A,4,$D5
00010 04854                              TTL    GET NEXT GOOD DIE

00030 04856                       ***********************************************
00040 04857                       *  COPYRIGHT BY ASM DIE BONDING INC.  1982
00050 04858                       *     SOFTWARE FOR THE D2KH DIE BONDER
00060 04859                       *            GETONE REV. 2.0A
00070 04860                       *
00080 04861                       *  DISK ID         : VIDEO 2
00090 04862                       *  DATE            :
00100 04863                       *  DWG NO          :
00110 04864                       *  ASSM NUMBER     :
00120 04865                       *  EPROM ID TAG    :
00130 04866                       *  ORGINATOR       :
00140 04867                       *  REVISED         :
00150 04868                       ***********************************************
00160 04869                       *    H O S T   C O M M A N D   $76
00170 04870                       *
00180 04871                       *   G E T   N E X T   G O O D   D I E
00190 04872                       ***********************************************
00200 04873                       *
00210 04874                       CJMPX  MACR
      04875                       0220         LDA    JMPX
      04876                       0230         LSRA
      04877                       0240         BCC    \.0
      04878                       0250         CJMP   JMPL
      04879                       0260         BRA    \.1
      04880                       0270 \.0     CJMP   JMPR
      04881                       0280 \.1     EQU    *
      04882                       0290         ENDM
00300 04883                       *
00310 04884A A56C B6   1C6E     A GETONE LDA    ALIGNF   ALIGN FLAG SET?
00320 04885A A56F 26   04   A575         BNE    GET1     YES,GOTO GET1
00330 04886A A571 8E   81BA     A        LDX    #REPLYF  SOFT NO ALIGN ERROR
00340 04887A A574 39                     RTS
00350 04888                       *
00360 04889A A575                 GET1   CFIND
00360      A A575 BD   A19F     A        JSR    FIND
00360      A A578 8C   8097     A        CMPX   #REPLY0
00360      A A57B 27   03   A580         BEQ    .00043
00360      A A57D 8C   8127     A        CMPX   #REPLY7
00360      A A580 27   01   A583 .00043  BEQ    *+3
00360      A A582 39                     RTS
00370 04890A A583 86   08       A        LDA    #8
00380 04891A A585 B4   E001     A        ANDA   LEDS+1   FIND LED ON?
00390 04892A A588 27   0E   A598         BEQ    GET2     NO,GO TO GET2
00400 04893A A58A 7D   1C70     A        TST    GETFLG   YES,IS 2ND PASS?
```

```
00410 04894A A58D 26   09   A598          BNE    GET2      YES,GOTO GET2
00420 04895A A58F 86   01      A          LDA    #1        NO,
00430 04896A A591 B7   1C70    A          STA    GETFLG    SET GET FLAG
00440 04897A A594 8E   8097    A          LDX    #REPLY0   RETURN
00450 04898A A597 39                      RTS
00460 04899                      *
00470 04900A A598 7F   1C70    A GET2     CLR    GETFLG    CLEAR GET FLAG
00480 04901A A59B 7D   6002    A GET3     TST    HOSTAC    NEW COMMAND?
00490 04902A A59E 2A   04   A5A4          BPL    GET4      NO,GO TO GET4
00500 04903A A5A0 8E   8097    A          LDX    #REPLY0   YES,RETURN
00510 04904A A5A3 39                      RTS
00520 04905                      *
00530 04906A A5A4                GET4     CJMPX  JUMP      X
00530        A A5A4 B6   1C00    A          LDA    JMPX
00530        A A5A7 44                      LSRA
00530        A A5A8 24   10   A5BA          BCC    .00044
00530        A A5AA                         CJMP   JMPL
00530        A A5AA BD   967E    A          JSR    JMPL
00530        A A5AD 8C   8097    A          CMPX   #REPLY0
00530        A A5B0 27   03   A5B5          BEQ    .00045
00530        A A5B2 8C   8127    A          CMPX   #REPLY7
00530        A A5B5 27   01   A5B8 .00045 BEQ    *+3
00530        A A5B7 39                      RTS
00530        A A5B8 20   0E   A5C8          BRA    .00046
00530        A A5BA                  .00044 CJMP   JMPR
00530        A A5BA BD   9659    A          JSR    JMPR
00530        A A5BD 8C   8097    A          CMPX   #REPLY0
00530        A A5C0 27   03   A5C5          BEQ    .00047
00530        A A5C2 8C   8127    A          CMPX   #REPLY7
00530        A A5C5 27   01   A5C8 .00047 BEQ    *+3
00530        A A5C7 39                      RTS
00530                 A5C8    A .00046 EQU    *
00540 04907A A5C8 4D                      TSTA             LIMIT REACHED?
00550 04908A A5C9 1027 00A1 A66E          LBEQ   GETCHK    NO,CHECK IT
00560 04909                      *
00570 04910A A5CD                         CJMP   JMPU      JUMP UP
00570        A A5CD BD   960F    A          JSR    JMPU
00570        A A5D0 8C   8097    A          CMPX   #REPLY0
00570        A A5D3 27   03   A5D8          BEQ    .00048
00570        A A5D5 8C   8127    A          CMPX   #REPLY7
00570        A A5D8 27   01   A5DB .00048 BEQ    *+3
00570        A A5DA 39                      RTS
00580 04911A A5DB 4D                      TSTA             LIMIT REACHED?
00590 04912A A5DC 27   43   A621          BEQ    GET6      NO,GO TO GET6
00600 04913                      *
00610 04914A A5DE 7D   1C1C    A          TST    PARTFL+1  WAFER?
00620 04915A A5E1 27   6C   A64F          BEQ    GETDNE    YES,GO TO GETDNE
00630 04916                      *
00640 04917A A5E3 BD   A732    A          JSR    CHGX      CHANGE X DIR
00650 04918A A5E6                GET5     CJMPX  JUMP      X
00650        A A5E6 B6   1C00    A          LDA    JMPX
00650        A A5E9 44                      LSRA
00650        A A5EA 24   10   A5FC          BCC    .00049
00650        A A5EC                         CJMP   JMPL
00650        A A5EC BD   967E    A          JSR    JMPL
00650        A A5EF 8C   8097    A          CMPX   #REPLY0
00650        A A5F2 27   03   A5F7          BEQ    .00050
00650        A A5F4 8C   8127    A          CMPX   #REPLY7
00650        A A5F7 27   01   A5FA .00050 BEQ    *+3
00650        A A5F9 39                      RTS
00650        A A5FA 20   0E   A60A          BRA    .00051
00650        A A5FC                  .00049 CJMP   JMPR
00650        A A5FC BD   9659    A          JSR    JMPR
00650        A A5FF 8C   8097    A          CMPX   #REPLY0
00650        A A602 27   03   A607          BEQ    .00052
00650        A A604 8C   8127    A          CMPX   #REPLY7
00650        A A607 27   01   A60A .00052 BEQ    *+3
00650        A A609 39                      RTS
00650                 A60A    A .00051 EQU    *
```

```
00660 04919A A60A 4D                      TSTA              LIMIT REACHED?
00670 04920A A60B 26   42    A64F         BNE    GETDNE     YES,GO TO GETDNE
00680 04921                        *
00690 04922A A60D                         CJMP   JMPU       NO,JUMP UP
00690       A A60D BD  960F     A         JSR    JMPU
00690       A A610 8C  8097     A         CMPX   #REPLY0
00690       A A613 27  03    A618         BEQ    .00053
00690       A A615 8C  8127     A         CMPX   #REPLY7
00690       A A618 27  01    A61B .00053  BEQ    *+3
00690       A A61A 39                     RTS
00700 04923A A61B 4D                      TSTA              LIMIT REACHED?
00710 04924A A61C 26   C8    A5E6         BNE    GET5       YES,GO TO GET5
00720 04925                        *
00730 04926A A61E BD   A732     A         JSR    CHGX       CHANGE X DIR
00740 04927                        *
00750 04928A A621 7D   1C1C     A GET6    TST    PARTFL+1
00760 04929A A624 27   3F    A665         BEQ    GET9
00770 04930                        *
00780 04931A A626                 GET7    CJMPX  JUMP       X
00780       A A626 B6  1C00     A         LDA    JMPX
00780       A A629 44                     LSRA
00780       A A62A 24  10    A63C         BCC    .00054
00780       A A62C                        CJMP   JMPL
00780       A A62C BD  967E     A         JSR    JMPL
00780       A A62F 8C  8097     A         CMPX   #REPLY0
00780       A A632 27  03    A637         BEQ    .00055
00780       A A634 8C  8127     A         CMPX   #REPLY7
00780       A A637 27  01    A63A .00055  BEQ    *+3
00780       A A639 39                     RTS
00780       A A63A 20  0E    A64A         BRA    .00056
00780       A A63C                .00054  CJMP   JMPR
00780       A A63C BD  9659     A         JSR    JMPR
00780       A A63F 8C  8097     A         CMPX   #REPLY0
00780       A A642 27  03    A647         BEQ    .00057
00780       A A644 8C  8127     A         CMPX   #REPLY7
00780       A A647 27  01    A64A .00057  BEQ    *+3
00780       A A649 39                     RTS
00780                  A64A     A .00056  EQU    *
00790 04932A A64A 4D                      TSTA              LIMIT REACHED?
00800 04933A A64B 27   D9    A626         BEQ    GET7       NO,GO TO GET7
00810 04934A A64D 20   16    A665         BRA    GET9       YES,GO TO GET9
00820 04935                        *
00830 04936A A64F FC   1C21     A GETDNE  LDD    WCOUNT
00840 04937A A652 C3   0001     A         ADDD   #1
00850 04938A A655 FD   1C21     A         STD    WCOUNT
00860 04939A A658 7D   1C1C     A         TST    PARTFL+1
00870 04940A A65B 27   04    A661         BEQ    GET8
00880 04941                        *
00890 04942A A65D 8E   8181     A         LDX    #REPLYD    WAFER COMPLETE
00900 04943A A660 39                      RTS
00910 04944                        *
00920 04945A A661 8E   8164     A GET8    LDX    #REPLYC    MATRIX COMPLETE
00930 04946A A664 39                      RTS
00940 04947                        *
00950 04948A A665 B6   1C1A     A GET9    LDA    MISDIE+1
00960 04949A A668 B7   1C12     A         STA    WKMIS
00970 04950A A66B BD   A732     A         JSR    CHGX
00980 04951                        *
00990 04952A A66E 86   08       A GETCHK  LDA    #8
01000 04953A A670 B4   E001     A         ANDA   LEDS+1
01010 04954A A673 27   07    A67C         BEQ    GET10

01020 04955A A675 7F   1C70     A         CLR    GETFLG
01030 04956A A678 8E   8097     A         LDX    #REPLY0
01040 04957A A67B 39                      RTS               GOT GOOD ONE!
01050 04958                        *
01060 04959A A67C 0D   C5       A GET10   TST    MISFLG
01070 04960A A67E 26   0C    A68C         BNE    GET14
01080 04961A A680 FC   1C1F     A         LDD    REJDIE
01090 04962A A683 C3   0001     A         ADDD   #1
```

```
01100 04963A A686 FD   1C1F    A        STD    REJDIE
01110 04964A A689 7E   A59B    A GET11  JMP    GET3
01120 04965                      *
01130 04966A A68C                GET14  CPOLL  XMTR
01130      A A68C 108E 6028    A        LDY    #XMTR
01130      A A690 BD   8E1B    A        JSR    POLL
01130      A A693 8C   8097    A        CMPX   #REPLY0
01130      A A696 27   01   A699        BEQ    *+3
01130      A A698 39                    RTS
01140 04967A A699 49                    ROLA
01150 04968A A69A 49                    ROLA
01160 04969A A69B B8   1C00    A        EORA   JMPX
01170 04970A A69E 44                    LSRA
01180 04971A A69F 24   E8   A689        BCC    GET11
01190 04972A A6A1 7A   1C12    A        DEC    WKMIS
01200 04973A A6A4 26   E3   A689        BNE    GET11
01210 04974                      *
01220 04975A A6A6 B6   1C1A    A        LDA    MISDIE+1
01230 04976A A6A9 B7   1C12    A        STA    WKMIS
01240 04977A A6AC                       CJMP   JMPU
01240      A A6AC BD   960F    A        JSR    JMPU
01240      A A6AF 8C   8097    A        CMPX   #REPLY0
01240      A A6B2 27   03   A6B7        BEQ    .00058
01240      A A6B4 8C   8127    A        CMPX   #REPLY7
01240      A A6B7 27   01   A6BA .00058 BEQ    *+3
01240      A A6B9 39                    RTS
01250 04978A A6BA 4D                    TSTA
01260 04979A A6BB 27   44   A701        BEQ    GET16
01270 04980A A6BD 7D   1C1C    A        TST    PARTFL+1
01280 04981A A6C0 27   8D   A64F        BEQ    GETDNE
01290 04982A A6C2 8D   6E   A732        BSR    CHGX
01300 04983A A6C4                GET15  CJMPX
01300      A A6C4 B6   1C00    A        LDA    JMPX
01300      A A6C7 44                    LSRA
01300      A A6C8 24   10   A6DA        BCC    .00059
01300      A A6CA                       CJMP   JMPL
01300      A A6CA BD   967E    A        JSR    JMPL
01300      A A6CD 8C   8097    A        CMPX   #REPLY0
01300      A A6D0 27   03   A6D5        BEQ    .00060
01300      A A6D2 8C   8127    A        CMPX   #REPLY7
01300      A A6D5 27   01   A6D8 .00060 BEQ    *+3
01300      A A6D7 39                    RTS
01300      A A6D8 20   0E   A6E8        BRA    .00061
01300      A A6DA                .00059 CJMP   JMPR
01300      A A6DA BD   9659    A        JSR    JMPR
01300      A A6DD 8C   8097    A        CMPX   #REPLY0
01300      A A6E0 27   03   A6E5        BEQ    .00062
01300      A A6E2 8C   8127    A        CMPX   #REPLY7
01300      A A6E5 27   01   A6E8 .00062 BEQ    *+3
01300      A A6E7 39                    RTS

01300                  A6E8    A .00061 EQU    *
01310 04984A A6E8 4D                    TSTA
01320 04985A A6E9 1026 FF62 A64F        LBNE   GETDNE
01330 04986A A6ED                       CJMP   JMPU
01330      A A6ED BD   960F    A        JSR    JMPU
01330      A A6F0 8C   8097    A        CMPX   #REPLY0
01330      A A6F3 27   03   A6F8        BEQ    .00063
01330      A A6F5 8C   8127    A        CMPX   #REPLY7
01330      A A6F8 27   01   A6FB .00063 BEQ    *+3
01330      A A6FA 39                    RTS
01340 04987A A6FB 4D                    TSTA
01350 04988A A6FC 26   C6   A6C4        BNE    GET15
01360 04989A A6FE 7E   A66E    A        JMP    GETCHK
01370 04990                      *
01380 04991A A701                GET16  CJMPX
01380      A A701 B6   1C00    A        LDA    JMPX
01380      A A704 44                    LSRA
01380      A A705 24   10   A717        BCC    .00064
01380      A A707                       CJMP   JMPL
```

```
01380          A A707 BD   967E     A           JSR     JMPL
01380          A A70A 8C   8097     A           CMPX    #REPLY0
01380          A A70D 27   03   A712            BEQ     .00065
01380          A A70F 8C   8127     A           CMPX    #REPLY7
01380          A A712 27   01   A715 .00065 BEQ     *+3
01380          A A714 39                        RTS
01380          A A715 20   0E   A725            BRA     .00066
01380          A A717                  .00064 CJMP    JMPR
01380          A A717 BD   9659     A           JSR     JMPR
01380          A A71A 8C   8097     A           CMPX    #REPLY0
01380          A A71D 27   03   A722            BEQ     .00067
01380          A A71F 8C   8127     A           CMPX    #REPLY7
01380          A A722 27   01   A725 .00067 BEQ     *+3
01380          A A724 39                        RTS
01380                 A725     A .00066 EQU     *
01390 04992A A725 4D                            TSTA
01400 04993A A726 1026 FF3B A665                LBNE    GET9
01410 04994A A72A 0D   C5       A               TST     MISFLG
01420 04995A A72C 1026 FF35 A665                LBNE    GET9
01430 04996A A730 20   CF   A701                BRA     GET16
01440 04997                            *
01450 04998A A732 B6   1C00     A CHGX          LDA     JMPX
01460 04999A A735 44                            LSRA
01470 05000A A736 24   05   A73D                BCC     GET17
01480 05001A A738 7A   1C00     A               DEC     JMPX
01490 05002A A73B 20   03   A740                BRA     GET18
01500 05003A A73D 7C   1C00     A GET17         INC     JMPX
01510 05004A A740 39                   GET18    RTS
00010 05005                                     TTL     CRUNCH

00030 05007                            ***********************************************
00040 05008                            *  COPYRIGHT BY ASM DIE BONDING INC.   1982
00050 05009                            *      SOFTWARE FOR THE D2KH DIE BONDER
00060 05010                            *              CRUNCH REV.  2.0A
00070 05011                            *
00080 05012                            *  DISK ID          : VIDEO 2
00090 05013                            *  DATE             : SEPT.  28,1981
00100 05014                            *  DWG NO           :
00110 05015                            *  ASSM NUMBER      :
00120 05016                            *  EPROM ID TAG     :
00130 05017                            *  ORGINATOR        : LARRY ALLRED
00140 05018                            *  REVISED          :
00150 05019                            ***********************************************
00160 05020                            *
00170 05021                            *CRUNCH SUBROUTINE WILL #1 CLEAR COUNTERS
00180 05022                            *                       #2 LOAD COUNTERS,SNAPS
00190 05023                            *                       #3 CLEAR THE SUM TABLE
00200 05024                            *                       #4 SUM THE 1'S IN SNAP
00210 05025                            *                       #5 FIND (IF ANY) STREE
00220 05026                            *
00230 05027                            *  FIRST CLEAR COUNTERS,AND LOAD COUNTERS,SNAP
00240 05028A A741 86   36       A CRUNCH LDA    #$36
00250 05029A A743 B7   7602     A        STA    CNTRAC    ARM THE ONESHOT
00260 05030A A746 BD   855B     A        JSR    DLY30     DELAY FOR TABLE TO SETT
00270 05031A A749 B6   7600     A        LDA    CNTRAD    DO A DUMMY READ TO CLEA
00280 05032A A74C 86   3E       A        LDA    #$3E
00290 05033A A74E B7   7602     A        STA    CNTRAC    ENABLE ONESHOT
00300 05034                            *
00310 05035                            * NOW CLEAR SUM TABLES WHILE COUNTERS,SNAP ARE
00320 05036                            *
00330 05037A A751 8E   0000     A CLRSUM LDX    #TOPSUM   CLEAR SUMS FIRST
00340 05038A A754 4F                     CLRA
00350 05039A A755 A7   80       A LOOPA  STA    ,X+
00360 05040A A757 8C   0040     A        CMPX   #BOTSUM+$10
00370 05041A A75A 26   F9   A755         BNE    LOOPA
00380 05042A A75C 86   02       A        LDA    #2
00390 05043                            *
00400 05044                            * CHECK IF COUNTERS,SNAP HAVE BEEN LOADED
00410 05045                            *
00420 05046A A75E 8E   FFFF     A NOLOAD LDX    #$FFFF
00430 05047A A761 7D   7602     A NOLOA1 TST    CNTRAC
```

```
05048A A764 2B   09    A76F        BMI    SUMUP
05049A A766 30   1F       A        LEAX   -1,X
05050A A768 26   F7    A761        BNE    NOLOA1
05051A A76A 4A                     DECA
05052A A76B 26   F1    A75E        BNE    NOLOAD
05053A A76D 20   D2    A741        BRA    CRUNCH
05054                          *
05055                          *  THIS WILL SUM THE 1'S IN SNAPSHOT
05056                          *  AND PUT IN TOP,BOTTOM,LEFT,RIGHT SUM TABLES
05057                          *
05058A A76F 8E   7520     A SUMUP  LDX    #SNAP+$20
05059A A772 108E A90F     A        LDY    #TABSUM
05060A A776 CE   0000     A        LDU    #TOPSUM
05061                          *
05062A A779 E6   82       A LOOP1  LDB    ,-X
05063A A77B A6   A5       A        LDA    B,Y
05064A A77D E6   82       A        LDB    ,-X

05065A A77F AB   A5       A        ADDA   B,Y
05066A A781 A7   C0       A        STA    ,U+
05067A A783 1183 0010     A        CMPU   #TOPSUM+$10
05068A A787 26   F0    A779        BNE    LOOP1
05069                          *
05070A A789 8E   7560     A        LDX    #SNAP+$60
05071A A78C CE   0030     A        LDU    #BOTSUM
05072                          *
05073A A78F E6   80       A LOOP2  LDB    ,X+
05074A A791 A6   A5       A        LDA    B,Y
05075A A793 E6   80       A        LDB    ,X+
05076A A795 AB   A5       A        ADDA   B,Y
05077A A797 A7   C0       A        STA    ,U+
05078A A799 1183 0040     A        CMPU   #BOTSUM+$10
05079A A79D 26   F0    A78F        BNE    LOOP2
05080                          *
05081A A79F 8E   7520     A        LDX    #SNAP+$20
05082A A7A2 108E 001F     A LOOP3  LDY    #LHTSUM+$F
05083A A7A6 CE   0020     A        LDU    #RHTSUM
05084A A7A9 C6   08       A        LDB    #8
05085                          *
05086A A7AB A6   80       A        LDA    ,X+
05087A A7AD 44              LOOP4  LSRA
05088A A7AE 24   02    A7B2        BCC    LOOP5
05089A A7B0 6C   A4       A        INC    ,Y
05090A A7B2 31   3F       A LOOP5  LEAY   -1,Y
05091A A7B4 5A                     DECB
05092A A7B5 26   F6    A7AD        BNE    LOOP4
05093                          *
05094A A7B7 C6   08       A        LDB    #8
05095A A7B9 A6   80       A        LDA    ,X+
05096A A7BB 44              LOOP6  LSRA
05097A A7BC 24   02    A7C0        BCC    LOOP7
05098A A7BE 6C   A4       A        INC    ,Y
05099A A7C0 31   3F       A LOOP7  LEAY   -1,Y
05100A A7C2 5A                     DECB
05101A A7C3 26   F6    A7BB        BNE    LOOP6
05102                          *
05103A A7C5 C6   08       A        LDB    #8
05104A A7C7 A6   80       A        LDA    ,X+
05105A A7C9 44              LOOP8  LSRA
05106A A7CA 24   02    A7CE        BCC    LOOP9
05107A A7CC 6C   C4       A        INC    ,U
05108A A7CE 33   41       A LOOP9  LEAU   1,U
05109A A7D0 5A                     DECB
05110A A7D1 26   F6    A7C9        BNE    LOOP8
05111                          *
05112A A7D3 C6   08       A        LDB    #8
05113A A7D5 A6   80       A        LDA    ,X+
05114A A7D7 44              LOOP10 LSRA
05115A A7D8 24   02    A7DC        BCC    LOOP11
05116A A7DA 6C   C4       A        INC    ,U
05117A A7DC 33   41       A LOOP11 LEAU   1,U
05118A A7DE 5A                     DECB
05119A A7DF 26   F6    A7D7        BNE    LOOP10
05120                          *
```

```
05121A A7E1 8C   7560     A         CMPX   #SNAP+$60
05122A A7E4 26   BC   A7A2          BNE    LOOP3
05123                        *
05124A A7E6 8E   0000     A         LDX    #TOPSUM
05125A A7E9 108E 0040     A         LDY    #TOPAVE
05126A A7ED 4F               TOPCRH CLRA
05127A A7EE AB   84       A         ADDA   0,X
05128A A7F0 A9   01       A         ADCA   1,X
05129A A7F2 A7   A0       A         STA    ,Y+
05130A A7F4 30   01       A         LEAX   1,X
05131A A7F6 108C 004F     A         CMPY   #TOPAVE+$F
05132A A7FA 26   F1   A7ED          BNE    TOPCRH
05133A A7FC 8E   0030     A         LDX    #BOTSUM
05134A A7FF 108E 0070     A         LDY    #BOTAVE
05135A A803 4F               BOTCRH CLRA
05136A A804 AB   84       A         ADDA   0,X
05137A A806 A9   01       A         ADCA   1,X
05138A A808 A7   A0       A         STA    ,Y+
05139A A80A 30   01       A         LEAX   1,X
05140A A80C 108C 007F     A         CMPY   #BOTAVE+$F
05141A A810 26   F1   A803          BNE    BOTCRH
05142A A812 8E   0010     A         LDX    #LHTSUM
05143A A815 108E 0050     A         LDY    #LHTAVE
05144A A819 4F               LHTCRH CLRA
05145A A81A AB   84       A         ADDA   ,X
05146A A81C A9   01       A         ADCA   1,X
05147A A81E A7   A0       A         STA    ,Y+
05148A A820 30   01       A         LEAX   1,X
05149A A822 108C 005F     A         CMPY   #LHTAVE+$F
05150A A826 26   F1   A819          BNE    LHTCRH
05151A A828 8E   0020     A         LDX    #RHTSUM
05152A A82B 108E 0060     A         LDY    #RHTAVE
05153A A82F 4F               RHTCRH CLRA
05154A A830 AB   84       A         ADDA   ,X
05155A A832 A9   01       A         ADCA   1,X
05156A A834 A7   A0       A         STA    ,Y+
05157A A836 30   01       A         LEAX   1,X
05158A A838 108C 006F     A         CMPY   #RHTAVE+$F
05159A A83C 26   F1   A82F          BNE    RHTCRH
05160                        *
05161                        * NOW FIND THE STREET AND PUT IN STREET COUNT
05162                        *     NO STREET FOUND, STREET COUNT = $FF
05163                        *
05164A A83E 8E   0040     A         LDX    #TOPAVE    POINT TO FIRST TOP AVE.
05165A A841 86   0A       A         LDA    #$A        10 IS THE MIN COUNT ALI
05166A A843 5F                      CLRB              B POINTER WILL BE WHERI
05167A A844 A1   85       A  RETRY1 CMPA   B,X        IS IT THIS ONE?
05168A A846 22   07   A84F          BHI    GOT1       YES, GO CHECK NEXT ONE
05169A A848 5C                      INCB              NO, TRY NEXT ONE
05170A A849 C1   0F       A         CMPB   #$F        DONE TRYING?
05171A A84B 26   F7   A844          BNE    RETRY1     NO, GOTO RETRY1
05172A A84D C6   FE       A         LDB    #$FE       YES, MAKE TOP COUNT NEG.
05173A A84F 5C               GOT1   INCB
05174A A850 D7   80       A         STB    TOPSTC     AND STORE IT
05175                        *
05176A A852 8E   0070     A         LDX    #BOTAVE    POINT TO FIRST BOTTOM
05177A A855 86   0A       A         LDA    #$A
05178A A857 5F                      CLRB
05179A A858 A1   85       A  RETRY2 CMPA   B,X        IS IT THIS ONE?
05180A A85A 22   07   A863          BHI    GOT2       YES, GO STORE IT
05181A A85C 5C                      INCB              NO, TRY NEXT ONE
05182A A85D C1   0F       A         CMPB   #$F        DONE TRYING?
05183A A85F 26   F7   A858          BNE    RETRY2     NO, GOTO RETRY2
05184A A861 C6   FE       A         LDB    #$FE
05185A A863 5C               GOT2   INCB
05186A A864 D7   83       A         STB    BOTSTC
05187                        *
05188A A866 8E   0050     A         LDX    #LHTAVE
05189A A869 86   0A       A         LDA    #$A
05190A A86B 5F                      CLRB
05191A A86C A1   85       A  RETRY3 CMPA   B,X
05192A A86E 22   07   A877          BHI    GOT3
05193A A870 5C                      INCB
```

```
01900 05194A A871 C1     0F        A         CMPB     ##F
01910 05195A A873 26     F7     A86C         BNE      RETRY3
01920 05196A A875 C6     FE        A         LDB      ##FE
01930 05197A A877 5C                 GOT3    INCB
01940 05198A A878 D7     81        A         STB      LHTSTC
01950 05199                          *
01960 05200A A87A 8E     0060      A         LDX      #RHTAVE
01970 05201A A87D 86     0A        A         LDA      ##A
01980 05202A A87F 5F                         CLRB
01990 05203A A880 A1     85        A RETRY4  CMPA     B,X
02000 05204A A882 22     07     A88B         BHI      GOT4
02010 05205A A884 5C                         INCB
02020 05206A A885 C1     0F        A         CMPB     ##F
02030 05207A A887 26     F7     A880         BNE      RETRY4
02040 05208A A889 C6     FE        A         LDB      ##FE
02050 05209A A88B 5C                 GOT4    INCB
02060 05210A A88C D7     82        A         STB      RHTSTC
02070 05211A A88E 39                         RTS
02080 05212                          *
02090 05213                          *
02100 05214                          *
02110 05215A A88F        01        A         FCB      1,2,2,3,2,3,3,4,2,3,3,4,3,4,4,5
02120 05216A A89F        02        A         FCB      2,3,3,4,3,4,4,5,3,4,4,5,4,5,5,6
02130 05217A A8AF        02        A         FCB      2,3,3,4,3,4,4,5,3,4,4,5,4,5,5,6
02140 05218A A8BF        03        A         FCB      3,4,4,5,4,5,5,6,4,5,5,6,5,6,6,7
02150 05219A A8CF        02        A         FCB      2,3,3,4,3,4,4,5,3,4,4,5,4,5,5,6
02160 05220A A8DF        03        A         FCB      3,4,4,5,4,5,5,6,4,5,5,6,5,6,6,7
02170 05221A A8EF        03        A         FCB      3,4,4,5,4,5,5,6,4,5,5,6,5,6,6,7
02180 05222A A8FF        04        A         FCB      4,5,5,6,5,6,6,7,5,6,6,7,6,7,7,8
02190 05223A A90F        00        A TABSUM  FCB      0,1,1,2,1,2,2,3,1,2,2,3,2,3,3,4
02200 05224A A91F        01        A         FCB      1,2,2,3,2,3,3,4,2,3,3,4,3,4,4,5
02210 05225A A92F        01        A         FCB      1,2,2,3,2,3,3,4,2,3,3,4,3,4,4,5
02220 05226A A93F        02        A         FCB      2,3,3,4,3,4,4,5,3,4,4,5,4,5,5,6
02230 05227A A94F        01        A         FCB      1,2,2,3,2,3,3,4,2,3,3,4,3,4,4,5
02240 05228A A95F        02        A         FCB      2,3,3,4,3,4,4,5,3,4,4,5,4,5,5,6
02250 05229A A96F        02        A         FCB      2,3,3,4,3,4,4,5,3,4,4,5,4,5,5,6
02260 05230A A97F        03        A         FCB      3,4,4,5,4,5,5,6,4,5,5,6,5,6,6,7
02270 05231                          *
02280 05232                                  TTL      SYMBOL TABLE
02300 05234                                  END
TOTAL ERRORS 00000--00000
TOTAL WARNINGS 00000--00000


 8A7C .00000 01071 01071*
 8A8B .00001 01071 01071*
 8B9C .00002 01212 01212*
 8BAB .00003 01212 01212*
 8CCA .00004 01358 01358*
 8CD9 .00005 01358 01358*
 9633 .00006 02831 02831 02831*
 9658 .00007 02840 02840 02840*
 967D .00008 02849 02849 02849*
 96A2 .00009 02858 02858 02858*
 96D1 .00010 02871 02871 02871*
 9701 .00011 02885 02885 02885*
 9730 .00012 02898 02898 02898*
 9760 .00013 02912 02912 02912*
 9813 .00014 03049 03049*
 981B .00015 03049 03049*
 982F .00016 03049 03049*
 9837 .00017 03049 03049*
 984B .00018 03050 03050*
 9853 .00019 03050 03050*
 9867 .00020 03050 03050*
 986F .00021 03050 03050*
 9B02 .00022 03441 03441*
 9B22 .00023 03447 03447*
 9B2D .00024 03448 03448*
 9B3E .00025 03451 03451*
 9B5D .00026 03455 03455*
 9B68 .00027 03456 03456*
 9B79 .00028 03459 03459*
```

```
9B8C .00029 03464 03464*
9B97 .00030 03465 03465*
9BA8 .00031 03468 03468*
9BC7 .00032 03472 03472*
9BD2 .00033 03473 03473*
9BE3 .00034 03476 03476*
9C06 .00035 03485 03485*
9C11 .00036 03486 03486*
9C28 .00037 03492 03492*
9C33 .00038 03493 03493*
9C5C .00039 03568 03568*
9CB5 .00040 03615 03615*
9D8F .00041 03727 03727*
A056 .00042 04085 04085*
A580 .00043 04889 04889*
A5BA .00044 04906 04906*
A5B5 .00045 04906 04906*
A5C8 .00046 04906 04906*
A5C5 .00047 04906 04906*
A5D8 .00048 04910 04910*
A5FC .00049 04918 04918*
A5F7 .00050 04918 04918*
A60A .00051 04918 04918*
A607 .00052 04918 04918*
A618 .00053 04922 04922*
A63C .00054 04931 04931*
A637 .00055 04931 04931*
A64A .00056 04931 04931*
A647 .00057 04931 04931*
A6B7 .00058 04977 04977*
A6DA .00059 04983 04983*
A6D5 .00060 04983 04983*
A6E8 .00061 04983 04983*
A6E5 .00062 04983 04983*
A6F8 .00063 04986 04986*
A717 .00064 04991 04991*
A712 .00065 04991 04991*
A725 .00066 04991 04991*
A722 .00067 04991 04991*
7700 ACNT   00035*00746 00781 04182 04482
7702 ACNTC  00036*00741 00762
1C06 ACOUNT 00098*03267 04183
A4D2 ADJBL  04657 04773*
A501 ADJBR  04654 04656 04802*
A41E ADJTL  04650 04659*
A478 ADJTR  04647 04649 04716*
9F76 ADXSZE 03994*03997
9F87 ADYSZE 04002*04005
919E AL0STO 02231 02235 02243 02248 02254*02257
9157 ALEND  02126 02129 02132 02222*
9C3F ALIGN  00542 03556*
9058 ALIGN0 00537 02102*
9C51 ALIGN1 03568*03610
9C70 ALIGN2 03575 03578 03581*
9C7F ALIGN3 03583 03586 03589*
9C8E ALIGN4 03591 03594 03597*
9C9D ALIGN5 03599 03602 03605*
9CAA ALIGN6 03615*03640
9D7E ALIGN7 03653 03657 03688 03692 03718*
9D80 ALIGN8 03647 03663 03668 03673 03677 03682 03698 03703 03708 03712
            03719*
9D84 ALIGN9 03716 03727*
9D95 ALIGNA 03731*03734
9DAD ALIGNB 03744*03747
9DC9 ALIGNC 03759*03762
9DE1 ALIGND 03772*03775
9E2A ALIGNE 03807 03815*
1C6E ALIGNF 00122*02647 03427 03562 04173 04339 04884
8ECE ALLOFF 00559 01798*02585 02770 03118
9C48 AOK    03557 03560*
7800 BCNT   00037*00747 00782 04184 04486
7802 BCNTC  00038*00742 00763
1C08 BCOUNT 00099*03269 04185
9AE2 BEG1   03428 03432*
```

```
9AEB BEG2   03433 03437*
9B17 BEG3   03447*03454
9B41 BEG31  03450 03452*
9B52 BEG32  03455*03462
9B81 BEG4   03445 03464*03471
9BAB BEG41  03467 03469*
9BBC BEG42  03472*03479
9AD9 BEGIN  00538 03427*
1C6F BEGINF 00123*
86B7 BOOT   00166 00660*
86C8 BOOT1  00662 00668*
86CD BOOT2  00670*00672
86DB BOOT3  00677*00681
8719 BOOT6  00666 00703*
871B BOOT7  00704*00708
871E BOOT8  00705*00706
8725 BOOTC  00710*
0070 BOTAVE 00050*05134 05140 05176
A803 BOTCRH 05135*05141
A40D BOTFIX 04642 04644 04652*
0083 BOTSTC 00054*03574 03619 03666 03873 03890 04064 04270 04383 04398
            04418 04499 04536 04562 04608 04628 04773 04802 05186
0030 BOTSUM 00046*05040 05071 05078 05133
9442 CALJMP 02381 02587*
958B CALSTP 02666 02767*
7900 CCNT   00039*00748 00783 04186 04363 04490
7902 CCNTC  00040*00743 00764
1C0A CCOUNT 00100*03271 04187 04356
8D5E CCWX   01443 01451*
8D84 CCWY   01458 01466*
9032 CENTAB 02057 02073*
9002 CENTER 02024 02050*
A732 CHGX   03489 03496 04917 04926 04950 04982 04998*
A31B CKNDIE 04368 04372 04376 04380 04532*
8EB8 CLEAR  00544 00710 00816 00834 00853 01765*02606 03194
8EBD CLEAR1 01767*01769
9465 CLR1   02594 02606*
A751 CLRSUM 05037*
1CFD CMOSFL 00131*00660 00697
9F14 CNTER  03938*
9F1D CNTER1 03940 03943*
9F35 CNTER2 03956 03959*
9014 CNTR   02059*
7602 CNTRAC 00034*00744 00772 05029 05033 05047
7600 CNTRAD 00033*00357 00360 00402 00405 00407 00410 00413 00416 00419
            00421 00424 00427 00753 00777 00784 01655 01711 01739 02237
            02251 03035 03037 04192 04244 04246 04520 04522 05031
008C COL    00063*01771 01833 01837 01867 01869 01872 01889 01895
8567 COMTAB 00399 00440*
9A9F COUNT  00555 03350*
8F58 CRLF   01864 01895*
8F65 CRLF1  01900 01902*
9BFB CROSS1 03485*03488
9C1D CROSS2 03483 03492*03495
9BEB CROSSX 03458 03461 03475 03478 03481*
7000 CRT    00028*01765 01768 01843 01846 01890 01905 01908
8F47 CRTADD 01859 01885*01916
A741 CRUNCH 03569 03617 03838 03855 03872 03889 04060 04181 04355 04481
            04626 05028*05053
1C24 CSTEPX 00114*03826 03905 03907 03945 04010 04149 04151 04444 04463
            04693 04705 04750 04762
1C25 CSTEPY 00115*03827 03908 03910 03962 04031 04152 04154 04404 04423
            04665 04677 04722 04734 04779 04791 04808 04820
8D52 CWX    01445*
8D78 CWY    01460*
1CFC DEFEFL 00130*00663 00694 01681 01684
990B DELAY  03047 03120*
990D DELAY1 03121*03125
9911 DELAY2 03122*03123
8528 DIEAD1 00407*00408 00411
851C DIEADJ 00358 00402*
6010 DIEEJT 00022*00765 00867 02015 02102 02358 02642 03432 03556 04330
A10B DIEPA1 04227*04230
```

```
A11C DIEPA2 04234*04237
A101 DIEPAT 02224 02368 03440 04224*04353 04474
97DE DISPLF 03034*03045
8F15 DISPLY 00712 00818 00856 01856*03196
855B DLY30  00406 00409 00420 00423 00430*02260 02278 05030
855E DLYLP  00431*00432
A0B4 DOIT   04176 04181*
A124 DPLY8  02369 02655 02662 02914 03561 04243*04354
912D DWN0   02138 02203*
913F DWN01  02201 02211*02216
914A DWN02  02212 02215*
9421 DWNLFT 02395 02573*
9430 DWNRHT 02397 02579*
8F0E ELINE  01849*01851
98DD END    03053 03055 03057 03091 03094*
98F1 END1   03104*03107
9901 END2   03111*03114
9591 ENDJMP 02668 02670 02672 02770*
943F ENDSTP 02375 02377 02379 02585*
976D ERRJMP 02920*
8093 ERROR  00173*00443 00444 00447 00448 00449 00450 00451 00452 00453
            00454 00456 00457 00458 00459 00460 00461 00462 00463 00464
            00465 00466 00467 00468 00469 00470 00471 00472 00473 00474
            00475 00476 00477 00478 00479 00480 00481 00482 00483 00484
            00485 00486 00487 00488 00489 00490 00491 00492 00493 00494
            00495 00496 00497 00498 00499 00500 00501 00502 00503 00504
            00505 00506 00507 00508 00509 00510 00511 00512 00513 00514
            00515 00516 00517 00518 00519 00520 00521 00522 00523 00524
            00525 00526 00527 00528 00529 00530 00531 00532 00533 00534
            00535 00545 00546 00547 00548 00549 00550 00551 00554 00557
            00563 00564 00565 00566
8E82 ERRSEN 01624 01628*
8E8C ERSEN1 01629 01633*
0085 EXBOT  00056*04346 04564 04598 04774 04803
A356 EXBOTK 04550 04562*
A3A0 EXDNE  04586 04595*
0086 EXLHT  00057*04348 04574 04600 04688
A36C EXLHTK 04563 04572*
0087 EXRHT  00058*04347 04587 04602 04745
A38A EXRHTK 04573 04585*
0084 EXTOP  00055*04345 04551 04596 04660 04717
8868 FAILX  00903*
886B FAILX1 00904*00908
887A FAILXY 00905 00913*
887E FAILY  00916*
A19F FIND   00541 02831 02840 02849 02858 02871 02885 02898 02912 03441
            04174 04330*04839 04889
A1BB FIND1  04340 04344*
A3D4 FIND2  04597 04599 04601 04603 04626*
A313 FIND8  04526*04845
A336 FINDER 04385 04387 04391 04393 04548*
A1A8 FINDOK 04331 04335*
00A9 FLAG   00072*03572 03609 03616 03639 04261 04274
A52F FLOST  04632 04638 04835*
A541 FMTERR 04477 04845*
A544 FMTLMT 04479 04847*
9761 FNDOFF 02824 02833 02842 02851 02860 02873 02887 02900 02914*
A575 GET1   03490 03497 04885 04889*
A67C GET10  04954 04959*
A689 GET11  04964*04971 04973
A68C GET14  04960 04966*
A6C4 GET15  04983*04988
A701 GET16  04979 04991*04996
A73D GET17  05000 05003*
A740 GET18  05002 05004*
A598 GET2   00567 04892 04894 04900*
A59B GET3   04901*04964
A5A4 GET4   04902 04906*
A5E6 GET5   04918*04924
A621 GET6   04912 04928*
A626 GET7   04931*04933
A661 GET8   04940 04945*
A665 GET9   04929 04934 04948*04993 04995
A66E GETCHK 04908 04952*04989
```

```
A64F GETDNE 04915 04920 04936*04981 04985
1C70 GETFLG 00124*03437 04893 04896 04900 04955
A56C GETONE 00558 04884*
A84F GOT1   05168 05173*
A863 GOT2   05180 05185*
A877 GOT3   05192 05197*
A88B GOT4   05204 05209*
8D42 GTCEN  00923 01441*02025 02112
8D68 GTCEN1 01449 01456*
8D8E GTCEN2 01464 01473*
8DA0 GTCEN4 01482*
8DA2 GTCEN5 01483*01487
8DA5 GTCEN6 01484*01495
8DB0 GTCEN7 01485 01491*
8DBC GTCEN8 01497*01501
8DBF GTCEN9 01494 01498*01506
8DCA GTCENA 01499 01505*
8DD1 GTCENB 01509*01513
8DD4 GTCENC 01492 01510*01518
8DDF GTCEND 01511 01517*
8DE4 GTCENE 01507 01520*
8DF6 GTCENF 01525 01529*
8DFA GTCENG 01522 01532*
8E05 GTCENH 01534 01538*
8818 HACK   00848 00853*
6002 HOSTAC 00020*00363 00582 00825 01924 02154 02173 02192 02211 03447
            03455 03464 03472 03485 03492 03568 03615 03727 04085 04901
6000 HOSTAD 00018*00344 00365 00585 00822 00838 01926 03447 03455 03464
            03472 03485 03492 03568 03615 03727 04085
6003 HOSTBC 00021*00334 00346 00387 00587 00596 00603 00611 00849 03157
6001 HOSTBD 00019*00337 00339 00349 00351 00390 00392 00590 00592 00599
            00601 00606 00609 00614 00616 00823 00842 00844 03159 03161
A3CE INCWIE 04617 04622*
9A12 INHEX  03169 03175 03245*
9A26 INHEX1 03249 03255*
9A27 INHEXE 03247 03251 03253 03257*
948D INJMP2 02658*
948A INJUMP 02657*02689 02710 02718 02723 02731 02736 02747 02755 02760
            02765
84D8 INPUT  00167 00357*00364 00368 00414 00428
8502 INPUT1 00387*00388
850F INPUT2 00374 00377 00380 00383 00394*
927E INSTEP 02371*02398 02409 02412 02415 02418 02539 02545 02551 02557
            02563 02569 02575 02581
9281 INSTP2 02372*
98D6 INVA   03083 03090*
95F1 JDNLFT 02686 02811*
9600 JDNRHT 02688 02817*
9634 JMPD   02784 02833*
96D2 JMPDL  02814 02873*03456 03465 03476
96A3 JMPDR  02820 02860*03448 03459 03473
95A6 JMPDWN 02676 02781*
9594 JMPERR 02694 02772*
967E JMPL   02796 02851*03486 04906 04918 04931 04983 04991
95C4 JMPLFT 02680 02793*
9659 JMPR   02790 02842*03493 04906 04918 04931 04983 04991
95B5 JMPRHT 02678 02787*
960F JMPU   02778 02824*04910 04922 04977 04986
9702 JMPUL  02808 02887*03468
9598 JMPUP  02674 02775*
9731 JMPUR  02802 02900*03451
1C00 JMPX   00096*02845 02846 02854 02855 02863 02866 02876 02880 02890
            02893 02906 02907 02923 02938 02942 02944 02946 02948 04026
            04060 04081 04085 04099 04159 04906 04918 04931 04969 04983
            04991 04998 05001 05003
1C03 JMPY   00097*02827 02828 02836 02837 02865 02868 02879 02882 02892
            02895 02903 02909 02956 02971 02975 02977 02979 02981 04047
            04083 04084 04085 04161
946D JUMP   00539 02589 02642*02777 02783 02789 02795 02801 02807 02813
            02819
94E4 JUMP1  02691*02779 02785 02791 02797 02803 02809 02815 02821
94F0 JUMP2  02692 02695*
```

```
94FA JUMP3   02699*02700
94FE JUMP4   02697 02701*
947F JUMPO1  02648 02652*
9476 JUMPOK  02643 02647*
95E2 JUPLFT  02684 02805*
95D3 JUPRHT  02682 02799*
EDC5 KYCODE  00026*00435
1C23 LDPTFL  00113*01541 02023 02046 02064 03179
E000 LEDS    00025*00789 00790 00792 00794 00795 01799 01800 01801 01954
             01955 01985 01986 02107 02222 02364 02366 02367 02400 02424
             02425 02429 02430 02437 02438 02442 02443 02453 02460 02464
             02468 02537 02543 02549 02555 02561 02567 02573 02579 02588
             02653 02654 02696 02702 02703 02716 02717 02721 02722 02729
             02730 02734 02735 02745 02746 02753 02754 02758 02759 02763
             02764 02767 02772 02775 02781 02787 02793 02799 02805 02811
             02817 02916 02917 03041 03042 03049 03049 03049 03049 03049
             03049 03049 03049 03050 03050 03050 03050 03050 03050 03050
             03050 03061 03069 03077 03085 03095 03096 04195 04336 04337
             04517 04518 04891 04953
00AA LFLAG   00073*01829 01857 01920
90AB LFT0    02146*
90BE LFT01   02154*02159 02182
90C8 LFT02   02155 02158*
0050 LHTAVE  00048*05143 05149 05188
A819 LHTCRH  05144*05150
0081 LHTSTC  00052*03598 03631 03680 03843 03877 04073 04374 04389 04435
             04504 04539 04572 04610 04633 04645 04652 04687 05198
0010 LHTSUM  00044*05082 05142
008B LINE    00062*01773 01831 01836 01839 01842 01873 01875 01886 01896
             01898 01915
A19B LMT     04283 04290 04296 04303 04308*
A16F LMT1    04285*04288
A188 LMT2    04298*04301
A165 LMTCHK  03605 03635 04279*
9449 LOADPG  02373 02591*02659
A779 LOOP1   05062*05068
A7D7 LOOP10  05114*05119
A7DC LOOP11  05115 05117*
A78F LOOP2   05073*05079
A7A2 LOOP3   05082*05122
A7AD LOOP4   05087*05092
A7B2 LOOP5   05088 05090*
A7BB LOOP6   05096*05101
A7C0 LOOP7   05097 05099*
A7C9 LOOP8   05105*05110
A7CE LOOP9   05106 05108*
A755 LOOPA   05039*05041
A016 LOOPJ1  04063 04066 04068 04070*
A028 LOOPJ2  04072 04075 04077 04079*
A001 LOOPJP  04060*04093 04095
00C6 LOSTF   00088*04525 04835 04837 04841
945D LPAG    02592 02602*
8EDE LPAGE   00556 01829*02603
8EEA LPAGE1  01834*01838
8EF4 LPAGE2  01835 01839*01852
8F00 LPAGE3  01844*01847
8F19 LPAGE4  01841 01858*01865 01871 01877 01879
8F29 LPAGE5  01863 01866*
8F43 LPAGE6  01861 01880*
8FCC LWAF    02018*
8FCD LWAF1   02016 02023*
8FE8 LWAF2   02032 02035*
8FC4 LWAFER  00536 02015*
893B MACK    00854 00972*
9E37 MAG     03813 03826*
9E71 MAGDL   03832 03854*
9E74 MAGDL1  03855*03866 03868
9E7F MAGDL2  03858 03860*
9E87 MAGDL3  03862 03864*
9E4D MAGDR   03831 03837*
9E50 MAGDR1  03838*03849 03851
9E5B MAGDR2  03841 03843*
9E63 MAGDR3  03845 03847*
```

```
9EF8 MAGER1 03919*03972 03974
9EF6 MAGERR 03913 03915 03918*
9EDA MAGMOV 03847 03864 03881 03898 03905*
9EB7 MAGUL  03835 03888*
9EBA MAGUL1 03889*03900 03902
9EC5 MAGUL2 03892 03894*
9ECD MAGUL3 03896 03898*
9E47 MAGUP  03829 03833*
9E94 MAGUR  03834 03871*
9E97 MAGUR1 03872*03883 03885
9EA2 MAGUR2 03875 03877*
9EAA MAGUR3 03879 03881*
8563 MAIN   00371 00435*
1C6A MAXMAT 00121*00687 01059 01200 01344 03206 03214 03222 03230 03238
1C66 MAXR   00120*00683 00685 01071 01212 01358 03208 03210 03216 03218
            03224 03226 03232 03234 03240 03242
88C5 MDIE   00869 00960*
881E MERROR 00836 00856*
997B MESPAR 03195 03200*
8977 MESS3  00910 00978*
8999 MESS4  00913 00982*
89D9 MESS5  00916 00988*
89FB MESS6  00817 00992*
A0E8 MINPA1 04208*04211
A0F9 MINPA2 04215*04218
A0DE MINPAT 03044 03560 04205*
1C26 MINX   00116*00674 03101 03729 03733 03738 04205
1C36 MINY   00117*03108 03770 03774 03779 04212
1C19 MISDIE 00108*03438 04948 04975
00C5 MISFLG 00087*04338 04529 04959 04994
A0DA MOTLMT 04058 04091 04168 04200*
A137 MOVBOT 03579 03621 04255*
9F02 MOVCEN 03852 03869 03886 03903 03927*
8E15 MOVE1  01445 01447 01460 01462 01545*
8E18 MOVE2  01451 01453 01466 01468 01546*
8A39 MOVEX  01051*02044 02063 02489 02496 02848 02857
8A42 MOVEX1 01053 01056*
8A4F MOVEX2 01057 01063*
8A8D MOVEX3 01061 01073*
8A98 MOVEX4 01076 01079*
8AA1 MOVEX5 01081 01084*
8C79 MOVEXY 00957 01331*02505 02515 02525 02534 02870 02884 02897 02911
            03911 03970 04053 04085 04086 04163 04475
8B59 MOVEY  01192*02475 02482 02830 02839
8B62 MOVEY1 01194 01197*
8B6F MOVEY2 01198 01204*
8BAD MOVEY3 01202 01214*
8BB8 MOVEY4 01217 01220*
8BC1 MOVEY5 01222 01225*
A14A MOVLHT 03603 03633 04264*
A152 MOVRHT 03595 03629 04268*
A12F MOVTOP 03587 03625 04251*
8AAE MOVX   01074 01095*01361 01473 02149 02168 02272
8ABE MOVX1  01098 01102*01117
8ACA MOVX2  01107*01114
8AD2 MOVX3  01108 01112*
8AE2 MOVX4  01120*01127
8AEA MOVX5  01121 01125*
8AFC MOVX6  01131 01135*
8B00 MOVXO1 01141*
8B02 MOVXO2 01142*01146
8B06 MOVXO3 01143*01151
8B13 MOVXO4 01144 01150*
8B23 MOVXO5 01155 01159*
8B2B MOVXO6 01160 01164*
8B00 MOVXOK 01079 01140*01371
8C82 MOVXY1 01333 01336*
8C8B MOVXY2 01338 01341*
8C9D MOVXY3 01342 01350*
8CDB MOVXY4 01348 01360*
8BCE MOVY   01215 01234*01366 01477 02187 02206 02290
8BDE MOVY1  01237 01241*01256
```

```
8BEA MOVY2  01246*01253
8BF2 MOVY3  01247 01251*
8C02 MOVY4  01259*01266
8C0A MOVY5  01260 01264*
8C1C MOVY6  01270 01274*
8C20 MOVYO1 01280*
8C22 MOVYO2 01281*01285
8C26 MOVYO3 01282*01290
8C33 MOVYO4 01283 01289*
8C43 MOVYO5 01294 01298*
8C4B MOVYO6 01299 01303*
8C20 MOVYOK 01220 01279*01376
8901 MSYNC  00835 00966*
8E78 MTRERR 01571 01579 01585 01591 01595 01601 01605 01613 01619 01623*
882C MTRPI1 00868 00872*
8823 MTRPIA 00446 00867*
87CA MTRST  00168 00815*
87EA MTRST0 00828*00832
87ED MTRST1 00829*00840
87FC MTRST2 00830 00838*
880E MTRST3 00847*00850
8D2B MUL1   01408 01410*
8D38 MUL2   01415 01417*
8D13 MULT   01066 01070 01207 01211 01353 01357 01397*03313 04016 04037
            04102
8667 NEXT   00581*02110 02372 02658 03051
8669 NEXT1  00582*00583
8671 NEXT2  00587*00588
8F90 NEXTH  01921 01924*01925 01950 01956 01983 01987 03152
8F89 NEXTL  01830 01832 01858 01920*
A315 NODIE  04364 04528*04546
A30E NOGOOD 04484 04488 04492 04496 04497 04501 04502 04506 04507 04511
            04512 04524*04530 04630 04636
A761 NOLOA1 05047*05050
A75E NOLOAD 05046*05052
808F NULL   00170*00440 00442 00445 03447 03455 03464 03472 03485 03492
            03568 03615 03727 04085
8D0D OFFXY  01346 01360 01388*
84CB OUT1   00346*00347
9AC0 OUT2H  03362 03363 03366*
9ABB OUT4H  03354 03356 03362*
9AD6 OUTCH  03377 03379*
9AC8 OUTHL  03367 03370*
9ACC OUTHR  03369 03374*
8681 OUTOK  00596*00597 02109 02153 02172 02191 02210 02371 02657 03048
868E OUTOK2 00603*00604
869D OUTOK3 00611*00612
84B7 OUTPUT 00334*00335 00342 00397
8EAF PAGOFF 00553 00815 01738*02599
8EA6 PAGON  00552 00713 00819 01710*02608 03197
9469 PAGON1 02596 02608*
9919 PARAM  00562 03151*
991C PARAM1 03152*03155
9926 PARAM2 03157*03158
993E PARAM3 03169*03180
996D PARAMX 03164 03184 03186 03194*03258
A3D7 PARDIE 04400 04420 04440 04460 04607 04609 04611 04613 04627*
9A95 PARTAB 03188 03318*
1C1B PARTFL 00109*00695 01056 01197 01341 04914 04928 04939 04980
00C8 PASSF  00090*
7400 PATERN 00031*
8E90 PATOFF 01654*02223 03043 03097
9A4D PERCN1 03277 03282*
9A56 PERCN2 03284 03287*
9A5E PERCN3 03288 03291*
9A66 PERCN4 03292 03295*
9A6E PERCN5 03296 03299*
9A76 PERCN6 03300 03303*
9A7E PERCN7 03304 03307*
9A84 PERCN8 03308 03310*
9A42 PERCNT 03268 03270 03272 03275*
945C PGEND  02598 02600*
8E1B POLL   01169 01308 01441 01456 01569*03442 03452 03469 03481 04966
8E2C POLL1  01578*01581
```

```
8E37 POLL2  01584*01587
8E48 POLL3  01594*01597
8E59 POLL4  01604*01607
8E66 POLL5  01612*01615
00C7 POLLF  00089*03443 03453 03470
8732 PWROK  00711 00716*
86AB PWRUP  00164 00634*
86AE PWRUP1 00635*00637
1C1F REJDIE 00111*03355 04961 04963
8097 REPLY0 00170 00176*00924 01052 01075 01080 01092 01135 01156 01169
            01193 01216 01221 01231 01274 01295 01308 01332 01337 01362
            01367 01372 01377 01388 01441 01456 01474 01478 01542 01620
            01686 01712 01740 01774 01802 02026 02113 02150 02169 02188
            02207 02225 02273 02291 02401 02691 02831 02840 02849 02858
            02871 02885 02898 02912 03191 03441 03442 03448 03451 03452
            03456 03459 03465 03468 03469 03473 03476 03481 03486 03493
            03715 03912 03919 03971 04054 04087 04164 04175 04197 04305
            04476 04524 04623 04889 04897 04903 04906 04906 04910 04918
            04918 04922 04931 04931 04956 04966 04977 04983 04983 04986
            04991 04991
809A REPLY1 00173 00178*
809D REPLY2 00180*02920 03429 04341
80C4 REPLY3 00186*03922
80EA REPLY4 00192*01880 01959 01990
80EE REPLY5 00194*02017 02104 03434 03558 04332
810B REPLY6 00198*01683
8127 REPLY7 00202*02693 03441 03448 03451 03456 03459 03465 03468 03473
            03476 03486 03493 04847 04889 04906 04906 04910 04918 04918
            04922 04931 04931 04977 04983 04983 04986 04991 04991
814C REPLY8 00208*03606 03636 03719 04200 04308 04842
8164 REPLYC 00212*04945
8181 REPLYD 00216*04942
819D REPLYE 00220*02360 02644
81BA REPLYF 00224*02649 04886
A549 REPLYW 04619 04851*
820D REPYAX 00236*01109
82F2 REPYAY 00266*01248
8240 REPYBX 00242*01122 01132
8325 REPYBY 00272*01261 01271
81E1 REPYHX 00230*01099 01164
82C6 REPYHY 00260*01238 01303
8299 REPYLX 00254*01161 02264 02304
837E REPYLY 00284*01300 02282 02316
8476 REPYPP 00316*01633
83AB REPYPW 00290*01488
8428 REPYPX 00304*01625
844F REPYPY 00310*01630
83F8 REPYRB 00298*01526
826C REPYRX 00248*01147 01502 01529
8351 REPYRY 00278*01286 01514 01535
9041 REPYWS 02033 02079*
876D RESET  00165 00441 00638 00739*
97F9 RET1   03047*03062 03065 03070 03073 03078 03081 03086 03089 03092
97FF RET2   03049*
97E9 RETADJ 00543 03040*
A844 RETRY1 05167*05171
A858 RETRY2 05179*05183
A86C RETRY3 05191*05195
A880 RETRY4 05203*05207
90D6 RHT0   02141 02165*
90E9 RHT01  02163 02173*02178
90F4 RHT02  02174 02177*
0060 RHTAVE 00049*05152 05158 05200
A82F RHTCRH 05153*05159
008A RHTDIF 00061*
0082 RHTSTC 00053*03590 03627 03701 03860 03894 04070 04278 04288 04438
            04458 04509 04542 04585 04612 04634 04744 05210
0020 RHTSUM 00045*05083 05151
91A6 RMPX   02162 02181 02260*
91B4 RMPX1  02263 02266*
91CA RMPX2  02274 02276*
91CB RMPY   02200 02219 02278*
91D9 RMPY1  02281 02284*
91EF RMPY2  02292 02294*
```

```
88C1 RST10  00951 00957*
8895 RST4   00925 00929*
889F RST5   00935*00941
88A5 RST6   00931 00939*
88AB RST7   00937 00943*
88B5 RST8   00949*00955
88BB RST9   00945 00953*
8E96 RURDY  00455 01681*
8EA2 RURDY1 01682 01686*
8F6C SCROL1 01906*01909
8F7A SCROL2 01911*01913
8F66 SCROLL 01878 01901 01904*
8882 SETOK  00901 00919*
A2AA SETUP  04455 04474*04702 04714 04759 04771
00C3 SFTEMP 00086*04098 04100
7500 SNAP   00032*05058 05070 05081 05121
00C9 SNAPTP 00091*
99B3 SQ1IN  03205*03318
99C6 SQ2IN  03213*03319
99D9 SQ3IN  03221*03320
99EC SQ4IN  03229*03321
99FF SQ5IN  03237*03322
1C13 SR1    00105*00689 03167
1C15 SR2    00106*00690
1C17 SR3    00107*00691
9262 STEP   00540 02358*02768
92D1 STEP1  02400*02541 02547 02553 02559 02565 02571 02577 02583
935A STEPD  02478*02546
93B6 STEPDL 02528*02576 03871
93A4 STEPDR 02518*02582 03888
9374 STEPL  02492*02558
926B STEPOK 02359 02363*
9367 STEPR  02485*02552
934D STEPU  02471*02540
9392 STEPUL 02508*02570 03837
9381 STEPUR 02499*02564 03854 04059
93D6 STPDWN 02385 02543*
9301 STPERR 02402 02426*
93F4 STPLFT 02389 02555*
93E5 STPRHT 02387 02549*
93C7 STPUP  02383 02537*
8547 STRAD1 00421*00422 00425
853B STRADJ 00361 00416*
01C8 STRING 00092*03151 03154 03166 03350 03359
9F57 STRX   03980*03983
9F67 STRY   03987*03990
A76F SUMUP  05048 05058*
8846 SYNC   00883*
8851 SYNC1  00888*00892
885D SYNC2  00895*00899
8497 TAB1   00322*00675
84A7 TAB2   00326*
921E TAB4   02228 02320*
922E TAB5   02232 02240 02322*
923E TAB6   02245 02324*
A90F TABSUM 05059 05223*
009B TEMP   00068*03311 04015 04017 04018 04019 04020 04021 04022 04023
            04024 04025 04036 04038 04039 04040 04041 04042 04043 04044
            04045 04046 04101
00A1 TEMP1  00069*01071 01071 01071 01071 01212 01212 01212 01212 01358
            01358 01358 01358 03310 03312
9061 THETA  02103 02106*
9066 THETA1 02109*02144
9069 THETA2 02110*02157 02176 02195 02214
9258 THETAB 02119 02333*
8AA8 TOFARX 01073 01091*
8BC8 TOFARY 01214 01230*
0040 TOPAVE 00047*05125 05131*05164
A7ED TOPCRH 05126*05132
0089 TOPDIF 00060*
0080 TOPSTC 00051*03582 03623 03645 03839 03856 04061 04266 04282 04395
            04494 04533 04549 04606 04627 04640 04659 04716 05174
```

```
0000 TOPSUM 00043*05037 05060 05067 05124
9894 TSTBOT 03059 03066*
98AA TSTLFT 03067 03074*
98C0 TSTRHT 03075 03082*
9102 UP0    02135 02184*
9114 UP01   02192*02197 02220
911F UP02   02193 02196*
979B UPDAT1 02941 02946*
97A3 UPDAT2 02933 02945 02949*
97D4 UPDAT3 02974 02979*
97DC UPDAT4 02966 02978 02982*
97A5 UPDATE 02871 02885 02898 02912 02952*
8B2F UPDATX 01051 01169*01331
8C4F UPDATY 01192 01308*01336
9771 UPDTX  02849 02858 02923*02952
8B4A UPDTX1 01174 01180*
8B56 UPDTX2 01178 01182 01187*
97AA UPDTY  02831 02840 02953 02956*
8C6A UPDTY1 01313 01319*
8C76 UPDTY2 01317 01321 01326*
9412 UPLFT  02393 02567*
9403 UPRHT  02391 02561*
8F9B VAROF1 01951*01958
8F99 VAROFF 00561 01950*
8FB0 VARON  00560 01983*
8FB2 VARON1 01984*01989
8FE4 WAFERR 02030 02033*02052 02054
1C1D WAFSIZ 00110*00701 02029 02050 02116 02266 02284 03182
9023 WAFTAB 02038 02067*
1C21 WCOUNT 00112*03353 04936 04938
91F0 WHOLX  02156 02175 02296*02297 02303
91FD WHOLX1 02300 02302*
9207 WHOLY  02194 02213 02308*02309 02315
9214 WHOLY1 02312 02314*
0088 WIERDF 00059*04523 04615 04618 04622
1C12 WKMIS  00104*03439 04949 04972 04976
9A2F WKSR   03190 03267*04188
1C0C WKSR1  00101*04483
1C0E WKSR2  00102*04487
1C10 WKSR3  00103*04491
9181 XAL0   02146 02165 02240*
00AF XCEN   00076*03740 03754
1C46 XDIE   00118*03080 03088 03979 04224
00B3 XDIECN 00078*03753
00BF XDIESZ 00084*03998 04009
00B7 XDIF   00080*03755 03791 03830 03833
00BB XDIFNW 00082*03794 03801 03929 03939 03942 03944
9526 XLFT   02714 02720*
9302 XLFTON 02422 02428*
A466 XLMOVE 04692 04704*
9335 XLY    02448 02456*
9564 XLY1   02740 02749*
9347 XLYD   02458 02467*
9580 XLYD1  02751 02762*
933B XLYU   02459*
956A XLYU1  02752*
9515 XMAL   02705 02712*
0093 XMAX2  00066*01065 01071 01210 01212 01352 01358
A28D XMOVEL 04437 04457*
A268 XMOVER 04415 04435*
A4A3 XMOVLA 04731 04744*04817 04829
```

```
A4C0 XMOVRA 04749 04761*
6028 XMTR   00023*00873 00876 00880 00884 00890 01096 01102 01104 01112
            01125 01129 01150 01153 01169 01441 01491 01505 01520 01623
            02158 02177 02261 02296 02298 03442 03452 03469 03481 04966
9E0A XPLUS  03792 03800*
A449 XRMOVE 04674 04687*04788 04800
9341 XRYD   02451 02463*
9575 XRYD1  02743 02757*
932F XRYU   02452*
9559 XRYU1  02744*
7200 XSIZE  00029*02229 02241 03050 03050 03079 03087 03102 03686 03689
            03690 03693 03696 03699 03706 03709 03710 03713 03742 03746
            03751 03795 03797 03802 03804 03928 03930 03978 03982 03992
            03996 04206 04225 04264 04266 04268 04270 04271 04273 04280
            04287 04575 04577 04578 04580 04581 04583 04588 04590 04591
            04593
1C71 XSPP   00125*00919 01085 01176 01180 01208 01382 01539
00AB XSPTMP 00074*00920 00935 04033 04034 04035
008D XSTR   00064*00930 00933 00936 00940 01095 01116 01141 01172 01177
            01181 01446 01448 01452 01454 02041 02043 02060 02062 02121
            02148 02161 02167 02180 02271 02420 02446 02486 02488 02493
            02495 02500 02503 02511 02513 02519 02523 02529 02532 02712
            02738 02844 02847 02853 02856 02862 02867 02875 02881 02889
            02894 02905 02908 02932 02934 02935 02936 02937 02939 02943
            02947 03846 03848 03863 03865 03880 03882 03897 03899 03906
            03943 03952 04027 04051 04078 04079 04085 04085 04092 04157
            04160 04349 04350 04452 04454 04471 04473 04699 04701 04711
            04713 04756 04758 04768 04770
924E XTAB   02268 02286 02327*
00A5 XTEMP  00070*01060 01063 01084 01187 01345 01350 01381
92E7 XVAR1  02404 02411*
92F3 XVARON 02411 02420*
954D XYMAL  02709 02738*
9323 XYVAR  02417 02446*
92EF XYVAR1 02408 02417*
9164 YAL0   02184 02203 02228*
00B1 YCEN   00077*03781
1C56 YDIE   00119*03064 03072 03986 04231
00B5 YDIECN 00079*03768 03782
00C1 YDIESZ 00085*04006 04030
00B9 YDIF   00081*03783 03806 03828
00BD YDIFNW 00083*03809 03816 03933 03955 03958 03960
A4EF YDMOVE 04778 04790*
9542 YDWN   02727 02733*
931A YDWNON 02435 02441*
9531 YMAL   02707 02725*
0097 YMAX2  00067*01069 01071 01206 01212 01356 01358
A51D YMOVDA 04807 04819*
A24B YMOVEU 04397 04417*
A494 YMOVUA 04721 04733*
6020 YMTR   00024*00874 00877 00881 00885 00897 00906 01235 01241 01243
            01251 01264 01268 01289 01292 01308 01456 01493 01517 01523
            01532 01628 02196 02215 02279 02308 02310
7300 YSIZE  00030*02233 02246 03049 03049 03063 03071 03109 03651 03654
            03655 03658 03661 03664 03671 03674 03675 03678 03757 03761
            03766 03810 03812 03817 03819 03932 03934 03985 03989 04000
            04004 04213 04232 04251 04253 04255 04257 04258 04260 04293
            04300 04552 04554 04555 04557 04558 04560 04565 04567 04568
```

```
                   04570
1C74 YSPP     00126*00921 01067 01226 01315 01319 01384 01540
00AD YSPTMP   00075*00922 00949 04012 04013 04014
0090 YSTR     00065*00944 00948 00950 00954 01234 01255 01280 01311 01316
              01320 01461 01463 01467 01469 02122 02186 02199 02205 02218
              02289 02433 02449 02456 02472 02474 02479 02481 02501 02504
              02509 02514 02521 02524 02530 02533 02725 02741 02749 02826
              02829 02835 02838 02864 02869 02878 02883 02891 02896 02902
              02910 02965 02967 02968 02969 02970 02972 02976 02980 03842
              03850 03859 03867 03876 03884 03893 03901 03909 03959 03969
              04048 04052 04069 04082 04085 04085 04094 04158 04162 04351
              04352 04412 04414 04431 04433 04671 04673 04683 04685 04728
              04730 04740 04742 04785 04787 04797 04799 04814 04816 04826
              04828
00A7 YTEMP    00071*01201 01204 01225 01326 01347 01354 01383
9E17 YTST     03798 03806*
A43A YUMOVE   04664 04676*
92EB YVAR1    02406 02414*
930B YVARON   02414 02433*
```

DETAILED CIRCUIT DESCRIPTION

Figure 20:
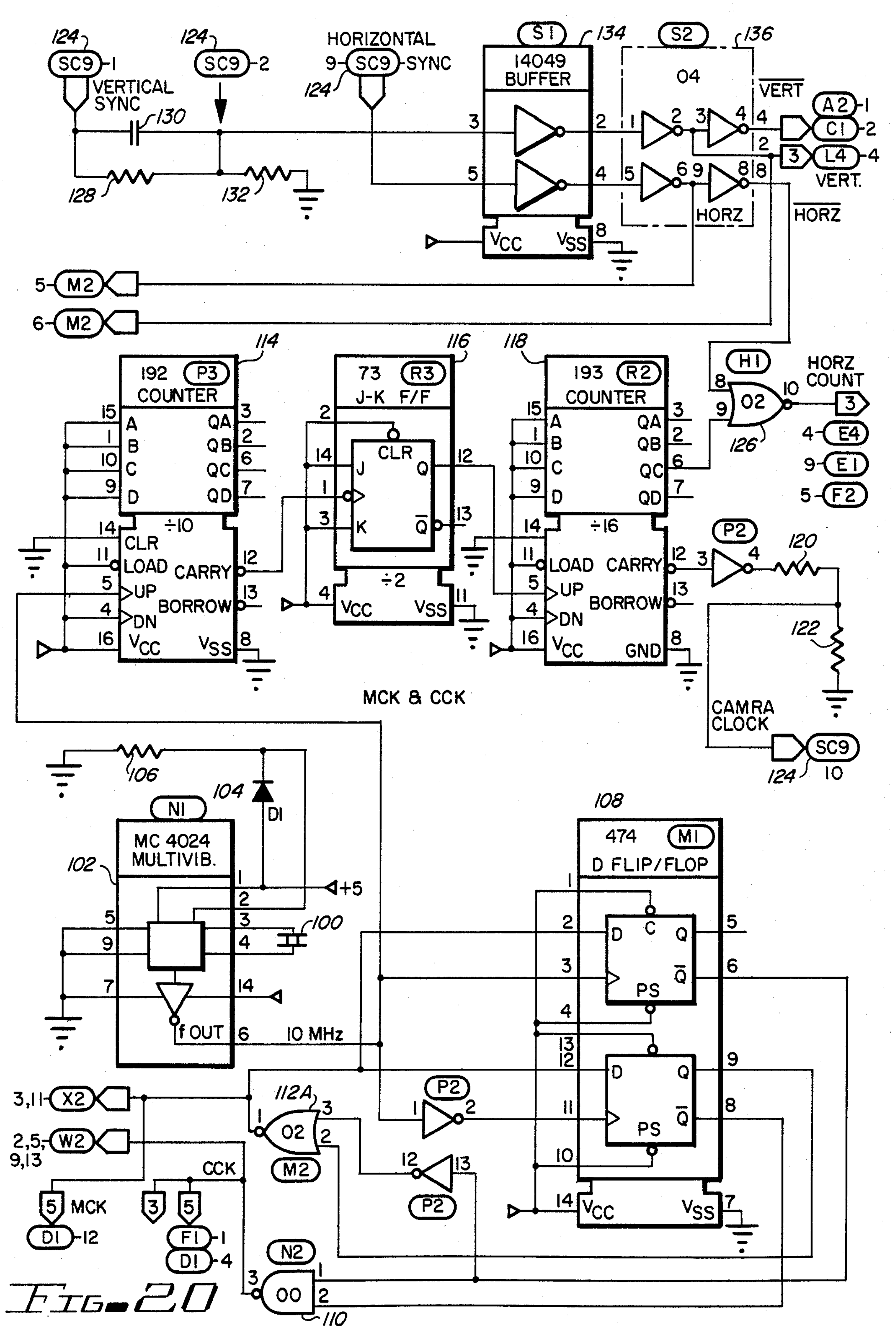
FIG. 20 is a diagram of a circuit which produces the various clock and pulse signals used throughout the numerous circuits of the invention.

Shown in FIG. 20 is the circuit which produces the various clock and pulse signals used throughout the numerous circuits of the invention. A 10 MHz crystal 100 is connected between pins 3 and 4 of a MC4024 multivibrator IC102. Pin 1 of IC102 is connected to Vcc (+5 v) and to the anode of a IN914 diode 104. The cathode of diode 104 is connected to pin 2 of IC102 and to ground through a 10 Kohm resistor 106. Pins 5, 7 and 9 of IC102 are all coupled to ground. Pin 14 of IC102 is connected to Vcc. Pin 6 of IC102 represents a 10 MHz square wave output signal.

The output of IC102, pin 6, is applied to pin 3 of the first half of a 7474 dual D flip/flop IC108. Pin 6 of IC102 is also inverted by a 7404 inverter and applied to pin 11 of the second half of IC108. Pins 1, 4, 10, 13 and 14 of IC108 are connected to Vcc. Pin 7 of IC108 is connected to ground, and pin 5 is left open. The $\overline{Q}$ output of the first D flip/flop, pin 6 of IC108, is coupled to input pin 1 of a 7400 NAND gate IC110. The other input, pin 2 of NAND gate IC100 is coupled to the $\overline{Q}$ output, pin 8, of the second D flip/flop of IC108. The output of IC110, pin 3, represents a COUNTER or "DOT" clock. The COUNTER clock has a period of 150 nanoseconds, and is at a logical high level for 100 nanoseconds. Pin 6 of IC108 is also inverted and applied to an input, pin 3, of a 7402 NOR gate IC112A. The second input, pin 2 of IC112A, is coupled to the Q output, pin 9, of the second D flip/flop of IC108. The output of IC112A, pin 1, is fed back to the D input, pins 2 and 12, of the first and second flip/flops of IC108. The output of IC112 also represents a MEMORY clock MCK, which is the inverse of the COUNTER clock.

Pin 6 of IC102 is also coupled to the up clock input, pin 5, of a 74192 counter IC114. Pins 1, 4, 9, 10, 11, 15 and 16 of IC114 are all coupled to Vcc. Pins 8 and 14 of IC114 are connected to ground. Pins 2, 3, 6, 7 and 13 of IC114 are all left open. The $\overline{\text{carry}}$ output, pin 12 of IC114, represents a divided (by ten) output equal to 1 MHz. IC114 divided the 10 MHz output of IC102 down to a 1 MHz signal.

The output of IC114 is coupled to the clock input, pin 1, of a 7473 J-K flip/flop IC116. Pins 2, 3 4, and 14 of IC116 are coupled to Vcc. Pin 11 of IC116 is connected to ground, and pin 13 is left open. The Q output, pin 12 of IC116, represents a 500 MHz square wave signal.

The output of IC116 is coupled to the up-counter input, pin 5, of a 74193 counter IC118. Pins 1, 4, 9, 10, 11, 15 and 16 of IC118 are coupled to Vcc. Pins 14 and 8 of IC118 are coupled to ground. Pins 2, 3, 7 and the borrow output, pin 13 of IC118, are all left open. Pin 6 of IC118 represents a 62.5 KHz square wave signal. The carry output, pin 12 of ILC118, represents a 31 KHz 31.2 usec high, 0.5 usec low signal. Thus, IC118 divides down the 500 KHz output of IC116 to produce both a 62.5 KHz signal and a 31 KHz signal.

The 31 KHz output from IC118, pin 12, is inverted and reduced by a voltage divider comprised of 680 ohm resistor 120 and 330 ohm resistor 122. At the junction of resistor 120 and 122 the 31 KHz signal is used as a CAMERA clock. The CAMERA clock reaches the exterior camera through pin 10 of an external connector 124. The other side of resistor 122 is coupled to ground.

The 26.5 KHz output from IC118, pin 6, is coupled to a first input, pin 9, of a 7402 NOR gate IC126.

A vertical SYNC signal from pin 1 of connector 124 is coupled to a 1.5 Mohm resistor 128 and to a 0.001 uf capacitor 130. The other sides of resistor 128 and of capacitor 130 are coupled together and to ground through a 100 Kohm resistor 132. The junction of resistor 128 and capacitor 130 is connected to a first input, pin 3, of a 14049 hex inverting buffer IC134. The output, pin 2 of IC134 is coupled to pin 1 of a 7404 inverter IC136. The output, pin 2 of IC136, represents a signal, VERT. The VERT signal is again inverted at pin 3 of IC136 and output at pin 4 of IC136 as a signal, $\overline{\text{VERT}}$.

A horizontal SYNC signal from pin 9 of connector 124 is coupled to the second input, pin 5, of inverting buffer IC134. The output, pin 4 of IC134, is inverted at pin 5 of IC136. The output at pin 6 of IC136 represents a signal HORZ. The HORZ signal is again inverted at pin 9 of IC136 and is output at pin 8 as a signal $\overline{\text{HORZ}}$. The signal $\overline{\text{HORZ}}$ is coupled to the second input, pin 8, of NOR gate IC126. The output of IC126, pin 10, represents a signal HORZ COUNT.

Pin 1 of buffer IC134 is coupled to Vcc. Pin 8 of buffer IC134 and pin 2 of connector 124 are coupled to ground.

Figure 21A:
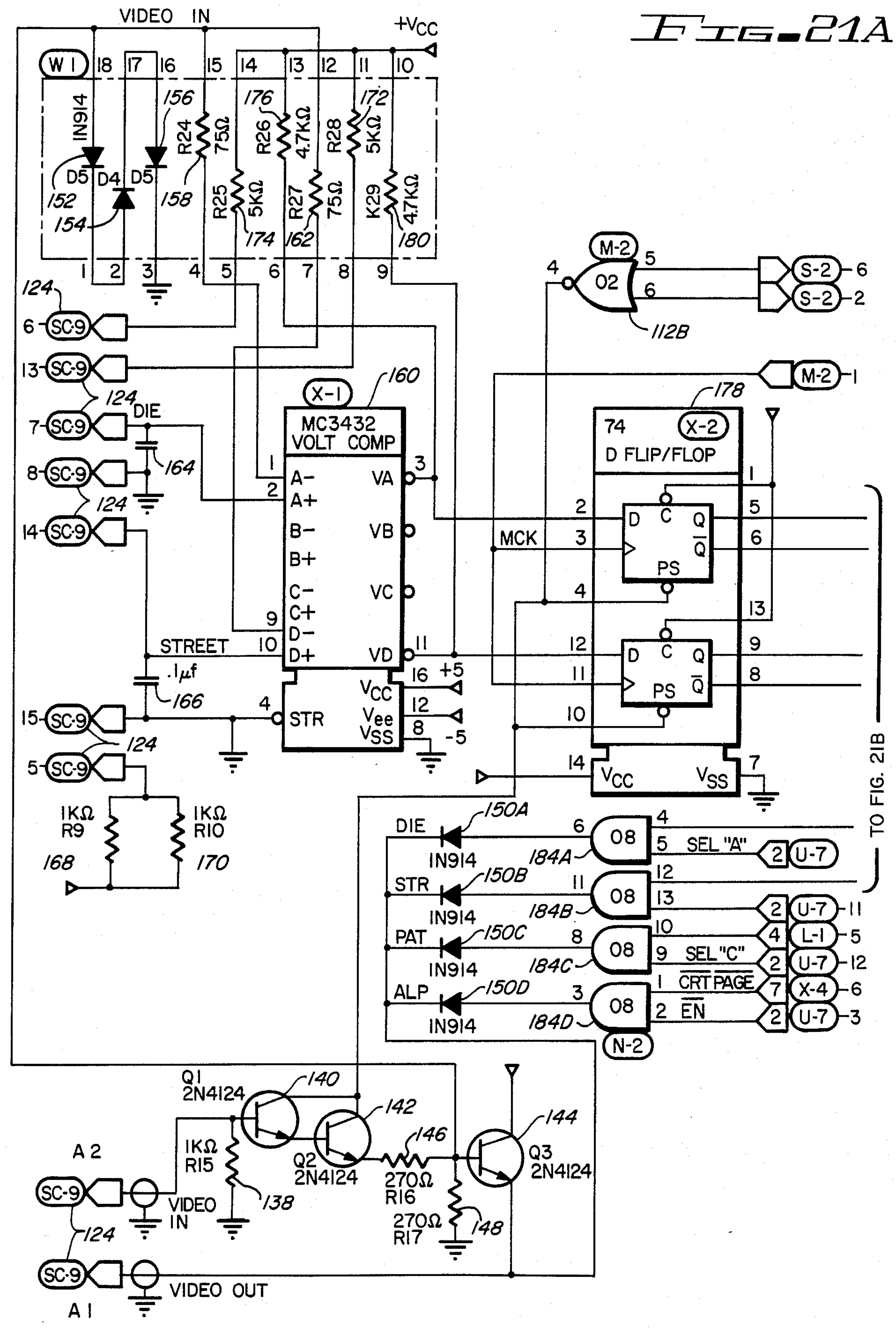
FIGS. 21A–21B are a diagram of a circuit which functions as the FRONT END shown in FIG. 5.
Figure 21B:
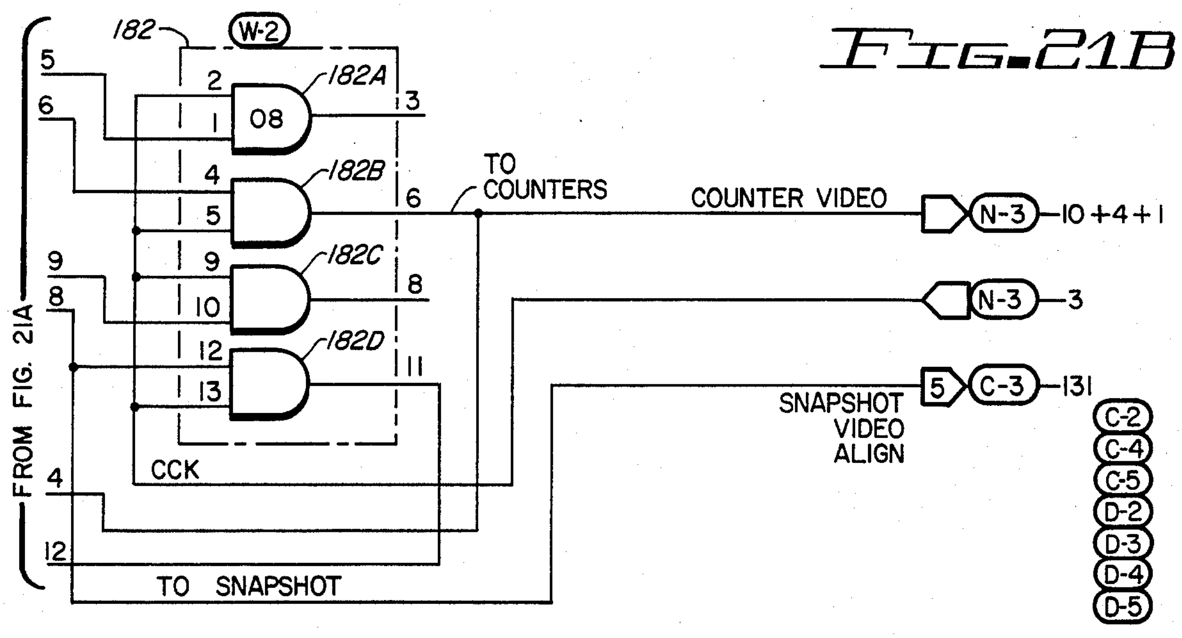

Referring to FIG. 21, a circuit is shown which performs the function of the block diagram labeled FRONT END and shown in FIG. 5. The VIDEO IN signal is received from a video camera at pin A2 of connector 124 and is transferred on a coaxial cable. The VIDEO IN signal is connected to ground through a 1 Kohm resistor 138 and to the base of a 2N4124 transistor 140. The emitter of transistor 140 is coupled to the base of a second 2N4124 transistor 142. The collectors of transistors 140 and 142 are coupled together. The emitter of transistor 142 is coupled to the base of a third 2N4124 transistor 144 through a 270 ohm resistor 146. The base of transistor 144 is coupled to ground through a 270 ohm resistor 148. The collector of transistor 144 is connected to Vcc.

The collectors of transistors 140 and 142 are connected to the output, pin 4, of a 7402 NOR gate IC112B. The inputs of NOR gate IC112B pin 5 is connected at to the HORZ signal (pin 6 of IC136) and at pin 6 to the VERT signal (pin 2 of IC136). Thus, transistors 140 and 142 are controlled by the VIDEO IN signal at the base of transistor 140 and by the output of NOR gate 150 at the collectors of transistors 140 and 142.

The VIDEO IN signal is picked up at the base of transistor 144, after passing through the Darlington pair of transistors 140 and 142, and is then clamped and limited prior to being received at a voltage comparator. The VIDEO IN signal is clamped by three IN914 diodes 152, 154, and 156, which are connected in series and lead to ground. The VIDEO IN signal is then connected through a 75 ohm resistor 158 to the A− input, pin 1, of the first comparator of a MC3432 Quad Voltage Comparator IC160. Similarly, the VIDEO IN signal is coupled through a 75 ohm resistor 162 to the D− input, pin 9, of a fourth voltage comparator contained in IC160. The second and third comparators in IC160 are not used.

The A+ input, pin 2 of the first comparator in IC160, is coupled to pin 7 of connector 124 and to one side of 0.1 uf capacitor 164. The other side of capacitor 164 is coupled to ground and to pin 8 of connector 124. The A+ input, pin 2 of the first comparator in IC160, receives the DIE ADJUST signal as described when referring to FIG. 5. The D+ input, pin 10 of the fourth comparator in IC160, is similarly connected to pin 14 of connector 124 and to one side of a 0.1 uf capacitor 166. The other side of capacitor 166 is coupled to ground, to pin 4 of IC160, and to pin 15 of connector 124. The D+ input, pin 10 of the fourth comparator in IC160, receives the STREET ADJUST signal as described when referencing FIG. 5.

Pin 5 of connector 124 is connected to Vcc through the parallel combination of two 1 Kohm resistors 168 and 170. Pins 13 and 6 of connector 124 are individually coupled to Vcc through 5 Kohm resistors, 172 and 174, respectively.

The output, pin 3 of the first comparator in IC160, is coupled to Vcc through a 4.7 Kohm resistor 176 and to the D input, pin 2, of the first half of a 7474 dual D flip-flop IC178. The output, pin 11 of the fourth comparator in IC160, is similarly coupled to Vcc through 4.7 Kohm resistor 180 and to the D input, pin 12, of the second half of IC178. Pin 14 and the $\overline{\text{CLEAR}}$ inputs of the two flip/flops of IC178, pins 1 and 13, are all coupled to Vcc. Pin 7 of IC178 is coupled to ground. Pin 4 of the first flip/flop and pin 10 of the second flip/flop of IC178 are both coupled to the output of the NOR gate IC112B. Both flip/flops of IC178 are clocked, at pins 3 and 11, by the MEMORY clock MCK from pin 1 of NOR gate IC112A.

The $\overline{Q}$ output, pin 6 of the first flip/flop of IC178, is coupled to the first input, pin 4 of AND gate 182B of a 7408 quad AND IC182. The Q output, pin 5 of the first flip/flop of IC178 is not used. The $\overline{Q}$ output, pin 8 of the second flip/flop of IC178, is coupled to the first input, pin 12, of AND gate 182D of IC182. The Q output, pin 9 of IC178, is similarly not used. Even though pins 5 and 9 of IC178 are not used, they are connected to input pins 1 and 10, respectively, of AND gates 182A and 182C, respectively, of IC182. However, the outputs of the AND gates 182A and 182C of IC182, pins 3 and 8, respectively, are left open. The second input of each AND gate of IC182, pins 2, 5, 9 and 13, is coupled to the COUNTER clock (CCK) at the output, pin 3, of AND gate IC110.

The $\overline{Q}$ output, pin 8 of IC178, is also coupled directly to the SNAPSHOT RAM circuit 34 to be described below. The output of the AND gate 182B of IC182, pin 6, represents the digitized die signal and is coupled directly to the COUNTER block circuit 30, to be described below. In addition, the output of AND gate 182B is coupled to pin 4 of a 7408 AND gate 184A. The output of AND gate 182D of IC182, pin 11, represents the digitized street signal and is coupled to pin 12 of 7408 AND gate 184B. An input to a third 7408 AND gate 184C, at pin 10, comes from the CHARACTER GENERATOR circuit 46 to be described below. An input, pin 1, of a fourth 7408 AND gate 184D is coupled to the 8-to-1 select 344 FIG. 27A from the PATTERN LOOK-UP RAM 38 to be described below AND gates 184A, 184B, 184C and 184D comprise a single 7408 quad AND gate labelled generally as IC184. Pin 5 of AND gate 184A, Pin 13 of AND gate 114B, Pin 9 of AND gate 184C, and Pin 2 of AND gate 184D are coupled to select signals at pins 10, 11, 12 and 13 of a control PIA to be described below (IC406).

The outputs pins 6, 11, 8 and 3 of quad AND gate IC184 are diode-OR'ed together by IN914 diodes 150A, 150B, 150C and 150D, the outputs of which are coupled to the emitter of the transistor 144. The emitter of the transistor 144 serves as the VIDEO OUT signal, which is transferred to the CRT through pin A1 of connector 124.

Figure 22:
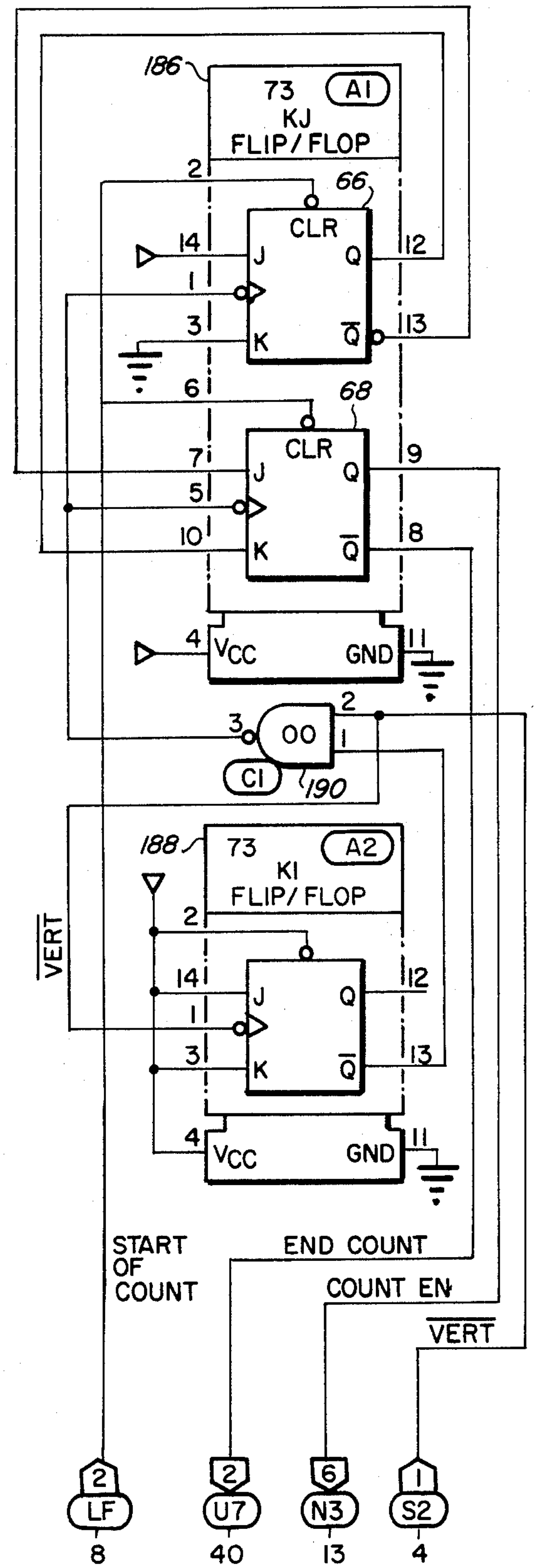
FIG. 22 is a diagram of a circuit which functions as the ARMING circuit shown in FIG. 6.

Referring to FIG. 22 a circuit is shown which functions as the ARMING circuit described above when referencing FIG. 6. A START OF COUNT signal is output from pin 39 of a control PIA, (IC406) to be described below. The START OF COUNT signal is inverted to produce a $\overline{\text{START}}$ $\overline{\text{OF}}$ $\overline{\text{COUNT}}$ signal which is used to clear the counters in the COUNTER block 30. The signal is again inverted, to increase drive capability of the START OF COUNT signal which is applied to the ARMING circuit.

The START OF COUNT signal is applied to the clear input, pin 2 of the first half of a 7473 dual J-K flip/flop IC186, referenced earlier as flip/flop 66. The START OF COUNT signal is also applied to the clear input, pin 6 of the second half of IC186, referenced earlier as flip/flop 68. Thus, both flip/flops of IC186 are cleared by the START OF COUNT signal when it is low. Pin 4 of IC186 is coupled to Vcc. Pin 11 of IC186 is coupled to ground. A third 7473 J-K flip/flop IC188 has pins 2, 3, 4 and 14 coupled to Vcc. Pin 11 of IC188 is coupled to ground. Pin 12 (the Q output of IC188) is left open. The third flip/flop, IC188, is clocked at pin 1 by the signal $\overline{\text{VERT}}$. The $\overline{Q}$ output of IC188 is coupled to the first input, pin 1, of a 7400 NAND gate IC190. The second input, pin 2 of IC190, is connected to the $\overline{\text{VERT}}$ signal. The output pin 3 of NAND gate IC190, is used to clock both flip/flops 66 and 68 of IC186 at pins 1 and 5, respectively. The J input, pin 14 of flip/flop 66 is coupled to Vcc. The K input, pin 3 of flip/flop 66, is coupled to ground. The Q output, pin 12 of flip/flop 66, is coupled to the K input, pin 10, of flip/flop 68. The $\overline{Q}$ output, pin 13 of flip/flop 66, is coupled to the J input, pin 7, of flip/flop 68. The Q and $\overline{Q}$ outputs of flip/flop 68, pins 9 and 8, respectively, provide the COUNT ENABLE and END OF COUNT signals, respectively.

Figure 23:
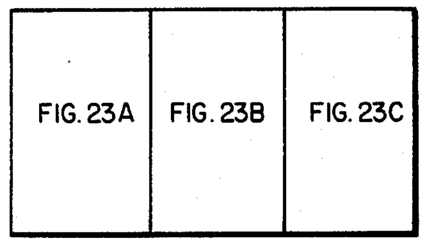
FIGS. 23A–23C are a diagram of a circuit which functions as the COUNTER BLOCK shown in FIG. 8.

Shown in FIG. 23 is a circuit which functions as the COUNTER block 30 described above when referencing FIG. 8. To create each 16-bit counter block, of which there are three (A, B and C), four 4-bit counters are connected in series, as will be explained. Each 16-bit block is read by a separate peripheral interface adapter (PIA). Counter block A is read by a 6821 PIA IC192; counter block B is read by a 6821 PIA IC194; counter block C is read by a 6821 PIA IC196. Each PIA receives and sends data from an 8-line VIDEO DATA bus from a MPU INTERFACE BOARD to be described below. The data is received at pins 26 through 23 on each of the PIA's, IC192, IC194 and IC196. Each PIA is coupled to a R/$\overline{\text{W}}$ signal at pin 21, a RS$\phi$ signal at pin 36, a RS1 signal at pin 35, a $\overline{\text{RESET}}$ signal at pin 34, and an ENABLE (E) signal at pin 25. Pin 1 of each PIA is coupled to ground. Pins 20, 22 and 24 of each PIA are coupled to Vcc. Pins 18, 19, 37, 38 and 39 of each PIA are left open. The CS2 input to PIA IC192, pin 23, is controlled by a PIA SEL A signal (from IC418 pin 8). The CS2 input, pin 23, of PIA IC194, is controlled by PIA SEL B signal (from IC 418 pin 9). The CS2 input, pin 23 of PIA IC196, is controlled by a PIA SEL C signal (from IC 418 pin 1Q). The above select signals receied by the PIA's IC's 192, 194 and 196, are sent by the MPU INTERFACE BOARD.

All twelve counters are cleared at pin 14 by the $\overline{\text{START}}$ $\overline{\text{OF}}$ $\overline{\text{COUNT}}$ signal from the MPU INTERFACE BOARD. Pins 1, 4, 9, 10, 11, 15 and 16 of each counter are coupled to Vcc. Pin 8 of each counter is coupled to ground. The borrow output, pin 13 of each counter, is left open.

As mentioned above, counter block A consists of four 74193 4-bit counters IC202, IC204, IC198 and IC200, coupled together in series to function as a 16-bit counter. Similarly, counter block B consists of four 74193 4-bit counters IC210, IC212, IC206, and IC208, coupled together in series. Finally, counter block C consists of four 74193 4-bit counters IC218, IC220, IC213 and IC216, similarly coupled together in series to form a 16-bit counter. Counters IC200, IC208, and IC216 are clocked at pin 5 by the carry output, pin 12, of counters IC198, IC206, and IC214, respectively. IC198, IC206, and IC214 are clocked at pin 5 by the carry output, pin 12, of counters IC204, IC212, and IC220, respectively. Similarly, counters IC204, IC212 and IC220 are clocked at pin 5 by the carry output, pin 12, of counters IC202, IC210 and IC218, respectively. Finally, counters IC202, IC210 and IC218 are clocked by the inverted output of 7410 three-input NAND gates IC222, IC224 and IC226, respectively. The carry output, pin 12 of counters IC200, IC208 and IC216, is connected to the CA1 input, pin 40, of PIA's IC192, IC194 and IC196, respectively.

A first input to each of the NAND gates IC222, IC224 and IC226 is the digitized die signal, VIDEO DIE, from the FRONT END. A second input to each of the NAND gates is the COUNT ENABLE signal from the ARMING circuit of FIG. 22. The final input to NAND gate IC222 is a WINDOW COUNTER A signal from PATTERN LOOK UP RAM CIRCUIT (IC342, Pin 6). The final inputs to NAND gates IC224 and IC226 are signals WINDOW COUNT B and WINDOW C respectively, also from the PATTERN LOOK UP RAM circuit (IC342, pins 8 and 11).

The outputs, pins 3, 2, 6 and 7 of counters IC198, IC206 and IC214, are connected to inputs, pins 2, 3, 4 and 5 of PIA's IC192, IC194 and IC196, respectively. The outputs, pins 3, 2, 6 and 7 of counters IC200, IC208 and IC216, are connected to the inputs, pins 6, 7, 8 and 9, of PIA's IC192, IC194 and IC196, respectively. The outputs, pins 3, 2, 6 and 7 of counters IC202, IC210 and IC218, are connected to inputs, pins 10, 11, 12 and 13 of PIA's IC192, IC194 and IC196, respectively. Finally, the outputs, pins 3, 2, 6 and 7 of counters IC204, IC212 and IC220 are connected to inputs, pins 14, 15, 16 and 17 of PIA's IC192, IC194 and IC196, respectively.

Figures 24, 24B:
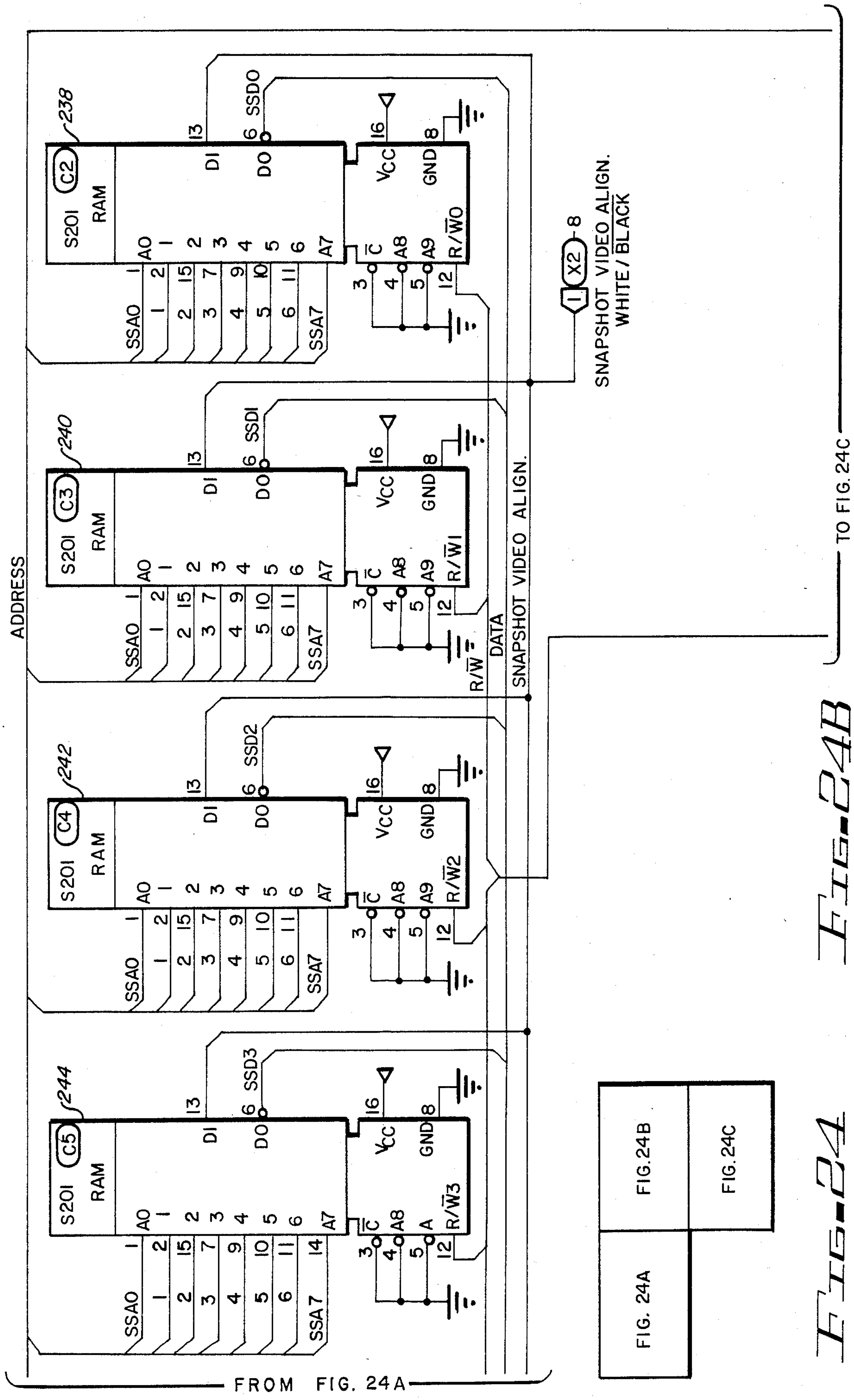
FIGS. 24A–24C are a diagram of a circuit which functions as the SNAPSHOT RAM circuit shown in FIG. 9.
Figure 24A:
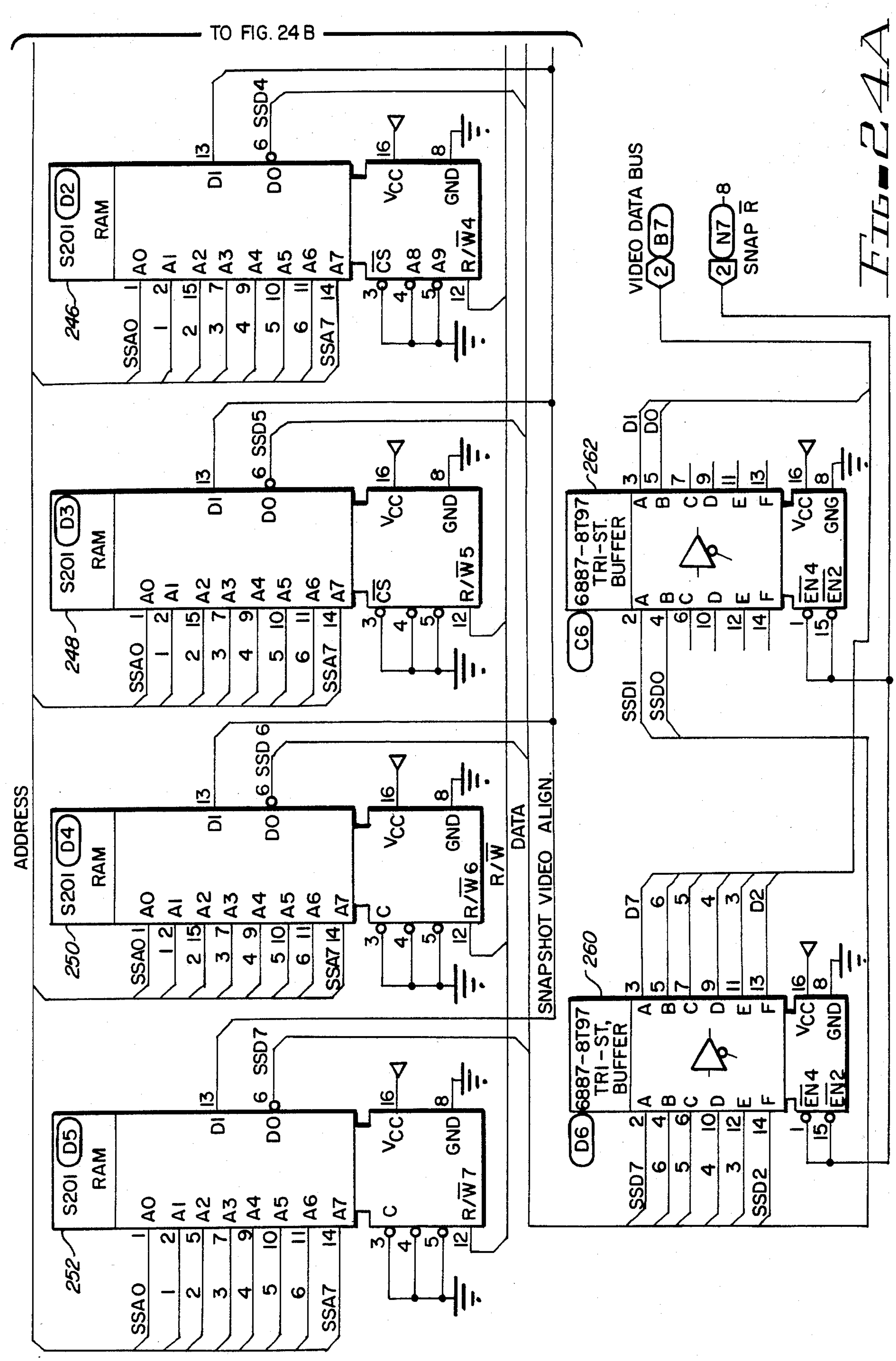
Figure 24C:
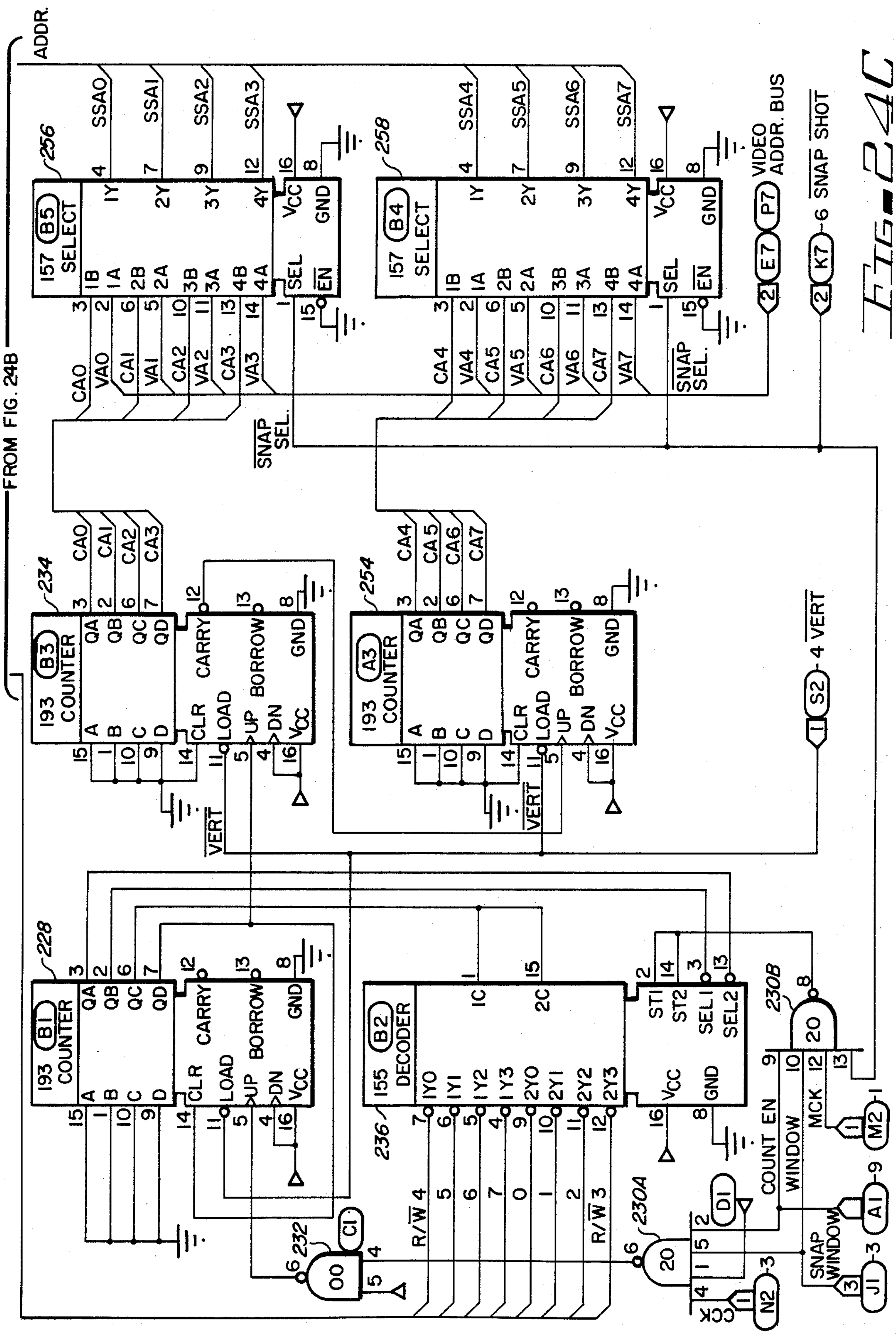
Figure 25A:
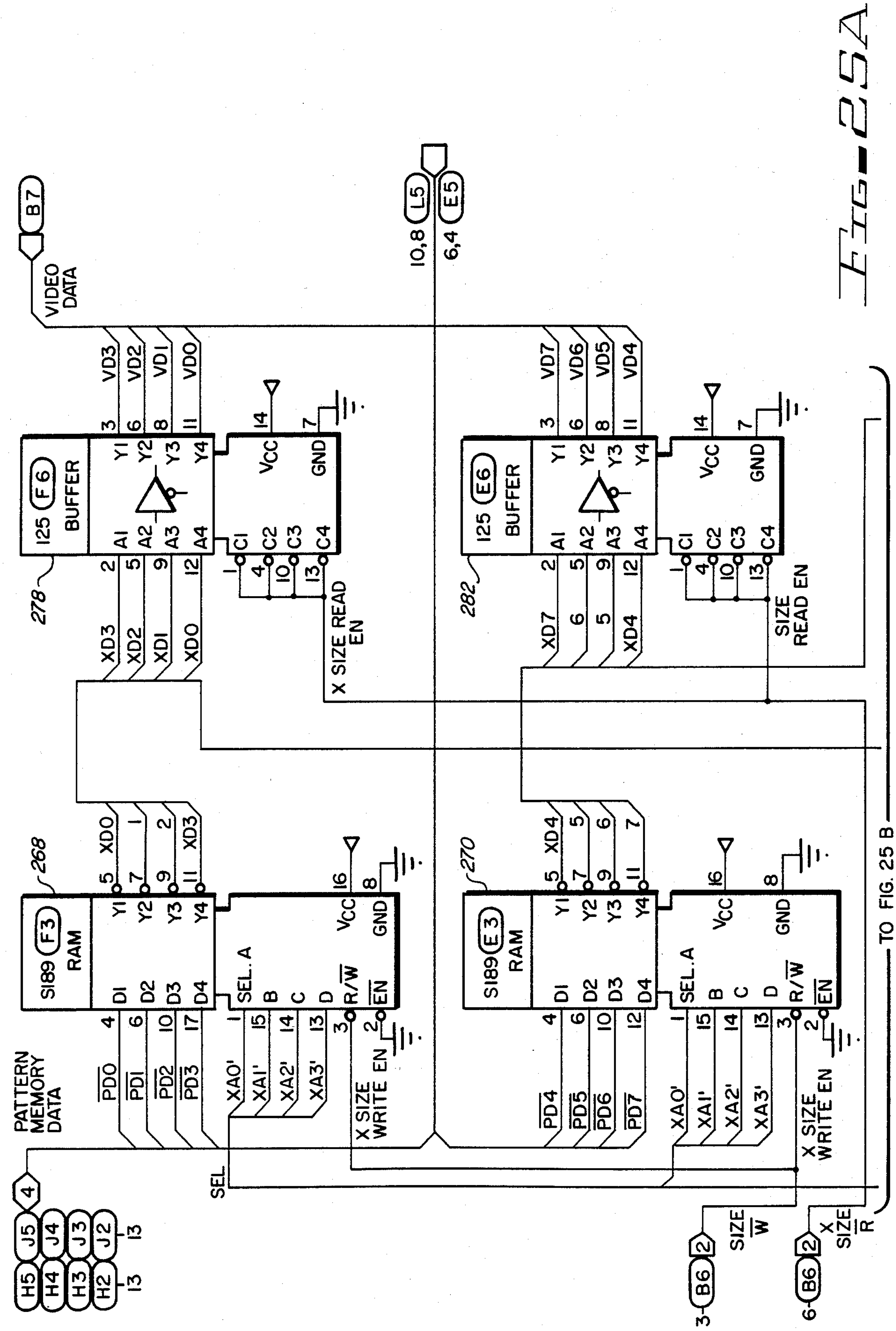
Figure 25B:
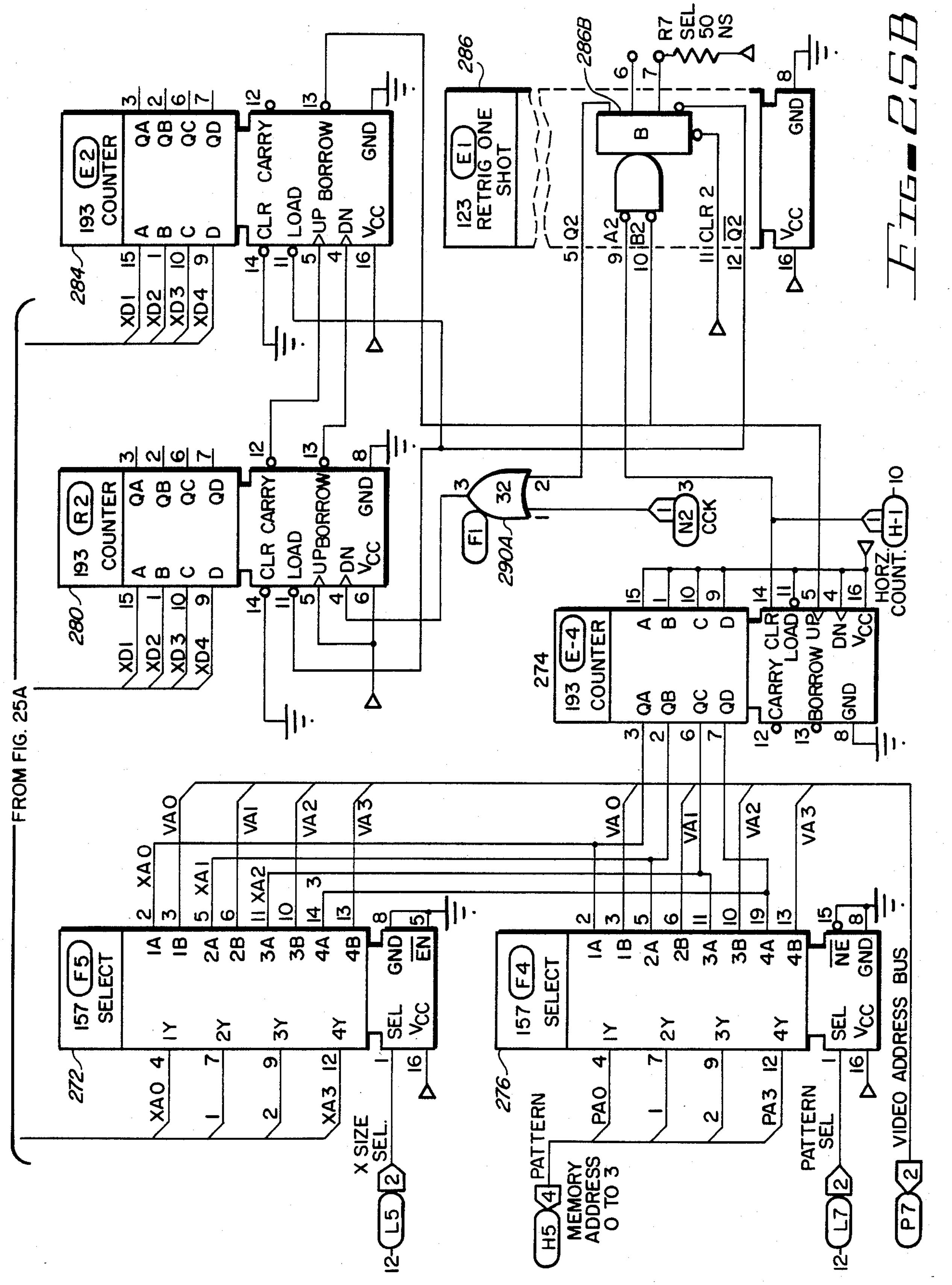
Figure 26A:
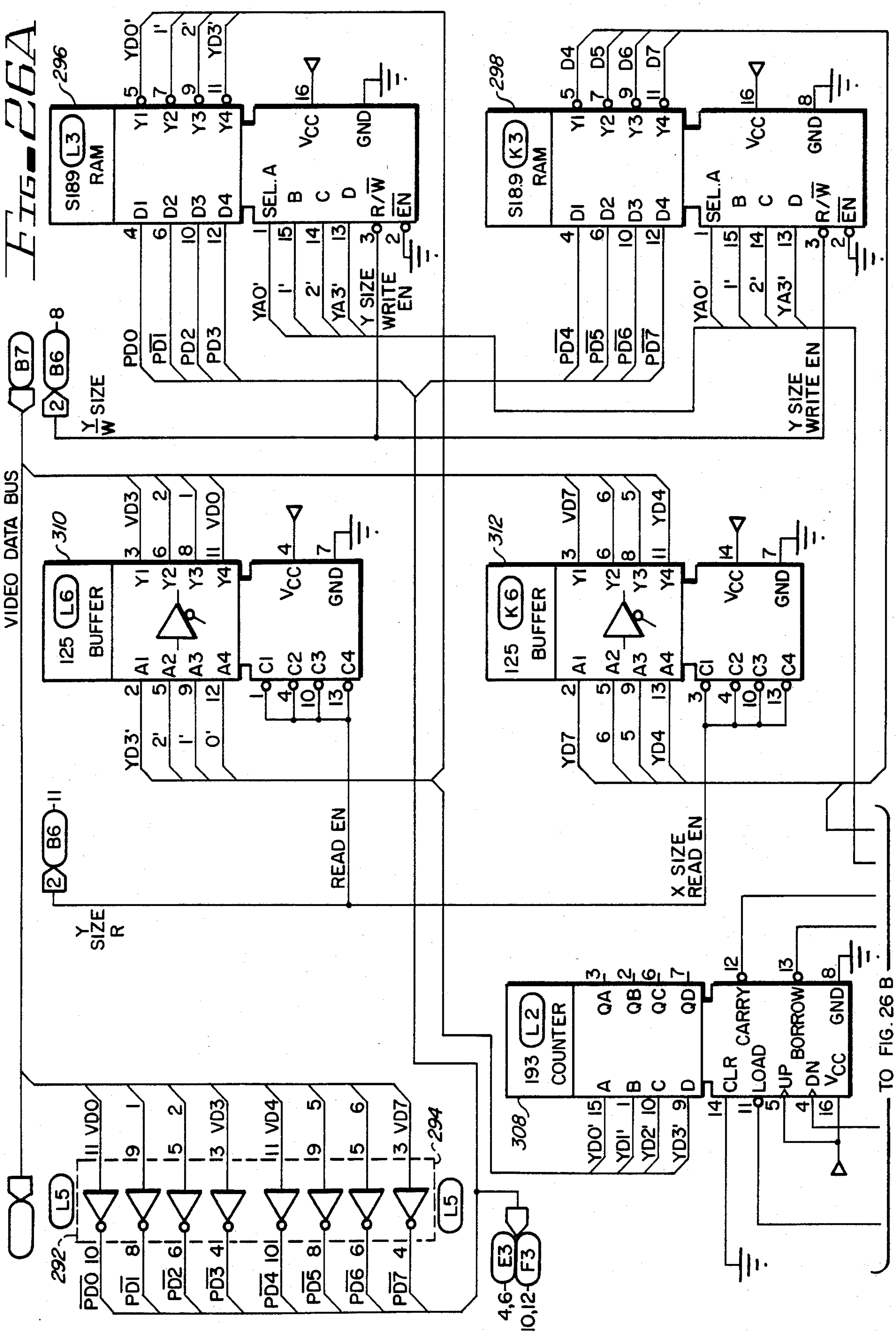
Figure 26B:
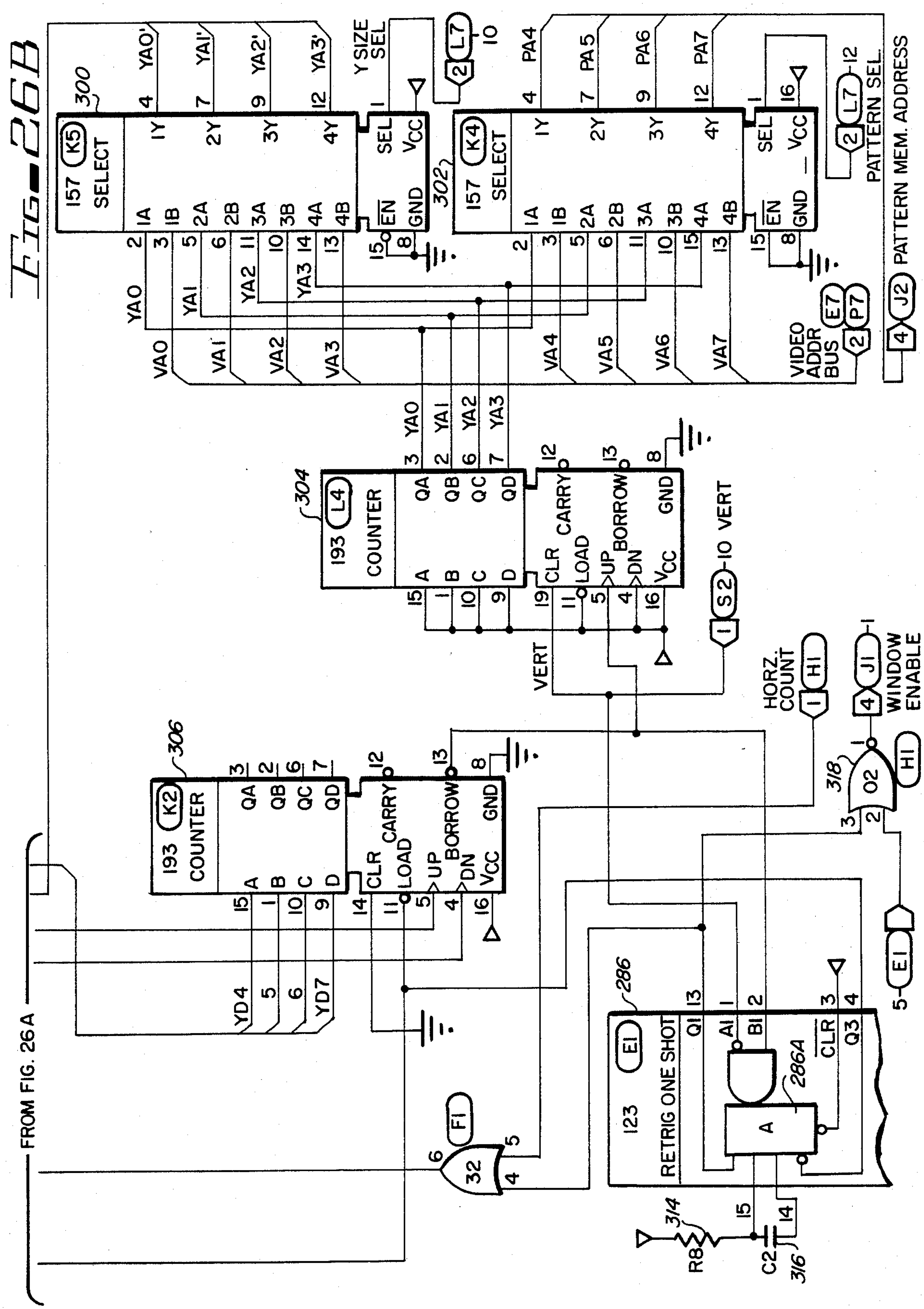

Shown in FIG. 24 is a circuit which functions as the SNAPSHOT RAM 34 described in FIG. 9 above. A 74193 4-bit up counter, IC228, is clocked at its up input pin 5 by the inverted output of a 7420 4-input NAND gate IC230A. The inputs to the NAND gate consist of the COUNT ENABLE signal from the ARMING circuit (pin 9 of IC186), which is applied to input pin 2; the COUNTER clock (CCK) signal from the clocking circuit described in FIG. 20, which is applied to input pin 4; and a SNAP WINDOW signal from PATTERN LOOK UP RAM circuit (IC342 pin 3) applied to input pin 5. Input pin 1 of the NAND gate IC230A is coupled to Vcc. The output, pin 6 of the NAND gate (IC230A, is inverted at input pin 4 by a 7400 2-input NAND gate IC232. The second input pin 5 of NAND gate IC232 is coupled to Vcc. As mentioned above, the output, pin 6 of NAND gate IC232 clocks counter IC228 at pin 5.

The load input, pin 11 of counter IC228, is coupled to the $\overline{\text{VERT}}$ signal from the clocking circuit described in FIG. 20. Pins 4, and 16 of IC228 are coupled to Vcc. Pins 8, 1 9, 10, 15 of IC228 is coupled to ground. Output pin 7 of IC228 is fed back to the clear input pin 14 and to the up clock pin 5 of of a 74193 4-bit up counter IC234. The carry and borrow outputs, pins 12 and 13, respectively, are both left open. Outputs, pins 2, 3 and 6 of IC228, provide 3 lines of input to a 74155 3-line to 1-of-8 line decoder IC236. Output pin 3 of IC228 is coupled to the Sel 2 input pin 13 of IC236. Output pin 2 of IC228 is coupled to the Sel 1 input pin 3 of IC236. Output pin 6 of IC228 is coupled to input pins 1 and 15 (Sel 3) of IC236. Pin 16 of IC236 is coupled to Vcc. Pin 8 of IC236 is coupled to ground. The ST1 and ST2 inputs, pins 2 and 14, respectively, of IC236 are coupled to the output, pin 8, of four-input NAND gate IC230B. The input signals to the NAND gate IC230B are the COUNT ENABLE signal from the ARMING circuit, which is coupled to pin 9; the WINDOW ENABLE signal (SNAP) from bit 7 of the PATTERN GENERATOR, which is applied to pin 10; the MEMORY clock (MCK) from the clocking circuit described above, which is applied to pin 12; and a $\overline{\text{SNAPSHOT}}$ signal from MPU INTERFACE BOARD (IC 418, pin 6), which is coupled to pin 13.

The outputs of the 3-line to 1-of-8 line decoder IC236 are coupled to the R/$\overline{\text{W}}$ inputs of eight 256×1 S201 RAMS. The eight RAMS make up the 256×8 SNAPSHOT MEMORY. Output pin 9 of IC236 is coupled to the R/$\overline{\text{W}}$ input, pin 12 of S201 RM IC238. Pin 10 of IC236 is coupled to pin 12 of S201 RAM IC240. Similarly, pins 11, 12, 7, 6, 5 and 4 of IC236 are coupled to pin 12 of S201 RAMS IC242, IC244, IC246, IC248, IC250 and IC252, respectively.

Four-bit counter IC234 is coupled in series to another 74193 4-bit up counter IC254, so as to perform as an 8-bit up counter. The carry output, pin 12 of IC234, is coupled to the up clock input, pin 5, of IC254. Pins 1, 8, 9, 10, 14 and 15 of IC234 are coupled to ground. Pins 4 and 16 are coupled to Vcc. The load input, pin 11 of IC234, is coupled to the $\overline{\text{VERT}}$ signal from the clocking circuits described above. Similarly, pins 1, 8, 9, 10, 14 and 15 of IC254 are coupled to ground. Pins 4 and 16 of IC254 are coupled to Vcc. The load input, pin 11 of IC254, is clocked by the $\overline{\text{VERT}}$ signal. Both the carry and the borrow outputs, pins 12 and 13 of IC254, respectively, are left open.

The outputs, pins 3, 2, 6 and 7 of both counters IC234 and IC254, are coupled to a first set of inputs, pins 3, 6, 10 and 13, respectively, of two 74157 one-of-two selects IC256 and IC258, respectively. A second set of inputs, pins 2, 5, 11 and 14 of IC256 and IC258, are coupled to the VIDEO ADDRESS BUS from the VIDEO BOARD. The select input, pin 1 of both IC256 and IC258 is coupled to the $\overline{\text{SNAPSHOT}}$ SEL signal from the MPU INTERFACE BOARD (IC418 pin 6). Pins 8 and 15 of both IC256 and IC258 are coupled to ground. Pin 16 of IC256 and IC258 is coupled to Vcc. Thus, counters IC234 and IC254 provide an 8-bit up counter, whose data is routed to one-of-two-selects IC256 and IC258, where either data from the 8-bit up counter or from the 8-bit VIDEO ADDRESS BUS is chosen to be routed to the SNAPSHOT RAMS, IC238 through IC252.

Outputs, pins 4, 7, 9 and 12, of IC256 are coupled to the inputs, pins 1, 2, 15 and 7, respectively, of the SNAPSHOT RAMS IC238 through IC252. Similarly, outputs, pins 4, 7, 9 and 12 of IC258, are coupled to the inputs, pins 9, 10, 11 and 14, respectively, of the SNAPSHOT RAMS IC238 through IC252. Pins 3, 4, 5 and 8 of the SNAPSHOT RAMs IC238 through IC252 are coupled to ground. Pin 16 of IC238 through IC252 is coupled to Vcc.

Data from the FRONT END, in the form of the SNAPSHOT VIDEO ALIGN signal (pin 8 of IC178), is coupled to the data in input, pin 13 of SNAPSHOT RAMS IC238 through IC252. The data from the data out output, pin 6 of the SNAPSHOT RAMS IC238 through IC252, forms 8-lines of data which are buffered by a pair of 6887-8T97 Tri-State Buffers IC260 and IC262. In particular, the output, pin 6 of SNAPSHOT RAMS IC238 and IC240, is coupled to pins 2 and 4, respectively, of IC262. The output, pin 6 of SNAPSHOT RAMS IC242 through IC252, is coupled to pins 14, 12, 10, 6, 4 and 2, respectively, of buffer IC260. Pins 1 and 15 of both buffers IC260 and IC262 are coupled to a SNAP $\overline{\text{R}}$ signal from the MPU INTERFACE BOARD (IC 424 Pin 8). Pin 16 of IC260 and IC262 is coupled to Vcc. Pin 8 of IC260 and IC262 is coupled to ground. Inputs, pins 6, 10, 12, and 14, and outputs, pins 7, 9, 11 and 13 of IC262, are all left open. Outputs, pins 3 and 5 of IC266 and pins 3, 5, 7, 9, 11 and 13 of IC260, are coupled the 8-line VIDEO DATA BUS.

Figure 25:
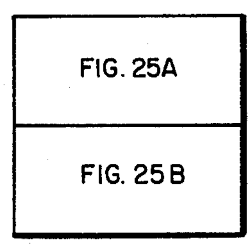
FIGS. 25A and 25B are a diagram of a circuit which functions as the X-SIZE block generator shown in FIG. 11.
Figure 23A:
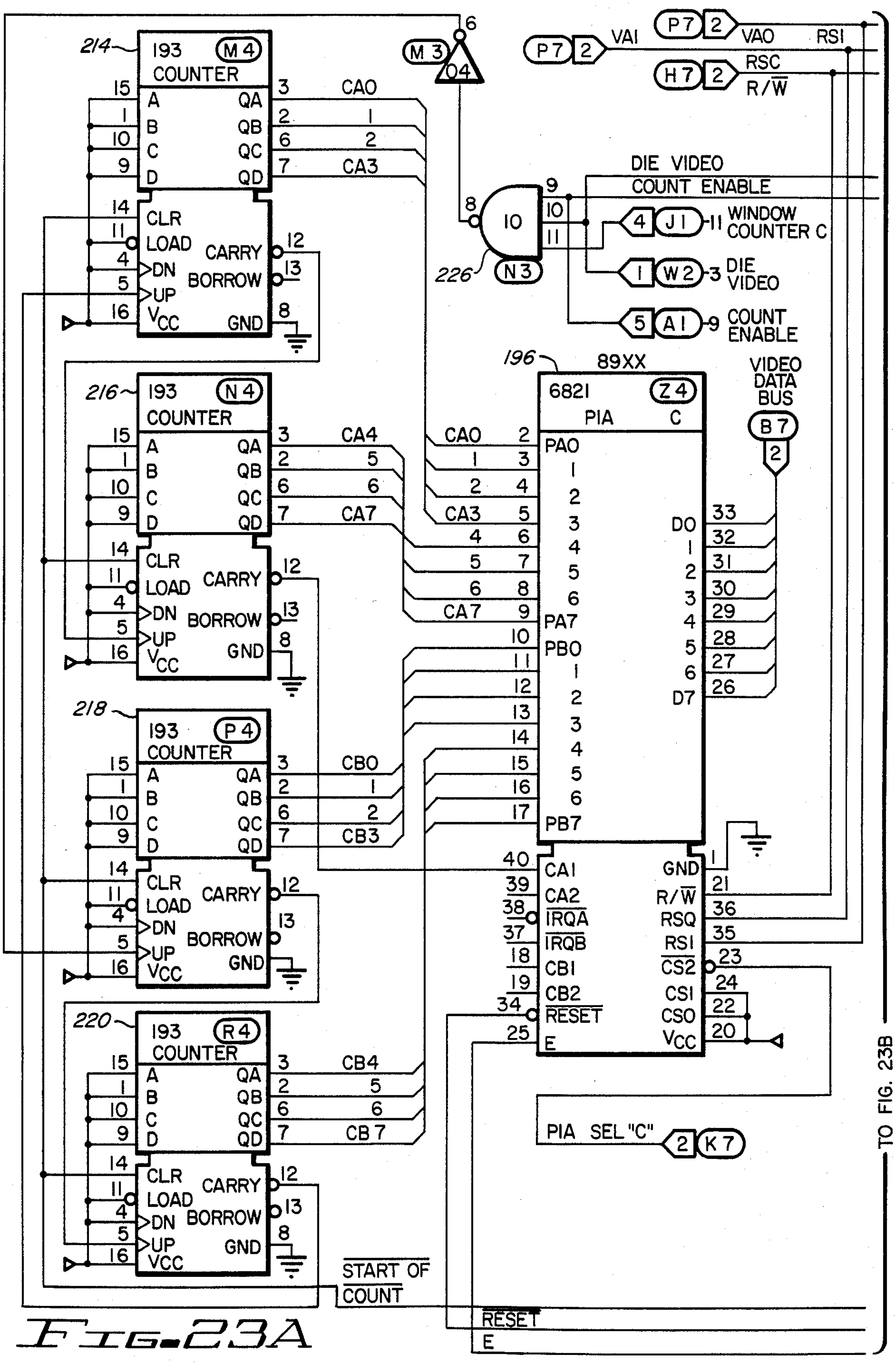
Figure 23B:
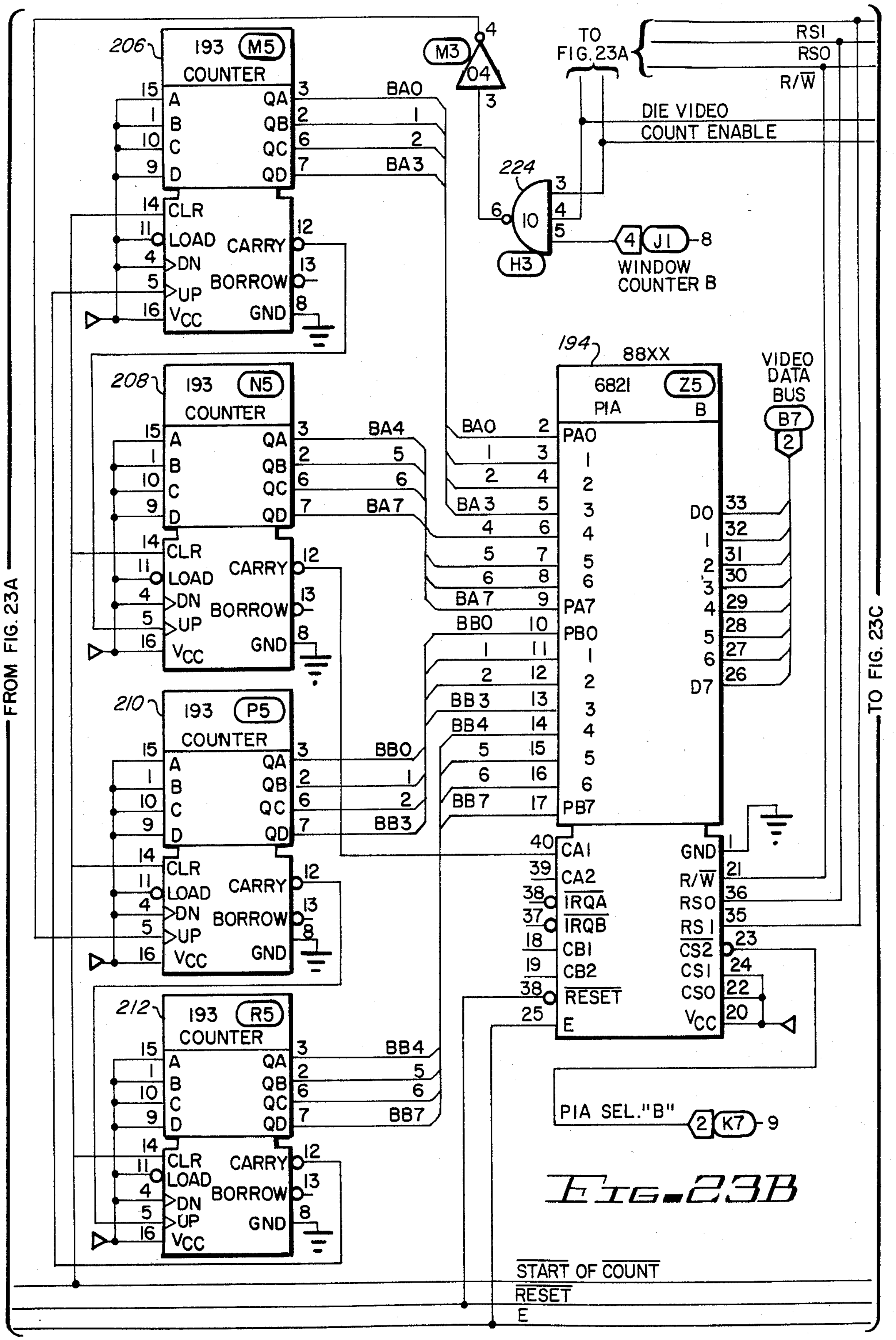
Figure 23C:
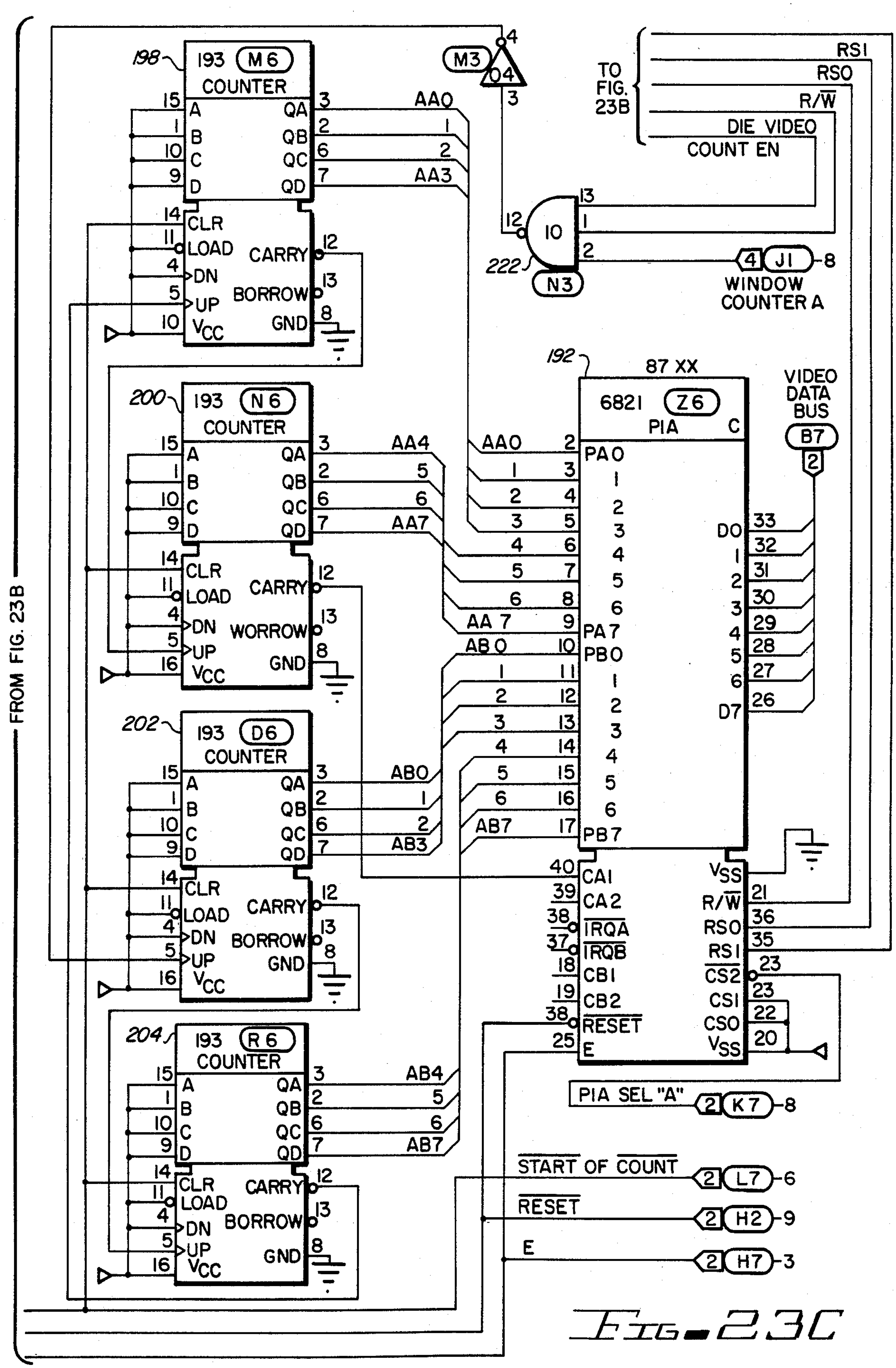

Shown in FIG. 25 is a circuit which functions as the X-SIZE BLOCK GENERATOR described above when referencing FIG. 11. Eight-lines of data, labeled PATTERN MEMORY DATA are coupled to the data in inputs, pins 4, 6, 10 and 12 of two 74S189 16-byte×4-bit RAMS IC268 and IC270. Thus, the two 16-byte×4-bit RAMS function, in combination, as a 16-byte by 8-bit RAM. Each line of a 4-line address is coupled to the RAMS IC268 and IC270 at one of the select pins 1, 15, 14 and 13, respectively. The 4-line address is the output, from pins 4, 7, 9 and 12, of a 74157 one-of-two select IC272. Pins 2 and 8 of IC268 and IC270 are coupled to ground. Pin 16 of IC268 and IC270 is coupled to Vcc. The R/$\overline{\text{W}}$ input, pin 3 of IC268 and IC270, is controlled by the X-SIZE WRITE ENABLE signal from the MPU INTERFACE BOARD (IC 422 pin 3).

One 4-line input to the select IC272 is the VIDEO ADDRESS BUS from the MPU INTERFACE BOARD, which is coupled to IC272 at pins 3, 6, 10 and 13. A second 4-line input to the select IC272, at pins 2, 5, 11 and 14, is the output, pins 3, 2, 6 and 7, respectively, of a 74193 up counter IC274. The select input, pin 1 of IC272, is controlled by a X-SIZE SELECT signal from the MPU INTERFACE BOARD (inverted output of pin 3 IC418). Pin 16 of select IC272 is coupled to Vcc. Pins 8 and 15 of IC272 are coupled to ground.

A second 74157 one-of-two select IC276 also receives as input at pins 3, 6, 10 and 13 the 4-line VIDEO ADDRESS BUS from the MPU INTERFACE BOARD. In addition, select IC276 also receives as the second As with the X-SIZE BLOCK GENERATOR, the inputs at pins 15, 1 10 and 9 of the 4-bit down counters IC306 and IC308 correspond to the outputs of pins 5, 7, 9 and 11, respectively, of the RAMS IC298 and IC296, respectively. Pins 2 and 8 of the RAMS IC296 and IC298 are coupled to ground. Pin 16 of the RAMS IC296 and IC298 is coupled to Vcc.

The 4-lines of output from each of the RAMS IC296 and IC298 are also coupled to the VIDEO DATA BUS through a pair of 74124 quad data buffers IC310 and IC312. In particular, pins 5, 7, 9 and 11 of IC296 are coupled to pins 12,9,5 and 2 of IC310, and pins 5,7, 9 and 11 of IC298 are coupled to pins 12, 9, 5 and 2 of IC312. The 4-line output, pins 11, 8, 6 and 3 from each of the buffers IC310 and IC312, are coupled to the VIDEO DATA BUS. Pin 14 of IC310 and IC312 is coupled to Vcc. Pin 7 of IC310 and IC312 is coupled to ground.

The major differences between the X-SIZE and Y-SIZE BLOCK GENERATORS are the signals which are used to clock and/or control the various chips. In the Y-SIZE BLOCK GENERATOR, a first input, pin 1 to the one shot multivibrator 286A, is the VERT signal from the clock circuit of FIG. 20. The second input, pin 2 of the one shot multivibrator 286A, is the borrow output, pin 13, of the 4-bit down counter IC306 (the output of the functional 8-bit down counter). Pin 3 of one shot multivibrator of 286A is coupled to Vcc. The down clock input to the 4-bit down counter IC308 (the clock input to the functional 8-bit down counter) is coupled to the output, pin 6, of a second 7432 two input OR gate 290B of IC290. The inputs, pins 4 and 5 of OR gate 290B, are coupled to the Q1 output, pin 13, of one shot multivibrator 286A and to the HORZ COUNT signal from the clocking circuit of FIG. 20, respectively. The one-of-two select IC300 is controlled at its select input, pin 1, by a Y-SIZE SEL signal from the MPU INTERFACE BOARD (inverted output of pin 4, IC418). The one-of-two select IC302 is controlled at its select input, pin 1, by a PATTERN SEL signal from the MPU INTERFACE BOARD (invented output, pin 5 of IC418). Both of the Y-SIZE RAMS IC296 and IC298 are controlled at their R/$\overline{W}$ inputs, pin 3, by a Y-SIZE WRITE ($\overline{W}$) signal from the MPU INTERFACE BOARD (IC422 pin 8). The buffers IC310 and IC312 are controlled at the inputs, pins 1, 4, 10 and 13, by a Y-SIZE READ ($\overline{R}$) signal from the MPU INTERFACE BOARD (IC422 pin 11). Finally, a WINDOW ENABLE signal is generated by the output, pin 1, of a 7402 NOR gate IC318. The inputs, pins 2 and 3 to the NOR gate IC318, are Q1 and Q2 outputs, pins 13 and 5, respectively, of the first and second one shot multivibrators of IC286.

Figure 27:
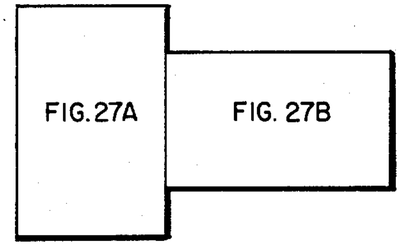
FIGS. 27A–27B are a diagram of a circuit which functions as the PATTERN LOOK UP RAM shown in FIG. 10.
Figure 27A:
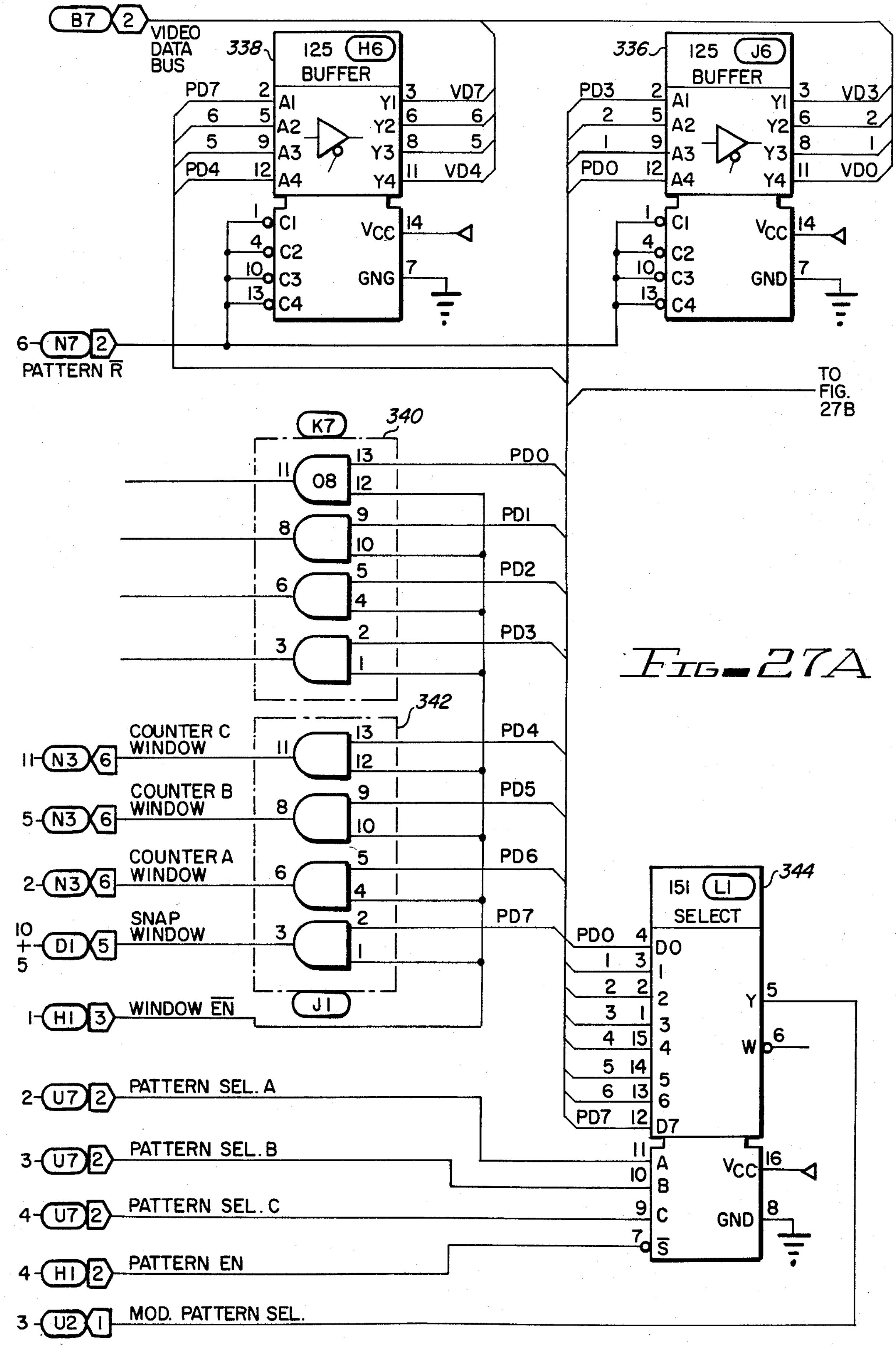
Figure 27B:
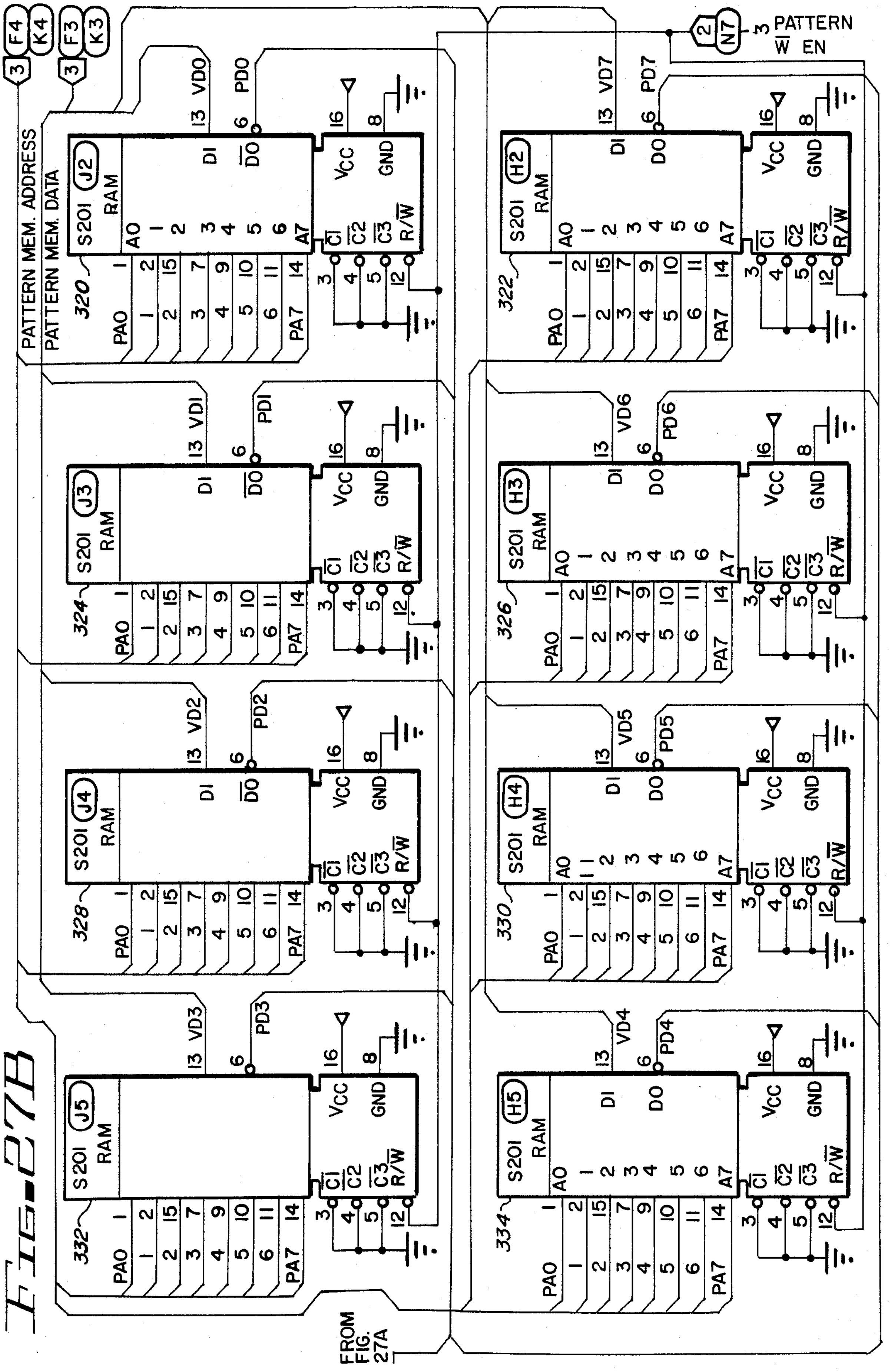
Figure 28A:
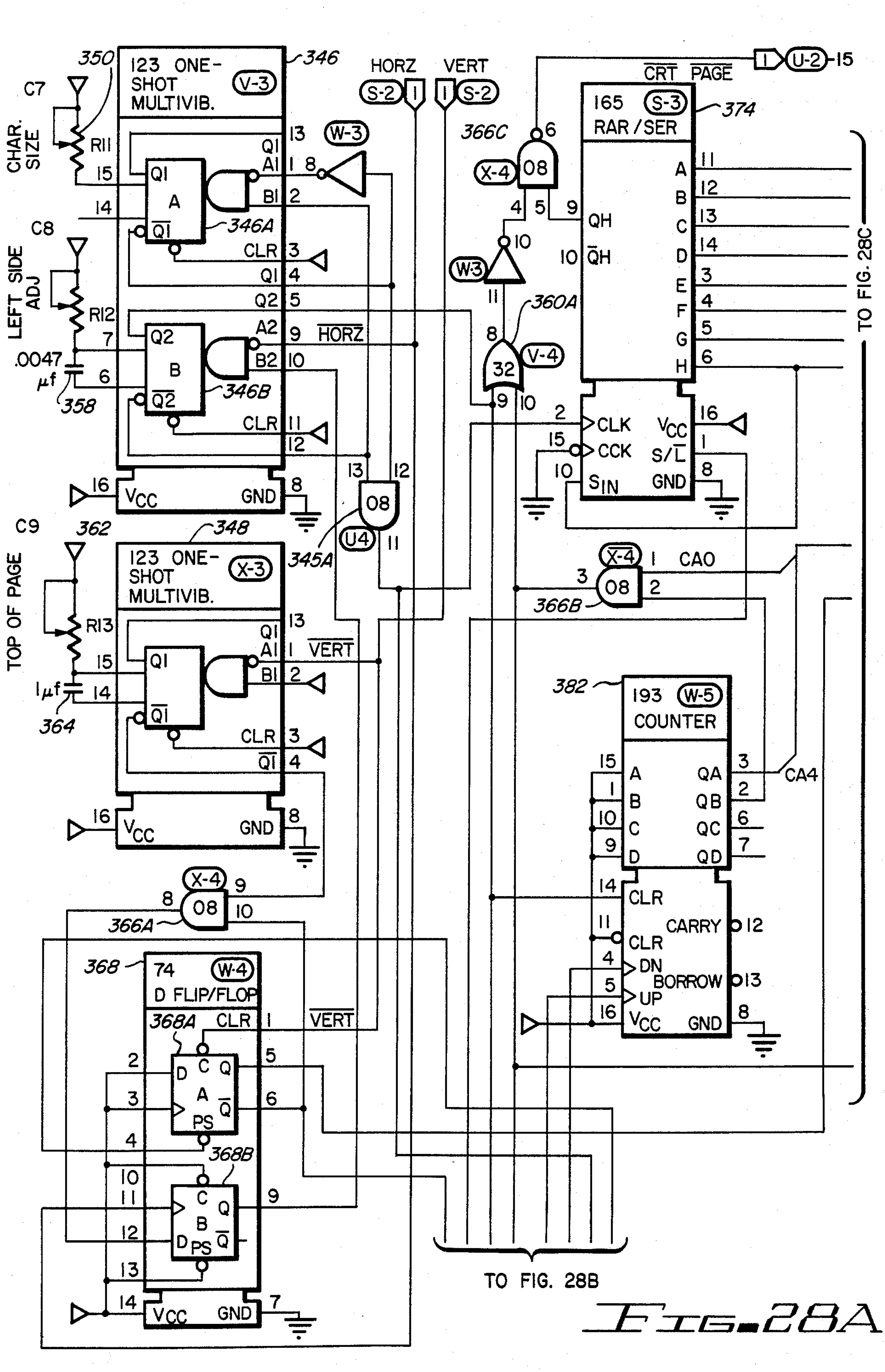
Figure 28B:
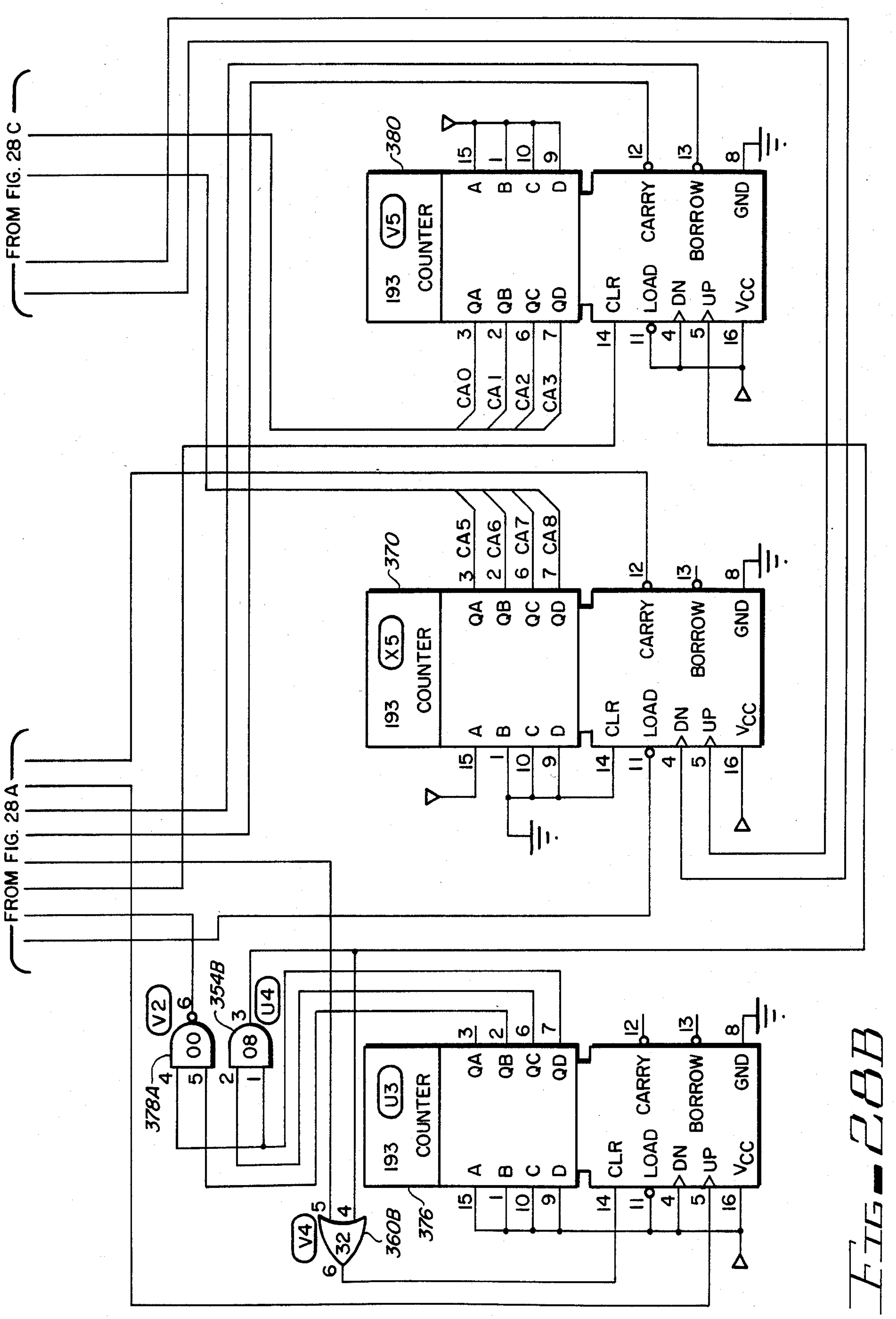
Figure 28C:
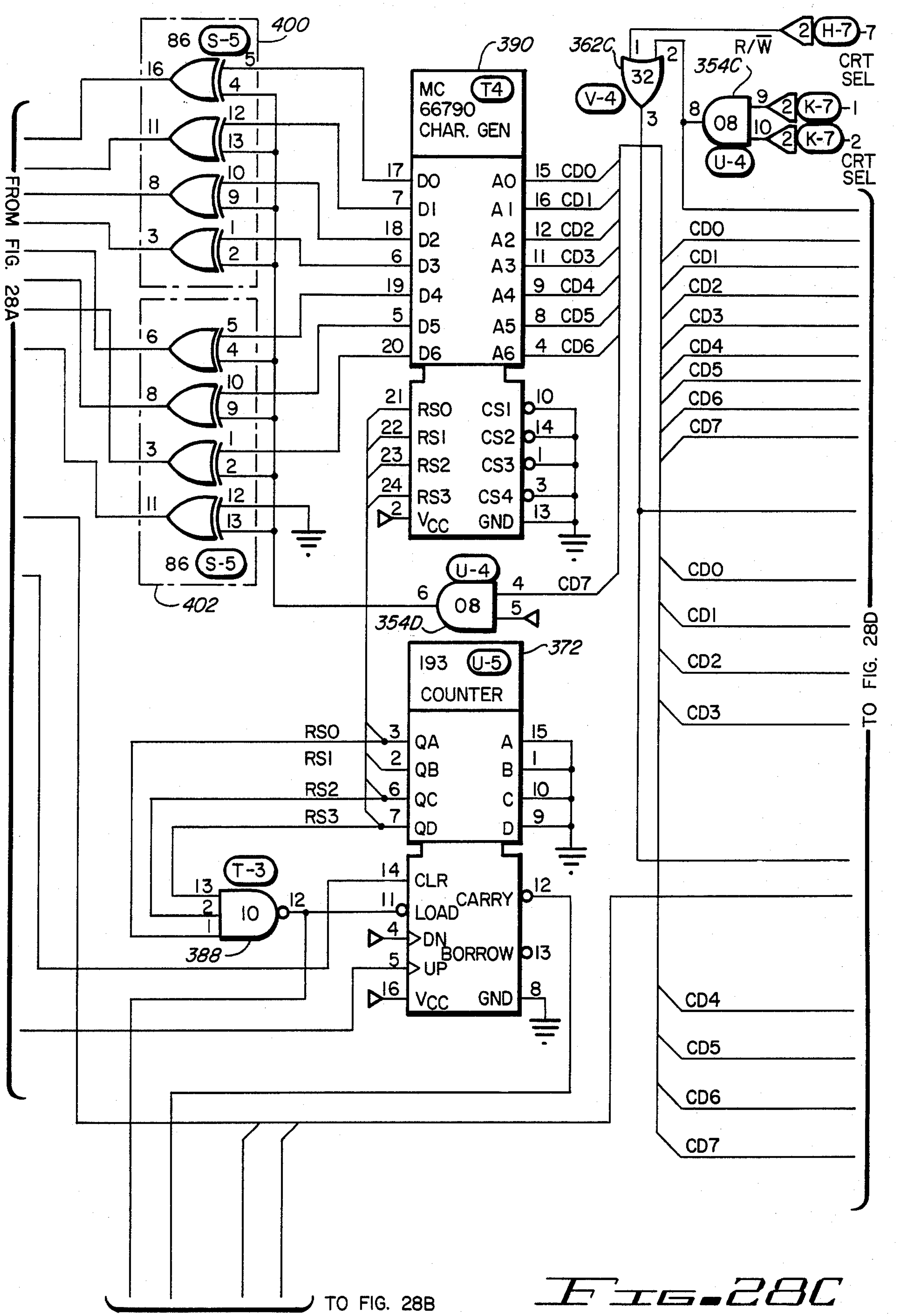
Figure 28D:
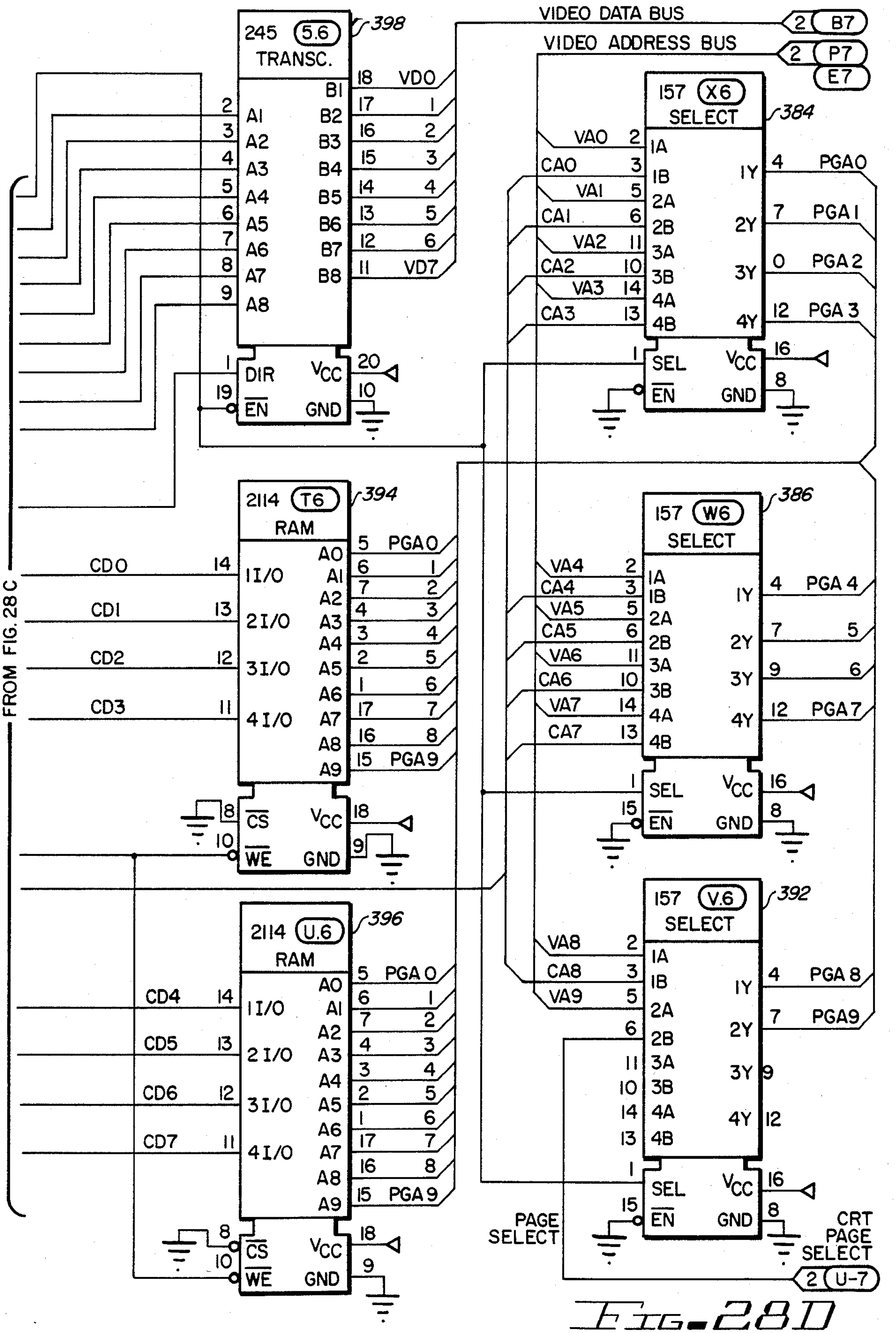

Referring to FIG. 27, a circuit is shown which functions as the PATTERN LOOK UP RAM described above when referencing FIG. 10. As explained above, 8 lines of data are carried on the PATTERN MEMORY ADDRESS, 4 lines from each the X-SIZE and Y-SIZE BLOCK GENERATORS. The 8 lines of data are received at pins 1, 2, 15, 7, 9, 10, 11 and 14 of eight 256-byte×1-bit 74S201 PATTERN LOOK UP RAMS IC320, IC322, IC324, IC326, IC328, IC330, IC332 and IC334. Each of the eight PATTERN LOOK UP RAMS have their R/$\overline{W}$ input, pin 12, controlled by a PATTERN WRITE ENABLE ($\overline{W}$) signal from the MPU INTERFACE BOARD (IC424 pin 3), and thus forms a 256-byte×8-bit memory. The PATTERN WRITE ENABLE signal is normally in the "READ" mode unless the MPU requires access to the PATTERN LOOK UP RAMS.

The MPU accesses the PATTERN LOOK UP RAMS IC320 through IC334 via the 8-line PATTERN MEMORY DATA BUS, one line of which is coupled to each PATTERN LOOK UP RAM at the data in (DI) input, pin 13. Pins 3, 4, 5 and 8 of each PATTERN LOOK UP RAM is coupled to ground. Pin 16 of each PATTERN LOOK UP RAM is coupled to Vcc.

The output, pin 6 of each PATTERN LOOK UP RAM, is combined to form an 8-line data bus. Each of the eight lines of data is buffered by one input of a pair of 74125 quad data buffers IC336 and IC338. Specifically, the output, pin 6 of PATTERN LOOKUP RAMS IC320, IC324, IC328 and IC332, is coupled to inputs, pins 12, 9, 5, and 2, respectively, of IC336. Similarly, the output, pin 6 of PATTERN LOOK UP RAMS IC322, IC326, IC330 and IC334, is coupled to inputs, pins 2, 5, 9 and 12, respectively, of IC338. The outputs, pins 3, 6, 8 and 11 of the buffers IC336 and IC338, form an 8-line VIDEO DATA BUS which transfers data to the MPU through the MPU INTERFACE BOARD. Each buffer IC336 and IC338 is controlled at pins 1, 4, 10 and 13 by a PATTERN READ ($\overline{R}$) signal from the MPU INTERFACE BOARD (IC424 Pin 6). Pins 14 and 7 of each buffer IC336 and IC338 are coupled to Vcc and ground, respectively.

Each line of the 8-line data bus from the eight PATTERN LOOK UP RAMS is coupled to one input of one gate of a pair of 7408 quad two-input AND gate IC340 and IC342. Specifically, the output, pin 6 of IC320, IC324, IC328 and IC332, is coupled to the input, pins 13, 9, 5 and 2, respectively, of IC340. Similarly, the output, pin 6 of IC322, IC326, IC330 and IC334, is coupled to the input, pins 2, 5, 9 and 13, respectively, of IC342. The second input of each AND gate, pins 1, 4, 10 and 12 of IC340 and IC342, is cupled to the WINDOW ENABLE signal from pin 1 of IC318. The outputs, pin 3, 6, 8 and 11 of IC340, are unused. The output, pin 3 of one AND gate of IC342, functions as the SNAP WINDOW signal applied to IC230 of the SNAPSHOT MEMORY. The outputs, pins 6, 8 and 11 of the remaining gates of IC342, function as the COUNT WINDOW A, COUNT WINDOW B and COUNT WINDOW C signals, respectively, which are coupled to the counters in the COUNTER BLOCK. Note that the unused outputs of IC340 could be utilized if more counters are deemed necessary (i.e. if a larger COUNTER BLOCK is used).

The 8-line data bus from the PATTERN LOOK UP RAMS IC320 through IC334 is also coupled to the inputs, pins 4, 3, 2, 1, 12, 13, 14 and 15, of a 74151 eight-to-one select IC344. The select IC344 is controlled at pins 11, 10, 9 and 7 by signals from the CONTROL PIA on the MPU INTERFACE BOARD (IC404). In particular, the signals PATTERN SEL A, PATTERN SEL B, PATTERN SEL C, and PATTERN ENABLE are coupled to pins 11, 10, 9 and 7, respectively. Pin 16 of IC344 is coupled to Vcc. Pin 8 of IC344 is coupled to ground. The output, pin 6, is left open. The output, pin 5, represents the MOD PATTERN SEL signal which is input to AND gate 184C at PIN 10 of IC184 in the FRONT END.

Figure 28:
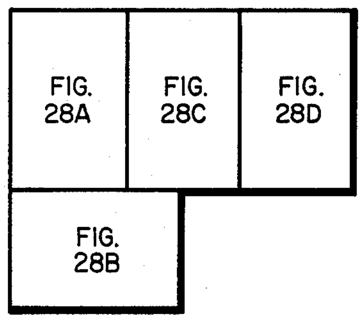
FIGS. 28A–28D are a diagram of a circuit which functions as the CHARACTER GENERATOR circuit shown in FIG. 4.

Referring to FIG. 28, a circuit is shown which functions as the CHARACTER GENERATOR circuit 46 described above in FIG. 4. The CHARACTER GENERATOR circuit 46 produces the alpha numerics which are input to AND gate 184D at pin 1 of IC184 in 4-line input, at pins 2, 5, 11, and 14, the output from pins 3, 2, 6 and 7, respectively, of counter IC274. The select input, pin 1 of IC276, is controlled by a PATTERN SELECT signal from the MPU INTERFACE BOARD (the inverted output of pin 5, IC418). Pin 16 of select IC276 is coupled to Vcc. Pins 8 and 15 of IC276 are coupled to ground. The 4-line output, pins 4, 7, 9 and 12 of select IC276, is coupled to the PATTERN LOOK-UP RAM described below and is labeled the PATTERN MEMORY ADDRESS. Thus, either the 4-line output of the 4-bit up counter IC274 or the 4-line VIDEO ADDRESS BUS can be selected to be routed to the X-SIZE RAMS IC268 and IC270 and to PATTERN LOOKUP RAM. When the select input i.e., pin 1 of IC272, is low, the 4-line input from counter IC274 is routed to RAMS IC268 and IC270. When the select input is high, the VIDEO ADDRESS BUS is routed to RAMS IC268 and IC270.

Pins 1, 4, 9, 10, 11, 15 and 16 of counter IC274 are coupled to Vcc. Pin 8 of IC274 is coupled to ground. The carry and borrow outputs, pins 12 and 13, respectively, are left open. The clear input, pin 14 of counter IC274, is controlled by the HORZ COUNT signal from the clocking circuit described above.

The 4-bit output, pins 5, 7, 9 and 11 of RAM IC268, is coupled to pins 12, 9, 5 and 2, respectively, of a 74125 data line buffer IC278 and to pins 15, 1, 10 and 9 of a 74193 4-bit down counter IC280. Similarly, the 4-bit output, pins 5, 7, 9 and 11 of RAM IC270, is coupled to pins 12, 9, 5 and 2, respectively, of a 74125 data line buffer IC282 and to pins 15, 1, 10 and 9 of a 74193 4-bit down counter IC284. Inputs, pins 1, 4, 10 and 13 of buffers IC278 and IC282, are coupled to the X-SIZE READ ENABLE signal from the MPU INTERFACE BOARD (IC 422 Pin 6). Pin 14 of both IC278 and IC282 is coupled to Vcc. Pin 7 of IC278 and IC282 is coupled to ground.

Counters IC280 and IC284 are coupled together so as to function as an 8-bit down counter. The carry output, pin 12 of IC280, is coupled to the up clock input, pin 5, of IC284. The borrow output, pin 13 of IC280, is coupled to the down clock input, pin 4, of IC284. Pin 14 of IC280 and IC284 is coupled to ground. Pin 8 of IC280 and IC284 is coupled to ground. Pins 5 and 16 of IC280 and pin 16 of IC284 are coupled to Vcc. Outputs, pins 2, 3, 6 and 7 of IC280 and IC284, are left open. Both counters IC280 and IC284 are loaded at pin 11 by the Q2 output, pin 12, of the one shot multivibrator 286B of a 74123 dual retrigerable one shot multivibrator IC286. The carry output, pin 12 of IC284, is left open. The borrow output, pin 13 of IC284, serves as one of the inputs, at pin 10, of the one shot multivibrator 286B and as the input to the up clock, pin 5, of the 4-bit up counter IC274.

The second input, pin 9 of the one shot multivibrator 286B, is the HORZ COUNT signal from the clock circuit described above. Pins 11 and 16 of one shot multivibrator 286B are coupled to Vcc. Pin 7 of IC286 is coupled to Vcc through a resistor 288. Output Q2, pin 5 of one shot multivibrator 286B is coupled to a first input, pin 2, of a 7432 two-input OR gate IC290A. The second input, pin 1 of OR gate IC290A is the COUNTER clock (CCK) from the clock circuit described above. The output, pin 3 of the OR gate IC290A, is coupled to the down clock input, pin 4, of 4-bit up counter IC280.

Figure 26:
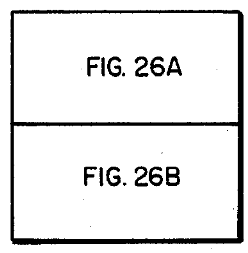
FIGS. 26A–26B are a diagram of a circuit which functions as the Y-SIZE BLOCK GENERATOR shown in FIG. 12.

The 4-lines of data from pins 3, 6, 8 and 11 of each of the buffers IC278 and IC282 forms an 8-line data bus called the VIDEO DATA BUS. The VIDEO DATA BUS is coupled to the MPU INTERFACE BOARD. In addition, the 8-line VIDEO DATA BUS is inverted by two 7404 inverters IC292 and IC294 (FIG. 26). Specifically, 4-lines of data are inverted by IC292 at input pins 11, 9, 5 and 3. Similarly, 4-lines of data are inverted by IC294 at input pins 11, 9, 5 and 3. The output of inverters IC292 and IC294, pins 10, 8, 6 and 4, is coupled to the 8-line PATTERN MEMORY DATA which is input to X-SIZE RAMS IC268 and IC270. Thus, the microprocessor, which is accessed thru the VIDEO DATA BUS from the MPU INTERFACE BOARD, can either read or write data sent through the X-SIZE RAMS IC268 and IC270.

Shown in FIG. 26 is a circuit which functions as the Y-SIZE BLOCK GENERATOR which was described above in reference to FIG. 12. The circuit for the Y-SIZE BLOCK GENERATOR is almost identical to that of the X-SIZE BLOCK GENERATOR described above and shown in FIG. 25. Two 74S189 16-byte×4-bit RAMS IC296 and IC298 are connected so as to form the required 16-byte×8-bit Y-SIZE RAM. Data is received from the 8-line PATTERN MEMORY DATA LINE at inputs 4, 6, 10 and 12 of the RAMS IC296 and IC298. As explained above, the VIDEO DATA BUS accesses the PATTERN MEMORY DATA LINE through inverters IC292 and IC294.

The addresses, pins 1,15,14 and 13 of the RAMS IC296 and IC298, are controlled by the output, pins 4, 7, 9 and 12, respectively, of a 74157 one-of-two select IC300. As with the X-SIZE BLOCK GENERATOR above, the 4-line output, pins 4, 7, 9 and 12 of a second 74157 one-of-two select IC302, is received by the PATTERN LOOK UP RAM CIRCUIT. Thus, the outputs of select IC276 and select IC302 form an 8-line PATTERN MEMORY ADDRESS, with the output of IC302 providing the most significant digits and IC276 providing the least significant digits.

One set of inputs, to pins 3, 6, 10 and 13 of both selects IC300 and IC302, is a 4-line VIDEO ADDRESS BUS from the MPU INTERFACE BOARD. The other set of inputs, to pins 2, 5, 11 and 14 of both selects IC300 and IC302, is the output from pins 3, 2, 6 and 7, respectively, of a 74193 4-bit up counter IC304. Pins 15 and 8 of IC300 and IC302 are coupled to ground. Pin 16 of both IC300 and IC302 is coupled to Vcc. Pins 1, 4, 9, 10, 11, 15 and 16 of IC304 are connected to Vcc. The counter IC304 is cleared at pin 14 by the VERT signal from the clock circuit described above. Pin 8 of IC304 is coupled to ground, while pins 12 and 13 remain open. Counter IC304 is clocked at its up clock input pin 5 by the borrow output, pin 13, of a 74193 4-bit counter IC306. The 4-bit counter IC306 is connected to a second 74193 4-bit counter IC308 so as to form an 8-bit down counter. Thus, the carry output, pin 12 of counter IC308, is coupled to the up clock input, pin 5, of counter IC306; the borrow output, pin 13 of IC308, is coupled to the down clock input, pin 4, of IC306. The carry output, pin 12 of IC306, is left open. Outputs, pins 2, 3, 6 and 7 of both counters IC306 and IC308 are left open. Pins 8 and 14 of both counters IC306 and IC308 are coupled to ground. Pins 5 and 16 of IC308 and pin 16 of IC306 are coupled to Vcc. The two counters, IC306 and IC308, are loaded at pin 11 by a Q1 output from pin 4 of the one shot 286A of the 74123 dual one shot multivibrator IC286. Pin 15 of one shot multivibrator 286A is coupled to Vcc through a 5.1 Kohm resistor 314 and to pin 14 through a 200 pf capacitor 316.

the FRONT END. Two 74123 dual one shot multivibrators IC346 and IC348 provide the timing necessary to clock the various portions of the CHARACTER GENERATOR circuit.

The first one shot multivibrators 346A of IC346 sets up the timing which controls the size of the characters. Pin 15 of the one shot multivibrator 346A is coupled to Vcc through a 20 Kohm adjustable resistor 350. Pin 14 of one shot multivibrator 346A is open. The clear input, pin 3 of the one shot multivibrator 346A, is coupled to Vcc. The Q1 output, pin 13 of the one shot multivibrator 346A, is left open. The Q1 output, pin 4 of the one shot multivibrator 346A, is coupled to the first input, pin 12, of one AND gate IC354A of a 7408 quad two-input AND gate. The Q1 outputs, pin 4 of one shot multivibrator 346A, is also inverted and fed back to its A1 input, pin 1.

The second one-shot multivibrator 346B of IC346 sets up the timing which controls the distance from the left side of the CRT before characters will appear. Pin 7 of one shot multivibrator 346B is coupled to Vcc through a 20 Kohm adjustable resistor 356 and to pin 6 of one-shot multivibrator 346B through a 0.0047 uf capacitor 358. The clear input, pin 11 of one-shot multivibrator 346B, is coupled to Vcc. The Q2 output of one-shot multivibrator 346B, pin 12, is coupled to the B1 input, pin 2, of one-shot multivibrator 346A. The A2 input, pin 9 of one-shot multivibrator 346B, is coupled to the signal $\overline{HORZ}$ from the clock circuit described when referencing FIG. 20. The Q2 output, pin 5 of one-shot multivibrator 346B, is coupled to a first input, pin 9, of one OR gate IC360A of a 7432 quad two-input OR gate. Pin 8 of IC346 is coupled to ground. Pin 16 of IC346 is coupled to Vcc.

The third one shot multivibrator IC348 sets up the timing which controls the vertical delay at the top of the CRT. Thus, IC348 controls how far from the top of CRT the first line is displayed. Pin 15 of IC348 is coupled to Vcc through an adjustable 20 Kohm resistor 362, and to pin 14 through a 1 uf capacitor 364. The Q1 output, pin 13 of IC348, is left open. Inputs, pins 2 and 3, and pin 16, of IC348 are coupled to Vcc. Pin 8 of IC348 is coupled to ground. Input, pin 1 of IC348, is coupled to the $\overline{VERT}$ signal generated by the clock circuit described above. The Q1 output, pin 4 of IC348, is coupled to the first input, pin 9, of one AND gate 366A of a 7408 quad two-input AND gate.

The $\overline{VERT}$ signal is also coupled to the clear input, pin 1, of the first flip/flop 368A of a 7474 dual D flip/flop IC368. Pins 2 and 3 of flip/flop 368A, pins 10 and 13 of the second flip/flop 368B of IC368, and pin 14 of IC368 are coupled to Vcc. Pin 7 of IC368 is coupled to ground. The $\overline{Q}$ output of flip/flop 368A pin 6 is coupled to the second input, pin 10 of AND gate IC366A, and to the load input, pin 11 of a 74193 counter IC370. The output, pin 8 of AND gate IC366A, is coupled to the D input, pin 12, of flip/flop 368B. The second input, pin 11 of flip/flop 368B, is coupled to the $\overline{HORZ}$ signal from the clock circuit. The Q output, pin 9 of flip/flop 368B, is coupled to the B2 input, pin 10, of the horizontal delay one-shot multivibrator 346B of IC346. The Q output, pin 5 of flip/flop 368A, is coupled to the clear input, pin 14, of 74193 counter IC372. The carry output, pin 12 of counter IC370, is coupled to pin 4 of flip/flop 368A.

The output, pin 11 of AND gate 354A, is coupled to the clock input, pin 2 of a 74165 parallel to serial shift register IC374, and to the up clock, pin 5, of a 74193 counter IC376. Pins 1, 4, 9, 10, 11, 15 and 16 of IC376 are coupled to Vcc. Pin 8 of IC376 is coupled to ground. Pins 3, 12 and 13 of IC376 are left open. Output, pin 2 of counter IC376, is coupled to an input, pin 5, of a first NAND gate 378A of a 7400 quad two-input NAND gate. Output, pin 6 of counter IC376, is coupled to a first input, pin 2, of an AND gate 354B. Output, pin 7 of IC376, is coupled to the second input, pin 1 of IC354B, and to the second input, pin 4, of IC378A. The output, pin 6 of NAND gate IC378A, is coupled to pin 1 of register IC374 and serves to load (when low) and shift (when high) a character. The output, pin 3 of AND gate IC354B, is coupled to the up clock input, pin 5 of a 74193 counter IC380, and to a first input, pin 4, of 7432 OR gate IC360B. The clear input, pin 14 of counter IC376, is coupled to the output, pin 6, of OR gate IC360B.

The Q2 output, pin 5 of one shot multivibrator 346B is also coupled to the clear input, pin 14, of two 74193 counters IC380 and IC382.

Pins 1, 9, 10, 11, 15 and 16 of counter IC382 are coupled to Vcc. Pin 8 of IC382 is coupled to ground. Outputs, pins 6, 7, and carry and borrow outputs pins 12 and 13, respectively, of IC382 are left open. The down clock input, pin 4, is coupled to the borrow output, pin 13, of counter IC380. The up clock input, pin 5 of IC382, is coupled to the carry output, pin 12, of IC380.

Pins 1, 4, 9, 10, 11, 15 and 16 of IC380 are coupled to Vcc. Pin 8 of IC380 is coupled to ground. The output, pins 3, 2, 6 and 7, of IC380, is coupled to one set of inputs, pins 3, 6, 10 and 13, respectively, of a 74157 one-of-two select IC384. In addition, the output, pin 3 of counter IC380, is coupled to the input, pin 1, of 7408 two-input AND gate IC366B. A second input to AND gate IC366B, at pin 2, is an output, pin 2, from counter IC382. The output, pin 3 of IC382, is coupled to one input, pin 3, of a first set of inputs to a 74157 one-of-two select IC386. The output, pin 3 of AND gate IC366B, is coupled to the second input, pin 5, of OR gate 360B, to the up clock input, pin 5 of counter IC372, and to the second input, pin 10, of OR gate IC36ØA.

Pins 4 and 16 of counter IC372 are coupled to Vcc. Pins 1, 8, 9, 10 and 15 of IC372 are coupled to ground. Output, pins 3, 6 and 7 of IC372, are coupled to inputs 1, 2 and 13, respectively, of a 7410 three-input NAND gate IC388. In addition, the outputs, pins 3, 2, 6 and 7 of IC372, are coupled to inputs, pins 21, 22, 23 and 24, respectively, of a MC66790 character generator IC390. The output, pin 12 of NAND gate IC388, is coupled to the LOAD input, pin 11 of IC372, and to the up clock input, pin 5, of counter IC370. The borrow output, pin 13 of IC372, is left open. The carry output, pin 12 of IC372, is coupled to the down clock input, pin 4, of IC370.

Pins 1, 8, 9, 10 and 14 of IC370 are coupled to ground. Pins 15 and 16 of IC370 are coupled to Vcc. The borrow output, pin 13 of IC370, is left open. Output, pins 3, 2 and 6 of counter IC370 are coupled to the remaining inputs, pins 6, 10 and 13, respectively, of the first set of inputs to the one-of-two select IC386. The final output, pin 7 of IC370, is coupled to input, pin 3, of a 74157 one-of-two select IC392.

The second set of inputs to the one-of-two selects IC384, IC386 and IC392 is a 10-line VIDEO ADDRESS BUS from the MPU INTERFACE BOARD. Specifically, the 10-line VIDEO ADDRESS BUS is coupled to inputs, pins 2, 5, 11 and 14 of selects IC384 and IC386, and to pins 2 and 5 of select IC392. Pins 15 and 8 of selects IC384, IC386, and IC392 are coupled to ground. Pin 16 of selects IC384, IC386 and IC392 is coupled to Vcc. The select input, pin 1 of selects IC384, IC386 and IC392, is coupled to the output, pin 8, of 7408 two-input AND gate IC354C.

The outputs, pins 4, 7, 9 and 12 of selects IC384 and IC386, and pins 4 and 7 of select IC392, provide the address input to two MM2114 1K×4 RAMS IC394 and IC396. The RAMS IC394 and IC396 cooperate so as to provide a 1K×8-bit RAM. Specifically, outputs, pins 4, 7, 9 and 12 of select IC384, are coupled to pins 5, 6, 7 and 4, respectively, of RAMS IC394 and IC396. Outputs, pins 4, 7, 9 and 12 of select IC386 are coupled to pins 3, 2, 1 and 17, respectively, of RAMS IC394 and IC396. Finally, outputs, pins 4 and 7 of IC392, are coupled to pins 16 and 15, respectively, of RAMS IC394 and IC396. Outputs, pins 9 and 12 of IC392, are left open. Input, pin 6 of IC392, is coupled to a PAGE SELECT signal from MPU INTERFACE BOARD (IC406 Pin 14). Inputs, pins 10, 11, 13 and 14 of IC392, are also left open. The input/output pins of RAMS IC394 and IC396, pins 14, 13, 12 and 11, are coupled to pins 2 through 9 of a 74LS245 transceiver IC398. Pins 8 and 9 of RAMS IC394 and IC396 are coupled to ground. Pin 18 of IC394 and IC396 is coupled to Vcc. The data through RAMS IC394 and IC396 are write enabled at pin 10 by the output, pin 3, of a 7432 OR gate IC362C.

The output of OR gate IC362C is also coupled to the direction input, pin 1, of transceiver IC398. The transceiver IC98 is enabled at pin 19 by the output, pin 8, of AND gate IC354C. The output of AND gate IC354C is also coupled to the input, pin 2, of OR gate IC362C to pin 19 of transceiver IC398, and to pin 1 of selects IC384, IC386 and IC392. Pin 20 of IC398 is coupled to Vcc. Pin 10 of IC398 is coupled to ground. The second set of data pins of the transceiver IC398, pins 11 through 18, are coupled to an 8-line VIDEO DATA BUS from the MPU INTERFACE BOARD. The other input of IC362C, pin 1, is coupled to the READ/$\overline{\text{WRITE}}$ signal from the MPU INTERFACE BOARD (IC416 Pin 7). The two inputs to AND gate IC354C are coupled to separate CRT SELECT signals, from the MPU INTERFACE BOARD, (IC418 Pins 1, 2).

Pins 14, 13, 12 and 11 of RAM IC394, and RAM IC396 are coupled to pins 15, 16, 12, 11, 9, 8 and 4, respectively, of character generator IC390. Pin 11 of RAM IC396 is coupled to the input, pin 4, of a 7408 two-input AND gate IC354D. The other input of IC354D, pin 5, is coupled to Vcc. The output of AND gate IC354D, pin 6, is coupled to the inputs, pins 4, 13, 9 and 2, of two 7486 quad exclusive OR gates IC400 and IC402. Pins 1, 3, 10, 13 and 14 of IC390 are coupled to ground. Pin 2 of IC390 is coupled to Vcc. The outputs, pins 17, 7, 18 and 6 of IC390, are coupled to the inputs, pins 5, 12, 10 and 1, respectively, of quad exclusive OR gates IC400. The outputs, pins 19, 5 and 20 of IC390, are coupled to the inputs, pins 5, 10 and 1, respectively, of three of the four exclusive OR gates of IC402. The input, pin 12 of IC402, is coupled to GND.

The outputs, pins 6, 11, 8 and 3 of IC400, are coupled to the inputs, pins 11, 12, 13 and 14 of the Parallel-to-Serial register IC374. The outputs, pins 6, 8, 3 and 11 of IC402, are coupled to the inputs, pins 3, 4, 5 and 6, of IC374. In addition, pin 11 of IC402 is coupled to the serial in input, pin 10, of IC374. Pin 16 of IC374 is coupled to Vcc. Pins 8 and 15 of IC374 are coupled to ground. The output of register IC374, pin 9, is coupled to the input, pin 5, of 7408 and gate IC366C. The other input of AND gate IC366C, pin 4, is coupled to the inverted output of OR gate IC360A, pin 8. The output of AND gate IC366C, pin 6, is the $\overline{\text{CRT}}$ $\overline{\text{PAGE}}$ signal which is input to AND gate 184D, pin 1 of the any-of-four IC184 in the FRONT END.

Figure 29B:
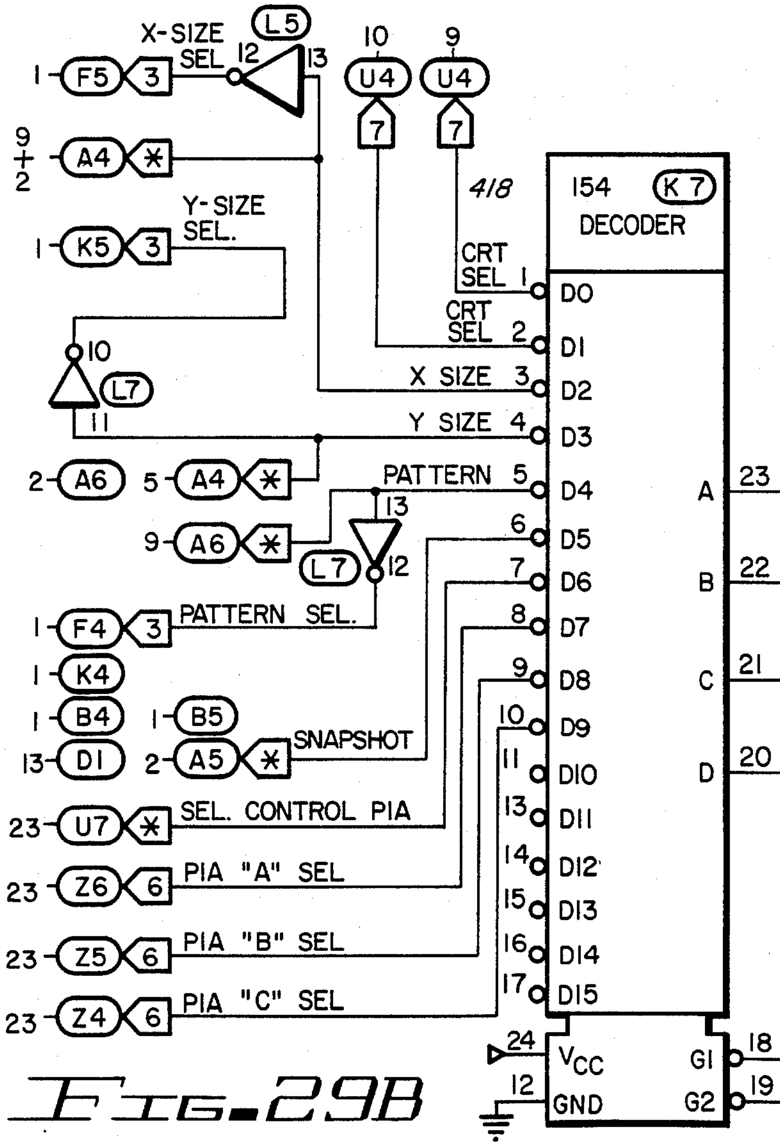
Figure 29A:
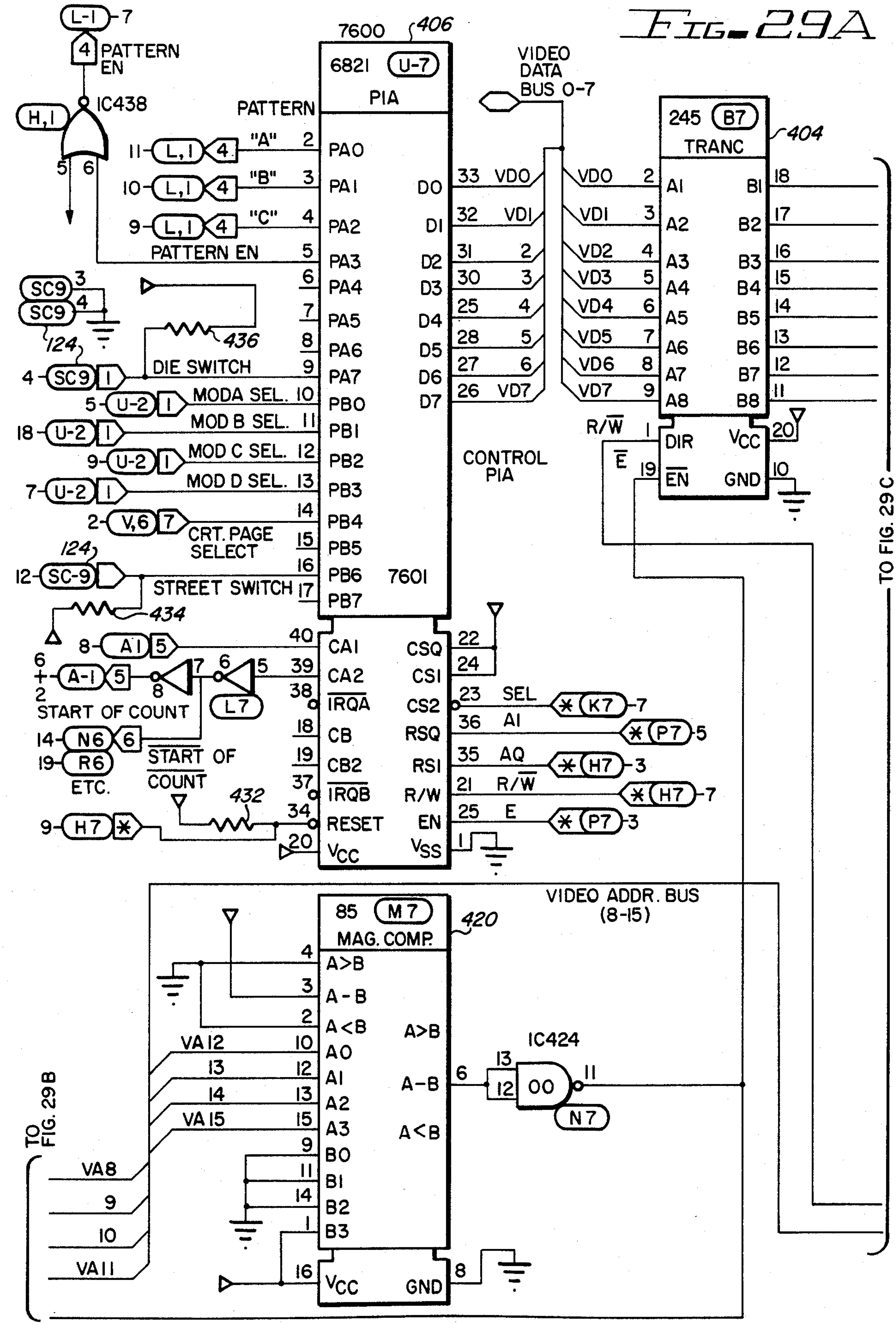
Figure 29C:
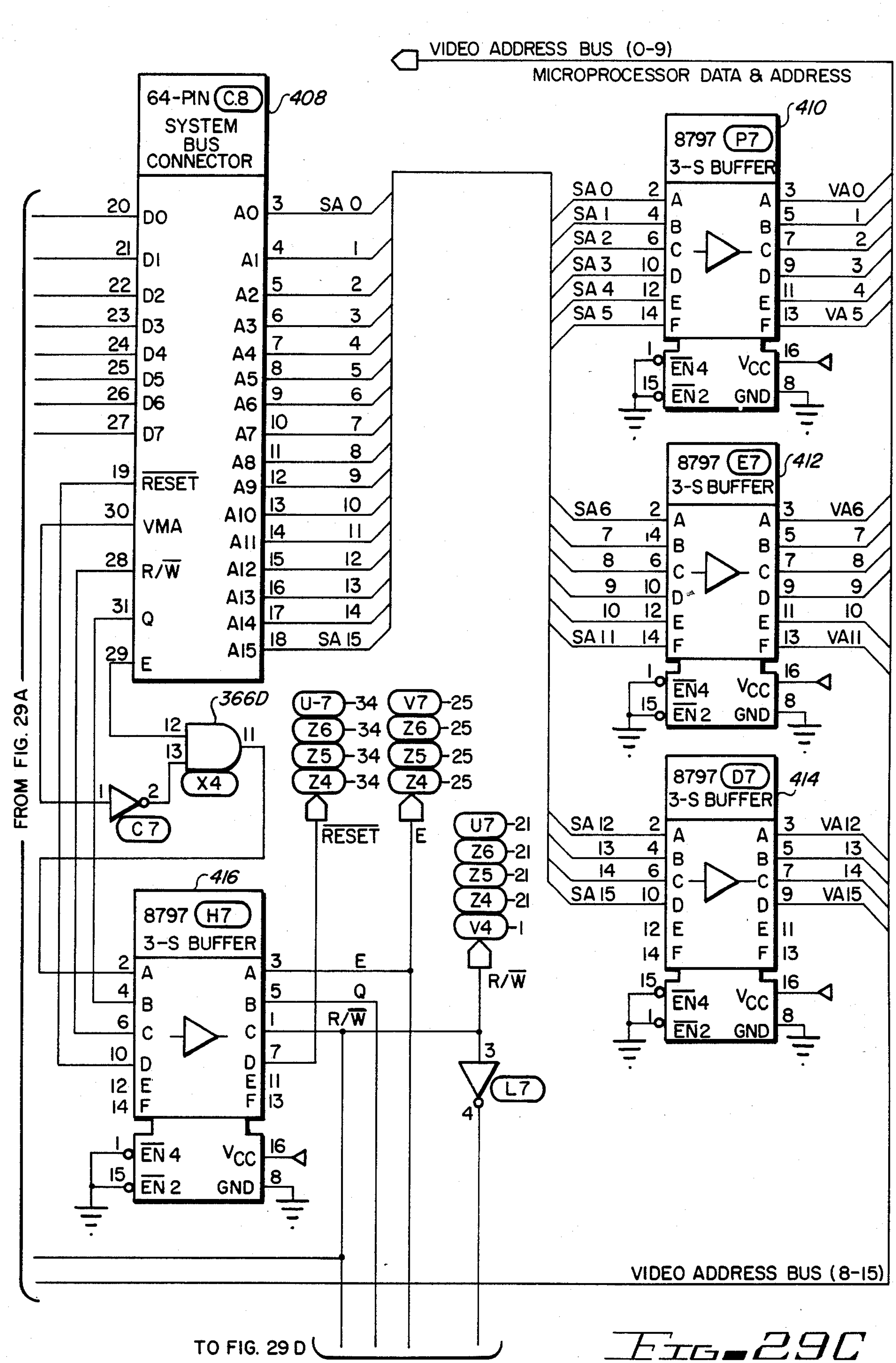

Shown in FIG. 29 is the MPU INTERFACE BOARD which allows the system's MPU to access the previously referenced circuits. The 8-line VIDEO DATA BUS originates from pins 2 through 9 of a 74LS245 transceiver IC404, and goes to pins 33 through 26 of a MC6821 PIA IC406. Pins 18 through 11 of transceiver IC404 are coupled to pins 20 through 27, respectively, of a 64 pin microprocessor system bus connector 408. Pin 20 of IC404 is coupled to Vcc. Pin 10 of IC404 is coupled to ground. Pins 3 through 18 of connector 408 form a 16-line address bus. Six lines of the address bus, pins 3 through 8 of connector 408, are connected to pins 2, 4, 6, 10, 12 and 14, respectively, of an 8T97 tri-state buffer IC410. Similarly, pins 9 through 14 of connector IC408 are connected to pins 2, 4, 6, 10, 12 and 14, respectively, of another 8T97 tri-state buffer IC412. Pins 15 through 18 of 408 are coupled to pins 2, 4, 6 and 10, respectively, of a third 8T97 tri-state buffer IC414. Pin 19 of connector 408 represents a $\overline{\text{RESET}}$ signal which is coupled to pin 10 of a fourth 8T97 tri-state buffer IC416. Pin 28 of 408 represents the READ/$\overline{\text{WRITE}}$ (R/$\overline{\text{W}}$) signal which is input into pin 6 of buffer IC416. Pin 29 of 408 is coupled to pin 12, the input of a 7408 AND gate IC366D. Pin 30 of 408 is inverted and coupled to pin 13, the second input of AND gate IC366D. The output, pin 11, of AND gate IC366D represents an enable clock (E) signal which is coupled to pin 2 of buffer IC416. Pin 31 of 408 represents a Q signal which is coupled to pin 4 of buffer IC416.

The output of buffer IC410, pins 3, 5, 7, 9, 11 and 13, form 6 lines of the 10-line VIDEO ADDRESS BUS. Part of the output of IC412, pins 3, 5, 7 and 9, provides the remaining 4 lines that constitute the VIDEO ADDRESS BUS. Pins 7, 9, 11 and 13 of buffer IC412 are coupled to pins 23, 22, 21 and 20 of a 74154 decoder IC418. Pins 3, 5, 7 and 9 of buffer IC414 are coupled to pins 10, 12, 13 and 15 of 7485 magnitude comparator IC420. Pin 16 of buffers IC410, IC412, IC414 and IC416 are coupled to Vcc. Pin 8 of IC410, IC412, IC414 and IC416 are coupled to ground. In addition, pins 1 and 15 of buffers IC410, IC412, IC414 and IC416 are coupled to ground. Pins 11, 12, 13 and 14 of buffer IC414 and IC416 are left open.

The output, pin 3 of buffer IC416, represents the enable clock (E) signal which is coupled to the PIA's of the COUNTER circuit of FIG. 23 and to pin 25 of PIA IC406. The (E) signal from pin 3 of IC416 is also coupled to pins 1, 5, 9 and 13 of a 7400 quad two-input NAND gate IC422, and to pins 1, 5 and 9 of a 7400 quad two-input NAND gate IC424. The output, pin 5 of buffer IC416, represents a Q signal which is coupled to pins 1 and 4 of two gates of a 7427 tri three-input NOR gate IC426 and to pin 10 of one gate of a 7427 tri three-input NOR gate IC428. The output, pin 7 of buffer IC416, represents the buffered R/$\overline{\text{W}}$ signal which is coupled to pin 21 of the PIA's of the COUNTER circuit in FIG. 23, to pin 21 of PIA IC406, and to pin 1 of OR gate IC326C of the PATTERN LOOK UP circuit of FIG. 27. In addition, the R/$\overline{\text{W}}$ signal from pin 7 of IC416 is also coupled to the direction input, pin 1 of transceiver IC404, and thus determine data flow direction to and from the MPU INTERFACE BOARD.

The R/$\overline{W}$ signal from IC416, pin 7, is also coupled to pins 13 and 3 of two gates of IC426 and to pin 11 of one gate of IC428. The R/$\overline{W}$ signal from IC416, pin 7, is also inverted and input to pin 11 of the third NOR gate of IC426, to pins 13 and 3 of the two remaining NOR gates of IC428, and to pin 13 of one gate of a 7427 tri three-input NOR gate IC430. Pin 9 of buffer IC416 represents a $\overline{RESET}$ signal which is an input signal to pin 34 of the PIA's of the COUNTER circuit of Figure and to pin 34 of PIA IC406.

Pins 2, 4 and 8 of comparator IC420 are coupled to ground. Pins 1, 3, and 16 of IC420 are coupled to Vcc. Pins 9, 11 and 14 are tied to ground. The comparator IC420 defines the hex address (at pins 9, 11, 4 and 1) for the software package. As shown, the hex address is S8XXX. Pins 5 and 7 of IC420 are left open. Pin 6 of IC420 is inverted by being input to pins 12 and 13 of the fourth 7400 NAND gate of IC424. The output of the fourth NAND gate of IC424, pin 11, represents a address decoding $\overline{ENABLE}$ signal which is coupled to pin 19 of transceiver IC404 and to pin 19 of decoder IC418.

Pins 12 and 18 of IC418 are coupled to ground. Pin 24 of IC418 is coupled to Vcc. Pins 11 and 13 through 17 of IC418 are left open. Pins 1 and 2 of decoder IC418 represent CRT SELECT signals and are coupled to the 7400 gate IC354C at pins 9 and 10, respectively. Pins 8, 9 and 10 of IC418 represent PIA A SEL, PIA B SEL and PIA C SEL signals which are coupled to the PIA's of the COUNTER block. The output, pin 7 of decoder IC418, is coupled to the select input, pin 23 of PIA IC406. The output, pin 6 of IC418, represents a $\overline{SNAP\ SHOT}$ signal and is coupled to pin 2 of NOR gate IC430, to pin 13 of NAND gate IC230 and to pin 1 of selects IC256 and IC258 of the COUNTER circuit of FIG. 23. The output, pin 5 of IC418, is a $\overline{PATTERN}$ signal which is coupled to pins 5 and 9 of two NOR gates in IC428. The $\overline{PATTERN}$ signal is also inverted and becomes a PATTERN SEL signal which is coupled to pin 1 of selects IC276 and IC302 of the X-SIZE and Y-SIZE block generators. Pin 4 of IC418 represents a Y-SIZE signal which is coupled to pin 2 of IC428 and to pin 5 of IC426. The Y-SIZE signal from pin 4 of IC418 is also inverted and becomes a Y-SIZE SEL signal which is coupled to pin 1 of select IC300 of the Y-SIZE block generator. The output, pin 3 of IC418, is a X-SIZE signal which is coupled to pins 2 and 9 of IC426. The X-SIZE signal from pin 3 of IC418 is also inverted and becomes a X-SIZE SEL signal which is coupled to pin 1 of IC272 of the X-SIZE block generator.

The outputs, pins 12, 8 and 6 of IC426, and pin 12 of IC428, are coupled to pins 2, 4, 10 and 12, respectively, of the quad two-input NAND gates of IC422. The outputs, pins 8 and 6 of the remaining NOR gates of IC428, and pin 12 of NOR gate IC430, are coupled to the inputs, pins 2, 4 and 10, respectively, of the first three NAND gates of IC424.

The output, pin 3 of the first NAND gate of IC422, represents the X-SIZE $\overline{WRITE}$ ($\overline{W}$) signal which is coupled to pin 3 of X-SIZE RAMS IC268 and IC270. The output, pin 6 of IC422, represents the X-SIZE $\overline{READ}$ ($\overline{R}$) signal which is coupled to pins 1, 4, 10 and 13 of the data line buffers IC278 and IC282 of the X-SIZE block generator. The output, pin 8 of the third NAND gate of IC422, represents the Y-SIZE $\overline{WRITE}$ ($\overline{W}$) signal which is coupled to pin 3 of the Y-SIZE RAMS IC296 and IC298. The output of the last NAND gate of IC422, pin 11, represents the Y-SIZE $\overline{READ}$ ($\overline{R}$) signal which is coupled to pins 1, 4, 10 and 13 of buffers IC310 and IC312. The output, pin 3 of the first NAND gate of IC424, represents the PATTERN $\overline{WRITE}$ ($\overline{W}$) signal which is coupled to pin 12 of the PATTERN LOOKUP RAMS of FIG. 27. The output, pin 6 of the second NAND gate of IC424, is a PATTERN $\overline{READ}$ ($\overline{R}$) signal which is coupled to pins 1, 4, 10 and 13 of buffers IC336 and IC338. Finally, the output, pin 8 of the third NAND gate of IC424 represents a SNAPSHOT $\overline{READ}$ ($\overline{R}$) signal which is coupled to pins 1 and 15 of the tri-state buffers IC260 and IC262.

Pins 20, 22 and 24 of PIA IC406 are coupled to Vcc. Pin 34 of IC406 is coupled to Vcc through a 10 Kohm pull up resistor 432 and receives a $\overline{RESET}$ signal from buffer IC416. Pin 1 of IC406 is coupled to ground. Pins 6, 7, 8, 18, 19, 37 and 38 of IC406 are left open. Pin 40 of IC406 receives the END OF COUNT input signal from the ARMING circuit of FIG. 21. Pin 17 of IC406 represents a STREET SWITCH signal and is coupled to Vcc through a 10 Kohm pull up resistor 434 and pin 12 of connector 124. Pins 10, 11, 12 and 13 of IC406 represent the MOD A SEL, MOD B SEL, MOD C SEL AND MOD D SEL signals, respectively, which are coupled to the AND gates of IC184 in the FRONT END of FIG. 21. Pin 14 of IC406 is the CRT PAGE SEL signal which is coupled to pin 6 of select IC392 of the PATTERN GENERATOR circuit of FIG. 27. Pin 9 of IC406 represents a DIE SWITCH signal and is coupled to Vcc through a 10K pull up resistor 436 and to pin 4 of connector 124. Pins 3 and 11 of connector 124 are coupled to ground. Pin 5 of IC406 is the PATTERN EN signal which is coupled to pin 6 of two-input NOR gate IC438. The other input of NOR gate IC438, pin 5, is coupled to ground. The output of NOR gate IC438, pin 4, is coupled to pin 7 of select IC344 of the PATTERN LOOK UP RAM of FIG. 27. Finally, pins 2, 3 and 4 of PIA IC406 represent PATTERN A, PATTERN B and PATTERN C signals which are coupled to pins 11, 10 and 9 of select IC344 of the PATTERN LOOK UP RAM.

The above detailed circuit description is given by way of example only. Changes in form and details may be made by one skilled in the art wthout departing from the spirit and scope of the invention as defined in the appended claims.

For example, whereas the invention has been disclosed as being controlled by a Motorola 6809 microprocessor (see Reference: MC6809 Preliminary Programming Manual, Motorola, Inc., 1979), the software program could be converted and various hardware changes could be made to adapt the invention to be controlled by other types of microprocessors such as the 8080 and 8086 as made by Intel.

What is claimed is:

1. A method of locating and testing a semiconductor die surrounded by a border region comprising:

scanning preselected regions of said die and said border region to generate a video signal corresponding thereto;

digitizing said video signal such that a light region of said die represented by a first potential and a dark region of said die is represented by a second potential;

storing said digitized video signal of said preselected regions; and comparing said stored digitized video signal with a stored digitized video signal which corresponds to an acceptable semiconductor die.

2. A method according to claim 1 further comprising:

summing and averaging the occurrences of said first potential in each of said preselected regions to locate an edge of said semiconductor die.

3. A method according to claim 2 wherein said preselected regions correspond to top, bottom, left and right regions, said top region overlapping a middle portion of a top edge of said semiconductor die, said bottom region overlapping a middle portion of a bottom edge of said semiconductor die, said left region overlapping a middle portion of a left edge of said semiconductor die, and said right region overlapping a middle portion of a right edge of said semiconductor die.

4. A method according to claim 3 further comprising scanning first, second, third and fourth corner regions and digitizing the video signal therefrom to locate and align semiconductor die.

5. A method according to claim 1 further comprising summing and averaging the occurrences of said first potential in each of said preselected regions to locate defects in said semiconductor die.

6. A method according to claim 5 wherein said preselected regions correspond to center and side regions, said center region scanning a central region of said semiconductor die, said side regions scanning the lengths of top, bottom left and right sides of said semiconductor die.

7. A method according to claim 1 further comprising altering the size of said preselected regions.

8. A method according to claim 1 further comprising displaying alpha numerics on a video screen.

9. A method according to claim 8 further comprising displaying on a video screen, in combination, said digitized die and border video signals; said preselected regions; and said alpha numerics.

* * * * *